(12) United States Patent
Hakii et al.

(10) Patent No.: US 9,287,521 B2
(45) Date of Patent: Mar. 15, 2016

(54) TRANSPARENT ELECTRODE, METHOD FOR MANUFACTURING TRANSPARENT ELECTRODE, ELECTRONIC DEVICE, AND ORGANIC ELECTROLUMINESCENCE ELEMENT

(71) Applicant: Konica Minolta, Inc., Chiyoda-ku, Tokyo (JP)

(72) Inventors: Takeshi Hakii, Sagamihara (JP); Hiroshi Ishidai, Hachioji (JP); Toshiyuki Kinoshita, Hino (JP); Kazuhiro Yoshida, Hachioji (JP); Takatoshi Tsujimura, Fujisawa (JP); Minako Ono, Hachioji (JP)

(73) Assignee: KONICA MINOLTA, INC. (JP)

( * ) Notice: Subject to any disclaimer, the term of this patent is extended or adjusted under 35 U.S.C. 154(b) by 0 days.

(21) Appl. No.: 14/396,628

(22) PCT Filed: Apr. 17, 2013

(86) PCT No.: PCT/JP2013/061367
§ 371 (c)(1),
(2) Date: Oct. 23, 2014

(87) PCT Pub. No.: WO2013/161639
PCT Pub. Date: Oct. 31, 2013

(65) Prior Publication Data
US 2015/0123091 A1 May 7, 2015

(30) Foreign Application Priority Data

Apr. 23, 2012 (JP) .................................. 2012-097978
Jun. 4, 2012 (JP) .................................. 2012-127212
Jun. 4, 2012 (JP) .................................. 2012-127213

(51) Int. Cl.
*H01L 51/52* (2006.01)
*H01L 51/00* (2006.01)

(52) U.S. Cl.
CPC ........ *H01L 51/5215* (2013.01); *H01L 51/5234* (2013.01); *H01L 51/0021* (2013.01); *H01L 51/0072* (2013.01)

(58) Field of Classification Search
CPC ............ H01L 51/5215; H01L 51/5234; H01L 51/0021; H01L 51/0072
See application file for complete search history.

(56) References Cited

U.S. PATENT DOCUMENTS 8,890,400 B2 * 11/2014 Naganawa ............. C09K 11/02
313/498
2009/0284138 A1 11/2009 Yasukawa et al.

(Continued)

FOREIGN PATENT DOCUMENTS

| JP | 2007036175 A | 2/2007 |
|----|--------------|--------|
| JP | 2008171637 A | 7/2008 |
| JP | 2010123439 A | 6/2010 |
| JP | 2010251675 A | 11/2010 |

(Continued)

OTHER PUBLICATIONS

International Search Report corresponding to International Application No. PCT/JP2013/061367; Date of Mailing; Jul. 30, 2013; 4 pp.

*Primary Examiner* — Ida M Soward
(74) *Attorney, Agent, or Firm* — Cantor Colburn LLP

(57) ABSTRACT

A transparent electrode is provided with a nitrogen-containing layer, an electrode layer having silver as the main component thereof, and an aluminum intermediate layer, wherein the aluminum intermediate layer is in contact with the nitrogen-containing layer and the electrode layer and sandwiched between the nitrogen-containing layer and the electrode layer. The nitrogen-containing layer is formed by using a compound containing a nitrogen atom. The effective unshared electron pair content [n/M] of this compound satisfies "$3.9 \times 10^{-3} \leq [n/M]$", where n is the number of unshared electron pair(s) not involved in aromaticity and not coordinated to metal, among unshared electron pair(s) owned by the nitrogen atom, and M is molecular weight.

23 Claims, 4 Drawing Sheets

(56) References Cited

U.S. PATENT DOCUMENTS

2011/0057920 A1 3/2011 Matsuura et al.
2012/0261654 A1 10/2012 Yasukawa et al.
2012/0326601 A1 12/2012 Yasukawa et al.

FOREIGN PATENT DOCUMENTS

| JP | 2011077028 A | 4/2011 |
| JP | 2012009359 A | 1/2012 |
| WO | 2009054253 A1 | 4/2009 |

* cited by examiner

TRANSPARENT ELECTRODE, METHOD FOR MANUFACTURING TRANSPARENT ELECTRODE, ELECTRONIC DEVICE, AND ORGANIC ELECTROLUMINESCENCE ELEMENT

This is the U.S. national stage of application No. PCT/JP2013/061367, filed on 17 Apr. 2013. The present invention claims priority under 35 U.S.C. §119 to Japanese Application No. 2012-097978 filed Apr. 23, 2012, Japanese Application No. 2012-127212, filed Jun. 4, 2012, and Japanese Application No. 2012-127213, filed Jun. 4, 2012, the entire content of these three applications are incorporated herein by reference.

TECHNICAL FIELD

The present invention relates to a transparent electrode, a method for producing such a transparent electrode, an electronic device, and an organic electroluminescence element and, more particularly, to a transparent electrode having electrical conductivity and light transmissibility, a method for producing such a transparent electrode, and an electronic device and an organic electroluminescence element in each of which such a transparent electrode is used.

BACKGROUND ART

An organic electroluminescence element (i.e., so-called organic EL element) using electroluminescence (referred to as EL hereinafter) of an organic material is a thin-film type completely-solid element capable of emitting light at a low voltage of several volts to several tens volts, and has many excellent features such as high brightness, high luminous efficiency, thin in thickness, and light in weight. Therefore, recently the organic electroluminescence element has attracted attention as a backlight for various kinds of displays, a display board (such as a signboard, an emergency light or the like), and a planar light-emitting body (such as a light source for a lighting fixture).

Such an organic electroluminescence element includes two layers of electrodes, and a light emitting layer formed of an organic material sandwiched between the two layers of electrodes; and the light emitted by the light emitting layer is transmitted through the electrode(s) and extracted to the outside. Thus, at least one of the two layers of electrodes is configured as a transparent electrode.

An oxide semiconductor material, such as indium tin oxide (ITO: SnO2-In2O3) or the like, or silver (Ag) is generally used as the transparent electrode. However, since ITO contains indium, which is a rare metal, the material cost goes up; and further, in order to reduce resistance, it is necessary to perform an annealing treatment at a temperature of about 300° C. to 400° C. after film-formation. Further, although silver (Ag) has excellent electrical conductivity compared with ITO, the light transmissibility will become low if the film-thickness is increased to obtain sufficient resistance.

To solve such a problem, a transparent conductive film laminate is proposed. The transparent conductive film laminate has a configuration in which a silver thin film layer composed of silver or a silver-alloy is laminated on a ground layer composed of a metal other than silver, such as gold, aluminum, copper, indium, tin, zinc or the like (see Patent Document 1, for example).

PRIOR ART DOCUMENTS

Patent Documents

Patent Document 1: Japanese Unexamined Patent Application Publication No. 2008-171637

DISCLOSURE OF THE INVENTION

Problems to be Solved by the Invention

However, even with the configuration in which silver is laminated on the ground layer formed of aluminum or the like that has high electrical conductivity, it is difficult to obtain sufficient electrical conductivity and light transmissibility at the same time.

In view of the aforesaid problems, it is an object of the present invention to provide a transparent electrode having sufficient electrical conductivity and light transmissibility and a method for producing such a transparent electrode, as well as an electronic device and an organic electroluminescence element whose performance is improved by using such a transparent electrode.

Means for Solving the Problems

The aforesaid object of the present invention is achieved by the following configurations.

1. A transparent electrode including:
   a nitrogen-containing layer formed by using a compound which contains a nitrogen atom and whose effective unshared electron pair content [n/M] satisfies "$3.9 \times 10^{-3} \leq [n/M]$", where n is the number of unshared electron pair(s) not involved in aromaticity and not coordinated to metal, among unshared electron pair(s) owned by the nitrogen atom contained in the compound, and M is molecular weight;
   an electrode layer having silver as the main component there of; and
   an aluminum intermediate layer in contact with the nitrogen-containing layer and the electrode layer and sandwiched between the nitrogen-containing layer and the electrode layer.

2. The transparent electrode according to configuration 1, wherein the effective unshared electron pair content [n/M] of the compound satisfies "$5.0 \times 10^{-3} \leq [n/M]$".

3. The transparent electrode according to configuration 1 or 2, wherein the nitrogen-containing layer contains a compound represented by the following General Formula (1),

[Chemical Formula 1]

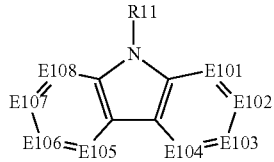

General Formula (1)

where
E101 to E108 each represent —C(R12)= or —N=, and at least one of E101 to E108 represents —N=, and
R11 and R12 each represent a hydrogen atom or a substituent.

4. The transparent electrode according to configuration 1 or 2, wherein the nitrogen-containing layer contains a compound represented by the following General Formula (2),

[Chemical Formula 2]

General Formula (2)

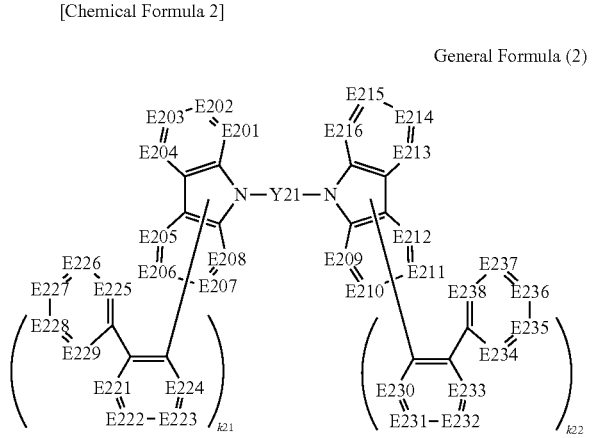

where

Y21 represents a divalent linking group which is an arylene group, a heteroarylene group or a combination of the arylene group and the heteroarylene group, E201 to E216 and E221 to E238 each represent —C(R21)= or —N=, wherein R21 represents a hydrogen atom or a substituent, and wherein at least one of E221 to E229 and at least one of E230 to E238 each represent —N=, and and k21 and k22 each represent an integer of 0 to 4, wherein the sum of k21 and k22 is an integer of 2 or more.

5. The transparent electrode according to configuration 1 or 2, wherein the nitrogen-containing layer contains a compound represented by the following General Formula (3),

[Chemical Formula 3]

General Formula (3)

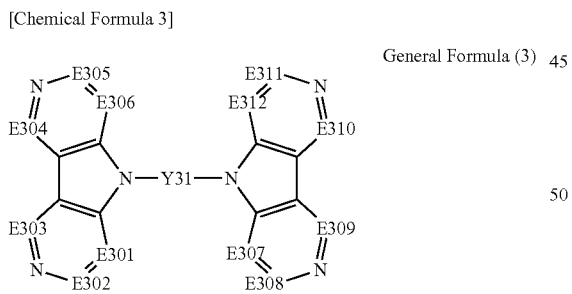

where

E301 to E312 each represent —C(R31)=, wherein R31 represents a hydrogen atom or a substituent, and Y31 represents a divalent linking group which is an arylene group, a heteroarylene group or a combination of the arylene group and the heteroarylene group.

6. The transparent electrode according to configuration 1 or 2, wherein the nitrogen-containing layer contains a compound represented by the following General Formula (4),

[Chemical Formula 4]

General Formula (4)

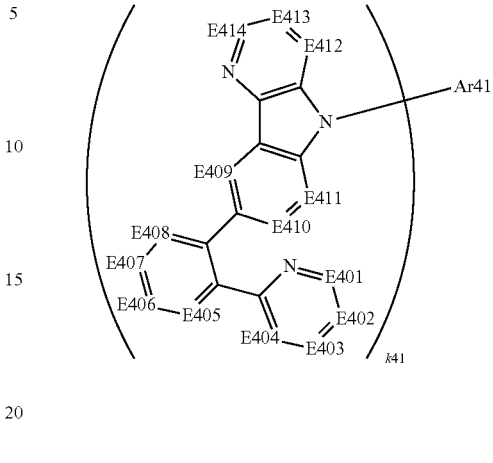

where

E401 to E414 each represent —C(R41)=, wherein R41 represents a hydrogen atom or a substituent, Ar41 represents a substituted or unsubstituted aromatic hydrocarbon ring or aromatic heterocycle, and k41 represents an integer of 3 or more.

7. The transparent electrode according to configuration 1 or 2, wherein the nitrogen-containing layer contains a compound represented by the following General Formula (5),

[Chemical Formula 5]

General Fomula (5)

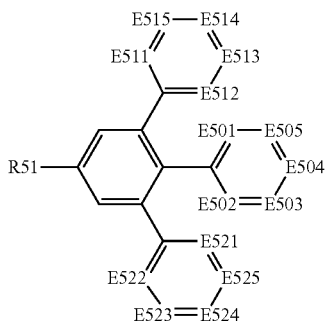

where

R51 represents a substituent,

E501, E502, E511 to E515, and E521 to E525 each represent —C(R52)= or —N=, and

E503 to E505 each represent —C(R52), wherein R52 represents a hydrogen atom (H) or a substituent, and wherein at least one of E501 and E502 represents —N=, at least one of E511 to E515 represents —N=, and at least one of E521 to E525 represents —N=.

8. The transparent electrode according to configuration 1 or 2, wherein the nitrogen-containing layer contains a compound represented by the following General Formula (6),

[Chemical Formula 6]

General Formula (6)

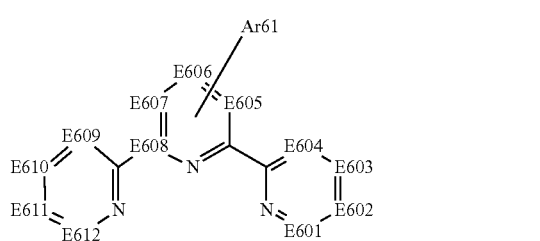

where

E601 to E612 each represent —C(R61)= or —N=, wherein R61 represents a hydrogen atom or a substituent; and Ar61 represents a substituted or unsubstituted aromatic hydrocarbon ring or aromatic heterocycle 9. The transparent electrode according to any one of configurations 1 to 8, wherein the nitrogen-containing layer contains halogen atoms.

10. The transparent electrode according to configuration 9, wherein the aluminum intermediate layer contains halogen atoms.

11. The transparent electrode according to configuration 9 or 10, wherein the aluminum intermediate layer includes an intermediate layer that contains halogen atoms at least in its interface with the nitrogen-containing layer.

12. The transparent electrode according to configuration 10 or 11, wherein the aluminum intermediate layer is formed so that the content of halogen atoms gradually decreases from the side of the nitrogen-containing layer toward the side of the electrode layer.

13. The transparent electrode according to any one of configurations 9 to 12, wherein the aluminum intermediate layer contains halogen atoms only in a portion thereof on the side of the nitrogen-containing layer.

14. The transparent electrode according to any one of configurations 9 to 12, wherein the aluminum intermediate layer contains halogen atoms in the whole layer thereof.

15. The transparent electrode according to any one of configurations 1 to 14, wherein the aluminum intermediate layer has a film-thickness of 1 nm or less.

16. The transparent electrode according to any one of configurations 1 to 15, wherein the nitrogen-containing layer is formed by using the compound and another compound, and the average value of the effective unshared electron pair content [n/M] obtained considering the mixing ratio of the both compounds satisfies "$3.9 \times 10^{-3} \leq [n/M]$".

17. A method for producing a transparent electrode, comprising the steps of:

forming a nitrogen-containing layer by using a compound which contains a nitrogen atom and whose effective unshared electron pair content [n/M] satisfies "$3.9 \times 10^{-3} \leq [n/M]$", where n is the number of unshared electron pair(s) not involved in aromaticity and not coordinated to metal, among unshared electron pair(s) owned by the nitrogen atom contained in the compound, and M is molecular weight;

forming an aluminum intermediate layer in contact with the nitrogen-containing layer; and forming an electrode layer in contact with the aluminum intermediate layer, the electrode layer having silver as the main component thereof.

18. The method for producing a transparent electrode according to configuration 17, wherein in the step of forming the nitrogen-containing layer, a nitrogen-containing layer containing halogen atoms is formed, and wherein in the step of forming the aluminum intermediate layer, the aluminum intermediate layer is formed while the halogen atoms contained in the nitrogen-containing layer are being diffused into the aluminum intermediate layer.

19. The method for producing a transparent electrode according to configuration 18 or 19, wherein in the step of forming the nitrogen-containing layer, a nitrogen-containing layer containing halogen atoms is formed, and wherein after the step of forming the aluminum intermediate layer, a step of diffusing the halogen atoms contained in the nitrogen-containing layer into the aluminum intermediate layer is performed.

20. An electronic device comprising:

a transparent electrode according to any one of configurations 1 to 16.

21. The electronic device according to configuration 20, wherein the electronic device is an organic electroluminescence element.

22. An organic electroluminescence element comprising:

a transparent electrode according to any one of configurations 1 to 16;

a light-emitting functional layer arranged on the electrode layer side of the transparent electrode; and an opposite electrode arranged so that the light-emitting functional layer is sandwiched between the opposite electrode and the transparent electrode.

23. An organic electroluminescence element comprising:

a transparent electrode according to any one of configurations 1 to 16;

a light-emitting functional layer arranged on the nitrogen-containing layer side of the transparent electrode; and an opposite electrode arranged so that the light-emitting functional layer is sandwiched between the opposite electrode and the transparent electrode.

The aforesaid transparent electrode has a configuration in which the electrode layer having silver as the main component thereof is arranged adjacent to the nitrogen-containing layer through the aluminum intermediate layer, wherein the nitrogen-containing layer is formed by using a compound containing nitrogen atoms. Due to the interaction between the electrode layer having silver as the main component thereof and aluminum of the aluminum intermediate layer and the interaction between the electrode layer having silver as the main component thereof and the nitrogen atoms constituting the nitrogen-containing layer, diffusion distance of silver in the adjoining interface is reduced, and therefore aggregation of silver is inhibited. Therefore, the silver thin-film will be formed in a manner in which the silver thin-film grows in a single-layer growth mode (Frank-van der Merwe: FW mode); while in contrast, the silver thin-film is generally formed in a manner in which the silver thin-film grows in a nuclear growth mode (Volumer-Weber: VW mode) and thereby the silver thin-film tends to be isolated into an island shape. Thus, it is possible to obtain an electrode layer which has small yet uniform film-thickness.

Particularly, the aforesaid effective unshared electron pair content [n/M] is used as an index of the bond stability of silver constituting the electrode layer with respect to the nitrogen-containing layer, and a compound whose effective unshared electron pair content [n/M] satisfies "$3.9 \times 10^{-3} \leq [n/M]$" is used to constitute the nitrogen-containing layer. Thus, it becomes possible to provide a nitrogen-containing layer by which the effect of "inhibiting aggregation of silver" can be reliably achieved. This is also confirmed by a fact (which is to be described in detail in the below-mentioned examples) that an electrode layer having an extremely small film-thickness of 5 nm yet having a low sheet resistance of about two-digit value is formed on such a nitrogen-containing layer through an aluminum intermediate layer having an extremely small thickness not impairing light transmissibility.

Thus, with the transparent electrode, it becomes possible to reliably obtain an electrode layer, wherein the light transmissibility of the electrode layer is ensured due to the thin film-thickness while the electrical conductivity of the electrode layer is ensured due to the uniform film-thickness, and therefore it becomes possible to improve both the electrical conductivity and the light transmissibility of the transparent electrode that uses silver.

Advantages of the Invention

As described above, according to the present invention, it is possible to improve both the electrical conductivity and the light transmissibility of the transparent electrode at the same time, and it is possible to improve the performance of the electronic device and the organic electroluminescence element in which the transparent electrode is used.

MODES FOR CARRYING OUT THE INVENTION

An embodiment of the present invention will be described in the following order with reference to the attached drawings.

1. Transparent Electrode
2. Applications of Transparent Electrode
3. First Example of Organic Electroluminescence Element (Top Emission Type)
4. Second Example of Organic Electroluminescence Element (Bottom Emission Type)
5. Third Example of Organic Electroluminescence Element (Dual Emission Type)
6. Fourth Example of Organic Electroluminescence Element (Inversely laminated configuration)
7. Applications of Transparent Electrode
8. Illumination Device 1
9. Illumination Device 2

<<1. Transparent Electrode>>

Figure 1:
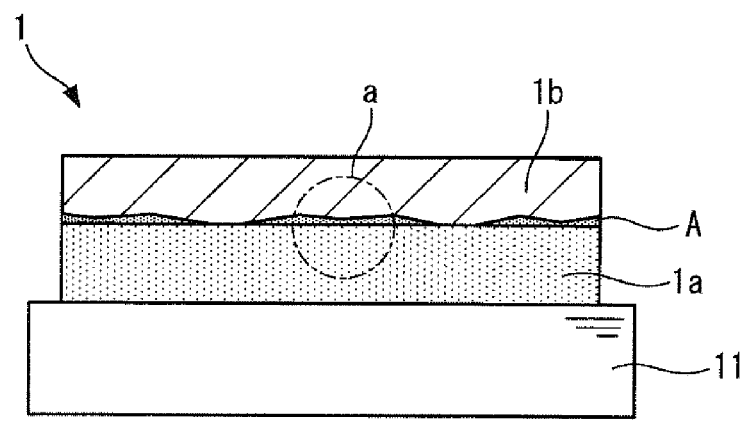
FIG. 1 is a view schematically showing a cross-sectional configuration of a transparent electrode according to the present invention.

FIG. 1 is a cross-sectional view schematically showing a configuration of a transparent electrode according to an embodiment. As shown in FIG. 1, a transparent electrode 1 has a laminated structure including a nitrogen-containing layer 1a, an electrode layer 1b and an aluminum intermediate layer A, wherein the aluminum intermediate layer A is sandwiched between the nitrogen-containing layer 1a and the electrode layer 1b. In such a transparent electrode 1, the nitrogen-containing layer 1a, the aluminum intermediate layer A and the electrode layer 1b are arranged, in this order, on the top of a base material 11, for example. The electrode layer 1b, which constitutes an electrode portion of the transparent electrode 1, is a layer having silver (Ag) as the main component thereof. Further, the nitrogen-containing layer 1a with respect to the electrode layer 1b is formed by using a compound containing nitrogen atom(s) (N); and particularly, the nitrogen-containing layer 1a is formed by using a compound in which the content of [effective unshared electron pair(s)] falls in a predetermined range, wherein the term [effective unshared electron pair] is defined as an unshared electron pair of a nitrogen atom stably bonded with silver, which is the main component of the electrode layer 1b.

Detailed configuration of the base material 11 (on which the transparent electrode 1 having the aforesaid laminated structure is formed), the nitrogen-containing layer 1a, the aluminum intermediate layer A and electrode layer 1b, which constitute the transparent electrode 1, will be described below in this order. Incidentally, the term "transparent" of the transparent electrode 1 in the present invention means that light transmittance of the transparent electrode 1 for light with a wavelength of 550 nm is 50% or higher.

<Base Material 11>

Examples of the base material 11, on which the transparent electrode 1 of the present invention is formed, include but not limited to glass, plastic and the like. Further, the base material 11 may be either transparent or non-transparent. However, in the case where the transparent electrode 1 of the present invention is applied to an electronic device in which the light is extracted from the side of the base material 11, the base material 11 is preferably transparent. Examples of the material favorably to be used as the transparent base material 11 include a glass, quartz, and a transparent resin film.

Examples of the glass include silica glass, soda-lime-silica glass, lead glass, borosilicate glass, alkali-free glass, and the like. From the viewpoint of durability, smoothness, and adhesiveness with the nitrogen-containing layer 1a, the surface of the aforesaid glass materials is subjected to a physical treatment such as polishing, and/or formed with an inorganic material coat, an organic material coat or a hybrid coat according to necessity, wherein the hybrid coat is obtained by combining the inorganic material coat and the organic material coat.

Examples of the material for the resin film include polyesters (such as polyethylene terephthalate (PET) and polyethylene naphthalate (PEN)), polyethylene, polypropylene, cellophane, cellulose esters and their derivatives (such as cellulose diacetate, cellulose triacetate, cellulose acetate butylate, cellulose acetate propionate (CAP), cellulose acetate phthalate (TAC), and cellulose nitrate), polyvinylidene chloride, polyvinylalcohol, polyethylenevinylalcohol, syndiotactic polystyrene, polycarbonate, norbornane resin, polymethylpentene, polyetherketone, polyimide, polyether sulfone (PES), polyphenylene sulfide, polysulfones, polyether imide, polyetherketone imide, polyamide, fluorine resin, nylon, polymethyl methacrylate, acryl or polyarylates, and cyclo-olefin resins (such as ARTON (trade name, manufactured by JSR Corp.) and APEL (trade name, manufactured by Mitsui Chemicals Inc.)).

The surface of the resin film may be formed with an inorganic material coat, an organic material coat or a hybrid coat, wherein the hybrid coat is obtained by combining the inorganic material coat and the organic material coat. It is preferred that the aforesaid coats and hybrid coat are each a barrier film having a water vapor permeability of 0.01 g/(m²·24 h) or less (at temperature of 25±0.5° C. and relative humidity of (90±2)% RH) measured by a method in conformity with JIS K 7129-1992. It is further preferred that the aforesaid coats and hybrid coat are each a high barrier film having an oxygen permeability of $1\times10^{-3}$ ml/(m²·24 h·atm) or less and a water vapor permeability of $1\times10^{-5}$ g/(m²·24 h) or less measured by a method in conformity with JIS K 7126-1987.

Any material capable of preventing penetration of substances that cause the element to degrade, such as moisture, oxygen and the like, may be used to form the aforesaid barrier film, and examples of such material include silicon oxide, silicon dioxide, silicon nitride and the like. Further, in order to reduce the fragility of the barrier film, it is more preferred that the barrier film has a laminated structure composed of the aforesaid inorganic layer and organic material layer (i.e., organic layer). There is no particular limitation on the order of laminating the inorganic layer and organic layer; however, it is preferred that the both layers are alternately laminated multiple times.

There is no particular limitation on the method of forming the barrier film. For example, the barrier film may be formed by a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method or the like; and it is particularly preferred that the barrier film is formed by an atmospheric pressure plasma polymerization method described in Japanese Unexamined Patent Application Publication No. 2004-68143.

On the other hand, in the case where the base material 11 is non-transparent, a metal plate (such as an aluminum plate, a stainless steel plate or the like), a non-transparent resin substrate, a ceramic substrate or the like may be used as the base material 11. These substrates may each be a film-like substrate capable of being flexibly bent.

<Nitrogen-Containing Layer 1a>

The nitrogen-containing layer 1a is a layer arranged adjacent to the aluminum intermediate layer A, and is formed by using a compound containing nitrogen atom(s) (N). The nitrogen-containing layer 1a may be partially in contact with the electrode layer 1b. Further, the nitrogen-containing layer 1a may contain halogen atoms. Particularly, the present invention is characterized that the content of the [effective unshared electron pair(s)] of the compound constituting the nitrogen-containing layer 1a falls in a predetermined range, wherein the term [effective unshared electron pair] is defined as an unshared electron pair of a nitrogen atom, among the nitrogen atom(s) contained in the compound, stably bonded with silver, which is the main component of the electrode layer 1b.

Here, the term [effective unshared electron pair] is defined as, among the unshared electron pairs owned by the nitrogen atom(s) contained in the compound, an unshared electron pair not involved in aromaticity and not coordinated to metal. Here, the term "aromaticity" means an unsaturated ring structure in which atoms each having a π electron are arranged in a ring-like shape, i.e., means aromaticity following so-called "Huckel's rule"; and is subject to a condition that the number of electrons contained in the π electron system of the ring need to be "4n+2" (n=0 or a natural number).

The aforesaid [effective unshared electron pair] is selected depending on whether or not the unshared electron pair owned by the nitrogen atom is involved in aromaticity, regardless of whether or not the nitrogen atom having the unshared electron pair is a hetero atom that constitutes the aromatic ring. For example, even though a certain nitrogen atom is a hetero atom that constitutes the aromatic ring, if the nitrogen atom has an unshared electron pair not involved in aromaticity, the unshared electron pair will be counted as an [effective unshared electron pair]. In contrast, even though a certain nitrogen atom is not a hetero atom that constitutes the aromatic ring, if the unshared electron pairs owned by the nitrogen atom are all involved in aromaticity, the unshared electron pairs of the nitrogen atom will not be counted as an [effective unshared electron pair]. Incidentally, in each compound, the number n of the aforesaid [effective unshared electron pair(s)] is equal to the number of the nitrogen atom(s) having the [effective unshared electron pair].

Particularly, in the present embodiment, the number n of the [effective unshared electron pair(s)] to the molecular weight M of the compound is defined as, for example, effective unshared electron pair content [n/M]. The present invention is characterized that the nitrogen-containing layer 1a is formed by using a compound selected so that [n/M] satisfies "$3.9\times10^{-3} \le [n/M]$". It is further preferred that the effective unshared electron pair content [n/M] defined as above falls in a range of "$5.0\times10^{3} \le [n/M]$". Also, the effective unshared electron pair content [n/M] may satisfy "$[n/M] \le 1.9\times10^{-2}$".

The nitrogen-containing layer 1a is formed by using a compound whose effective unshared electron pair content [n/M] falls in the aforesaid predetermined range; the nitrogen-containing layer 1a may either be formed by using such a compound only, or be formed by a mixture obtained by mixing such a compound with other compound(s). The other compound(s) may either contain nitrogen atom or not contain nitrogen atom; and further, the effective unshared electron pair content [n/M] may not fall in the aforesaid range.

In the case where the nitrogen-containing layer 1a is formed by using a plurality of compounds, the molecular weight M of the mixed compound obtained by mixing the plurality of compounds is obtained based on, for example, the mixing ratio of the plurality of compounds, and the number n of summed [effective unshared electron pairs] with respect to the molecular weight M is obtained as the average value of the effective unshared electron pair content [n/M], and it is preferred that such value is within the aforesaid predetermined range. In other words, it is preferred that the effective unshared electron pair content [n/M] of the nitrogen-containing layer 1a itself is within a predetermined range.

In the case where the nitrogen-containing layer 1a is formed by using a plurality of compounds and where the mixing ratio (the content ratio) of the plurality of compounds varies in the film-thickness direction, it is only required that the effective unshared electron pair content [n/M] in the interface of the nitrogen-containing layer 1a with aluminum intermediate layer A falls in the aforesaid predetermined range.

Further, the nitrogen-containing layer 1a may contain a compound having a halogen atom. In such a case, a compound whose effective unshared electron pair content [n/M] falls in the aforesaid predetermined range may have the halogen atom, or another compound constituting the nitrogen-containing layer 1a, other than the said compound, may contain the halogen atom.

[Compound-1]

As the compound constituting the nitrogen-containing layer 1a, concrete examples (No. 1 to No. 30) of the compound whose effective unshared electron pair content [n/M] satisfies "$3.9 \times 10^{-3} \leq [n/M]$" will be described below. In each of Compounds No. 1 to No. 30, each nitrogen atom having [effective unshared electron pair] is circled with a circle. Further, the molecular weight M, the number n of the [effective unshared electron pairs], and the effective unshared electron pair content [n/M] of each of Compounds No. 1 to No. 30 are shown in Table 1 below. In copper phthalocyanine shown as the following Compound 26, among the unshared electron pairs owned by nitrogen atoms, the unshared electron pairs not coordinated to copper are counted as the [effective unshared electron pairs].

[Chemical Formula 7]

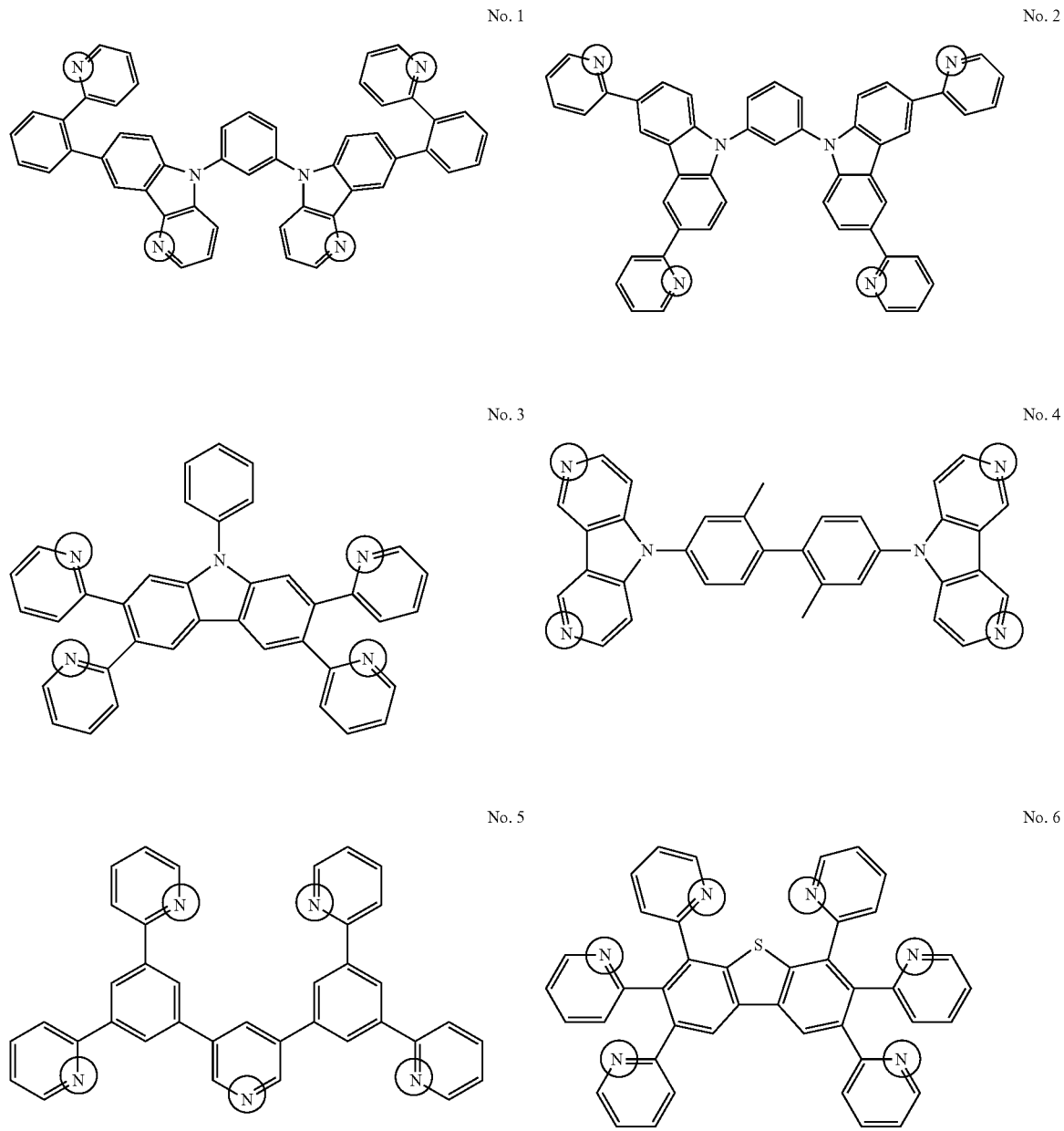

-continued
No. 7
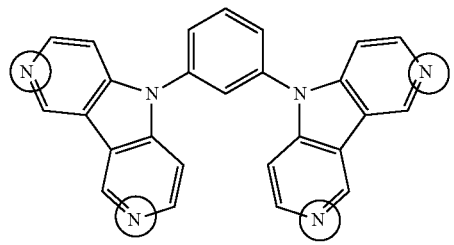
No. 8
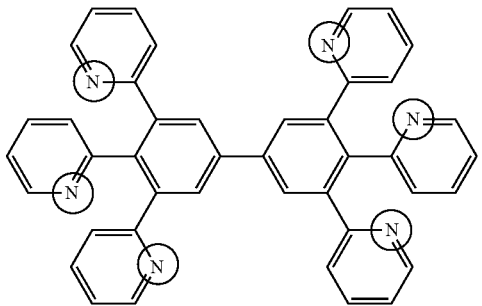
No. 9
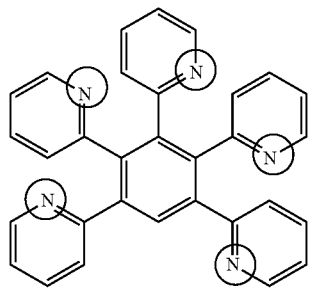
No. 10
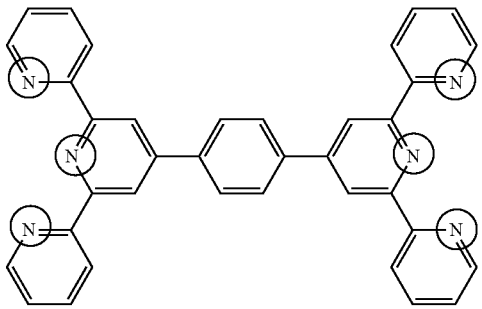
No. 11
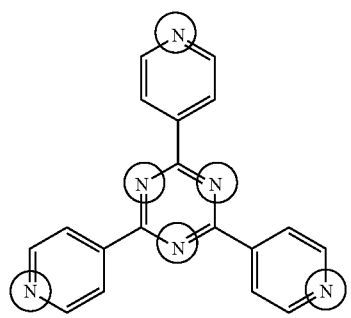
[Chemical Formula 9]
No. 12
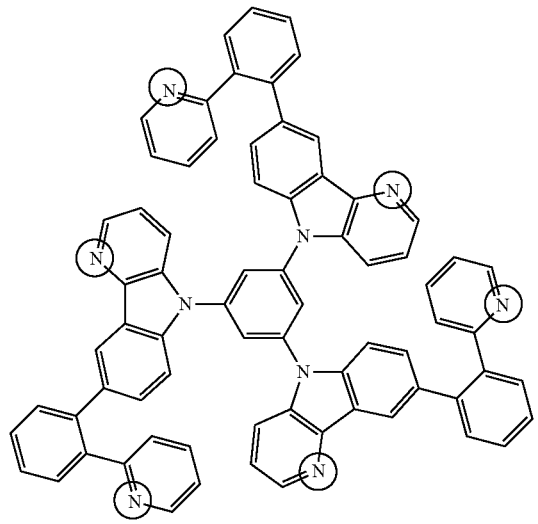
No. 13
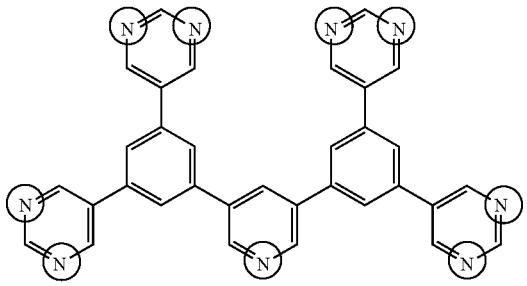

-continued
No. 14
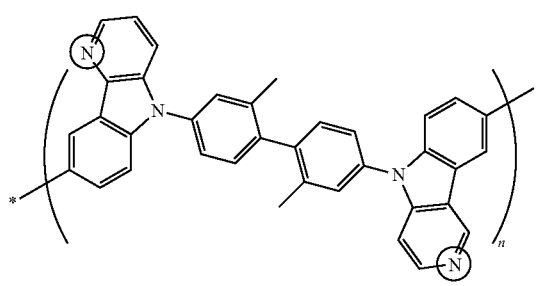
No. 15
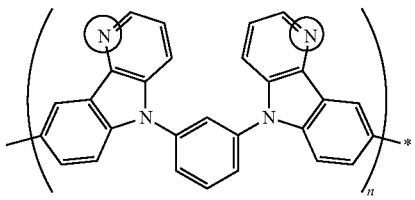
[Chemical Formula 10]
No. 16
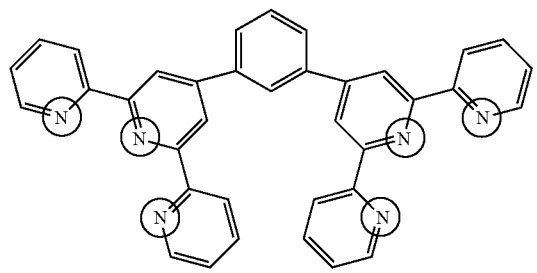
No. 17
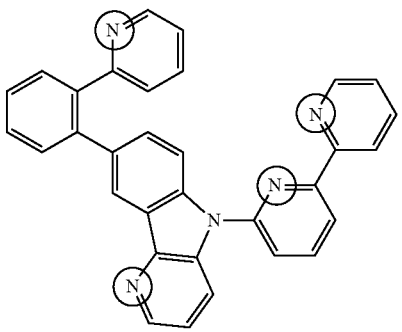
No. 18
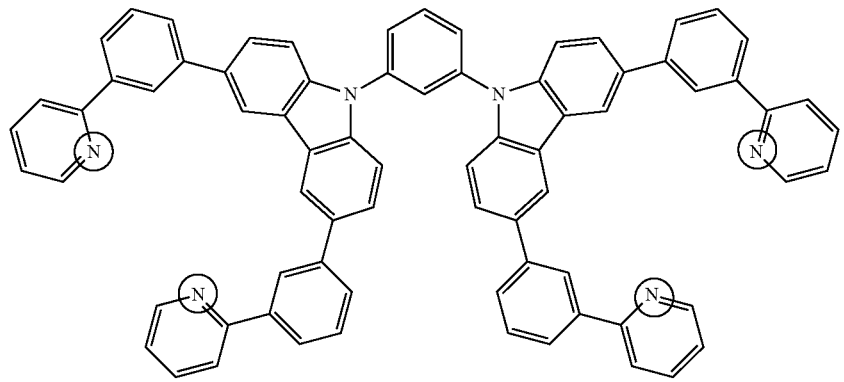
No. 19
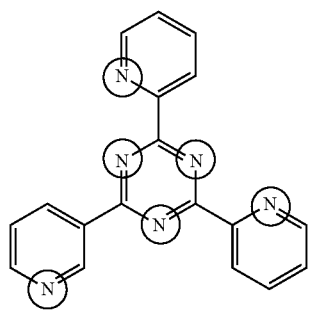
No. 20
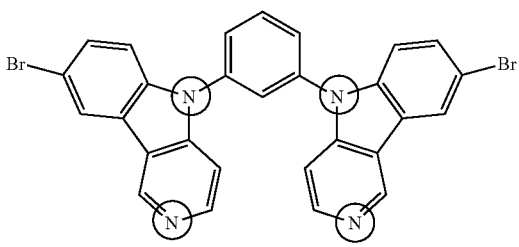

-continued
No. 21
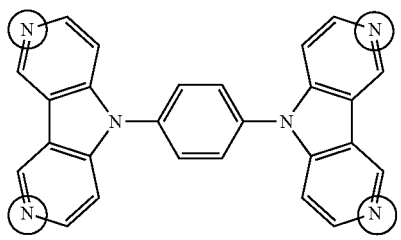
No. 22
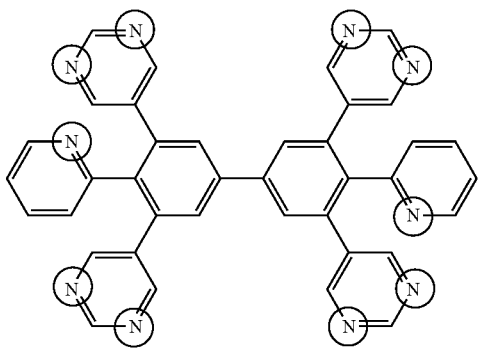
[Chemical Formula 11]
No. 23
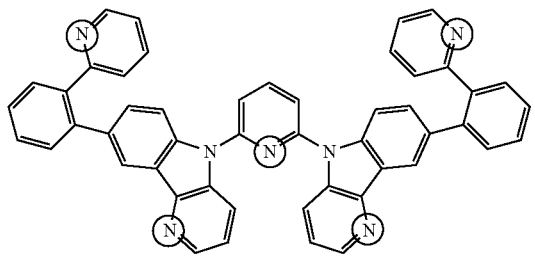
No. 24
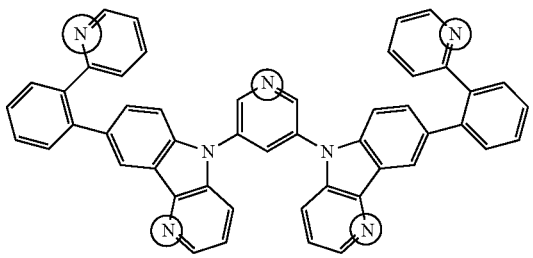
No. 25
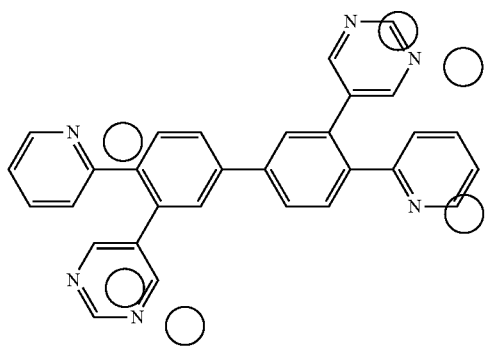
No. 26
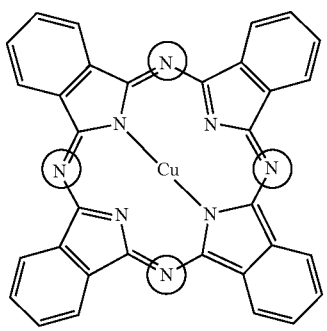
No. 27
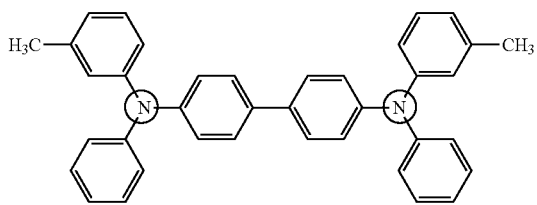
No. 28
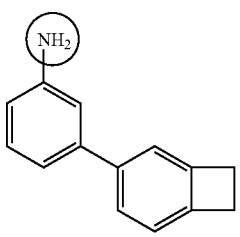

No. 29

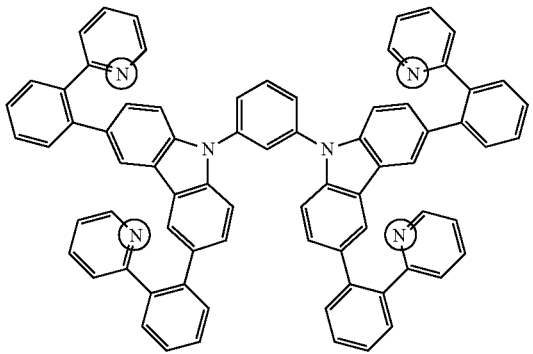

No. 30

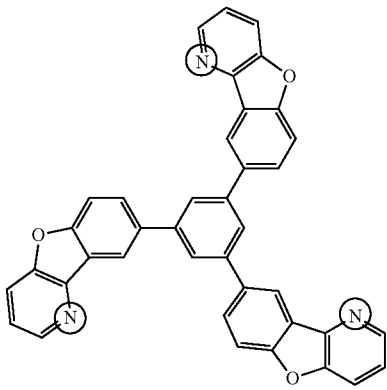

TABLE 1

| Compound | Number of effective unshared electron pair [n] | Molecular weight [M] | [n/M] | Corresponding General Formula |
|---|---|---|---|---|
| No. 1 | 4 | 716.83 | 5.6E−03 | (1), (2) |
| No. 2 | 4 | 716.83 | 5.6E−03 | |
| No. 3 | 4 | 551.64 | 7.3E−03 | |
| No. 4 | 4 | 516.60 | 7.7E−03 | (1), (3) |
| No. 5 | 5 | 539.63 | 9.3E−03 | |
| No. 6 | 6 | 646.76 | 9.3E−03 | (5) |
| No. 7 | 4 | 412.45 | 9.7E−03 | (1), (3) |
| No. 8 | 6 | 616.71 | 9.7E−03 | (5) |
| No. 9 | 5 | 463.53 | 1.1E−02 | (2) |
| No. 10 | 6 | 540.62 | 1.1E−02 | (6) |
| No. 11 | 6 | 312.33 | 1.9E−02 | |
| No. 12 | 6 | 1036.19 | 5.8E−03 | (1), (4) |
| No. 13 | 9 | 543.58 | 1.7E−02 | |
| No. 14 | 2 | 512.60 | 3.9E−03 | (1) |
| No. 15 | 2 | 408.45 | 4.9E−03 | (1) |
| No. 16 | 6 | 540.62 | 1.1E−02 | (6) |
| No. 17 | 4 | 475.54 | 8.4E−03 | (1) |
| No. 18 | 4 | 1021.21 | 3.9E−03 | |
| No. 19 | 6 | 312.33 | 1.9E−02 | (6) |
| No. 20 | 4 | 568.26 | 7.0E−03 | (1) |
| No. 21 | 4 | 412.45 | 9.7E−03 | (1), (3) |
| No. 22 | 10 | 620.66 | 1.6E−02 | (5) |
| No. 23 | 5 | 717.82 | 7.0E−03 | (1), (2) |
| No. 24 | 5 | 717.82 | 7.0E−03 | (1), (2) |
| No. 25 | 6 | 464.52 | 1.3E−02 | |
| No. 26 | 4 | 576.10 | 6.9E−03 | |
| No. 27 | 2 | 516.67 | 3.9E−03 | |
| No. 28 | 1 | 195.26 | 5.1E−03 | |
| No. 29 | 4 | 1021.21 | 3.9E−03 | (2) |
| No. 30 | 3 | 579.60 | 5.2E−03 | |

Incidentally, in the case the exemplified compound also belongs to the below-mentioned General Formulas (1) to (6), which represent other compounds to be described later, the corresponding General Formula is also shown in Table 1.
[Compound-2]

Further, in addition to the compound whose effective unshared electron pair content [n/M] falls in the aforesaid predetermined range, other compound(s) may also be used as the compound constituting the nitrogen-containing layer 1a in the case where such compound(s) has properties necessary for the electronic device to which the transparent electrode 1 having the nitrogen-containing layer 1a is applied. For example, in the case where the transparent electrode 1 is used as an electrode of an organic electroluminescence element, one or more of the compounds represented by the below-mentioned General Formulas (1) to (6) is used as the compound constituting the nitrogen-containing layer 1a, due to its film-forming performance and electron transport performance.

The compounds represented by General Formulas (1) to (6) also include the compounds whose effective unshared electron pair content [n/M] falls in the aforesaid range, and in such a case, one of such compounds may be used alone as the compound constituting the nitrogen-containing layer 1a (see Table 1). On the other hand, if a compound represented by General Formulas (1) to (6) is a compound whose effective unshared electron pair content [n/M] does not fall in the aforesaid range, such compound may be used as the compound constituting the nitrogen-containing layer 1a by being used in combination with a compound whose effective unshared electron pair content [n/M] falls in the aforesaid range.

[Chemical Formula 12]

General Formula (1)

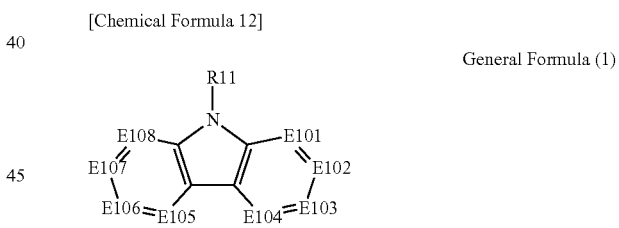

In General Formula (1), E101 to E108 each represent —C(R12)= or —N=, and at least one of E101 to E108 represents —N=. Further, in General Formula (1), R11 and the aforesaid R12 each represent a hydrogen atom or a substituent.

Examples of the substituent include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, a pentadecyl group and the like); a cycloalkyl group (for example, a cyclopentyl group, a cyclohexyl group and the like); an alkenyl group (for example, a vinyl group, an allyl group and the like); an alkynyl group (for example, an ethynyl group, a propargyl group and the like); an aromatic hydrocarbon group (also referred to as an aromatic carbon ring group, an aryl group or the like, and examples of the aromatic hydrocarbon group include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenyryl group and the like); an aromatic heterocyclic group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolinyl group, a diazacarbazolyl group (which is formed by substituting any one of carbon atoms constituting a carboline ring of the aforesaid carbolinyl group with a nitrogen atom), a phtharazinyl group and the like); a heterocyclic group (for example, a pyrrolidyl group, an imidazolidyl group, a morpholyl group, an oxazolidyl group and the like); an alkoxy group (for example, a methoxy group, an ethoxy group, a propyloxy group, a pentyloxy group, a hexyloxy group, an octyloxy group, a dodecyloxy group and the like); a cycloalkoxy group (for example, a cyclopentyloxy group, a cyclohexyloxy group and the like); an aryloxy group (for example, a phenoxy group, a naphthyloxy group and the like); an alkylthio group (for example, a methylthio group, an ethylthio group, a propylthio group, a pentylthio group, a hexylthio group, an octylthio group, a dodecylthio group and the like); a cycloalkylthio group (for example, a cyclopentylthio group, a cyclohexylthio group and the like); an arylthio group (for example, a phenylthio group, a naphthylthio group and the like); an alkoxycarbonyl group (for example, a methyloxycarbonyl group, an ethyloxycarbonyl group, a butyloxycarbonyl group, an octyloxycarbonyl group, a dodecyloxycarbonyl group and the like); an aryloxycarbonyl group (for example, a phenyloxycarbonyl group, a naphthyloxycarbonyl group and the like); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group and the like); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group and the like); an acyloxy group (for example, an acetyloxy group, an ethylcarbonyloxy group, a butylcarbonyloxy group, an octylcarbonyloxy group, a dodecylcarbonyloxy group, a phenylcarbonyloxy group and the like); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group and the like); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group and the like); an ureido group (for example, a methylureido group, an ethylureido group, a pentylureido group, a cyclohexylureido group, an octylureido group, a dodecylureido group, a phenylureido group, a naphthylureido group, a 2-pyridylaminoureido group and the like); a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group and the like); an alkylsulfonyl group (for example, a methylsulfonyl group, an ethylsulfonyl group, a butylsulfonyl group, a cyclohexylsulfonyl group, a 2-ethylhexylsulfonyl group, a dodecylsulfonyl group and the like); an arylsulfonyl group or a heteroarylsulfonyl group (for example, a phenylsulfonyl group, a naphthylsulfonyl group, a 2-pyridylsulfonyl group and the like); an amino group (for example, an amino group, an ethylamino group, a dimethylamino group, a butylamino group, a cyclopentylamino group, a 2-ethylhexylamino, a dodecylamino group, an anilino group, a naphthylamino group, a 2-pyridylamino group, a piperidyl group (also referred to as a piperidinyl group), a 2,2,6,6-tetramethyl piperidinyl group and the like); a halogen atom (for example, a fluorine atom, a chlorine atom, a bromine atom and the like); a fluorohydrocarbon group (for example, a fluoromethyl group, a trifluoromethyl group, a pentafluoroethyl group, a pentafluorophenyl group and the like); a cyano group; a nitro group; a hydroxyl group; a mercapto group; a silyl group (for example, a trimethylsilyl group, a triisopropylsilyl group, a triphenylsilyl group, a phenyldiethylsilyl group and the like); a phosphate group (for example, dihexylphosphoryl group and the like); a phosphite group (for example, diphenylphosphinyl group and the like); a phosphono group, and the like.

Part of these substituents may be further substituted by the above-mentioned substituent. Further, a plurality of these substituents may be bonded to each other to form a ring.

[Chemical Formula 13]

General Formula (2)

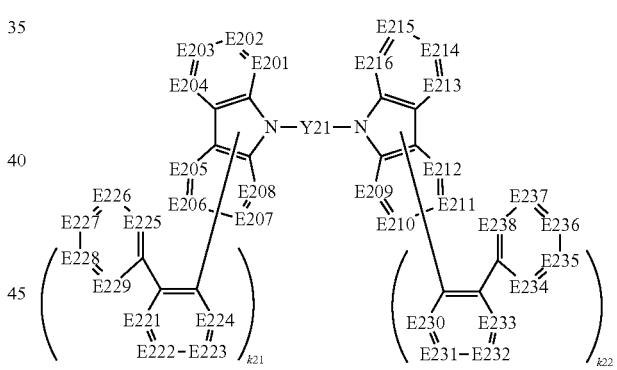

General Formula (2) is also one form of General Formula (1). In General Formula (2), Y21 represents a divalent linking group which is an arylene group, a heteroarylene group or a combination of the arylene group and the heteroarylene group; E201 to E216 and E221 to E238 each represent —C(R21)= or —N=, wherein R21 represents a hydrogen atom or a substituent, and wherein at least one of E221 to E229 and at least one of E230 to E238 each represent —N=; and k21 and k22 each represent an integer of 0 to 4, wherein the sum of k21 and k22 is an integer of 2 or more.

Examples of the arylene group represented by Y21 in General Formula (2) include an o-phenylene group, a p-phenylene group, a naphthalenediyl group, an anthracenediyl group, a naphthacenediyl group, a pyrenediyl group, a naphthylnaphthalenediyl group, a biphenyldiyl group (for example, a [1,1'-biphenyl]-4,4'-diyl group, a 3,3'-biphenyldiyl group, and a 3,6-biphenyldiyl group), a terphenyldiyl group, a quaterphenyldiyl group, a quinquephenyldiyl group, a sexiphenyldiyl group, a septiphenyldiyl group, an octiphenyldiyl group, a nobiphenyldiyl group and a deciphenyldiyl group and the like.

Examples of the heteroarylene group represented by Y21 in General Formula (2) include a divalent group derived from the group consisting of a carbazole ring, a carboline ring, a diazacarbazole ring (also referred to as a monoazacarboline ring, indicating a ring structure formed in such a manner that one of the carbon atoms constituting the carboline ring is replaced with a nitrogen atom), a triazole ring, a pyrrole ring, a pyridine ring, a pyrazine ring, a quinoxaline ring, a thiophene ring, an oxadiazole ring, a dibenzofuran ring, a dibenzothiophene ring and an indole ring.

It is preferred that the divalent linking group (which is an arylene group, a heteroarylene group or a combination thereof represented by Y21) contains, among the heteroarylene groups, a group derived from a condensed aromatic heterocycle formed by condensing three or more rings, and further, it is preferred that the group derived from the condensed aromatic heterocycle formed by condensing three or more rings is a group derived from a dibenzofuran ring or a group derived from a dibenzothiophene ring.

In General Formula (2), in the case where R21 of —C(R21)═ represented by each of E201 to E216 and E221 to E238 is a substituent, the examples of the substituent of R11, R12 of General Formula (1) may be applied equally as examples of the substituent of R21.

In General Formula (2), it is preferable that six or more of E201 to E208 and six or more of E206 to E216 are each represented by —C(R21)═.

It is preferable that, in General Formula (2), at least one of E225 to E229 and at least one of E234 to E238 each represent —N═.

It is further preferable that, in General Formula (2), any one of E225 to E229 and any one of E234 to E238 each represent —N═.

Further, it is preferable that, in General Formula (2), E221 to E224 and E230 to E233 are each represented by —C(R21)═.

Further, it is preferred that, in the compound represented by General Formula (2), E203 is represented by —C(R21)═, wherein R21 represents a liking site; and it is further preferred that E211 is also represented by —C(R21)═, wherein R21 represents a liking site.

Furthermore, it is preferred that E225 and E234 are each represented by —N═, and E221 to E224 and E230 to E233 are each represented by —C(R21)═.

[Chemical Formula 14]

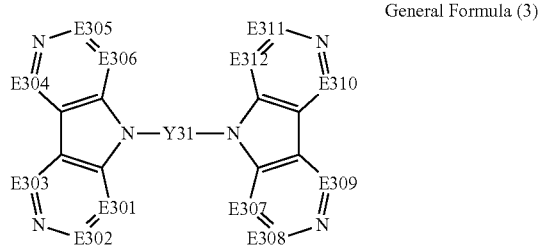

General Formula (3)

General Formula (3) is also one form of General Formula (1). In General Formula (3), E301 to E312 each represent —C(R31)═, wherein R31 represents a hydrogen atom or a substituent; and Y31 represents a divalent linking group which is an arylene group, a heteroarylene group or a combination of the arylene group and the heteroarylene group.

In General Formula (3), in the case where R31 of —C(R31)═ represented by each of E301 to E312 is a substituent, the examples of the substituent of R11, R12 of General Formula (1) may be applied equally as examples of the substituent of R31.

Further, in General Formula (3), preferable examples of the divalent linking group (which is an arylene group, a heteroarylene group or a combination of the both) represented by Y31 include the same ones exemplified as Y21 of General Formula (2).

[Chemical Formula 15]

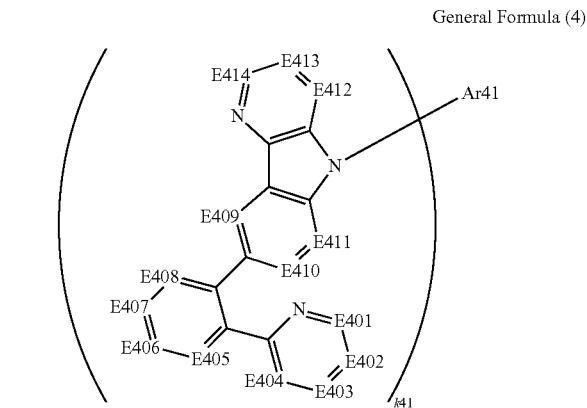

General Formula (4)

General Formula (4) is also one form of General Formula (1). In General Formula (4), E401 to E414 each represent —C(R41)═, wherein R41 represents a hydrogen atom or a substituent; Ar41 represents a substituted or unsubstituted aromatic hydrocarbon ring or aromatic heterocycle; and k41 represents an integer of 3 or more.

In General Formula (4), in the case where R41 of —C(R41)═ represented by each of E401 to E414 is a substituent, the examples of the substituent of R11, R12 of General Formula (1) may be applied equally as examples of the substituent of R41.

Further, in General Formula (4), in the case where Ar41 represents an aromatic hydrocarbon ring, examples of the aromatic hydrocarbon ring include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring and an anthranthrene ring. Each of these rings may further have a substituent exemplified as R11, R12 of General Formula (1).

Further, in General Formula (4), in the case where Ar41 represents an aromatic heterocycle, examples of the aromatic heterocycle include a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, a benzimidazole ring, a benzothiazole ring, a benzoxazole ring, a quinoxaline ring, a quinazoline ring, a phthalazine ring, a carbazole ring and an azacarbazole ring. Incidentally, the azacarbazole ring indicates a ring formed by substituting at least one of carbon atoms of a benzene ring constituting a carbazole ring with a nitrogen atom. Each of these rings may further have a substituent exemplified as R11, R12 of General Formula (1).

[Chemical Formula 16]

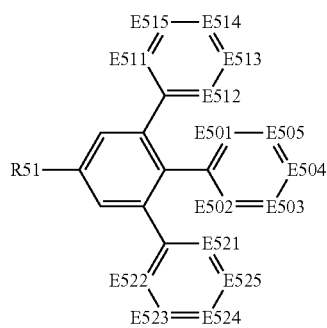

General Formula (5)

In General Formula (5), R51 represents a substituent, E501, E502, E511 to E515, and E521 to E525 each represent —C(R52)= or —N=, and E503 to E505 each represent —C(R52), wherein R52 represents a hydrogen atom (H) or a substituent, and wherein at least one of E501 and E502 represents —N= (nitrogen atom), at least one of E511 to E515 represents —N= (nitrogen atom), and at least one of E521 to E525 represents —N= (nitrogen atom).

In General Formula (5), in the case where R51, R52 each represent a substituent, the examples of the substituent of R11, R12 of General Formula (1) may be applied equally as examples of the substituent of R51, R52.

[Chemical Formula 17]

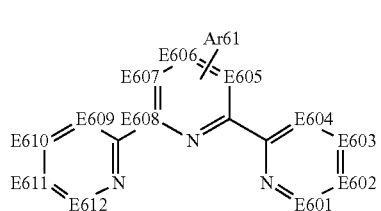

General Formula (6)

In General Formula (6), E601 to E612 each represent —C(R61)= or —N=, wherein R61 represents a hydrogen atom or a substituent; and Ar61 represents a substituted or unsubstituted aromatic hydrocarbon ring or aromatic heterocycle.

In General Formula (6), in the case where R61 of —C(R61)= represented by each of E601 to E612 is a substituent, the examples of the substituent of R11, R12 of General Formula (1) may be applied equally as examples of the substituent of R61.

Further, in General Formula (6), examples of the substituted or unsubstituted aromatic hydrocarbon ring or aromatic heterocycle represented by Ar61 include the same ones exemplified as Ar41 of General Formula (4).

[Compound-3]

In addition to the compounds represented by General Formulas (1) to (6), concrete examples of the compound constituting the nitrogen-containing layer 1a also include Compounds 1 to 118 described below. These compounds are each a material showing electron transport performance or electron injection performance. Thus, the transparent electrode 1 in which the nitrogen-containing layer 1a is formed by using such a compound can be favorably used as a transparent electrode of an organic electroluminescence element, so that the nitrogen-containing layer 1a can be used as an electron transporting layer or electron injecting layer the organic electroluminescence element. Incidentally, Compounds 1 to 118 also include the compounds that fall in the range of the aforesaid effective unshared electron pair content [n/M], and therefore such compounds may be used alone as the compound constituting the nitrogen-containing layer 1a. Further, Compounds 1 to 118 also include the compounds represented by General Formulas (1) to (6).

[Chemical Formula 18]

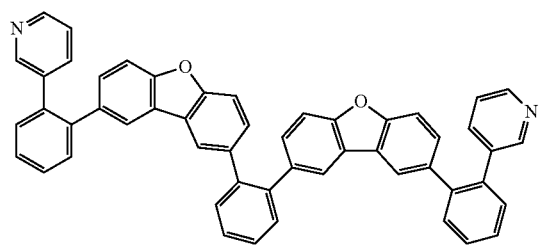

1

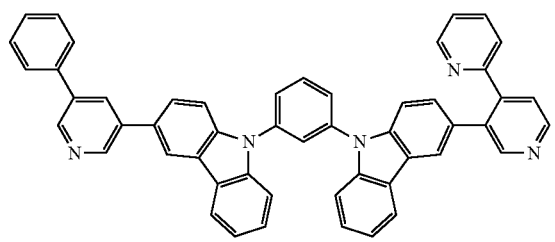

2

-continued
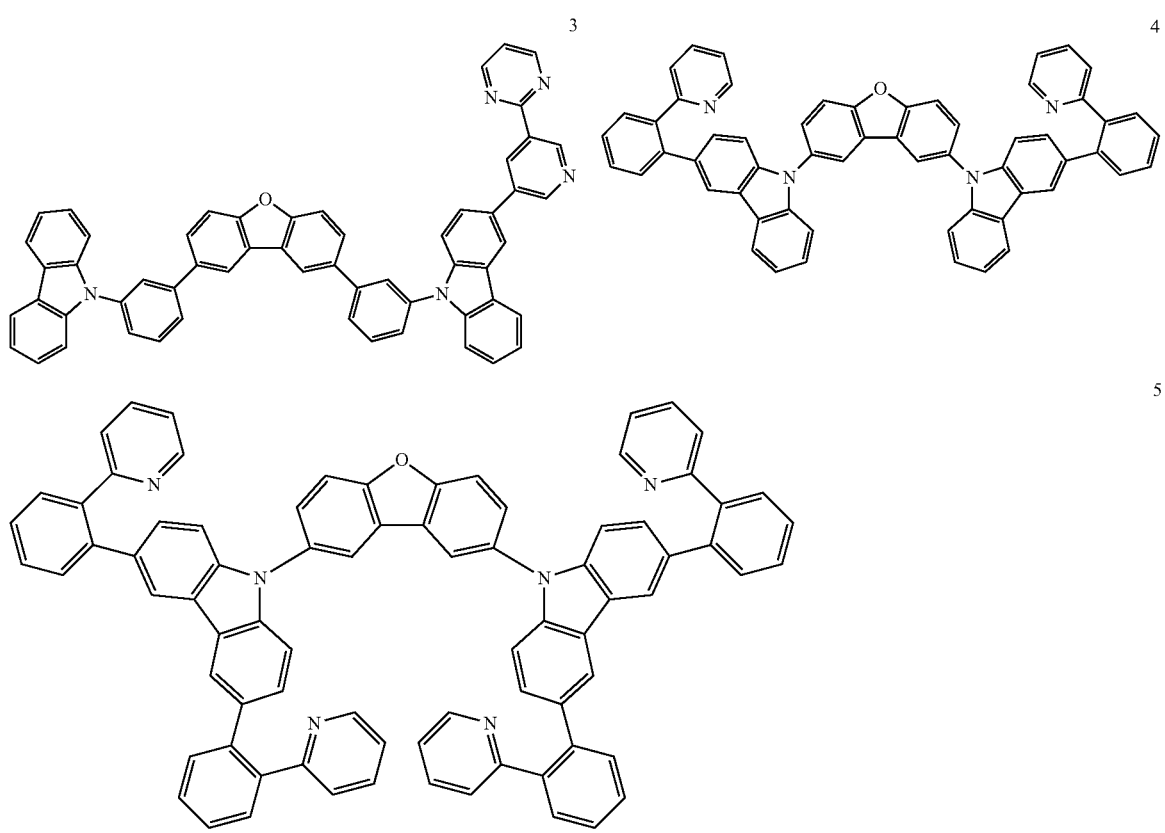
[Chemical Formula 19]
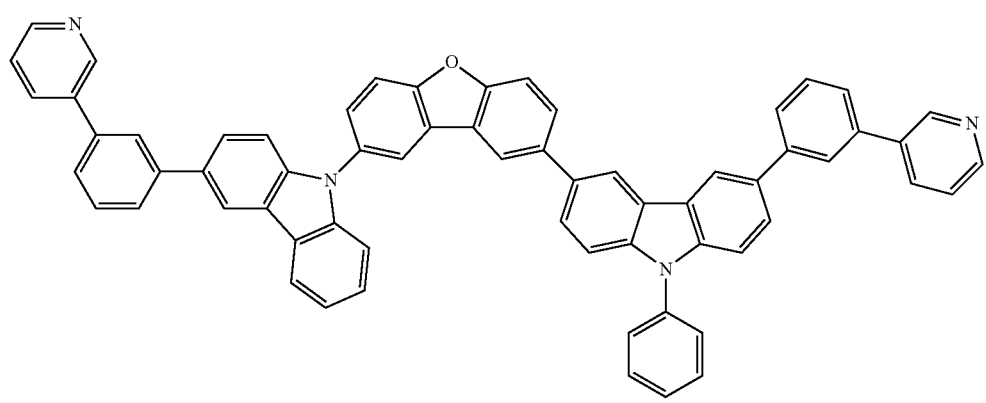
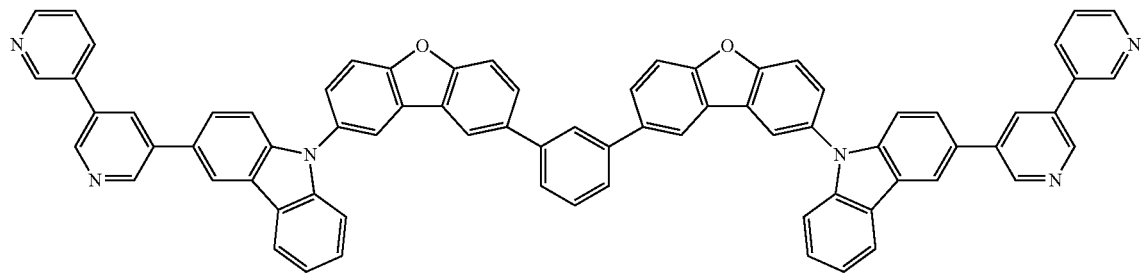

-continued
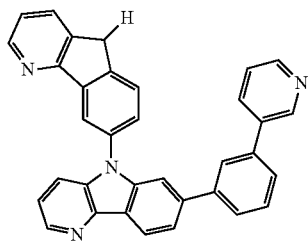
8
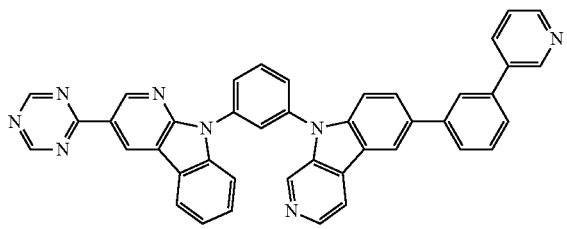
9
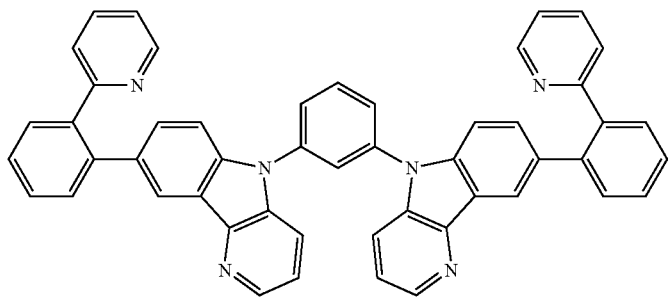
10
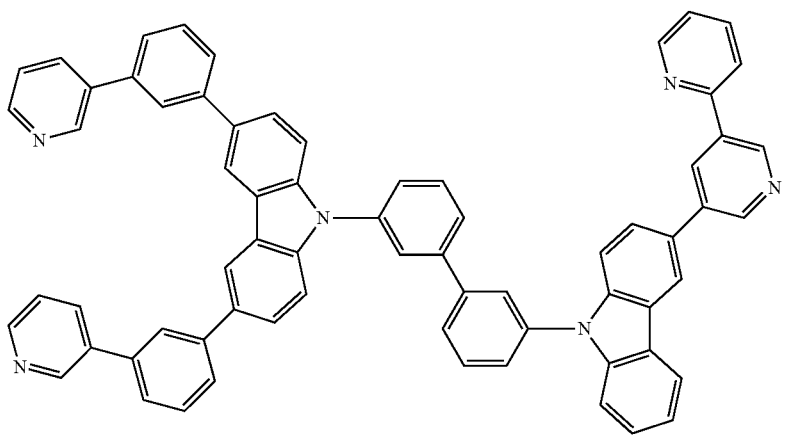
11
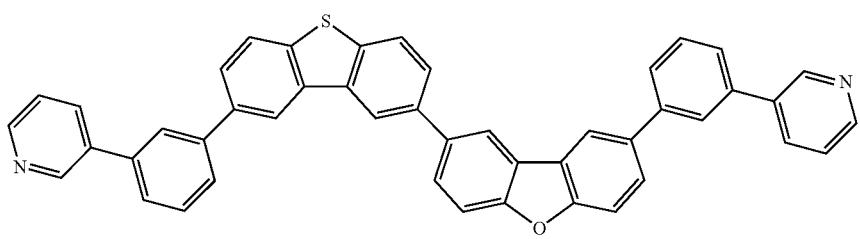
12
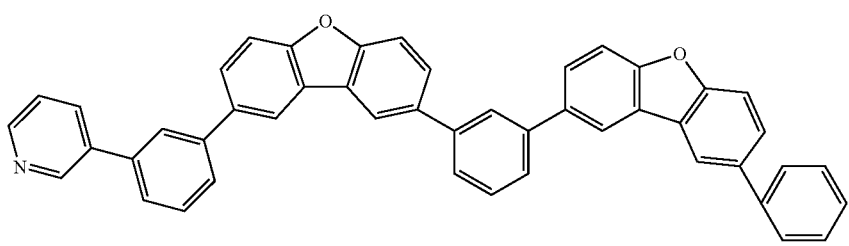
13

-continued
14
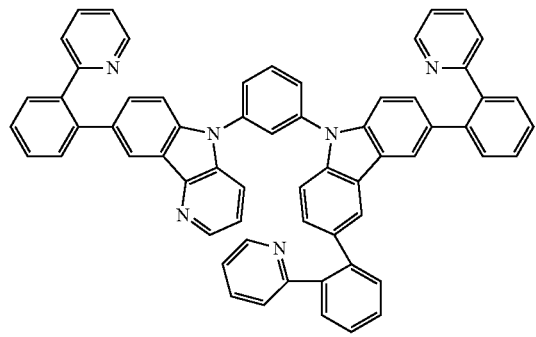
15
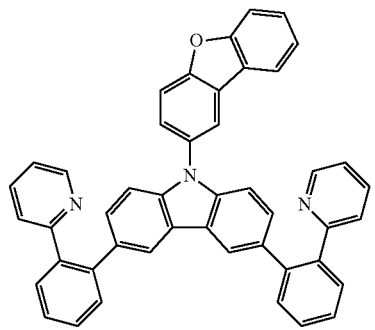
[Chemical Formula 21]
16
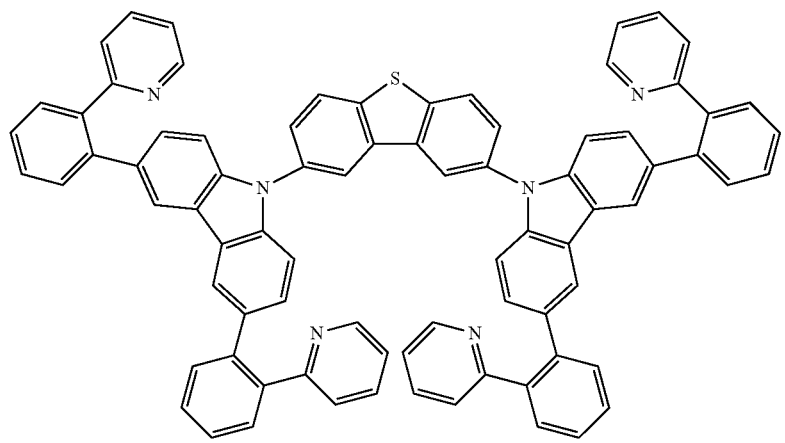
17
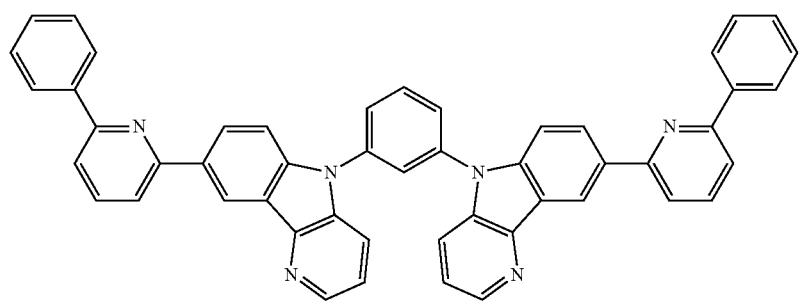

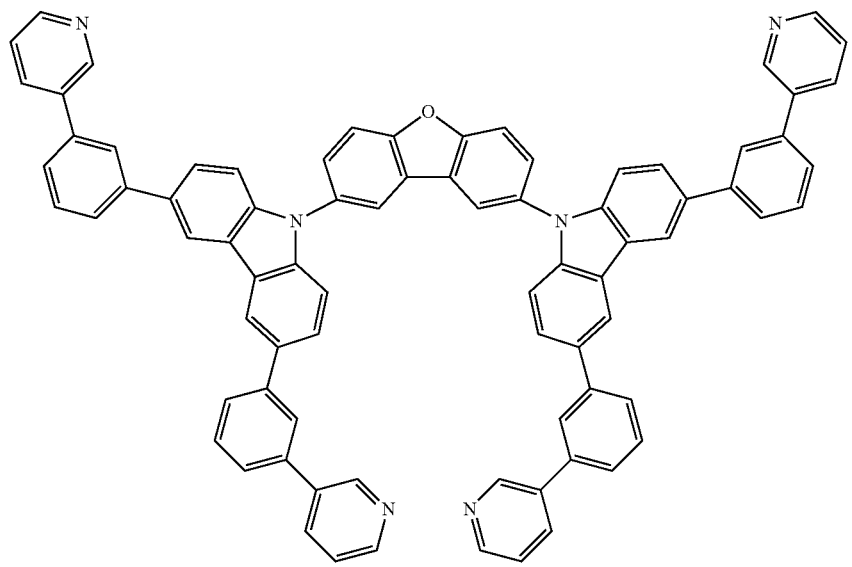
18
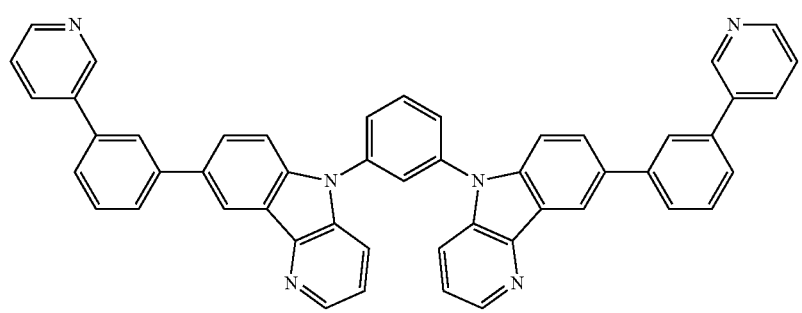
19
[Chemical Formula 22]
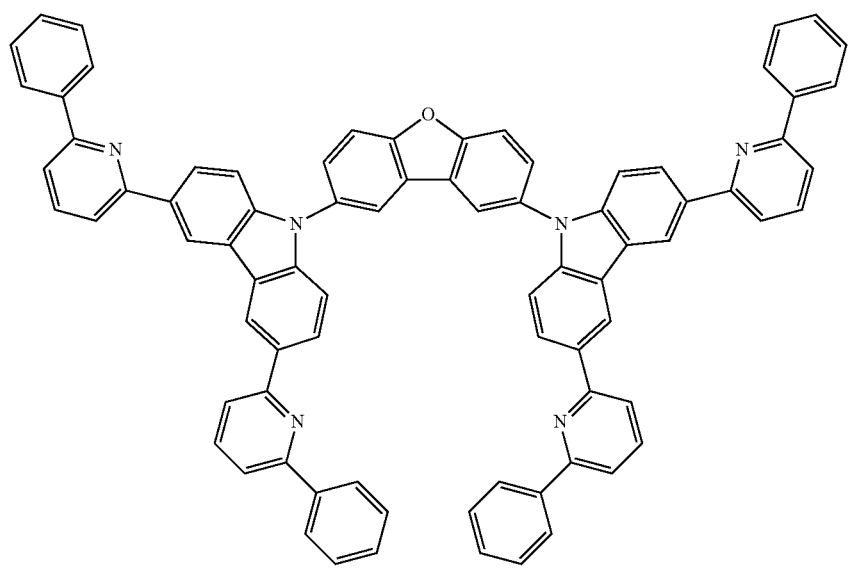
20

-continued
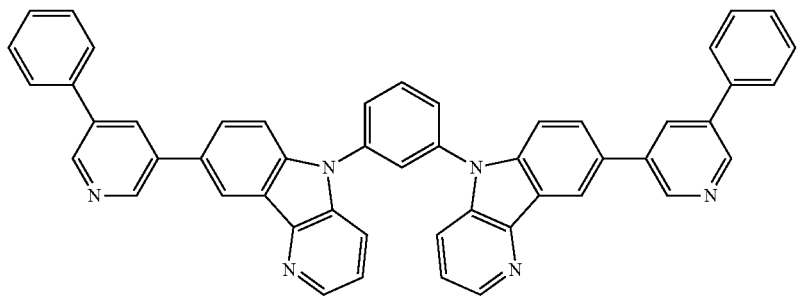
21
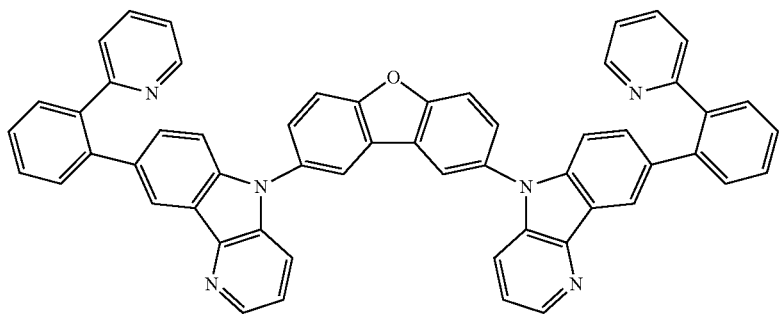
22
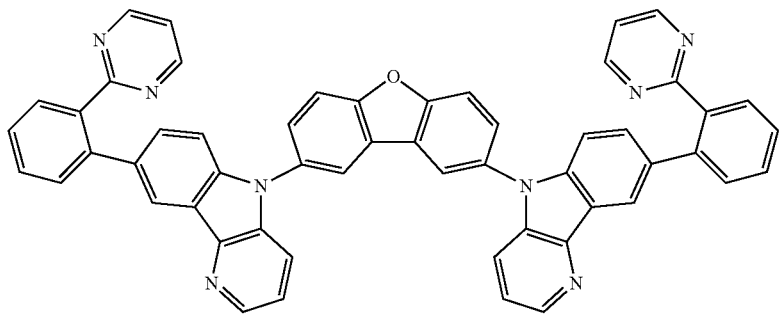
23
[Chemical Formula 23]
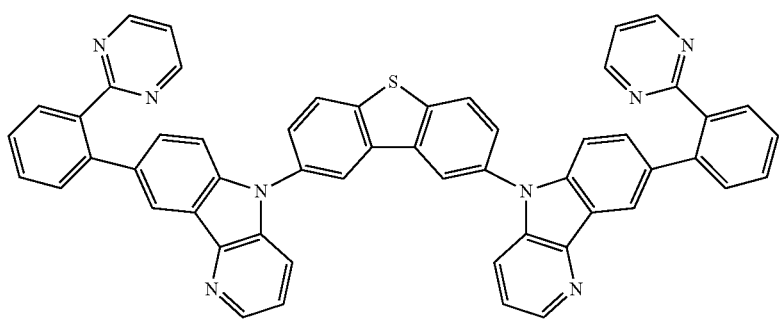
24
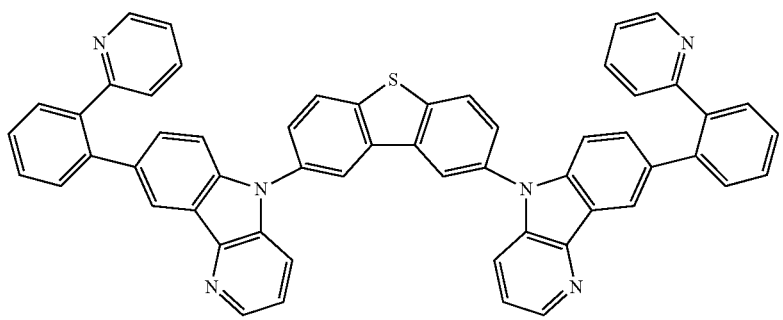
25

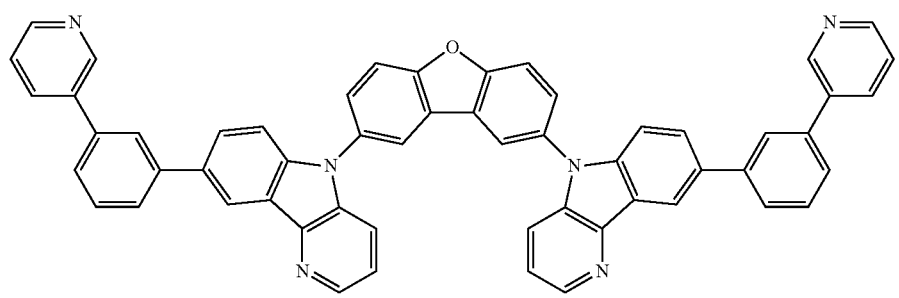
26
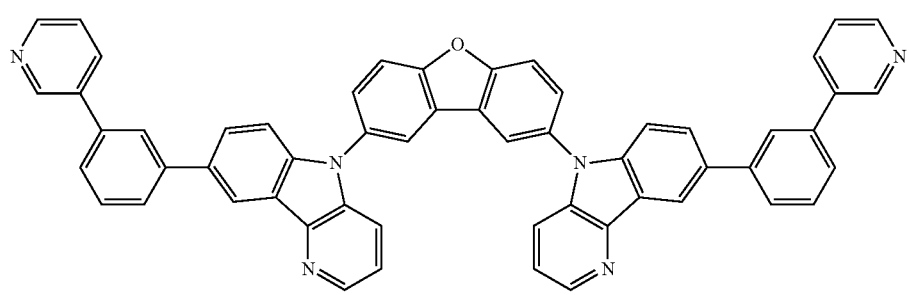
27
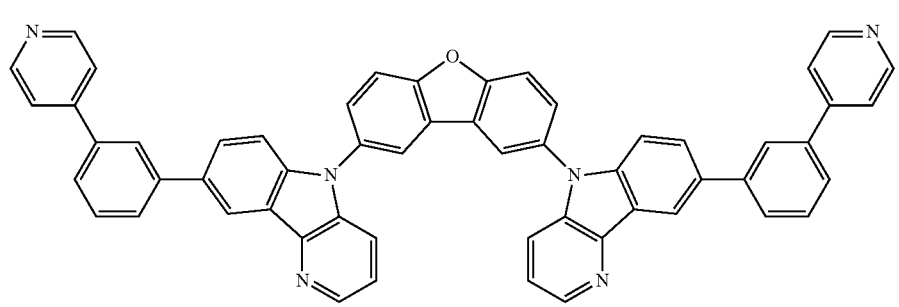
28
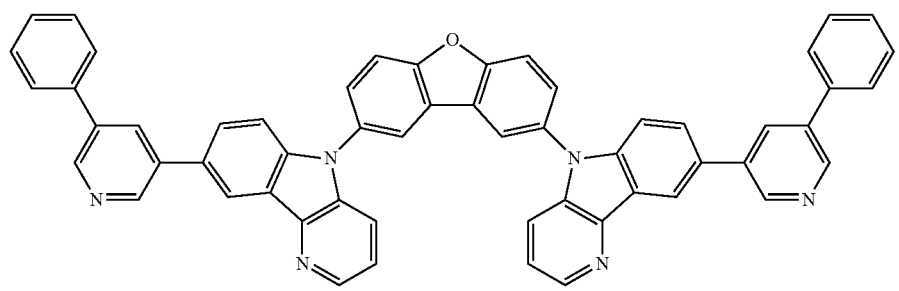
29
[Chemical Formula 24]
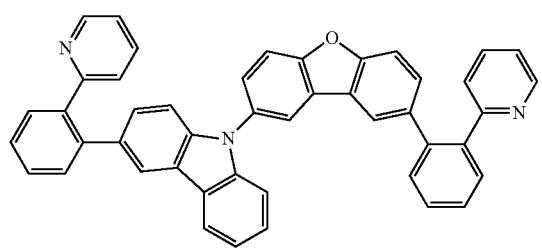
30
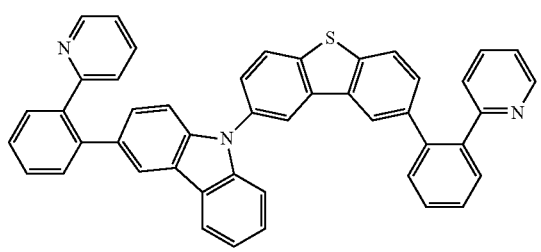
31

-continued
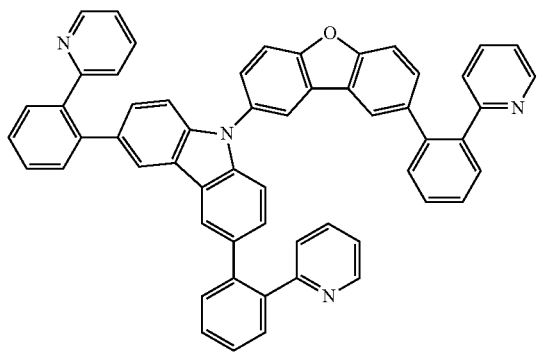
32
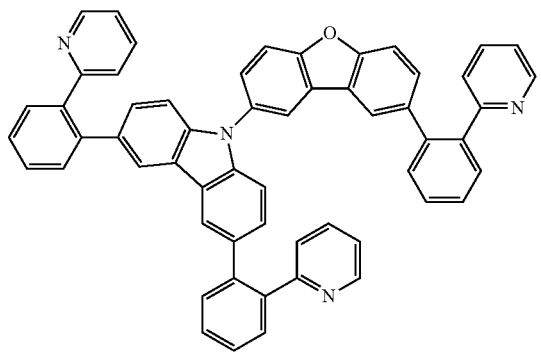
33
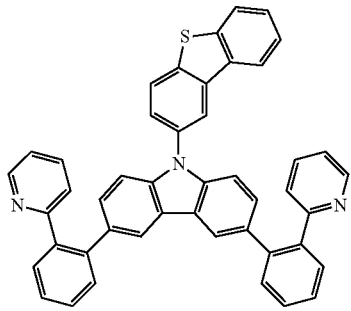
34
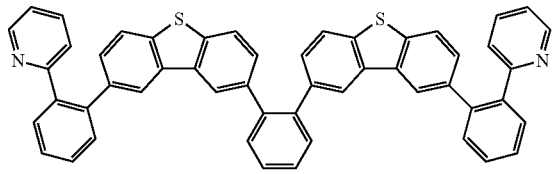
35
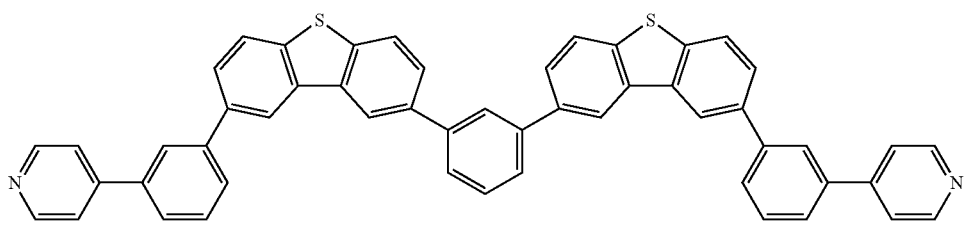
36
[Chemical Formula 25]
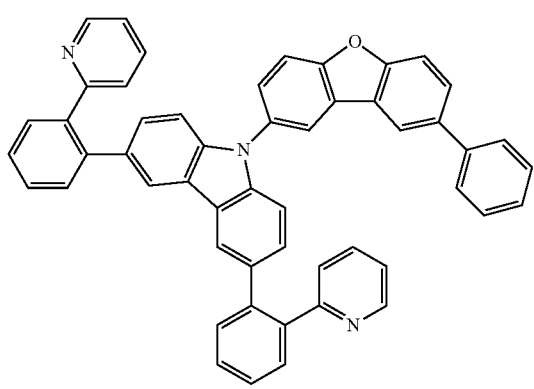
37
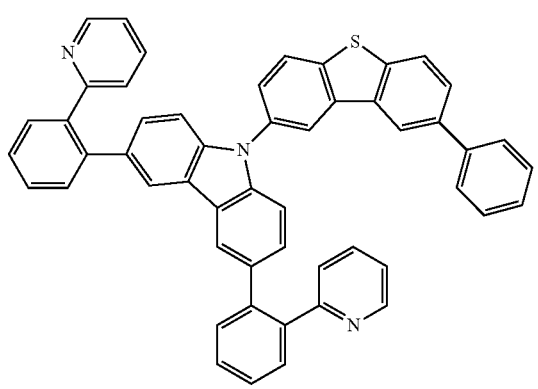
38

-continued
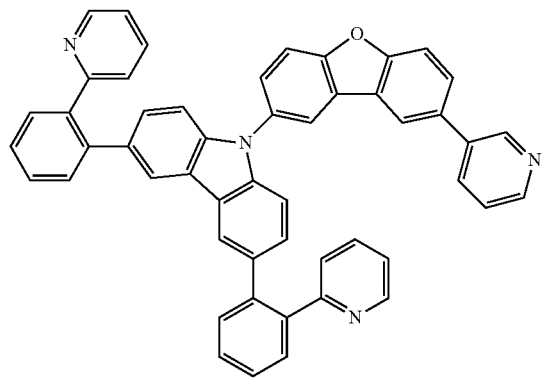
39
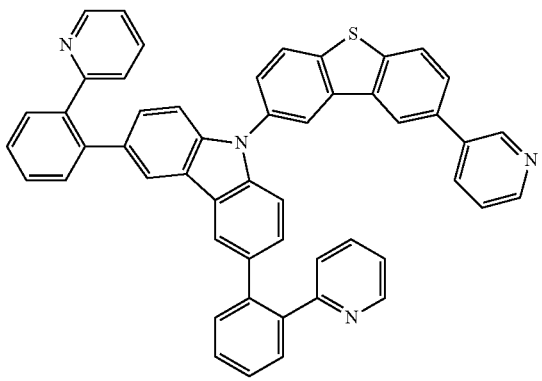
40
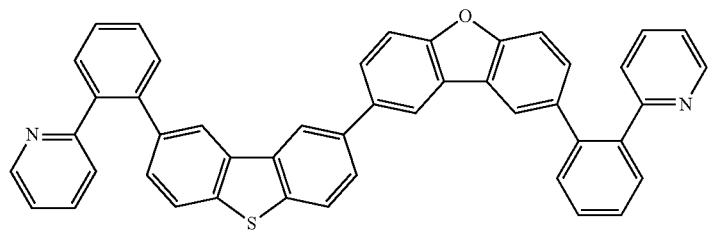
41
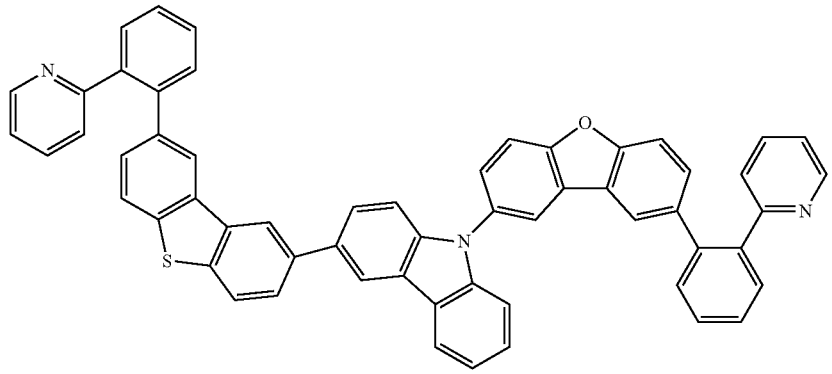
42
[Chemical Formula 26]
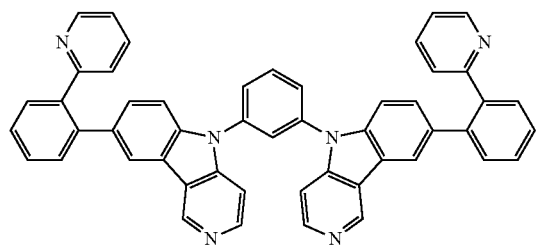
43
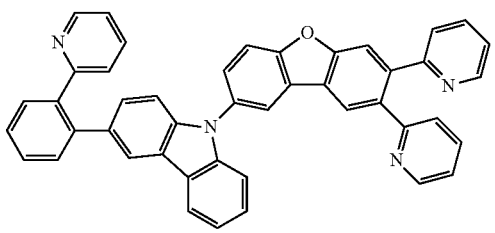
44

-continued
45
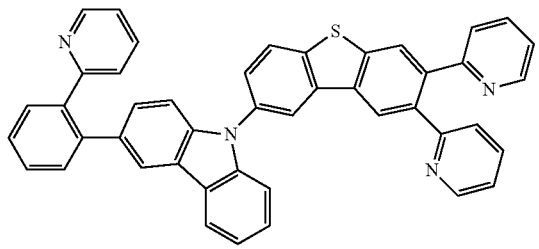
46
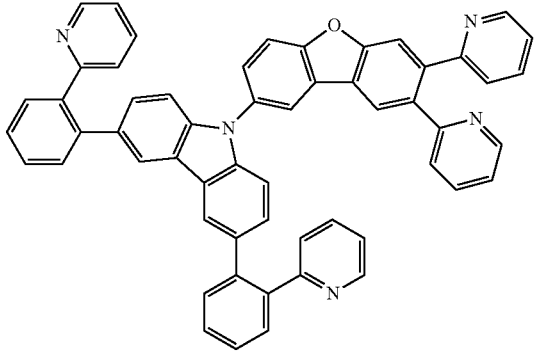
47
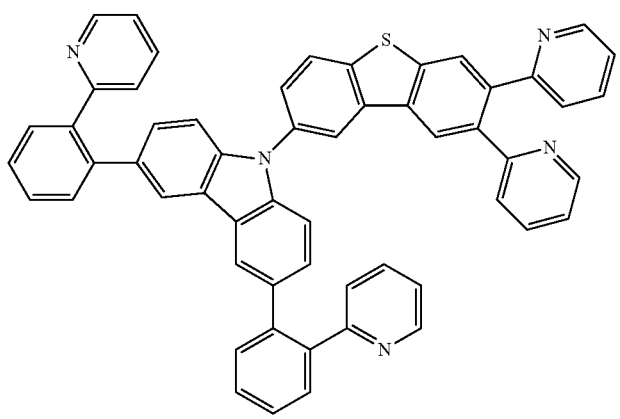
[Chemical Formula 27]
48
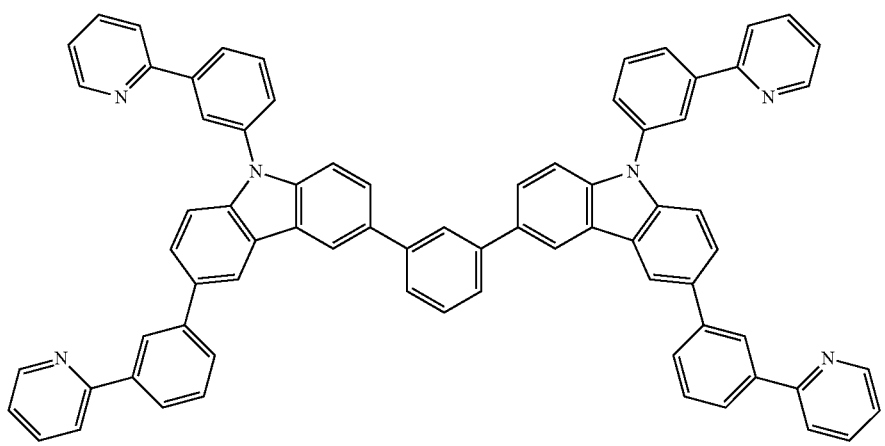
49
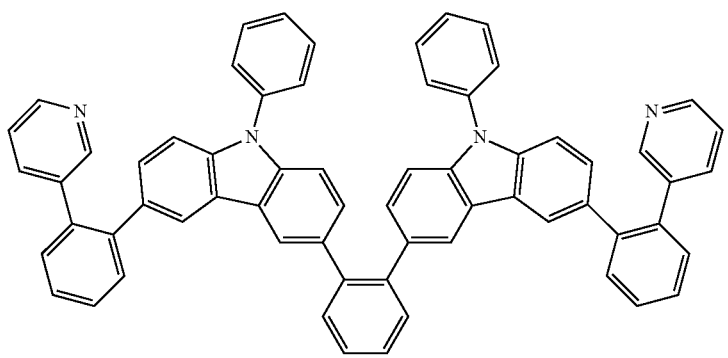

-continued
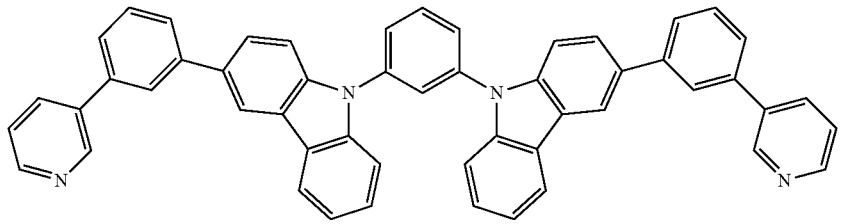
50
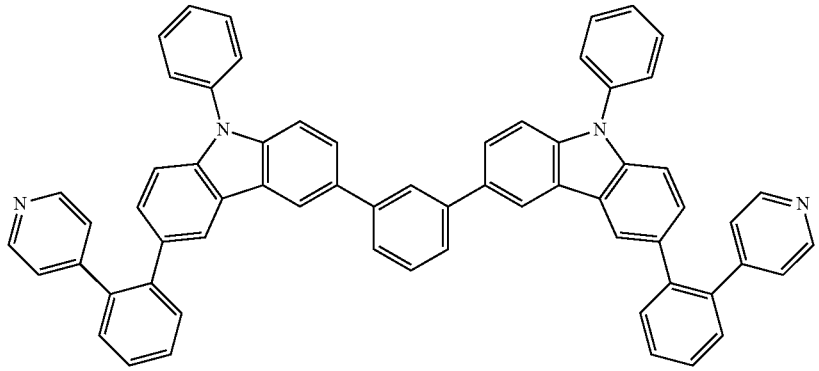
51
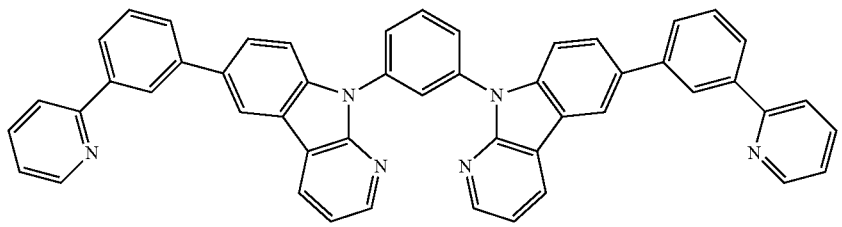
52
[Chemical Formula 28]
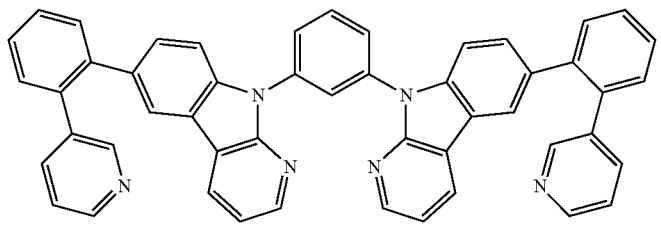
53
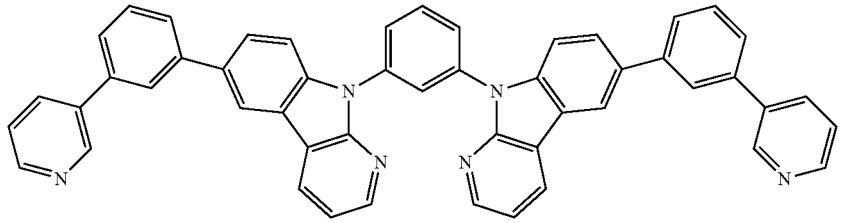
54
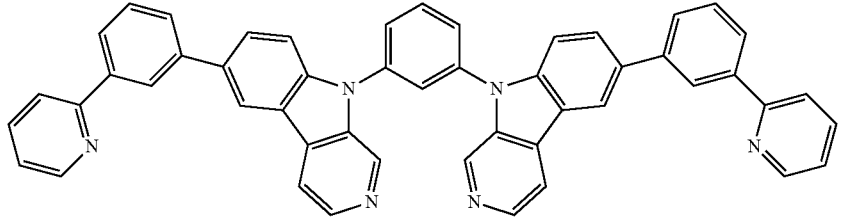
55

-continued
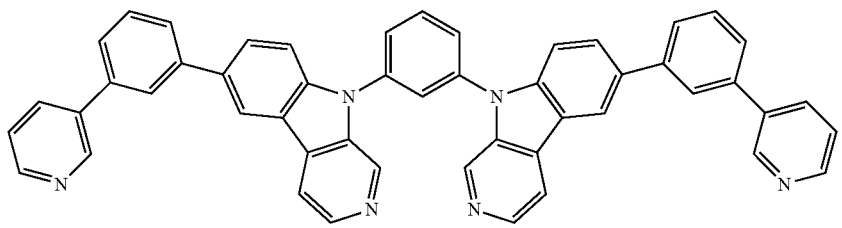
56
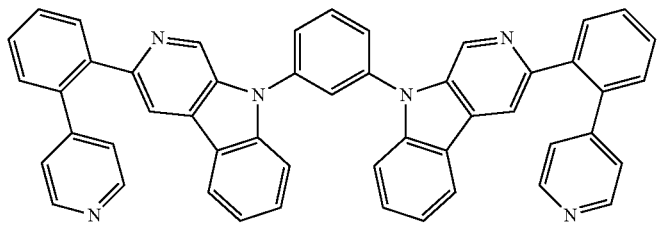
57
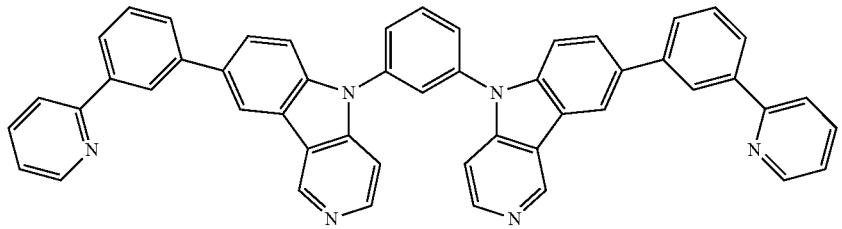
58
[Chemical Formula 29]
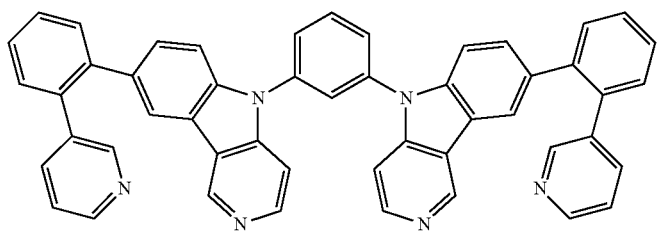
59
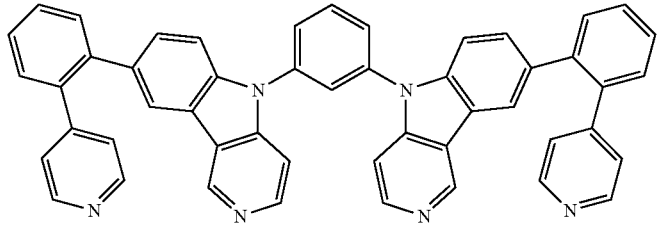
60
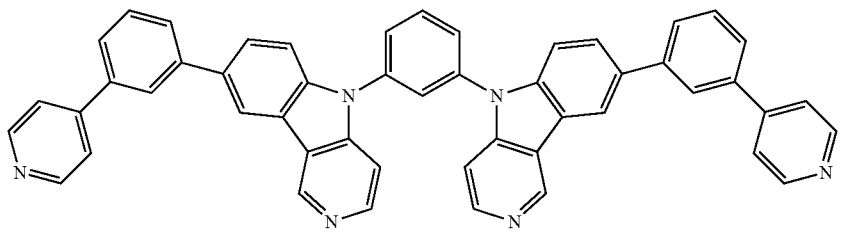
61

62
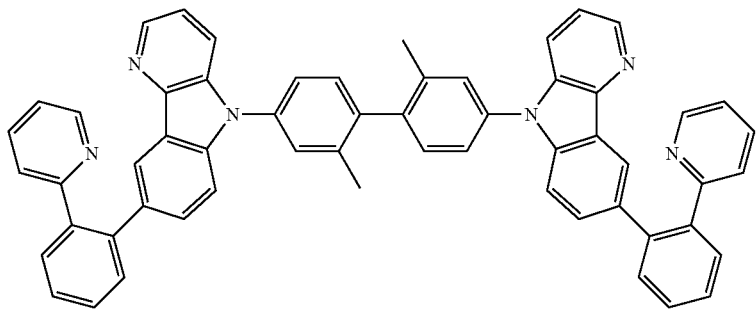
63
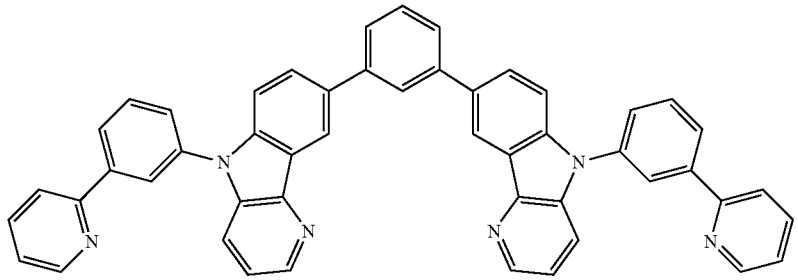
64
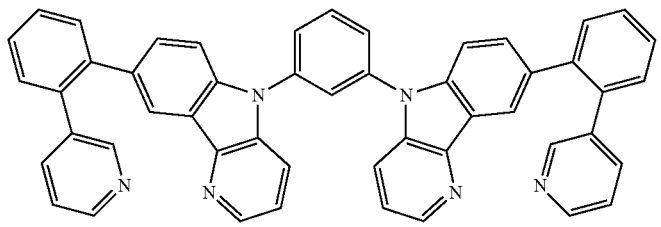
[Chemical Formula 30]
65
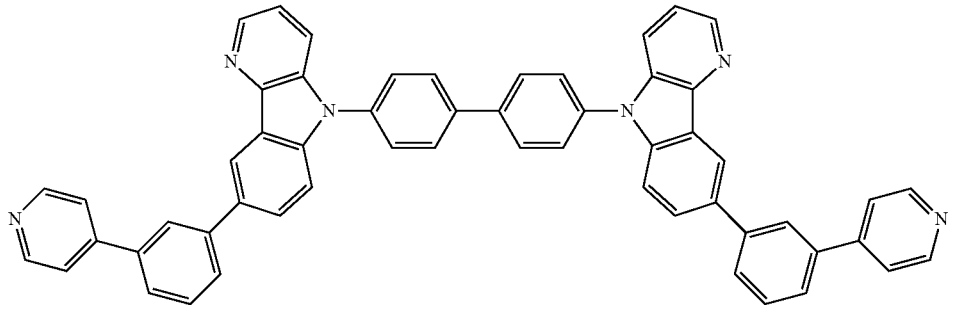
66
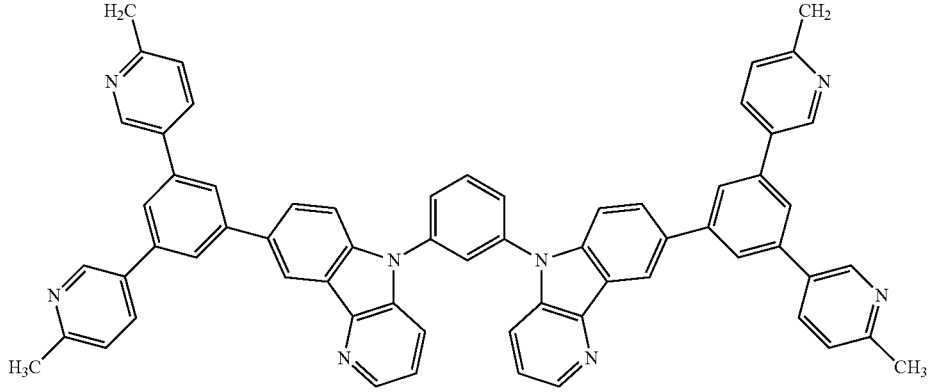

67
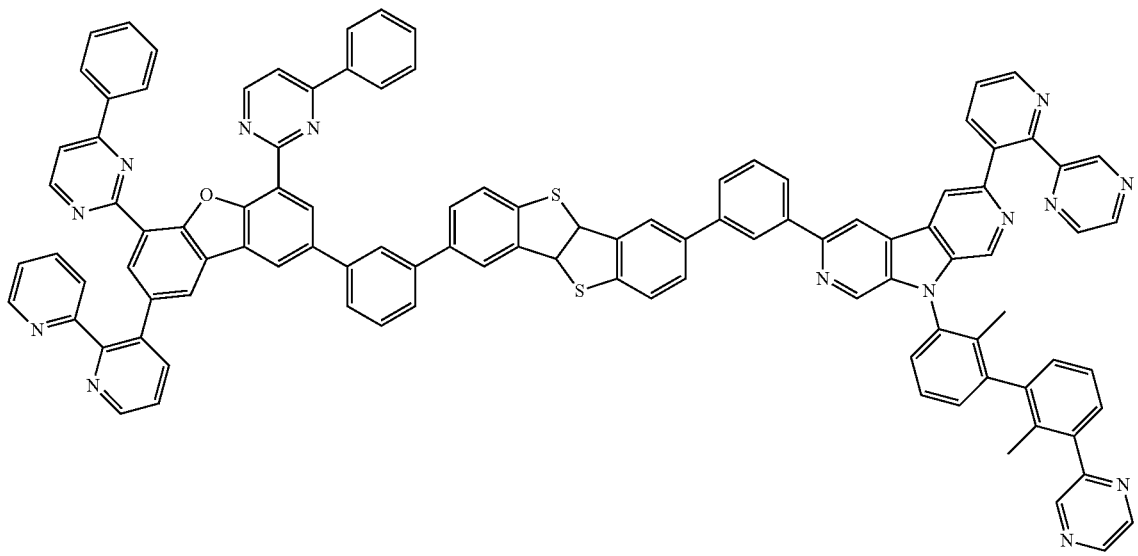
[Chemical Formula 31]
68
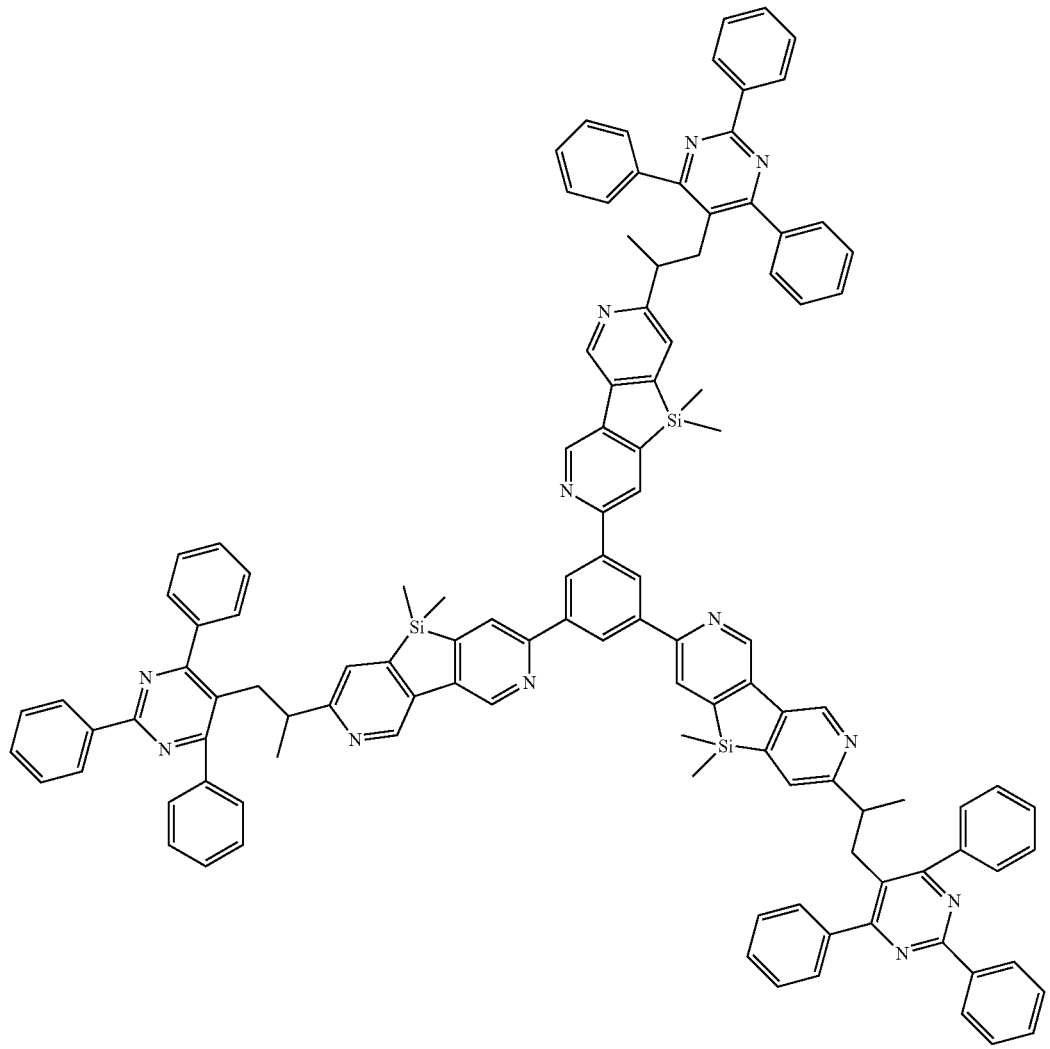

-continued
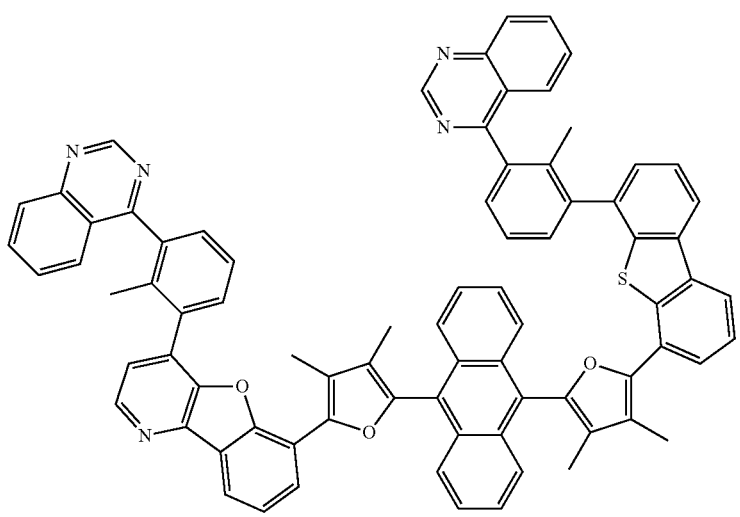
[Chemical Formula 32]
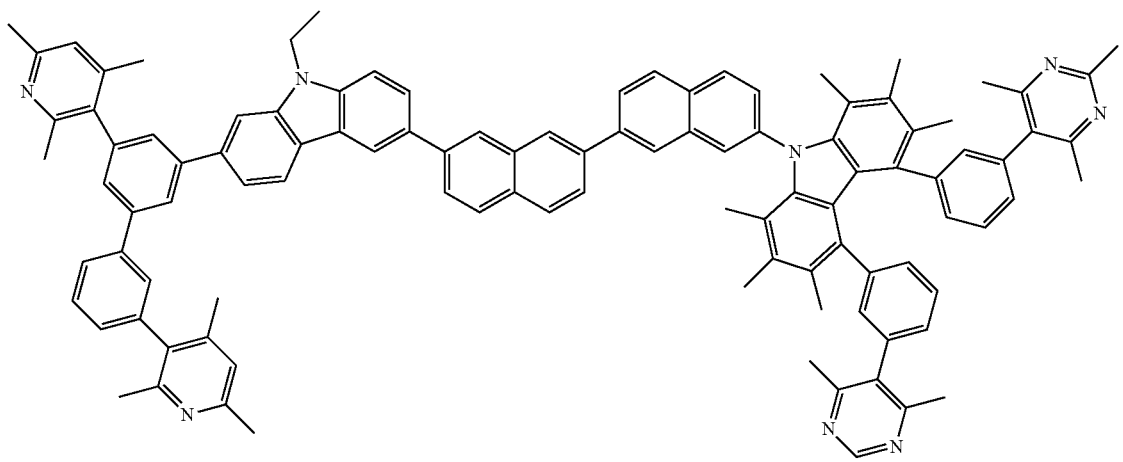
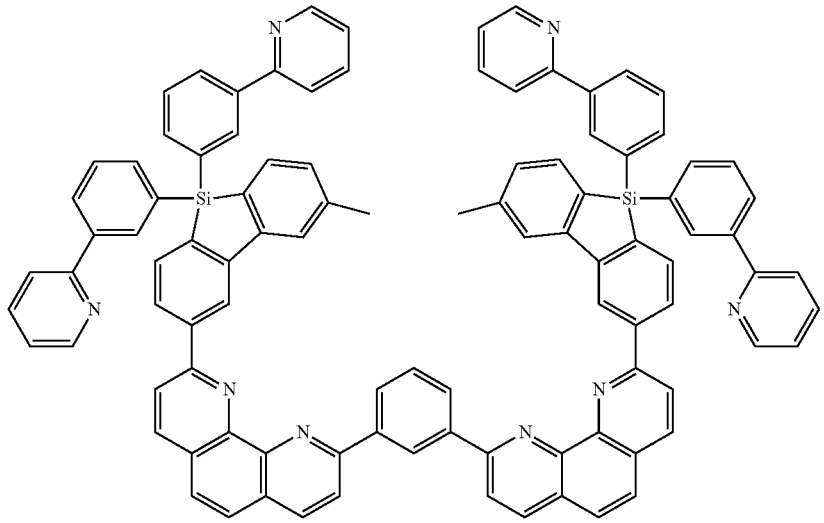

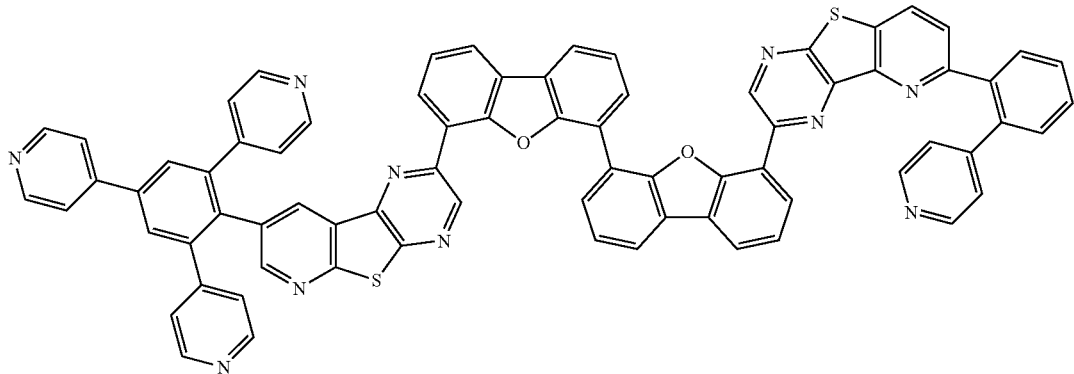
72
[Chemical Formula 33]
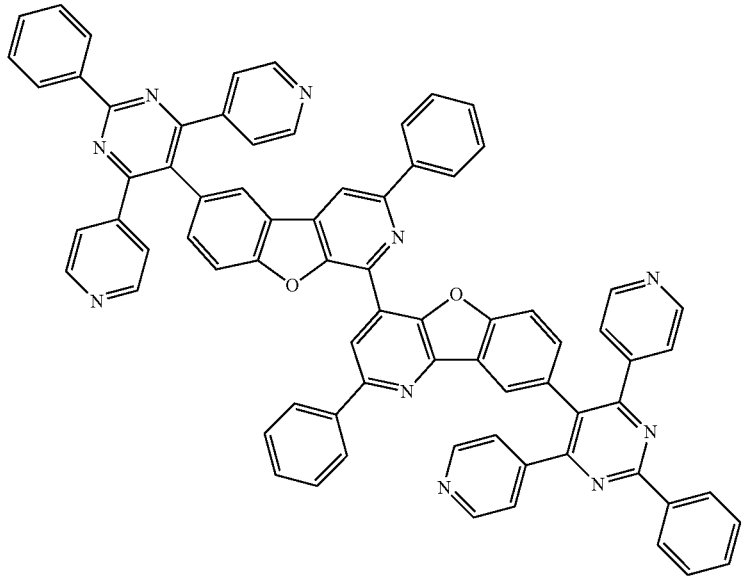
73
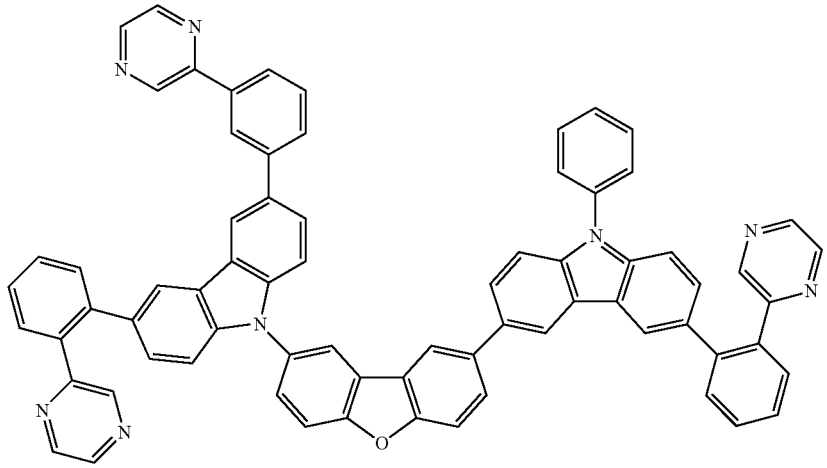
74

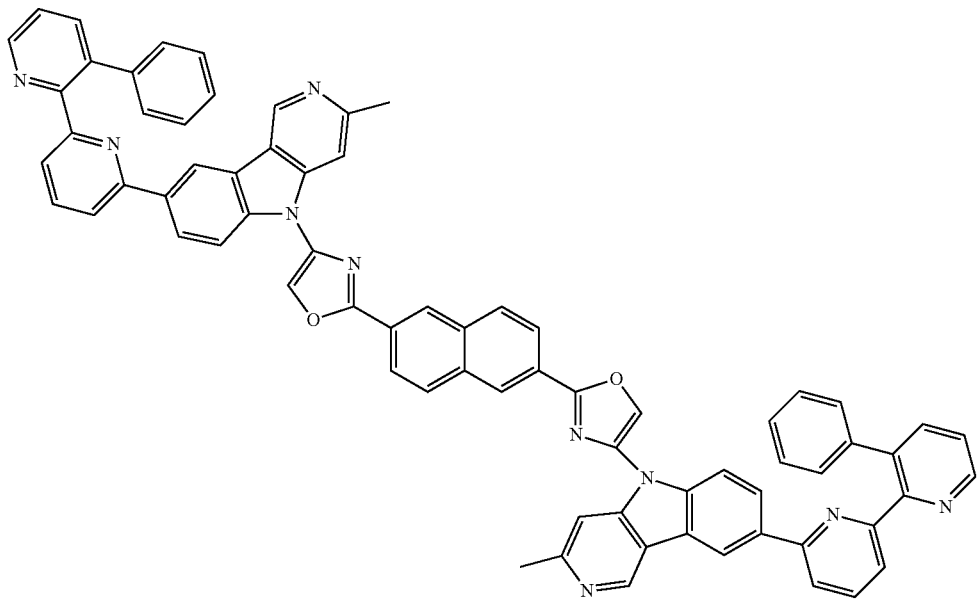
75
[Chemical Formula 34]
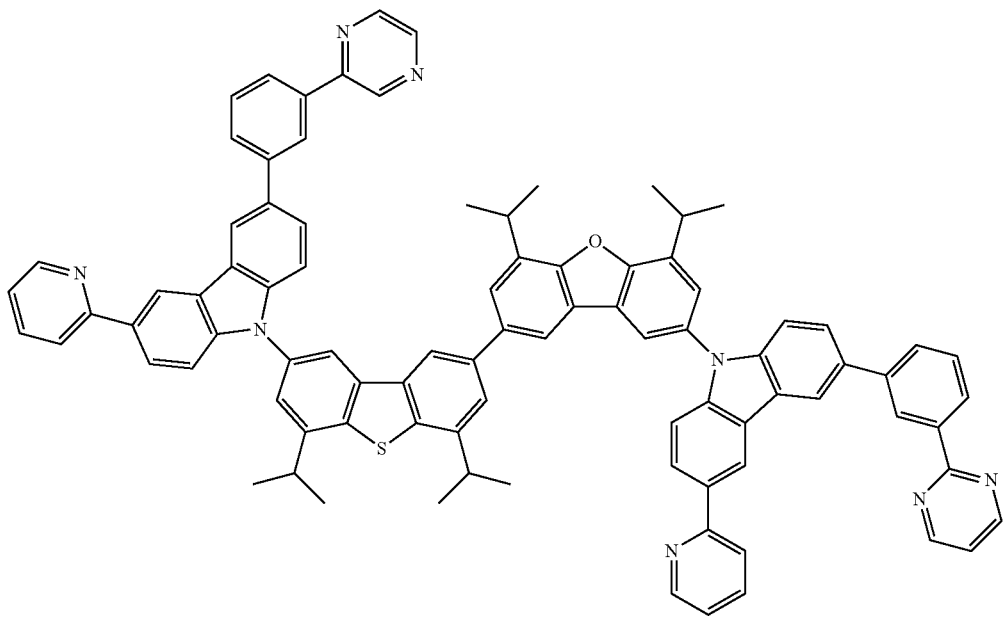
76
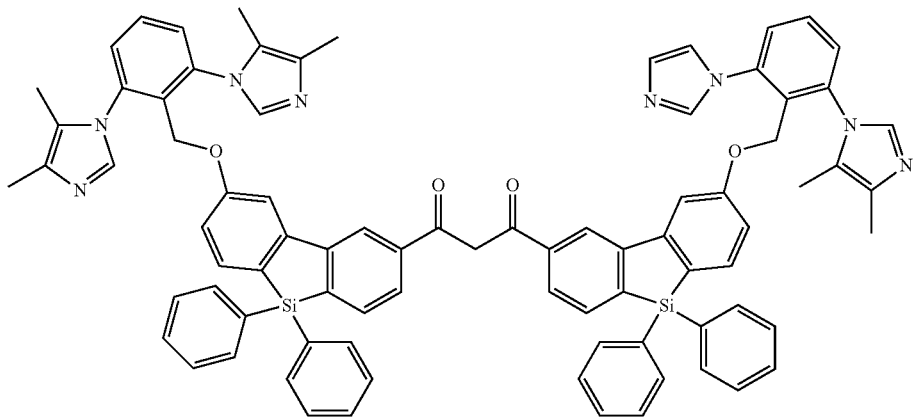
77

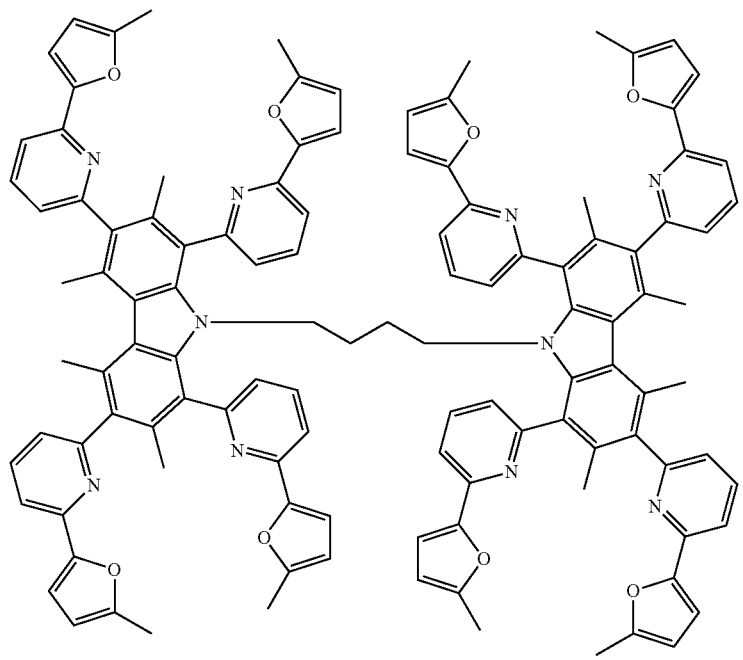
78
[Chemical Formula 35]
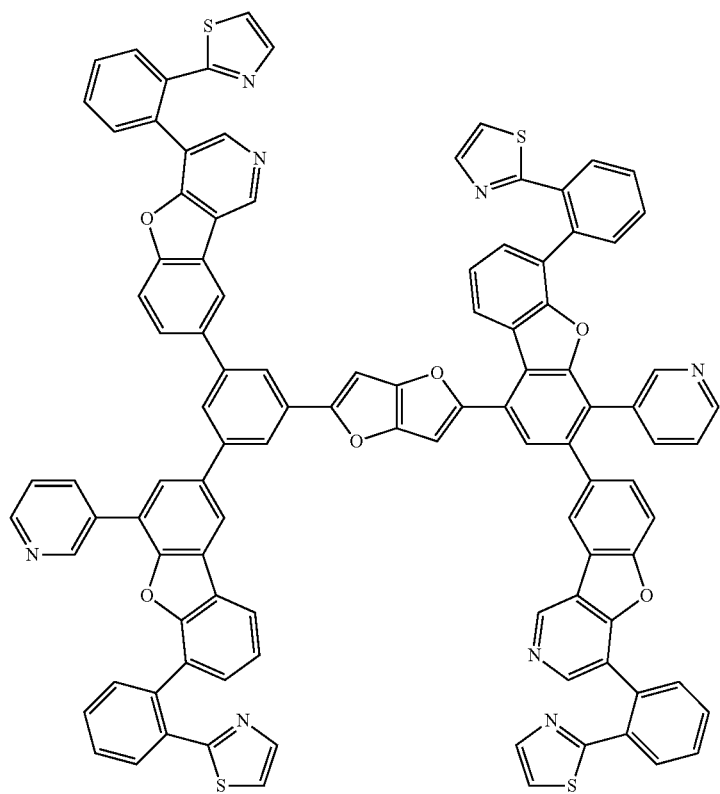
79

-continued
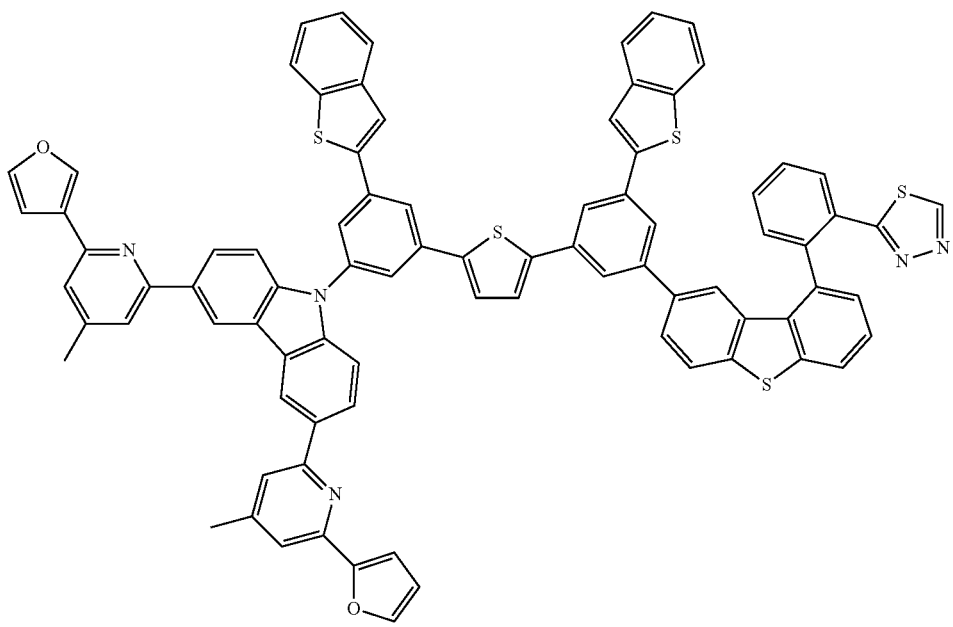
80
[Chemical Formula 36]
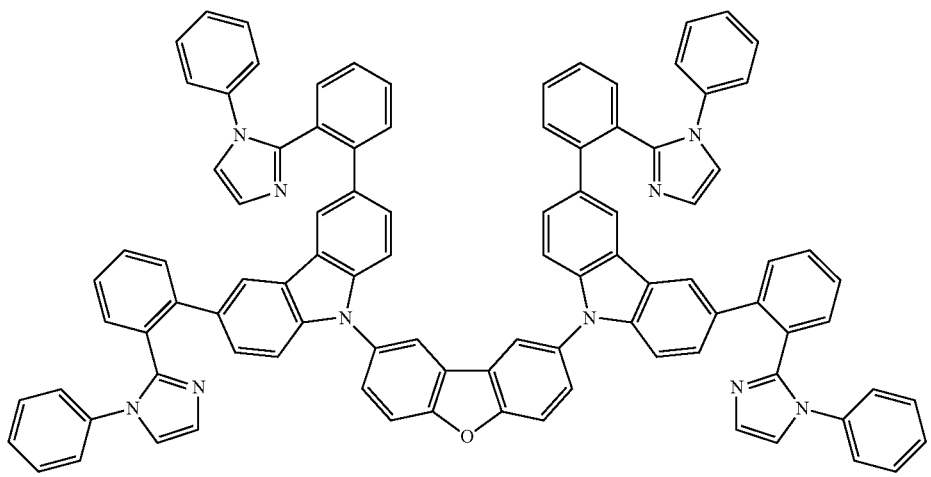
81
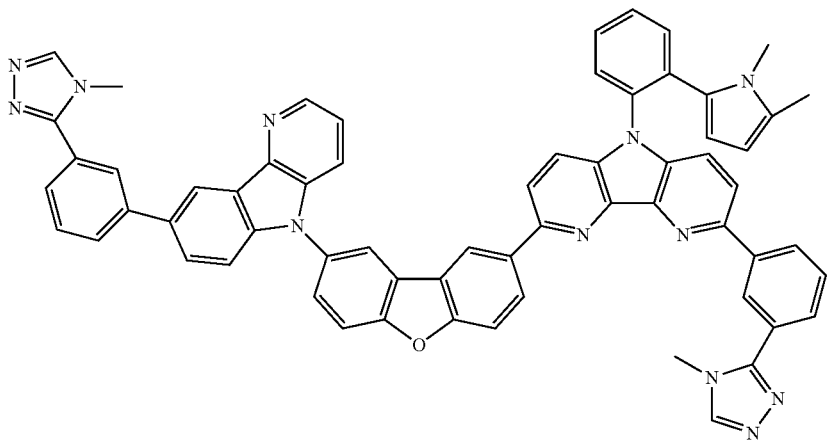
82

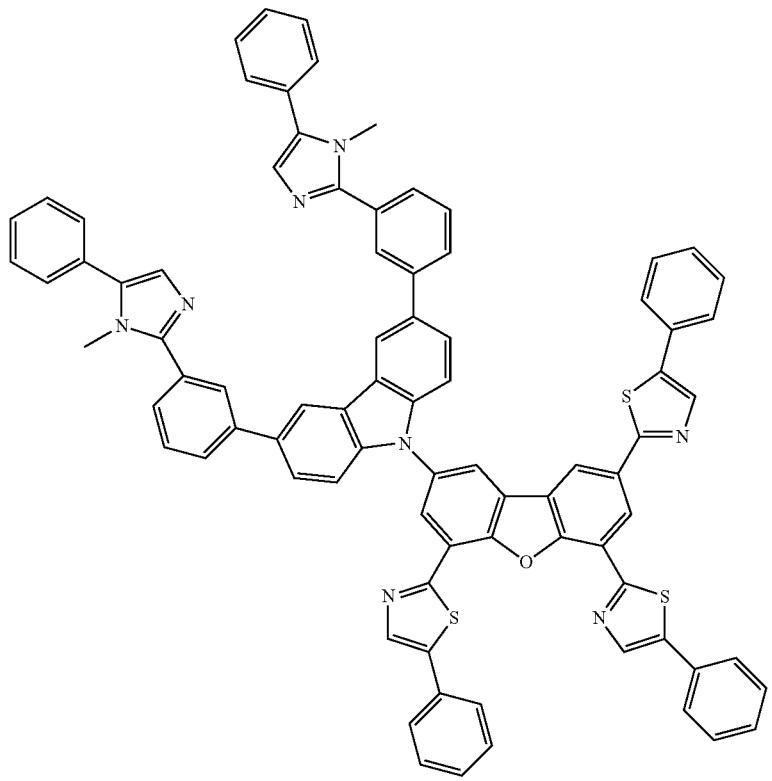
83
[Chemical Formula 37]
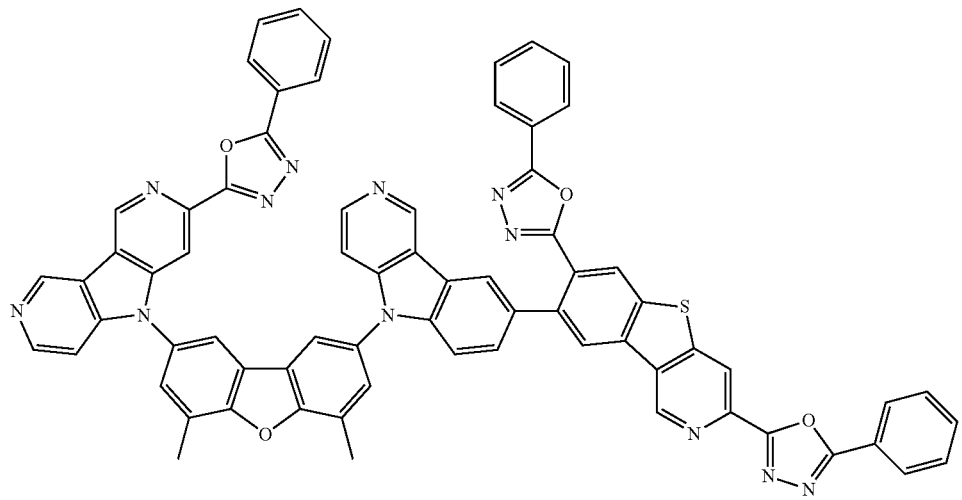
84

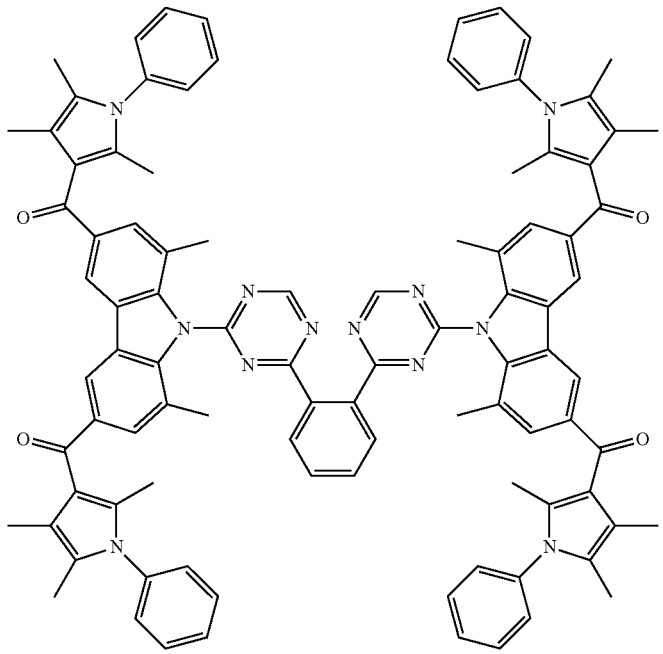
85
[Chemical Formula 38]
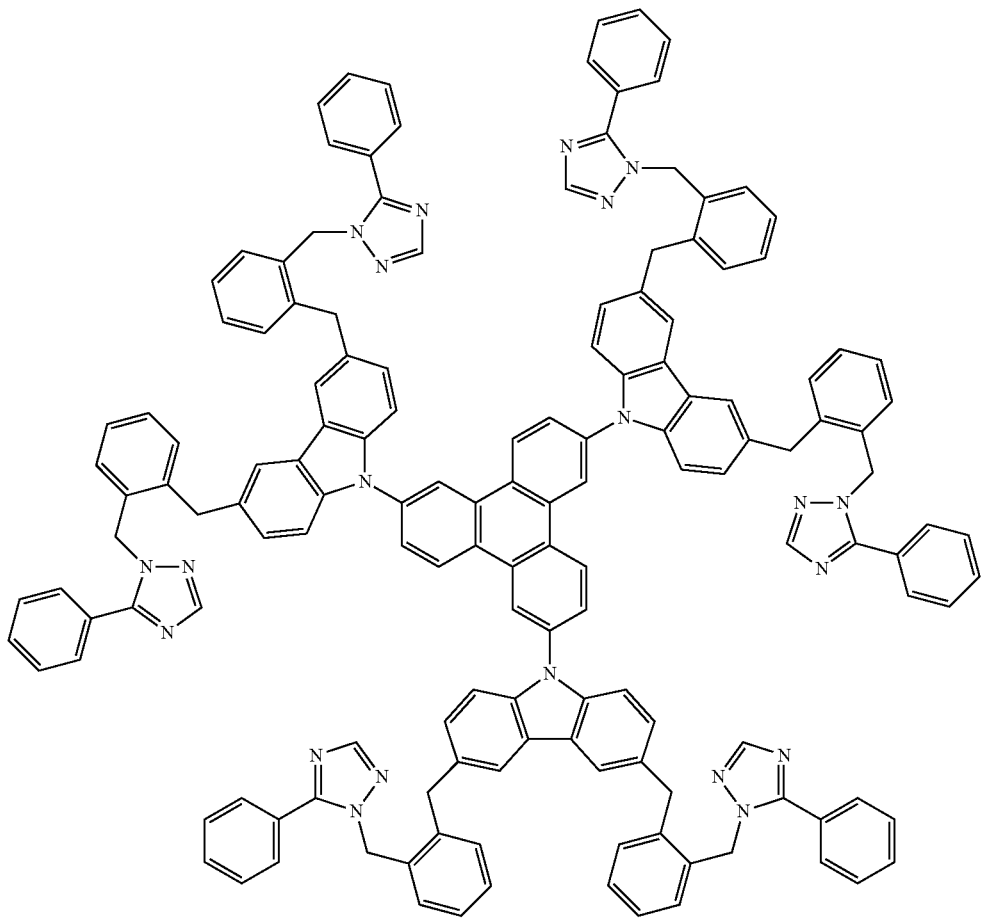
86

-continued
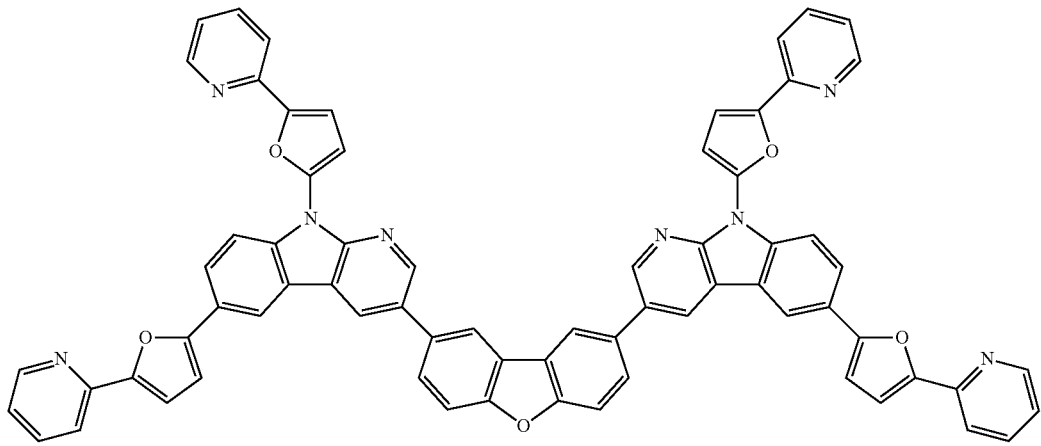
87
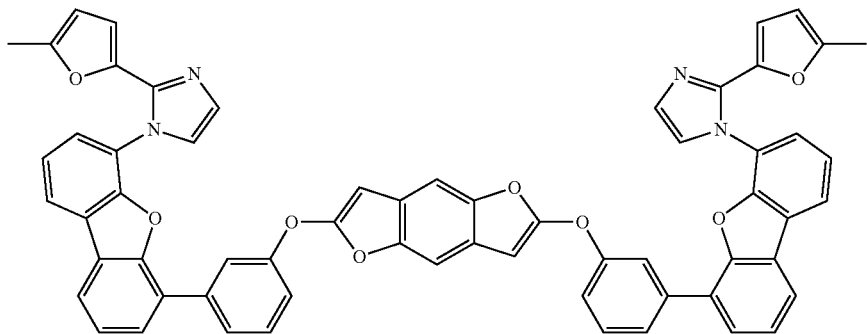
88
[Chemical Formula 39]
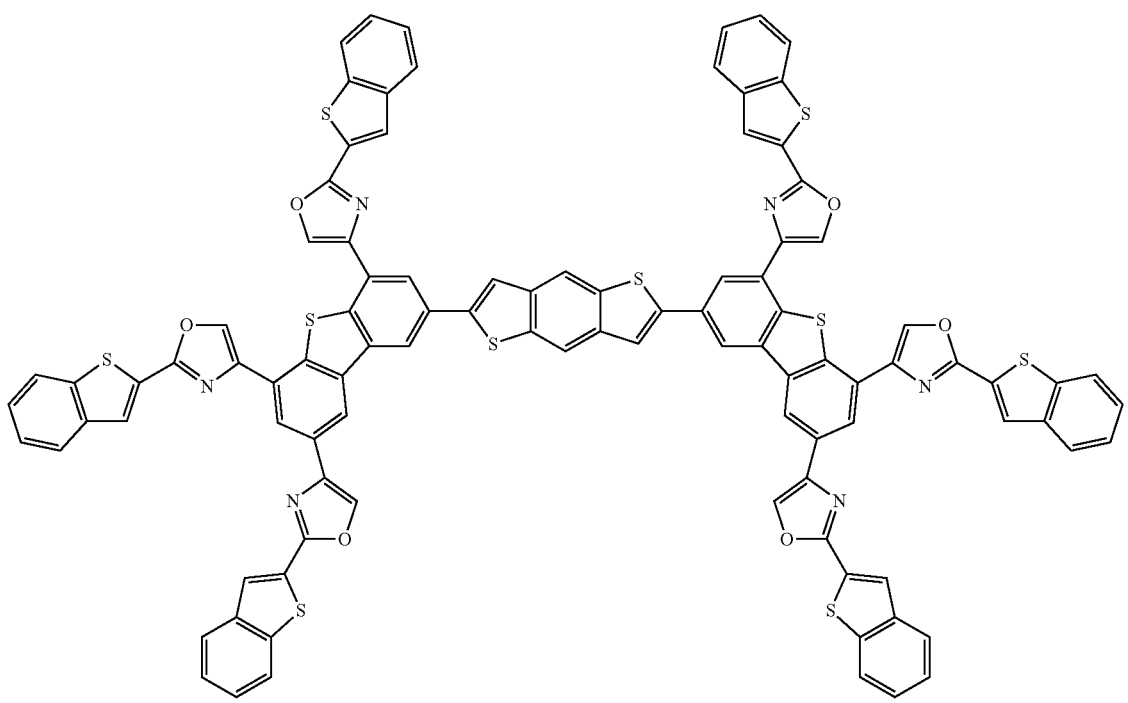
89

-continued
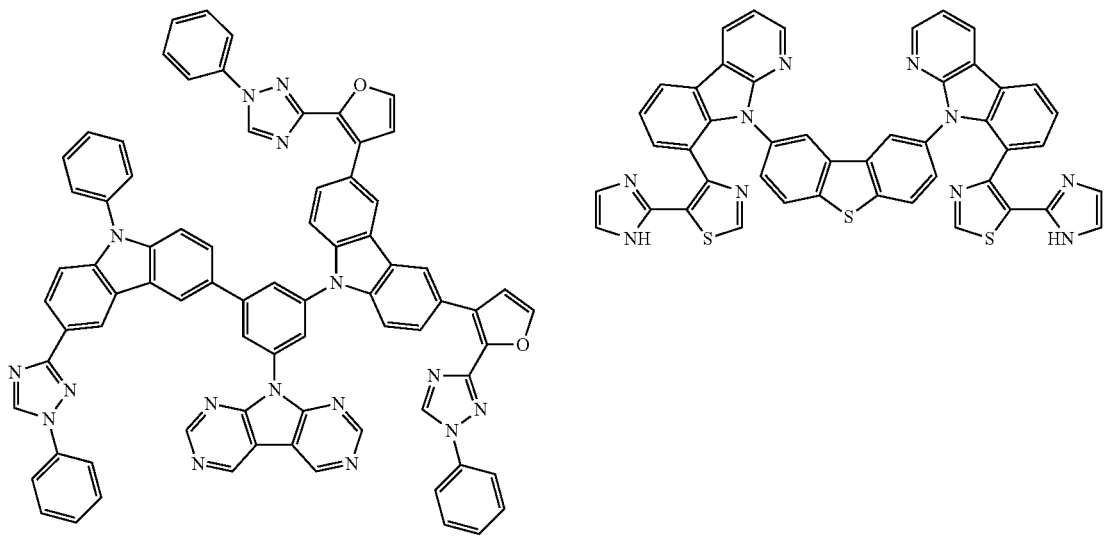
90
91
[Chemical Formula 40]
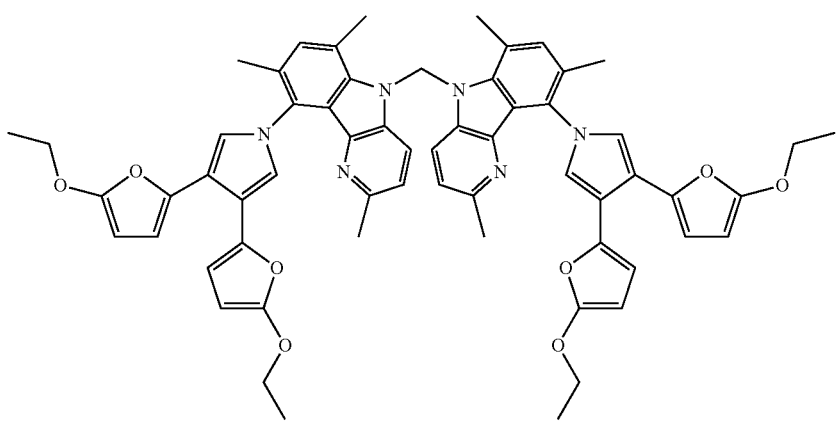
92
93
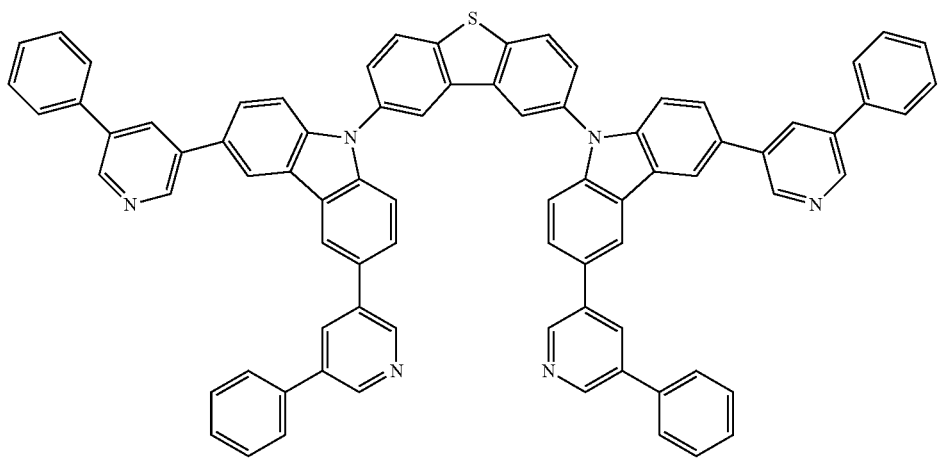

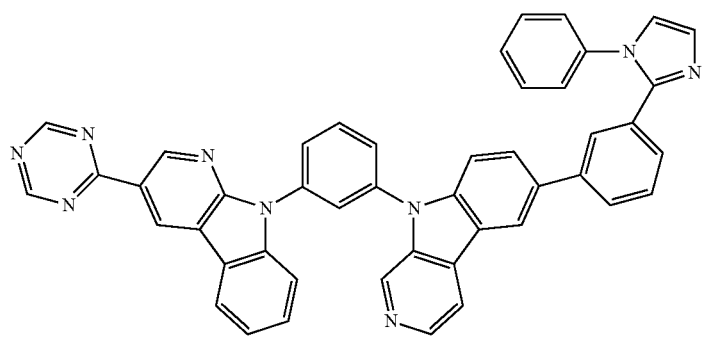
94
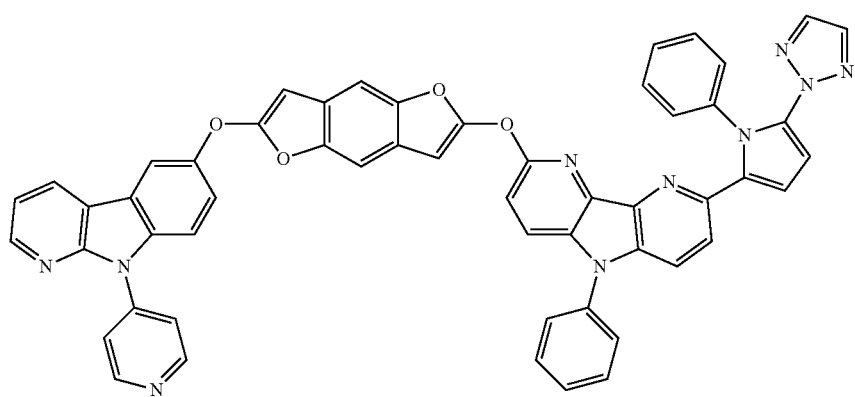
95
[Chemical Formula 41]
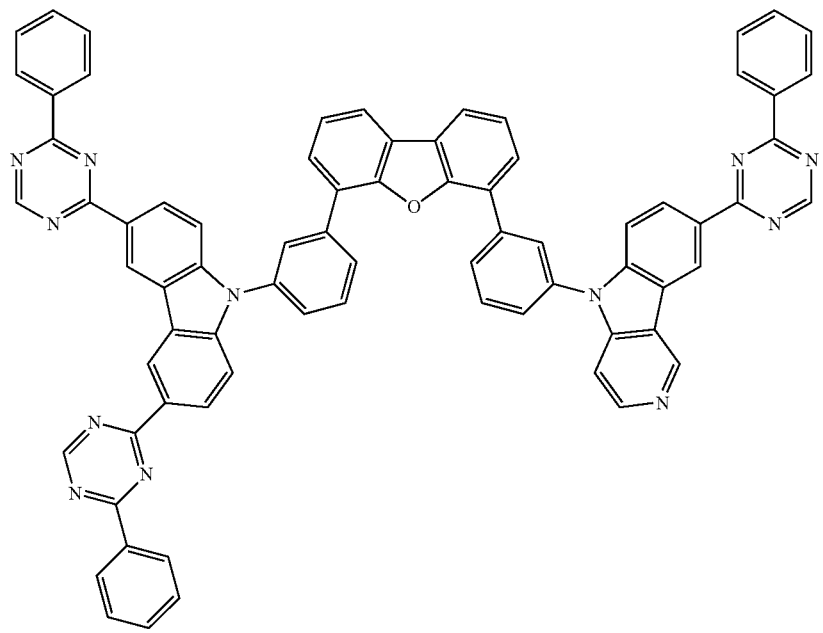
96

97
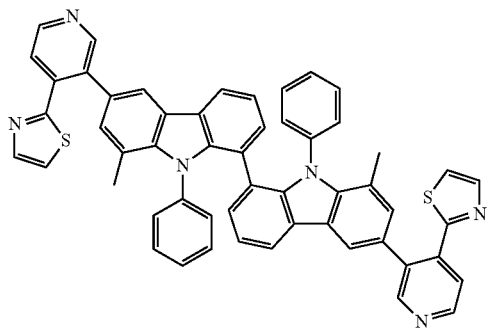
98
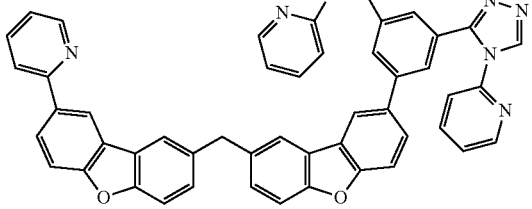
99
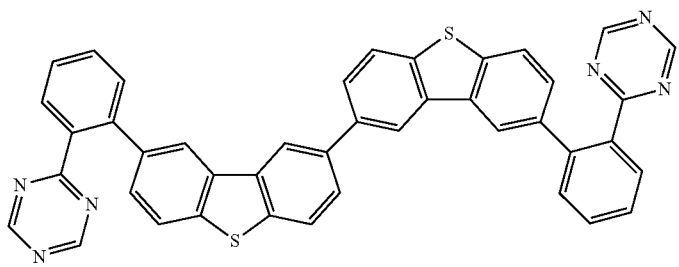
[Chemical Formula 42]
100
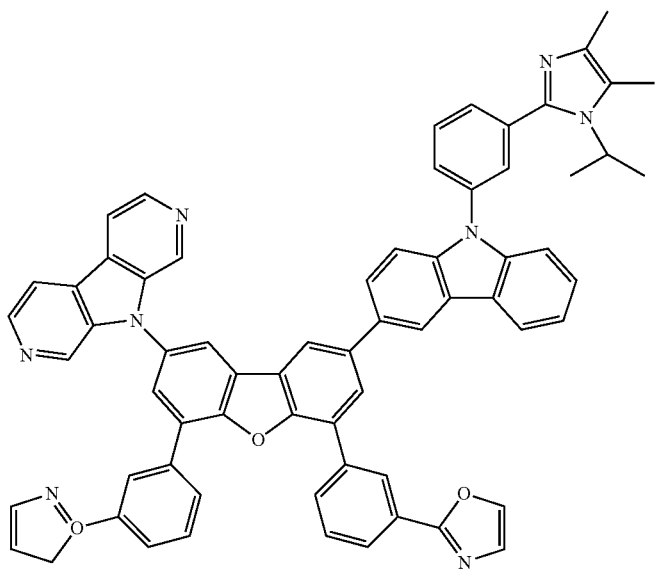

-continued
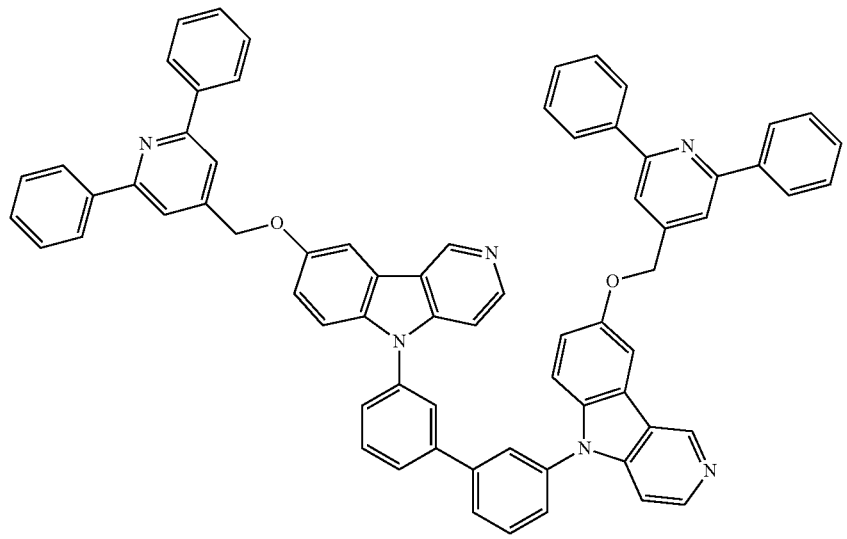
101
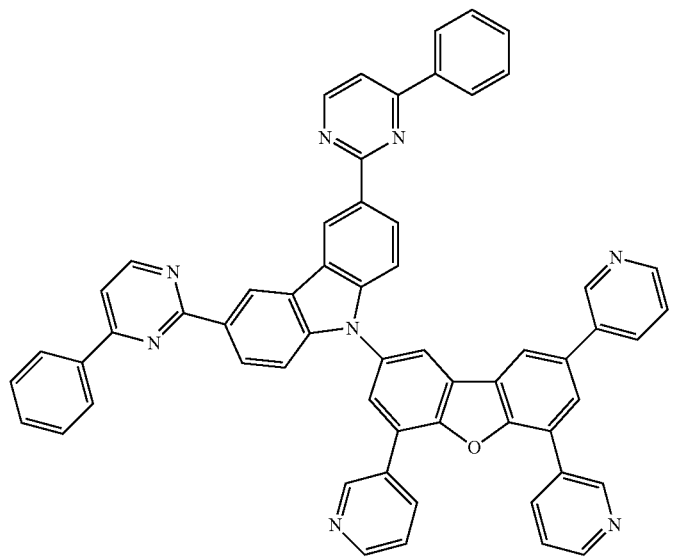
102
[Chemical Formula 43]
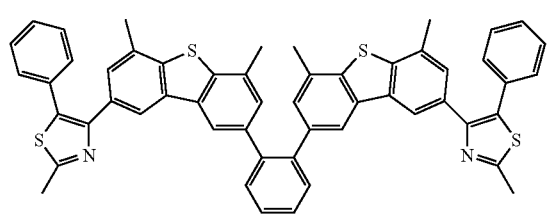
103
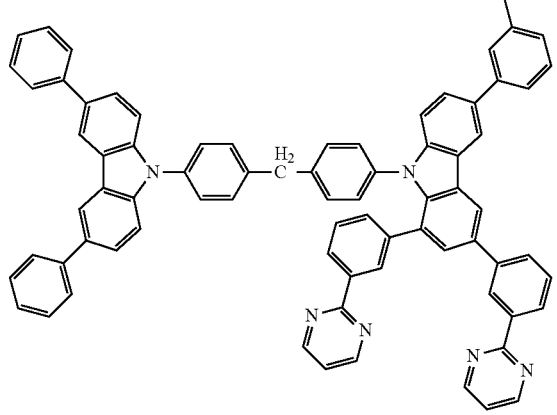
104

-continued
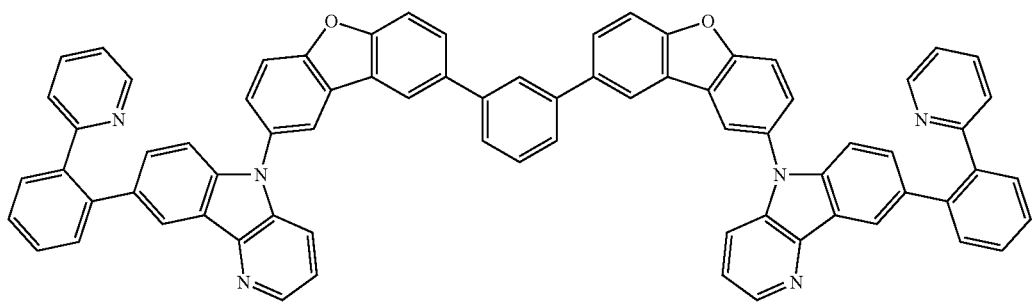
105
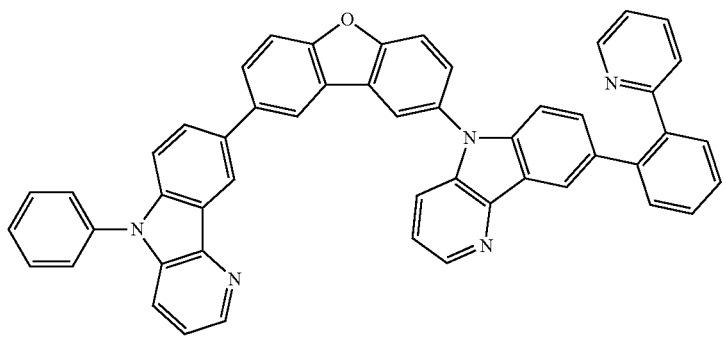
106
[Chemical Formula 44]
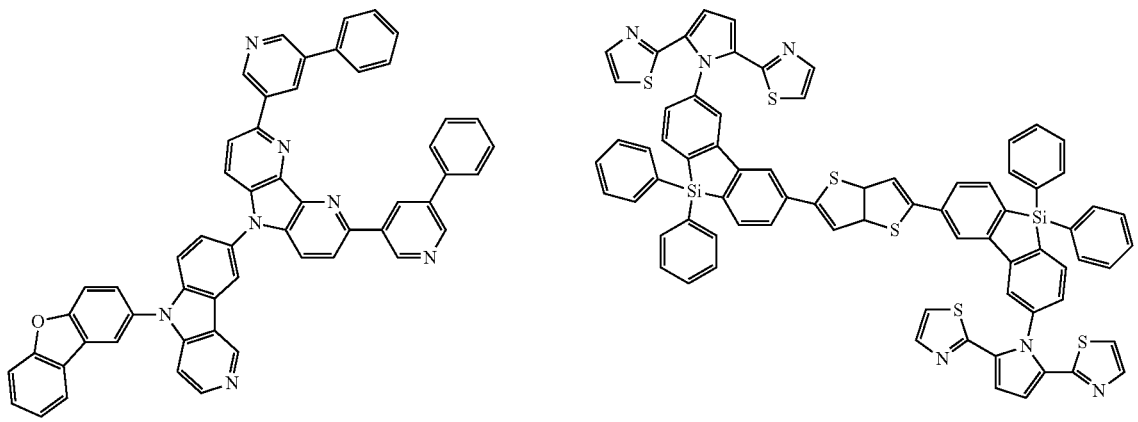
107    108
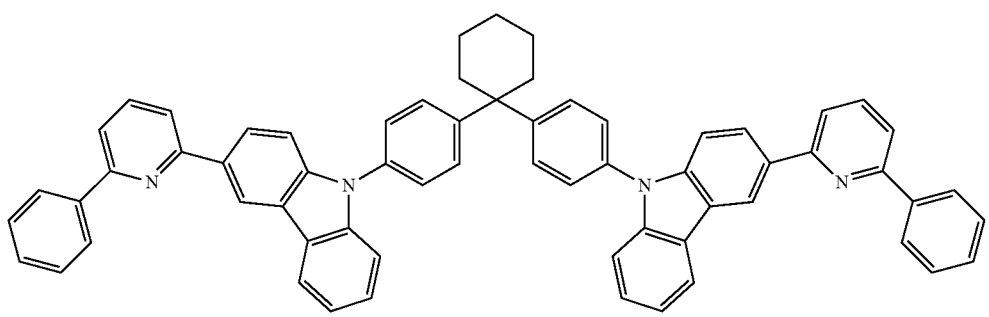
109

-continued
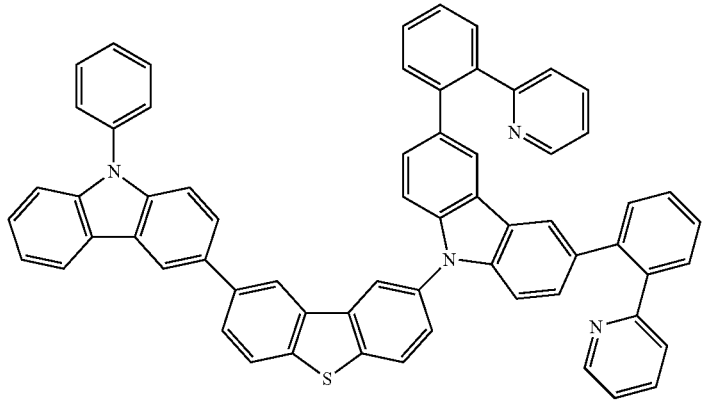
110
[Chemical Formula 45]
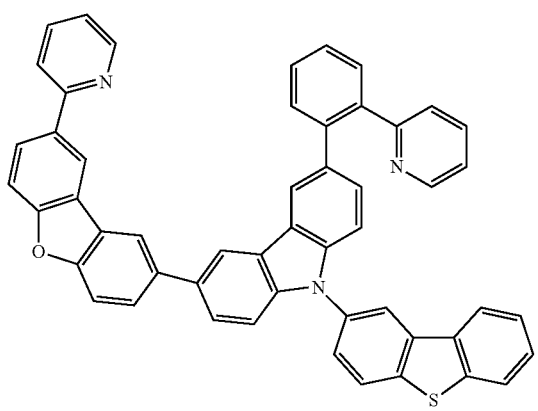
111
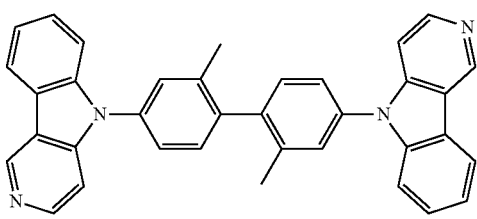
112
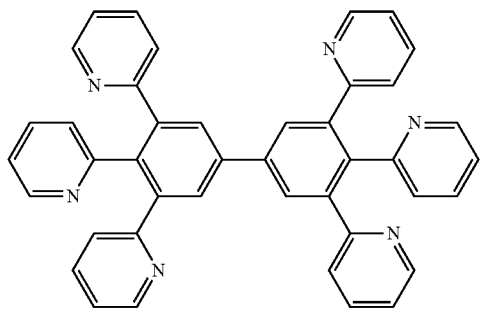
113
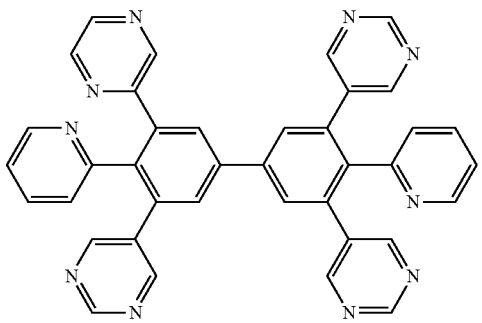
114
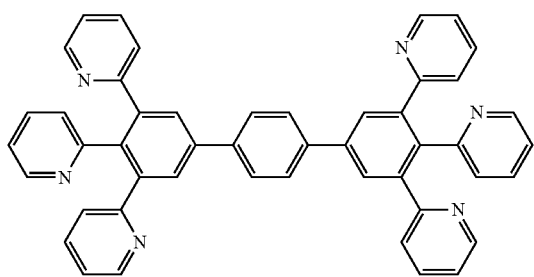
115
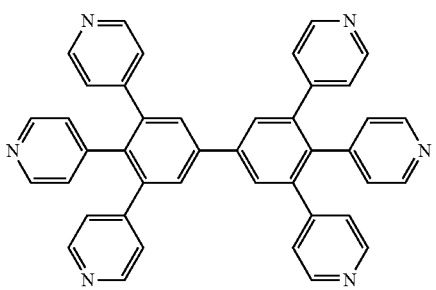
116

117

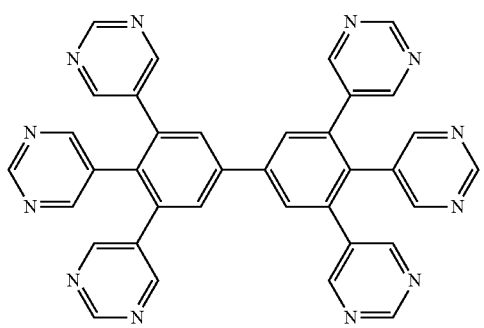

118

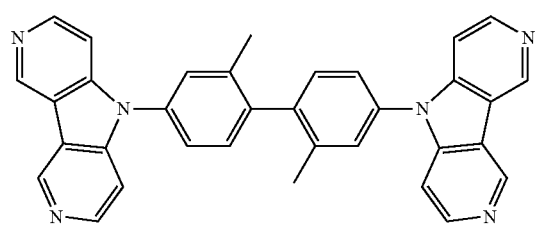

[Example of Synthesizing Compound]

As an example of synthesizing a typical compound, a concrete example of synthesizing the compound 5 is described below; however, the present invention is not limited thereto.

Synthesis of compound 5

[Chemical Formula 46]

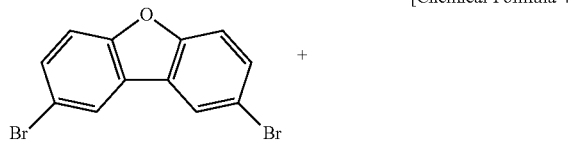

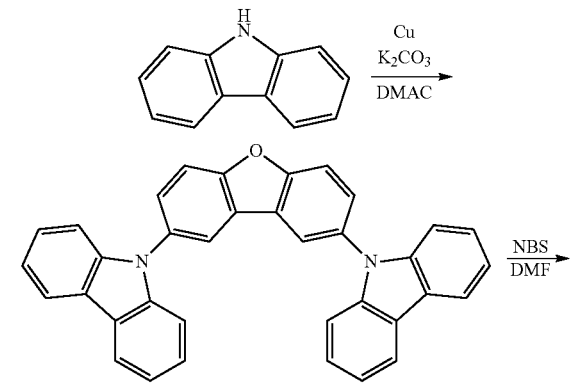

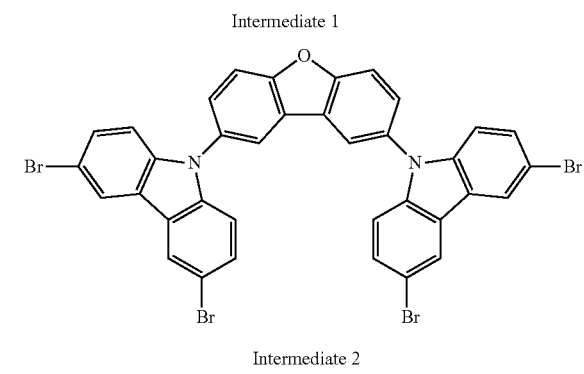

-continued

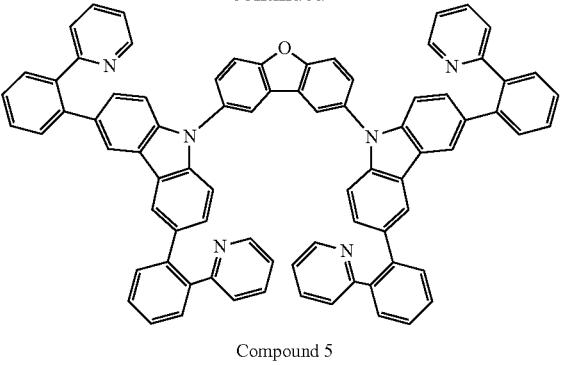

Compound 5

Process 1: (Synthesis of Intermediate 1)

Under nitrogen atmosphere, 2,8-dibromodibenzofuran (1.0 mol), carbazole (2.0 mol), copper powder (3.0 mol) and potassium carbonate (1.5 mol) were mixed in 300 ml of DMAc (dimethylacetamide) and then stirred for 24 hours at 130° C. After the reaction liquid obtained in the above-described manner was cooled to room temperature, 1 liter of toluene was added to the reaction liquid, the resultant substance was washed three times with distilled water, the solvent was distilled off from the washed substance under a reduced pressure, and the residue was purified with silica gel flash chromatography (n-heptane:toluene=4:1 to 3:1) to obtain an intermediate 1 at a yield of 85%.

Process 2: (Synthesis of Intermediate 2)

At room temperature under atmospheric pressure, the intermediate 1 (0.5 mol) was dissolved into 100 ml of DMF (dimethylformamide), and 2.0 mol of NBS (N-bromosuccinimide) was added, and then the resultant liquid was stirred for one night at room temperature. The obtained precipitate was filtered and washed with methanol to obtain an intermediate 2 at a yield of 92%.

Process 3: (Synthesis of Compound 5)

Under nitrogen atmosphere, the intermediate 2 (0.25 mol), 2-phenylpyridine (1.0 mol), ruthenium complex [($\eta_6$-$C_6H_6$)RuCl$_2$]$_2$ (0.05 mol), triphenylphosphine (0.2 mol), and potassium carbonate (12 mol) were mixed in 3 liters of NMP (N-methyl-2-pyrrolidone), and then the mixture was stirred for one night at 140° C.

After the reaction liquid was cooled to room temperature, 5 liters of dichloromethane was added to the reaction liquid, and then the reaction liquid was filtered. Next, the solvent was distilled off from the filtrate under a reduced-pressure atmosphere (800 Pa, 80° C.), and the residue was purified with silica gel flash chromatography (CH$_2$Cl$_2$:Et$_3$N=20:1 to 10:1).

After the solvent had been distilled off from the purified substance under the reduced-pressure atmosphere, the residue was dissolved again into dichloromethane and washed three times with water. The substance obtained by washing was dried with anhydrous magnesium sulfate, and the solvent was distilled off from the dried substance under the reduced-pressure atmosphere to thereby obtain the compound 5 at a yield of 68%.

[Halogen Atom and Halogen Compound]

Examples of the halogen atom contained in the transparent electrode 1 include fluorine, chlorine, bromine, iodine, and the like. As described before, the halogen atom may either be contained in a compound containing nitrogen atoms, or be contained in the nitrogen-containing layer 1a as a halogen compound other than the compound containing nitrogen atoms. Examples of the halogen compound constituting the nitrogen-containing layer 1a include lithium fluoride, potassium fluoride, calcium fluoride, lithium chloride, potassium chloride, calcium chloride, lithium bromide, potassium bromide, calcium bromide, lithium iodide, iodo potassium, and calcium iodide, and the like.

[Film-Forming Method of Nitrogen-Containing Layer 1a]

In the case where the aforesaid nitrogen-containing layer 1a is formed on the base material 11, the nitrogen-containing layer 1a may be formed by a method based on wet process (such as a coating method, an ink-jet method, a dipping method or the like), a method based on dry process (such as a deposition method (e.g., a resistance heating method, an EB method or the like), a sputtering method, a CVD method or the like) or the like. Among these methods, the deposition method is preferably used.

Particularly, in the case where the nitrogen-containing layer 1a is formed by using a plurality of compounds, a co-deposition method is applicable in which the plurality of compounds are supplied at the same time from a plurality of deposition sources. Further, in the case where the nitrogen-containing layer 1a is formed by using a polymer material, a coating method is preferably used. In such a case, a coating liquid obtained by dissolving the compound into a solvent is used. The solvent into which the compound is dissolved is not particularly limited. Furthermore, in the case where the nitrogen-containing layer 1a is formed by using a plurality of compounds, the coating liquid needs to be prepared using a solvent capable of dissolving the plurality of compounds.

<Aluminum Intermediate Layer A>

The aluminum intermediate layer A is a layer formed by using aluminum, and is sandwiched between the nitrogen-containing layer 1a and the electrode layer 1b in a state in which the aluminum intermediate layer A is in contact both with the nitrogen-containing layer 1a and with the electrode layer 1b. It is important that the film-thickness of the aluminum intermediate layer A is sufficiently small so that the light transmissibility of the transparent electrode 1 is not impaired, and that the effect of the nitrogen contained in the nitrogen-containing layer 1a on the electrode layer 1b is not inhibited.

Figure 2:
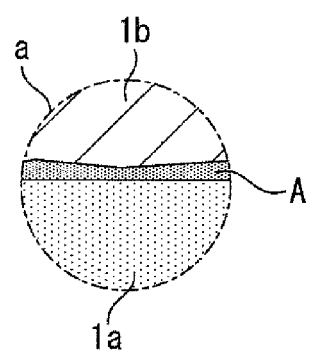
FIG. 2 is a view schematically showing the aforesaid portion of the transparent electrode according to the present invention in an enlarged manner.

FIG. 2 shows a portion "a" of FIG. 1 in an enlarged manner, which is a primary portion including the aluminum intermediate layer A of the transparent electrode 1. As shown in FIG. 2, the aluminum intermediate layer A does not have to be formed as a film having uniform thickness and/or to be formed as a continuous film, as long as it has a film-thickness of 1 nm or less; and the aluminum intermediate layer A may also have an island shape, or have a shape with a plurality of holes.

The main component of the aforesaid aluminum intermediate layer A is aluminum; apart from aluminum, the aluminum intermediate layer A may contain silver, magnesium, copper, and indium lithium and the like.

In the case where the nitrogen-containing layer 1a contains halogen atoms, the aluminum intermediate layer A may contain halogen atoms or contain a halogen compound. The halogen atoms or halogen compound of the aluminum intermediate layer A shall be contained at least in the interface with the nitrogen-containing layer 1a, but may also be contained in the whole layer of aluminum intermediate layer A. In other words, the aluminum intermediate layer A may also have a configuration in which the halogen atoms or halogen compound is contained in the whole layer of aluminum intermediate layer A from the side in contact with the nitrogen-containing layer 1a to the side in contact with the electrode layer 1b.

The halogen atoms contained in the aluminum intermediate layer A are the same as the halogen atoms contained in the nitrogen-containing layer 1a, for example, aluminum halide is contained as the halogen atoms. Concrete examples of the aluminum halide constituting the aluminum intermediate layer A include, for example, aluminum fluoride, aluminum chloride, aluminum bromide, iodide aluminum and the like.

Figure 3:
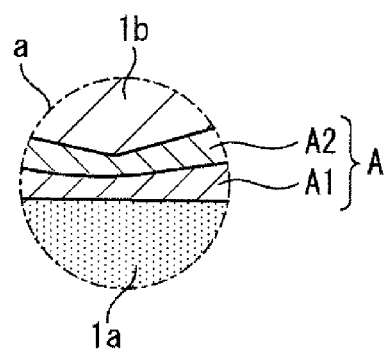
FIG. 3 is a view schematically showing a portion of another transparent electrode according to the present invention in an enlarged manner.

FIG. 3 shows another form of the aluminum intermediate layer A. FIG. 3 shows the portion "a" of FIG. 1 in an enlarged manner, which is a primary portion including the aluminum intermediate layer A of the transparent electrode 1. As shown in FIG. 3, the aluminum intermediate layer A may include a first layer A1 arranged on the side of the nitrogen-containing layer 1a and a second layer A2 arranged on the side of the electrode layer 1b, wherein the first layer A1 contains halogen atoms and the second layer A2 contains no halogen atom.

The halogen atoms constituting the first layer A1 are the same halogen atoms as the halogen atoms contained in the nitrogen-containing layer 1a. The halogen atoms constituting the first layer A1 are contained as an aluminum halide in the first layer A1. Concrete examples of the aluminum halide include, for example, aluminum fluoride, aluminum chloride, aluminum bromide, iodide aluminum and the like.

As another form of the aluminum intermediate layer A, there is a configuration in which the content of the halogen atoms has a concentration gradient in the film-thickness direction. In such a case, the aluminum intermediate layer A may be configured as a layer which has aluminum as the main component thereof and which is formed so that the content of the halogen atom (i.e., the halogen concentration in the aluminum intermediate layer A) gradually decreases from the side of the nitrogen-containing layer 1a toward the side of the electrode layer 1b. In other words, it is only required that the aluminum intermediate layer A contains halogen atoms at least in the interface with the nitrogen-containing layer 1a.

[Method for Forming Aluminum Intermediate Layer A]

The aluminum intermediate layer A of each of the aforesaid configurations may be formed by, for example, a method based on wet process, a method based on dry process or the like, wherein examples of the method based on wet process include a coating method, an ink-jet method, a dipping method and the like, and the method based on dry process include a deposition method (e.g., a resistance heating method, an EB method or the like), a sputtering method, a CVD method and the like). Among these methods, the deposition method is preferably used. After the aluminum intermediate layer A having been formed by a suitable method, an annealing treatment (a heat treatment) may be performed according to necessity. It is preferred that the annealing treatment is performed at a temperature between 40° C. and 150° C.

Particularly, when forming an aluminum intermediate layer A containing halogen atoms, a nitrogen-containing layer 1a containing halogen atoms is first formed. Thereafter, an aluminum intermediate layer A having aluminum as the main component thereof is formed on the nitrogen-containing layer 1a containing halogen atoms, so that the halogen atoms in the nitrogen-containing layer 1a are diffused into at least the interface of the aluminum intermediate layer A with the nitrogen-containing layer 1a. The halogen atoms may be diffused into the aluminum intermediate layer A while the aluminum intermediate layer A is being formed, or after the aluminum intermediate layer A has been formed, or both the time while the aluminum intermediate layer A is being formed and the time after the aluminum intermediate layer A has been formed.

In the case where the halogen atoms are to be diffused while the aluminum intermediate layer A is being formed, the substrate needs to be heated when forming the aluminum intermediate layer A. Thus, due to the heat when forming the aluminum intermediate layer A, the halogen atoms contained in the nitrogen-containing layer 1a react with aluminum, so that the aluminum intermediate layer A is formed so that the halogen atoms, as aluminum halide, are contained at least in the interface with the nitrogen-containing layer 1a.

On the other hand, in the case where the halogen atoms are to be diffused after the aluminum intermediate layer A has been formed, the reaction between the halogen atoms contained in the nitrogen-containing layer 1a and the aluminum of the aluminum intermediate layer A may be promoted by performing an annealing treatment. At this time, the amount of diffusion of the halogen atoms from the nitrogen-containing layer 1a into the aluminum intermediate layer A (i.e., the amount of the reaction between aluminum and halogen atoms) is controlled by adjusting heating temperature and/or heating time of the annealing treatment. In such a manner, the content of the halogen atoms contained in the aluminum intermediate layer A finally formed is adjusted, so that at least the aluminum intermediate layer A on the side of the interface with the nitrogen-containing layer 1a is halogenated. Incidentally, the annealing treatment may be performed in any one process after the aluminum intermediate layer A has been formed; for example, the annealing treatment may be performed after the electrode layer 1b has been formed.

Particularly, as shown in FIG. 3, in the case where an aluminum intermediate layer A having a first layer A1 containing halogen atoms and a second layer A2 containing no halogen atom is to be formed, or in the case where an aluminum intermediate layer A whose content of the halogen atoms has a concentration gradient is to be formed, the aluminum intermediate layer A can be prevented from being halogenated across the entire layer either by suitably setting the temperature of the substrate heating process when forming the aluminum intermediate layer A and/or the condition of the annealing treatment after film-forming of the aluminum intermediate layer A, or by not performing substrate heating process and the annealing treatment. Further, it is also possible to form the aluminum intermediate layer without diffusing the halogen atoms up to the surface layer by other means, such as reducing the content of the halogen atoms contained in the nitrogen-containing layer 1a to a level below the predetermined value, or increasing the film-thickness of the aluminum intermediate layer as much as possible within a range wherein the transmittance of aluminum intermediate layer is not impaired.

Incidentally, in the case where an aluminum intermediate layer A containing no halogen atom is to be formed on the top of the nitrogen-containing layer 1a containing halogen atoms, the film-forming substrate may be cooled while forming the aluminum intermediate layer A, so that the aluminum intermediate layer A is formed while the diffusion of the halogen atoms from the nitrogen-containing layer 1a is prevented.

<Electrode layer 1b>

The electrode layer 1b is a layer whose main component is silver, and is a layer formed by using silver or an alloy having silver as the main component thereof, and arranged in a state in which the aluminum intermediate layer A is sandwiched between the electrode layer 1b and the nitrogen-containing layer 1a. The electrode layer 1b is arranged adjacent to the aluminum intermediate layer A. Further, in the case where the aluminum intermediate layer A is an island-shaped layer or a layer having a plurality of holes, instead of being a continuous film, the electrode layer 1b is partially adjacent to the nitrogen-containing layer 1a.

Examples of the alloy having silver as the main component thereof, which constitutes the electrode layer 1b, include silver magnesium (AgMg), silver copper (AgCu), silver palladium (Aged), silver palladium copper (AgPdCu), silver indium (AgIn) and the like.

Alternatively, in the electrode layer 1b described above, the layer of silver or an alloy having silver as the main component thereof may include a plurality of layers, according to necessity, laminated one on top of another.

Further, it is preferred that the film-thickness of the electrode layer 1b is in a range between 4 nm and 12 nm. By setting the film-thickness to 12 nm or less, absorption component or reflection component of the layer is reduced, and therefore the light transmittance of the transparent barrier film can be maintained, which is desirable. While by setting the film-thickness to 4 nm or more, the electrical conductivity of the layer can be maintained.

Alternatively, the aforesaid transparent electrode 1, which has a laminated structure in which the aluminum intermediate layer A is sandwiched between the nitrogen-containing layer 1a and the electrode layer 1b, may have a protective film coated on the top of the electrode layer 1b or have another conductive layer laminated on the top of the electrode layer 1b. In such a case, it is preferred that the protective film and the conductive layer have light transmissibility so that the light transmissibility of the transparent electrode 1 is not impaired. Further, layer(s) may be provided at the bottom of the nitrogen-containing layer 1a (i.e., between the nitrogen-containing layer 1a and the base material 11) according to necessity.

[Film-Forming Method of Electrode Layer 1b]

The electrode layer 1b may be formed by a method based on wet process, a method based on dry process or the like, wherein examples of the method based on wet process include a coating method, an ink-jet method, a dipping method and the like, and the method based on dry process include a deposition method (e.g., a resistance heating method, an EB method or the like), a sputtering method, a CVD method and the like). Among these methods, the deposition method is preferably used. The electrode layer 1b is characterized that, by being formed on the nitrogen-containing layer 1a through an extremely thin aluminum intermediate layer A, the electrode layer 1b has sufficient electrical conductivity without performing high-temperature annealing or the like after film-formation; however, high-temperature annealing or the like may also be performed according to necessity, after the film-forming process. The high-temperature annealing may also function as the aforesaid annealing treatment for causing the reaction between the halogen atoms in the nitrogen-containing layer 1a and aluminum in the aluminum intermediate layer A when forming the aluminum intermediate layer A.

<Effect of Transparent Electrode 1>

The aforesaid transparent electrode 1 has a configuration in which the electrode layer 1b having silver as the main component thereof is arranged adjacent to the nitrogen-containing layer 1a through the aluminum intermediate layer A, wherein the nitrogen-containing layer 1a is formed by using a compound containing nitrogen atoms. Due to the interaction between the electrode layer 1b having silver as the main component thereof and aluminum of the aluminum intermediate layer A and the interaction between the electrode layer 1b and the compound containing nitrogen atoms constituting the nitrogen-containing layer 1a, diffusion distance of silver on the adjoining interface is reduced, and therefore aggregation of silver is inhibited. Therefore, the silver thin-film will be formed in a manner in which the silver thin-film grows in a single-layer growth mode (Frank-van der Merwe: FW mode); while in contrast, the silver thin-film is generally formed in a manner in which the silver thin-film grows in a nuclear growth mode (Volumer-Weber: VW mode) and thereby the silver thin-film tends to be isolated into an island shape. Thus, it is possible to obtain an electrode layer 1b having small yet uniform film-thickness.

Since the film-thickness of the aluminum intermediate layer A is extremely small in order to obtain the effect of inhibiting aggregation of silver in the electrode layer 1b, absorption of light by the aluminum intermediate layer A is minimized, so that the light transmissibility of the transparent electrode 1 will not be impaired. Further, since the film-thickness of the aluminum intermediate layer A is extremely small, it is possible for the nitrogen constituting the nitrogen-containing layer 1a to interact with the silver constituting the electrode layer 1b through the aluminum intermediate layer A.

Particularly, the aforesaid effective unshared electron pair content [n/M] is used as an index of the bond stability of silver constituting the electrode layer 1b with respect to the nitrogen-containing layer 1a, and a compound whose effective unshared electron pair content [n/M] satisfies "$3.9 \times 10^{-3} \leq [n/M]$" is used to constitute the nitrogen-containing layer 1a. Thus, it becomes possible to provide a nitrogen-containing layer 1a by which the effect of "inhibiting aggregation of silver" can be reliably achieved. This is also confirmed by a fact (which is to be described in detail in the below-mentioned examples) that an electrode layer 1b having an extremely small film-thickness of 5 nm yet having a low sheet resistance of about two-digit value is formed on such a nitrogen-containing layer 1a.

As a result, in the transparent electrode 1, it is possible to reliably obtain an electrode layer 1b whose light transmissibility is ensured due to the small film-thickness while whose electrical conductivity is ensured due to the uniform film-thickness, and therefore it becomes possible to improve both the electrical conductivity and the light transmissibility of the transparent electrode 1 that uses silver.

Further, in the transparent electrode 1 of the present embodiment, by containing halogen atoms into the nitrogen-containing layer 1a, it is possible to reduce driving voltage and improve high-temperature/high-humidity preservation performance.

Furthermore, in the aforesaid transparent electrode 1, since the halogen atoms, as aluminum halide, are contained at least in the interface of the aluminum intermediate layer A with the nitrogen-containing layer 1a, it is possible to cause the physical properties to continuously change from the layer of organic material toward the layer of inorganic material. Thus, if the nitrogen-containing layer 1a and the aluminum intermediate layer A are regarded as a ground layer, since continuity of the physical properties from the ground layer with respect to the electrode layer 1b having silver as the main component thereof is maintained, it is possible to improve adhesiveness, reduce the voltage, and inhibit aggregation of silver.

This further increases the possibility of forming the electrode layer 1b having silver as the main component thereof as a thin-film with a uniform thickness, so that it is possible to further improve electrical conductivity and light transmissibility of the transparent electrode 1 that uses silver.

Further, since indium (In), which is a kind of rare metal, is not used, the cost of the transparent electrode 1 is low; and since chemically unstable material, such as ZnO or the like, is not used, the transparent electrode 1 is excellent in long-term reliability.

<<2. Applications of Transparent Electrode>>

The transparent electrode 1 having the aforesaid configuration can be used in various kinds of electronic devices. Examples of the electronic devices include organic electroluminescence elements, LED (Light Emitting Diode), liquid crystal elements, solar cells, touch panels and the like; and the transparent electrode 1 can be used as an electrode member of each of these electronic devices wherein the electrode member needs to have light transmissibility. As an example of the application, an embodiment of the organic electroluminescence element using the transparent electrode an anode and a cathode will be described below.

<<3. First Example of Organic Electroluminescence Element (Top Emission Type)>>

<Configuration of Organic Electroluminescence Element EL-1>

Figure 4:
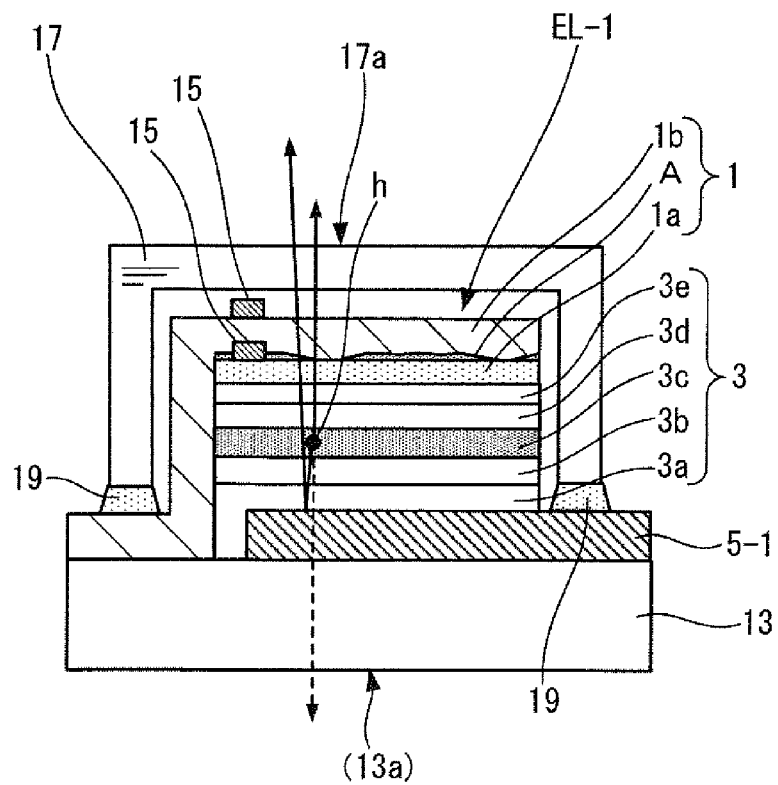
FIG. 4 is a view showing a cross-sectional configuration of a first example of an organic electroluminescence element that uses the transparent electrode according to the present invention.

As an example of the electronic device of the present invention, FIG. 4 shows a cross-sectional configuration of a first example of an organic electroluminescence element that uses the aforesaid transparent electrode 1. The configuration of the organic electroluminescence element will be described below with reference to FIG. 4.

An organic electroluminescence element EL-1 shown in FIG. 4 is arranged on a substrate 13. The organic electroluminescence element EL-1 is formed by laminating an opposite electrode 5-1, a light-emitting functional layer 3 and a transparent electrode 1, in this order, from the side of the substrate 13, wherein the light-emitting functional layer 3 is formed by using an organic material and the like. It is characterized that the transparent electrode 1 of the present invention described above is used as the transparent electrode 1 of the organic electroluminescence element EL-1. Thus, the organic electroluminescence element EL-1 is configured as a top emission type organic electroluminescence element in which the light emitted thereby (referred to as "luminescence light h" hereinafter) is extracted at least from a side opposite to the side of the substrate 13.

Further, the entire layer-structure of the organic electroluminescence element EL-1 is not particularly limited, but may be a generic layer-structure. Here, the transparent electrode 1 is arranged on the side of the cathode, wherein mainly the electrode layer 1b functions as the cathode; and the opposite electrode 5-1 functions as the anode.

In such a case, for example, the light-emitting functional layer 3 is formed by laminating [a hole injecting layer 3a/a hole transporting layer 3b/a light emitting layer 3c/an electron transporting layer 3d/an electron injecting layer 3e], in this order, from the side of the opposite electrode 5-1 (which is the anode); among these layers, the light emitting layer 3c formed by using at least an organic material is indispensable. The hole injecting layer 3a and the hole transporting layer 3b may also be formed as a hole transporting/injecting layer that has hole transport performance and hole injection performance. The electron transporting layer 3d and the electron injecting layer 3e may also be formed as a single layer that has electron transport performance and electron injection performance. Further, among the aforesaid layers of the light-emitting functional layer 3, the electron injecting layer 3e, for example, may also be formed of an inorganic material.

Further, in the transparent electrode 1 (as the cathode), the nitrogen-containing layer 1a may also serve as an electron injecting layer, or may also serve both as an electron transporting layer and as an electron injecting layer.

In addition to the aforesaid layers, the light-emitting functional layer 3 may have other layer(s), such as a hole blocking layer, an electron blocking layer and/or the like, laminated on required place(s) according to necessity. Further, the light emitting layer 3c may also be formed as a light emitting layer unit which includes a plurality of emitting layers each emit light of different wavelength range, wherein the plurality of emitting layers are laminated one on top of another with a non-luminescent intermediate layer interposed between each two adjacent layers. The intermediate layer may function as a hole blocking layer or an electron blocking layer. Further, the opposite electrode 5-1 (i.e., the anode) may also have a laminated structure according to necessity. In such a configuration, only a portion where the light-emitting functional layer 3 is sandwiched by the transparent electrode 1 and the opposite electrode 5-1 is a light-emitting region of the organic electroluminescence element EL-1.

In the aforesaid layer-structure, in order to reduce the resistance of the transparent electrode 1, an auxiliary electrode 15 may be provided in contact with the electrode layer 1b of the transparent electrode 1.

In order to prevent deterioration of the light-emitting functional layer 3, which is formed by using an organic material and the like, the organic electroluminescence element EL-1 having the aforesaid configuration is sealed by a transparent sealing material 17 (which is to be described later) on the substrate 13. The transparent sealing material is fixed to the side of the substrate 13 through an adhesive 19. However, the terminal portions of both the transparent electrode 1 and the opposite electrode 5-1 are exposed from the transparent sealing material 17 in a state where the transparent electrode 1 and the opposite electrode 5-1 are insulated from each other by the light-emitting functional layer 3 on the substrate 13.

The details of the main layers for constituting the aforesaid organic electroluminescence element EL-1 will be described below in the following order: the substrate 13, the transparent electrode 1, the opposite electrode 5-1, the light emitting layer 3c of the light-emitting functional layer 3, the other layers of the light-emitting functional layer 3, the auxiliary electrode 15, and the transparent sealing material 17. Thereafter, a production method of the organic electroluminescence element EL-1 will be described.

[Substrate 13]

The same material as the base material on which the transparent electrode 1 of the present invention described above is used as the material of the substrate 13 of the present example. Incidentally, in the case where the organic electroluminescence element EL-1 is a dual emission type organic electroluminescence element in which the luminescence light h is also extracted from the side of the opposite electrode 5-1, the substrate is formed by a transparent material selected from the examples of the base material.

[Transparent Electrode 1 (on Cathode Side)]

The transparent electrode 1 is the transparent electrode 1 of the present invention described above; and is configured by forming a nitrogen-containing layer 1a, an aluminum intermediate layer A, and an electrode layer 1b, in this order, from the side of the light-emitting functional layer 3. Particularly, herein the electrode layer 1b and the aluminum intermediate layer A of the transparent electrode 1 is a substantive cathode. In the organic electroluminescence element EL-1 of the present embodiment, the nitrogen-containing layer 1a formed by an organic material is disposed between the light-emitting functional layer 3 and the electrode layer 1b, which is used as the substantive cathode. Thus, the nitrogen-containing layer 1a of the transparent electrode 1 of the present embodiment may also be regarded as a layer which constitutes a portion of the light-emitting functional layer 3.

The nitrogen-containing layer 1a is formed by using a material having electron transport performance or electron injection performance and selected from the compounds whose effective unshared electron pair content [n/M] falls in a predetermined range. Further, the nitrogen-containing layer 1a may also be formed by using a mixture obtained by mixing a compound having electron transport performance or electron injection performance with a compound whose effective unshared electron pair content [n/M] is equal to a certain value, so that the nitrogen-containing layer 1a itself has aforesaid effective unshared electron pair content [n/M].

[Opposite Electrode 5-1 (Anode)]

The opposite electrode 5-1 is an electrode film functioning as an anode that supplies holes to the light-emitting functional layer 3; and is formed by using a metal, an alloy, an organic or inorganic conductive compound, or a mixture of these materials. To be specific, the opposite electrode 5-1 is formed by using gold, aluminum, silver, magnesium, lithium, a magnesium/copper mixture, a magnesium/silver mixture, a magnesium/aluminum mixture, a magnesium/indium mixture, indium, a lithium/aluminum mixture, a rare earth metal, an oxide semiconductor (such as ITO, ZnO, TiO2, SnO2 and the like) or the like.

The opposite electrode 5-1 can be formed by forming a thin-film with one of the aforesaid conductive materials by a method such as deposition, sputtering or the like. The sheet resistance of the opposite electrode 5-1 is preferably several hundred Q/sq. or less; and the film-thickness of the opposite electrode 5-1 is generally within a range from 5 nm to 5 μm, preferably within a range from 5 nm to 200 nm.

Incidentally, in the case where the organic electroluminescence element EL-1 is a dual emission type organic electroluminescence element in which the luminescence light h is also extracted from the side of the opposite electrode 5-1, the opposite electrode 5-1 may be formed by using a material with good light transmissibility selected from the aforesaid conductive materials.

[Light Emitting Layer 3c]

The light emitting layer 3c used in the present invention contains, for example, a phosphorescent compound as a light emitting material.

The light emitting layer 3c is a layer where electrons injected from the electrode or the electron transporting layer 3d and holes injected from the hole transporting layer 3b are recombined to emit light; and light emitting portion may be either the inside of the light emitting layer 3c or an interface of the light emitting layer 3c with its adjacent layer.

The structure of the light emitting layer 3c is not particularly limited as long as the light emitting material contained therein satisfies light emitting requirements. Further, the light emitting layer 3c may also include a plurality layers having the same emission spectrum and/or emission maximum wavelength. In such a case, it is preferable that a non-luminescent intermediate layer (not shown) is provided between each two adjacent light emitting layers 3c.

The total film-thickness of the light emitting layers 3c is preferably within a range from 1 nm to 100 nm and, and more preferably within a range from 1 nm to 30 nm, this is because a lower driving voltage can be obtained in such a range. Incidentally, the total film-thickness of the light emitting layers 3c is, if the non-luminescent intermediate layer is provided between each two adjacent light emitting layers 3c, the total film-thickness including the film-thickness of the intermediate layer(s).

In the case where the light emitting layer 3c has a configuration in which a plurality of layers are laminated one on another, the film-thickness of each emitting layer is preferably to be adjusted to a range from 1 nm to 50 nm, and further preferably to be adjusted to a range from 1 nm to 20 nm. In the case where the plurality of laminated light emitting layers respectively correspond to emission color of blue, emission color of green and emission color of red, the relationship between the film-thickness of the light emitting layer of blue, the film-thickness of the light emitting layer of green and the film-thickness of the light emitting layer of red is not particularly limited.

The aforesaid light emitting layer 3c can be formed by forming a thin film of a light emitting material or a host compound (which are to be described later) using a known thin film forming method such as a vacuum deposition method, a spin coating method, a casting method, an LB method, an ink-jet method or the like.

The light emitting layer 3c may be formed of a plurality of materials in mixture; or a phosphorescent material and a fluorescent material (also referred to as a "fluorescent dopant" or a "fluorescent compound") may be used in mixture in the same light emitting layer 3c.

It is preferred that the light emitting layer 3c contains a host compound (also referred to as a light-emitting host) and a light emitting material (also referred to as a light-emitting dopant compound or a guest material), and light is emitted by the light emitting material.

(Host Compound)

It is preferred that the host compound contained in the light emitting layer 3c is a compound whose phosphorescence quantum yield preferably is, when emitting phosphorescence at the room temperature (25° C.), less than 0.1, and further preferably is less than 0.01. Further, it is preferred that the volume ratio of the host compound of the compounds contained in the light emitting layer 3c is 50% or more.

One type of known host compound, or a plurality of types of known host compounds may be used as the host compound. By using a plurality of types of known host compounds, it is possible to adjust the transfer of electrical charges, and it is possible to improve the efficiency of the organic electroluminescence element EL-1. Further, by using a plurality of types of light emitting materials described later, it is possible to mix different colors of emission light, and therefore it is possible to obtain any emission color.

A known low-molecular compound, a high-molecular compound having a repeating unit, or a low-molecular compound having a polymerizable group such as a vinyl group or an epoxy group (a deposition polymerizable emission host) may be used as the host compound.

It is preferred that the known host compound is a compound which has hole transporting capability and electron transporting capability, which prevents increase in emission wavelength, and which has high Tg (glass transition temperature). The glass transition temperature (Tg) herein is a value obtained by using DSC (Differential Scanning Colorimetry) in conformity with JIS-K-7121.

Concrete examples (H1 to H79) of the host compound possible to be used in the present invention are shown below; however, the present invention is not limited thereto. Incidentally, in host compounds H68 to H79, x and y represent ratio of a random copolymer. Such ratio can be set to x:y=1:10, for example.

[Chemical Formula 47]

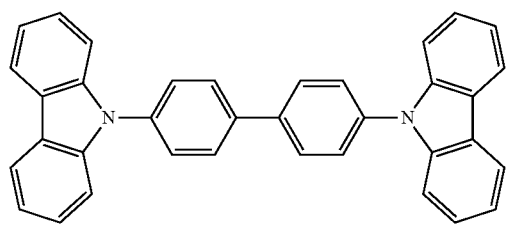

H1

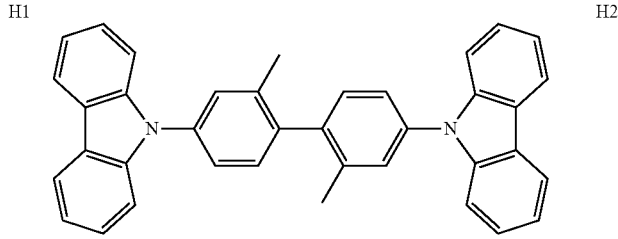

H2

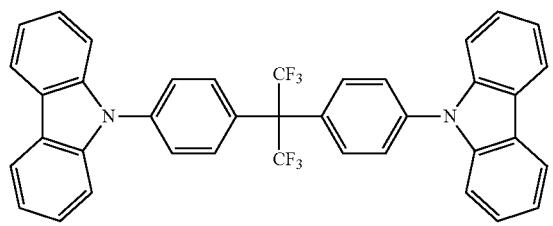

H3

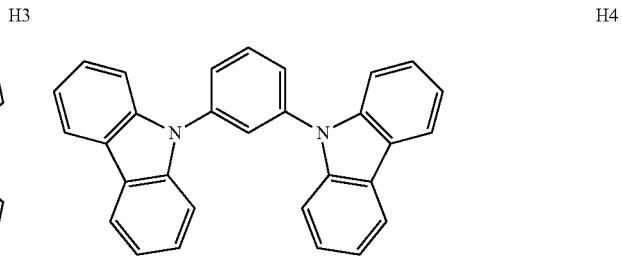

H4

-continued
H5 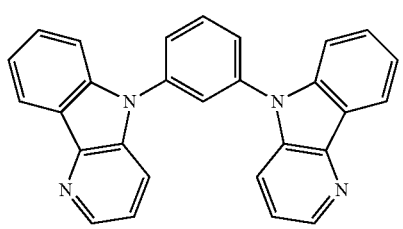
H6 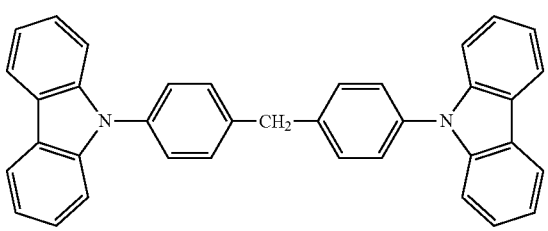
H7 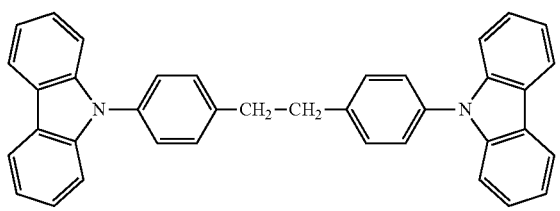
H8 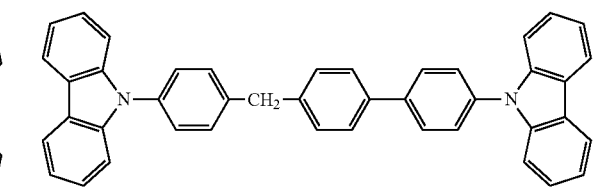
H9 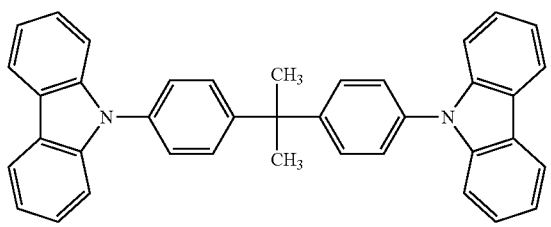
[Chemical Formula 48]
H10 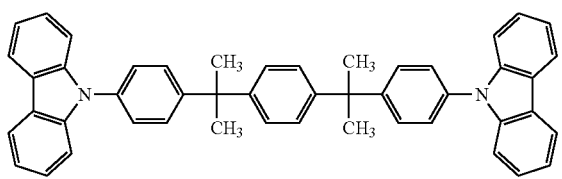
H11 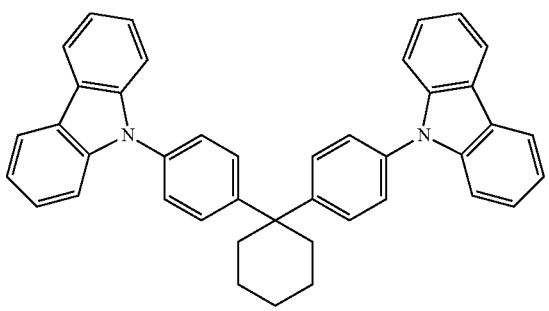
H12 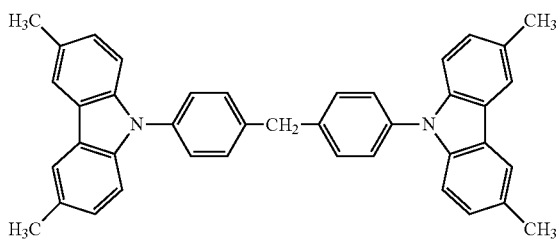
H13 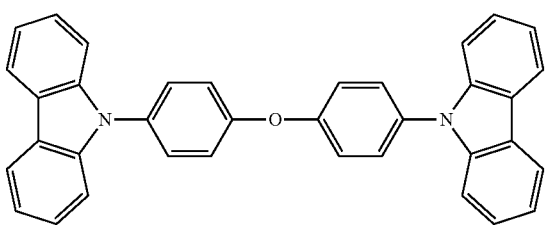

-continued
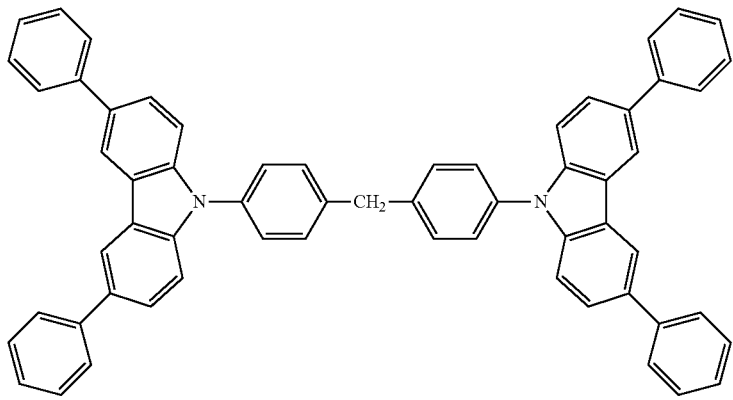
H14
[Chemical Formula 49]
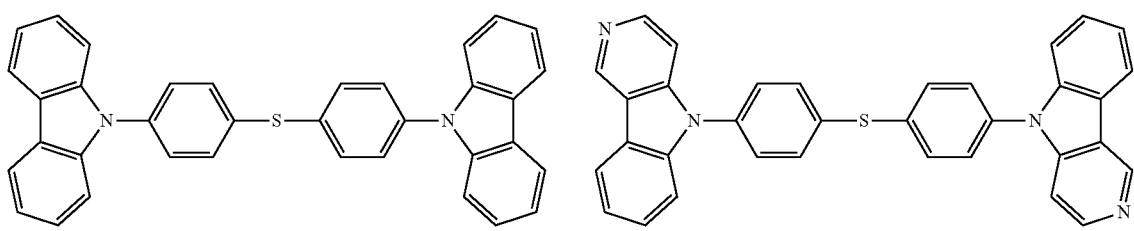
H15   H16
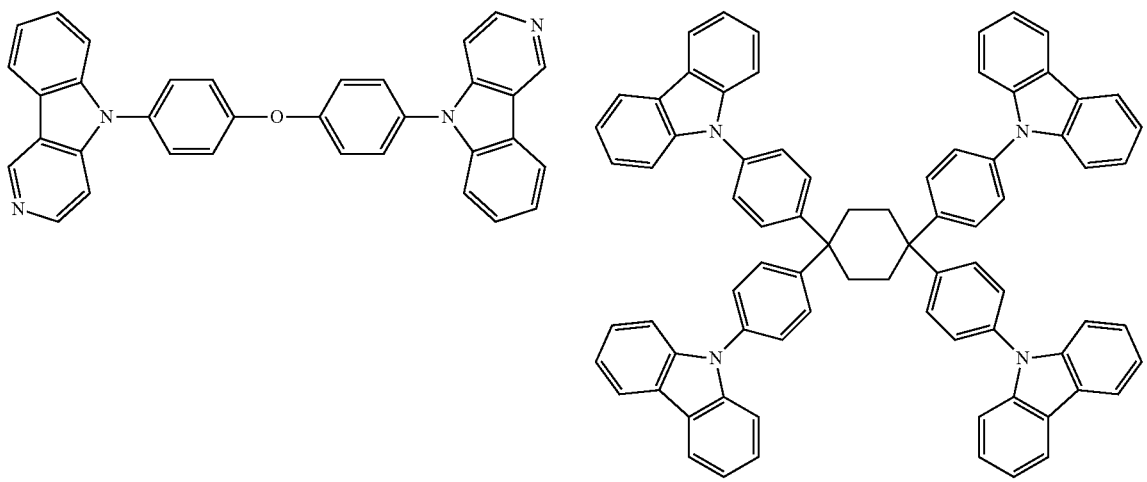
H17   H18
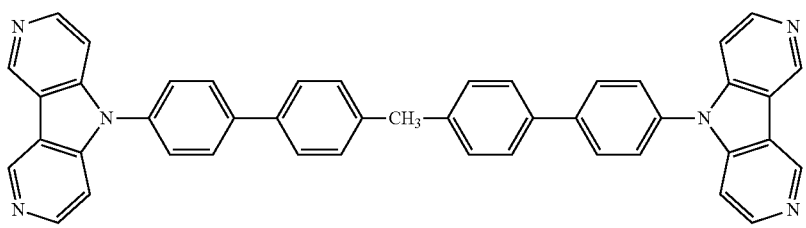
H19

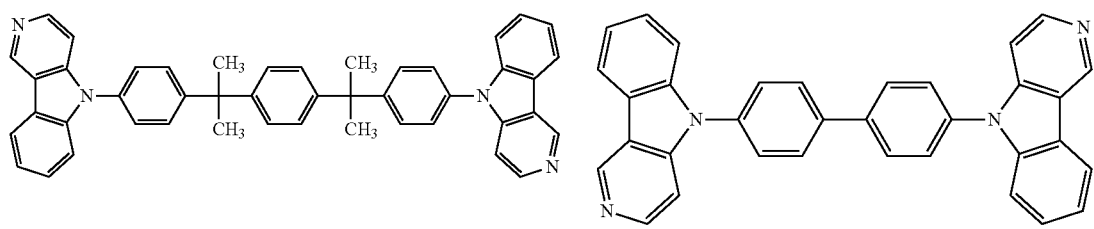
H20
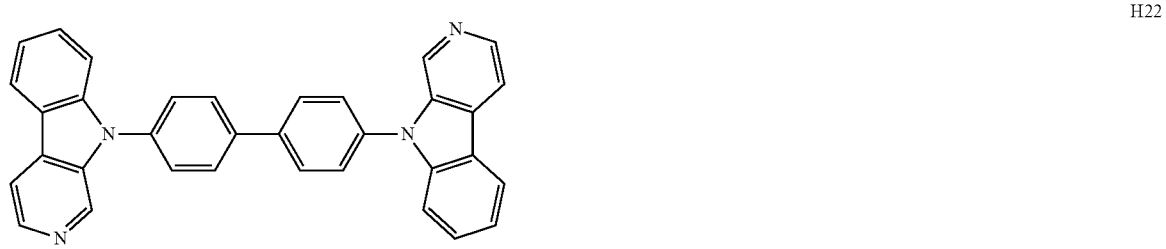
H21
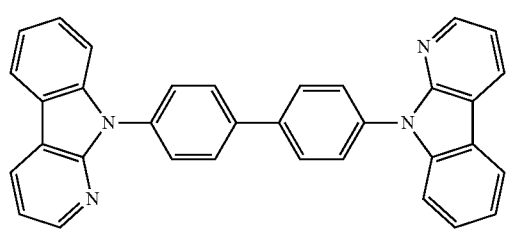
H22
[Chemical Formula 50]
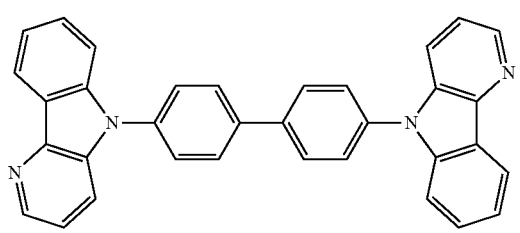
H23
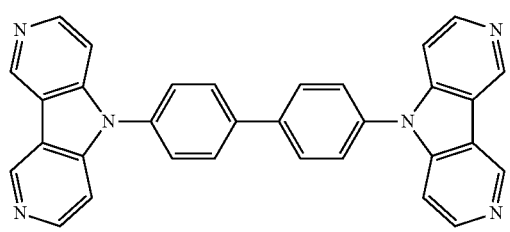
H24
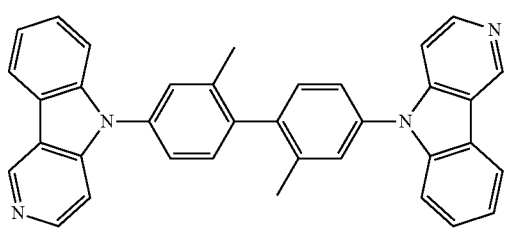
H25
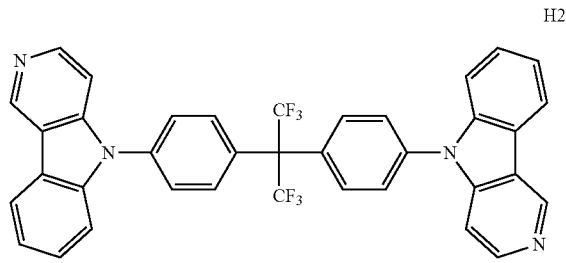
H26
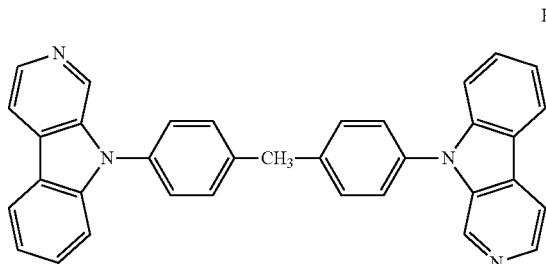
H27
H28

H29 H30
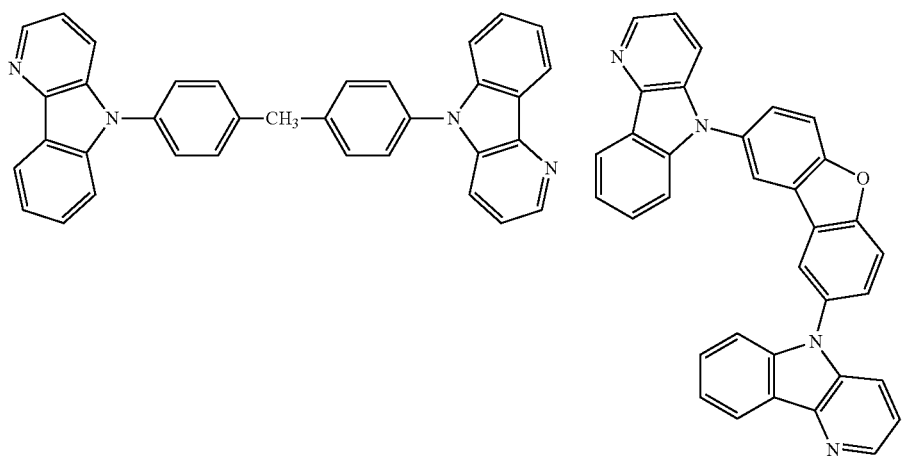
[Chemical Formula 51]
H31 H32
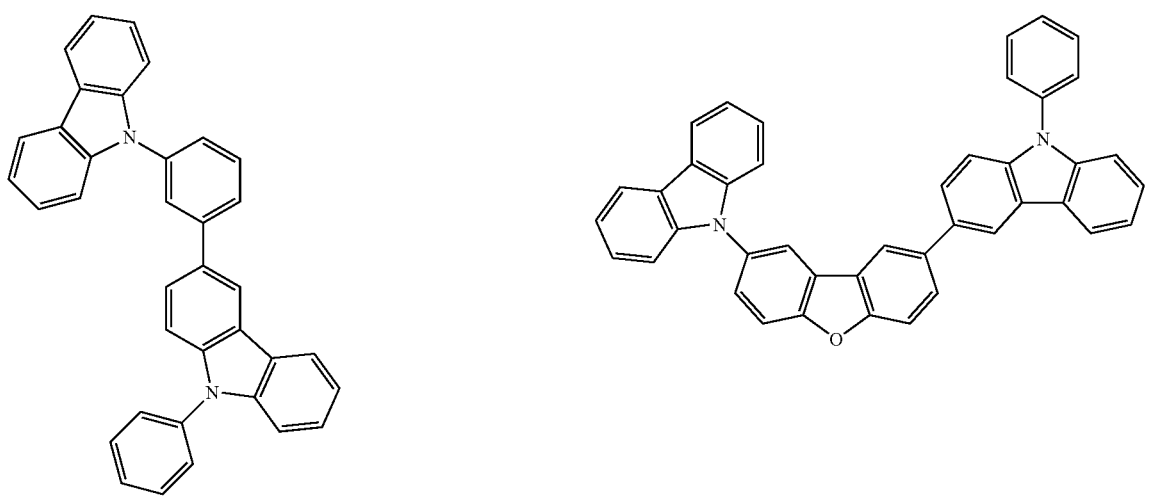
H33
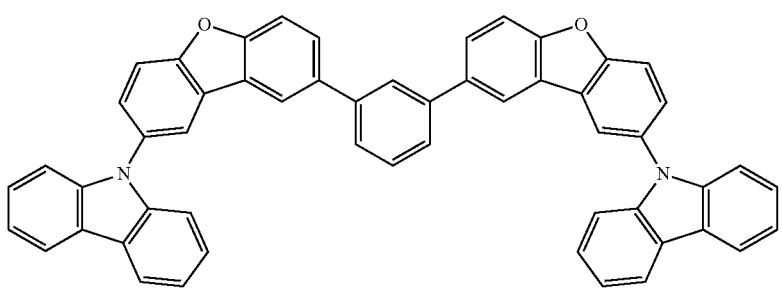
[Chemical Formula 52]
H34
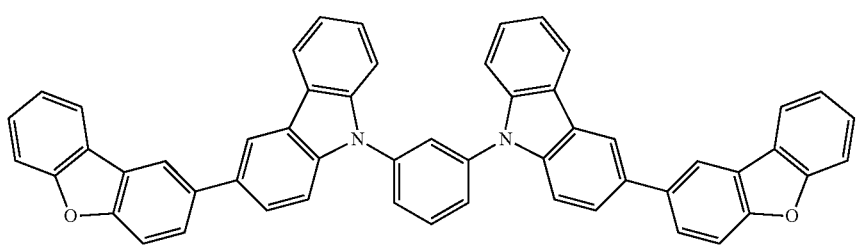

-continued
| H35 | H36 |
|---|---|
| 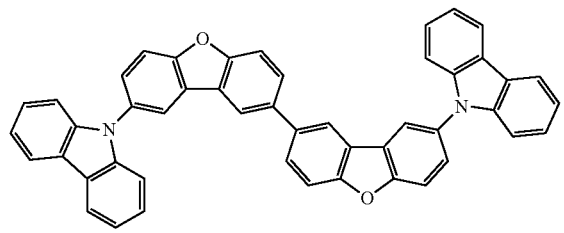 | 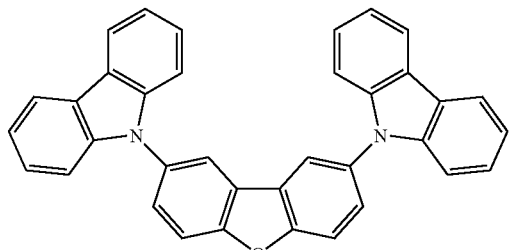 |
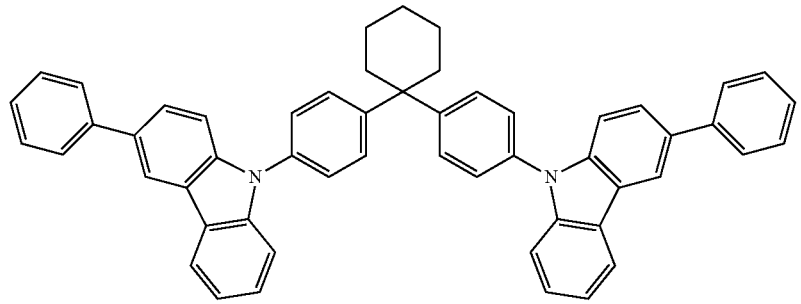
H37
| H38 | H39 |
|---|---|
| 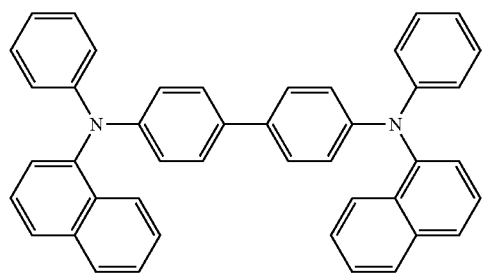 | 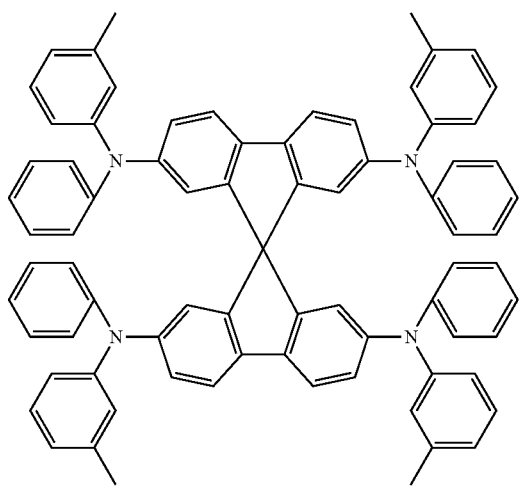 |
[Chemical Formula 53]
| H40 | H41 |
|---|---|
| 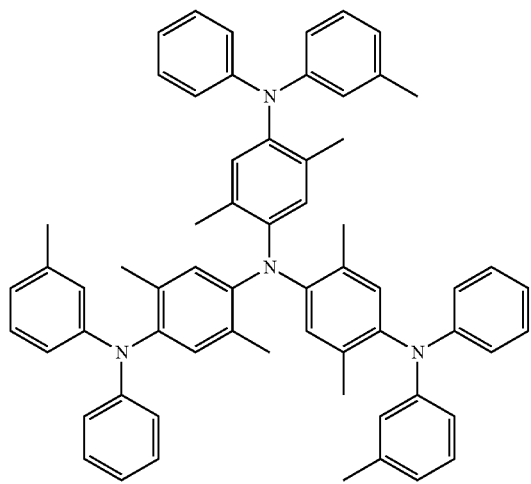 | 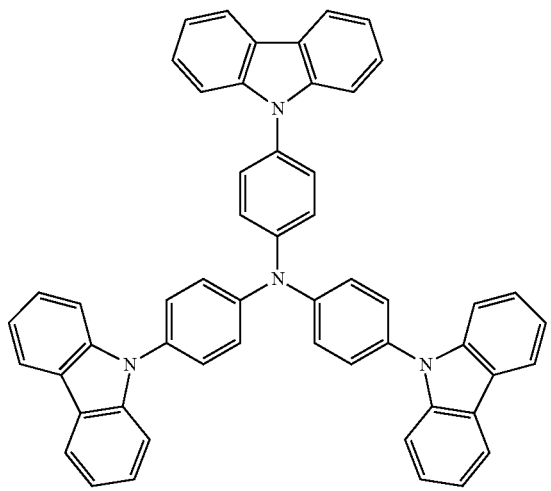 |

-continued
H42
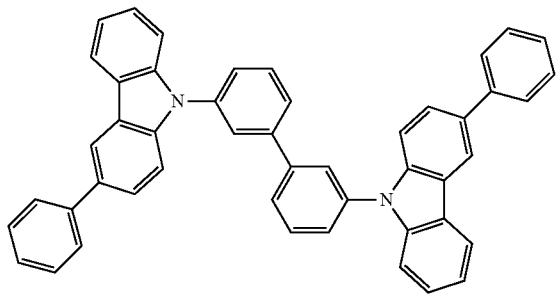
H43
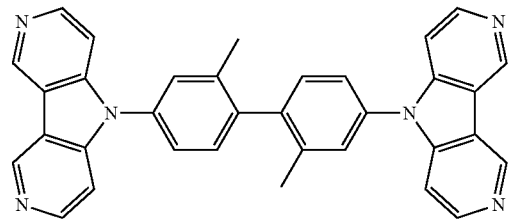
H44
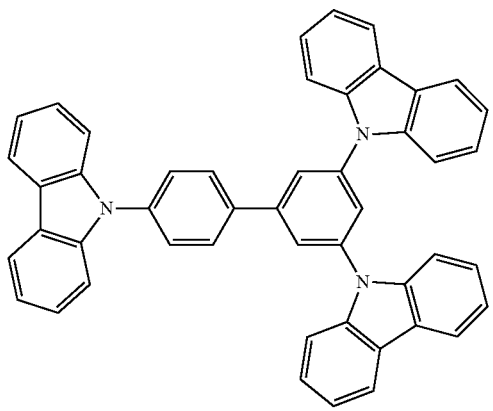
H45
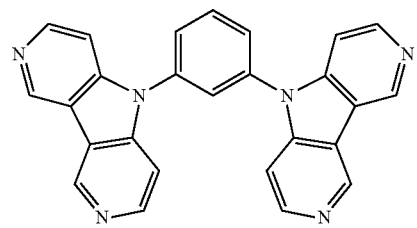
H46
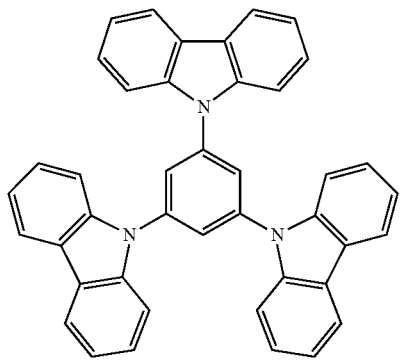
H47
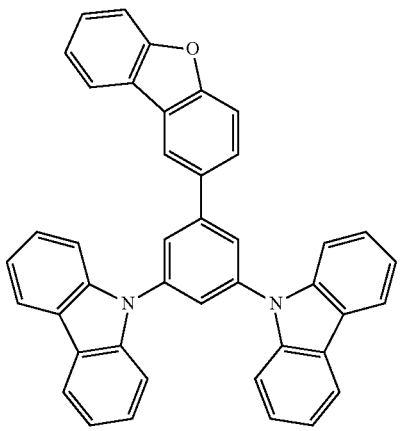
[Chemical Formula 54]
H48
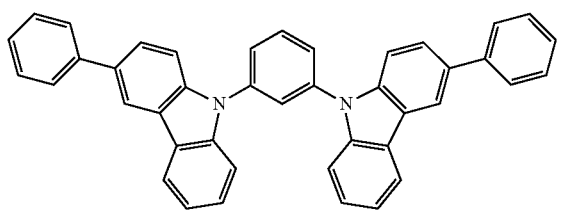
H49
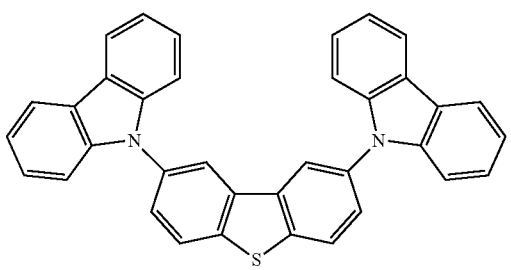

-continued
H50
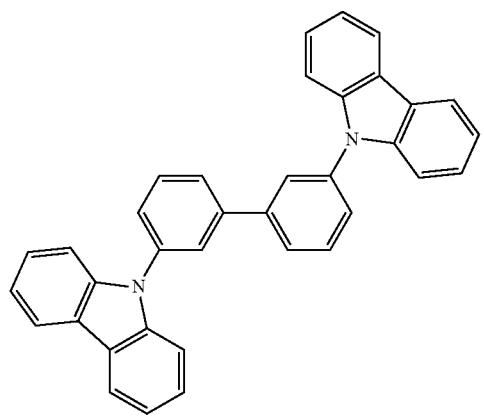
H51
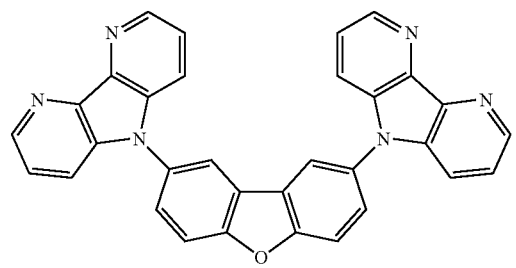
H52
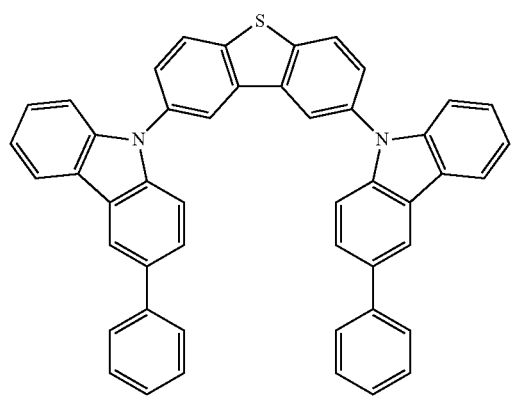
H53
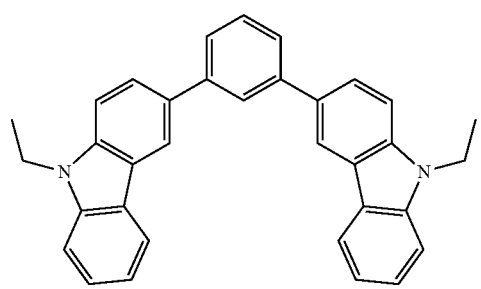
H54
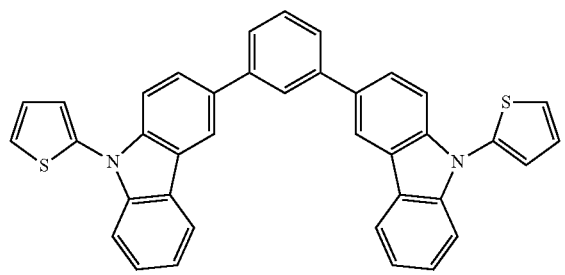
H55
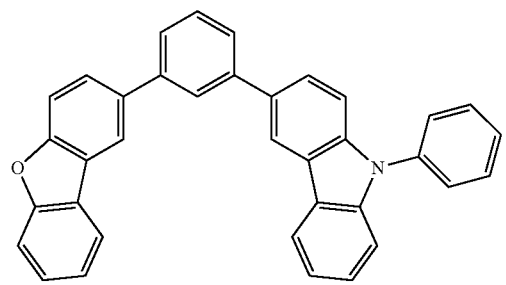
[Chemical Formula 55]
H56
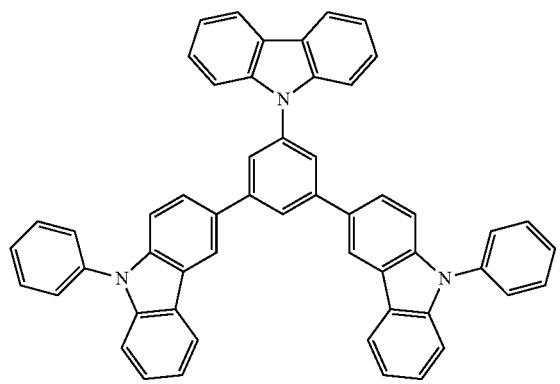
H57
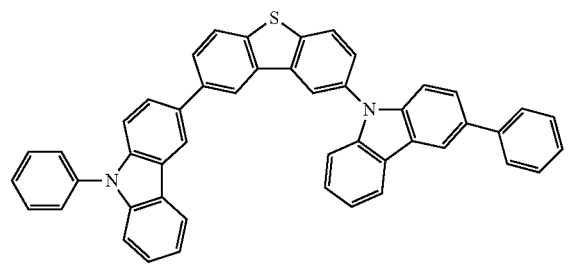

-continued
H58
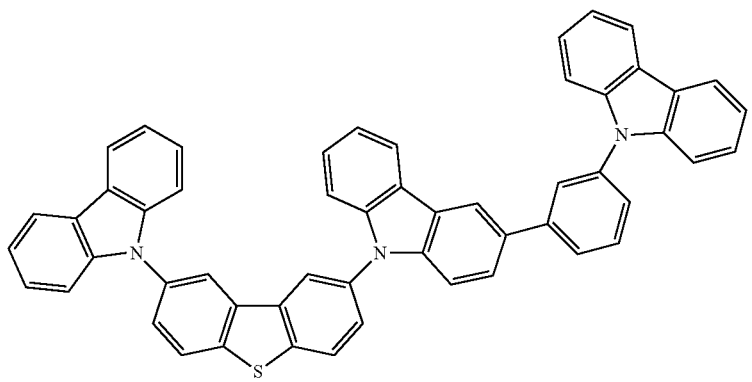
H59
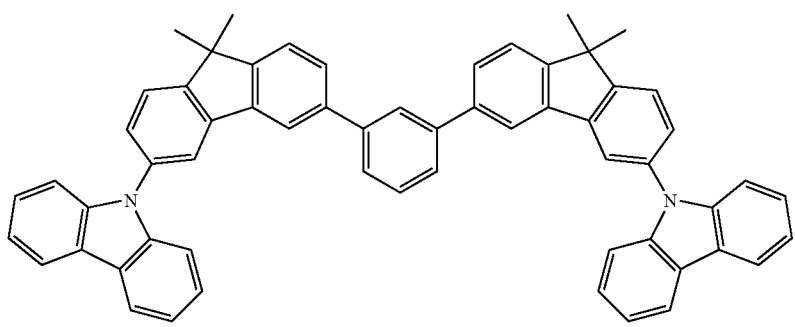
[Chemical Formula 56]
H60
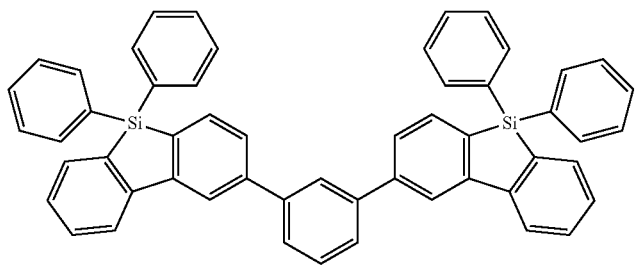
H61
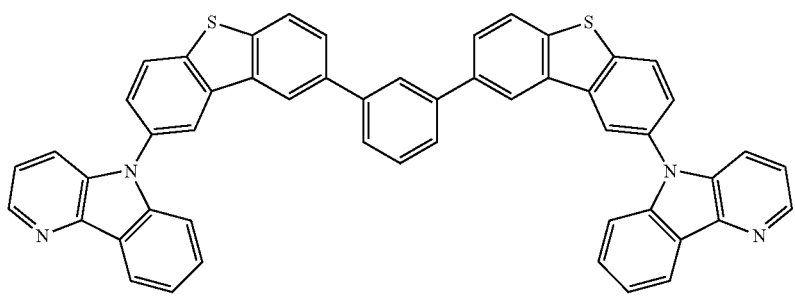
H62
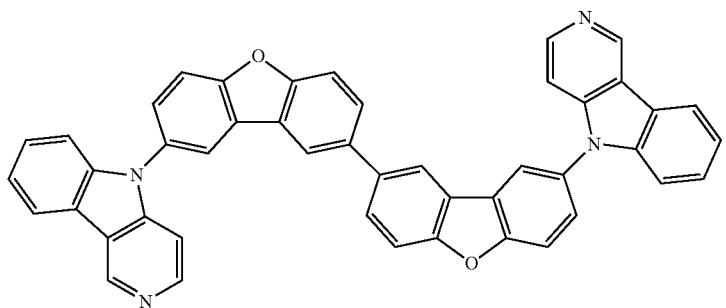

H63
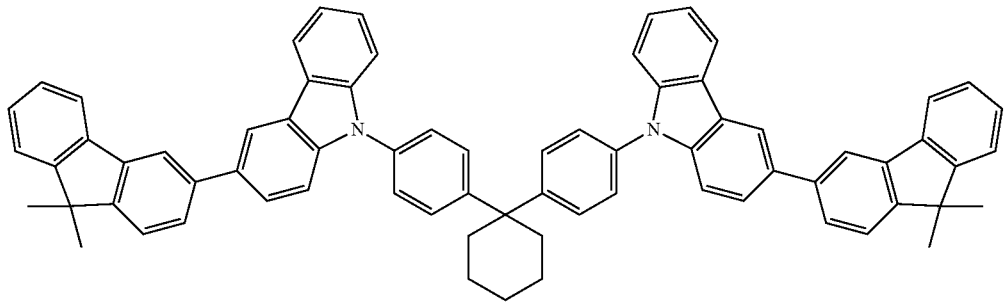
H64
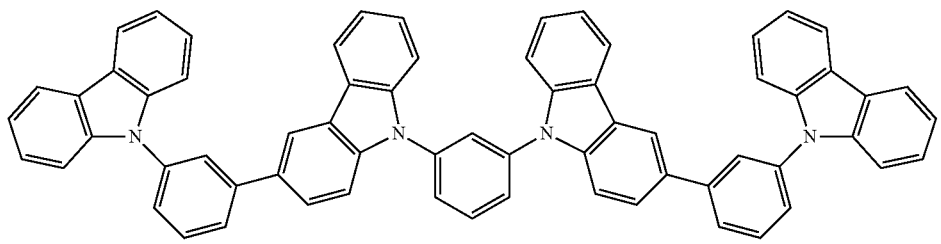
[Chemical Formula 57]
H65
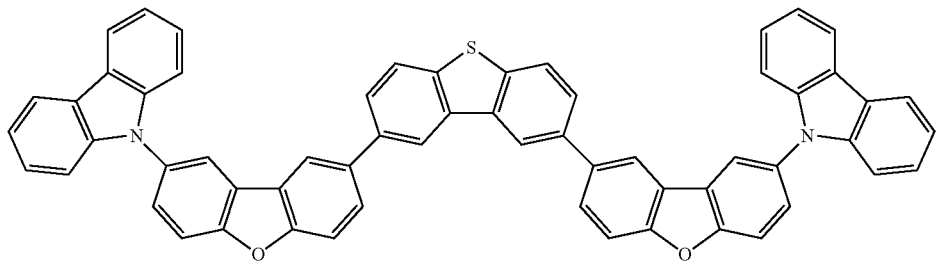
H66
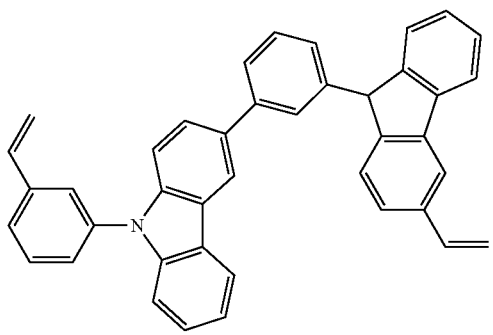
H67
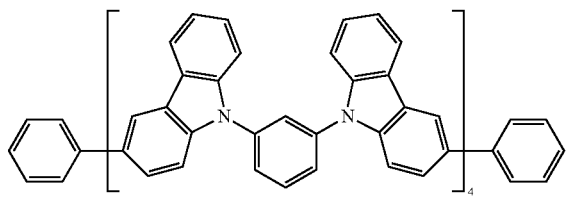

[Chemical Formula 58]
H68
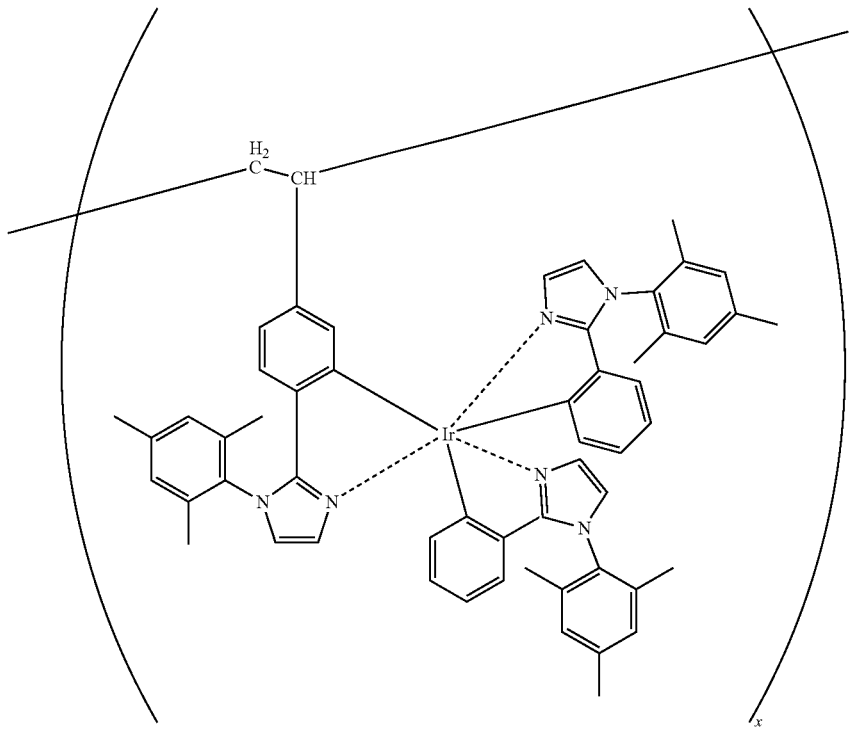
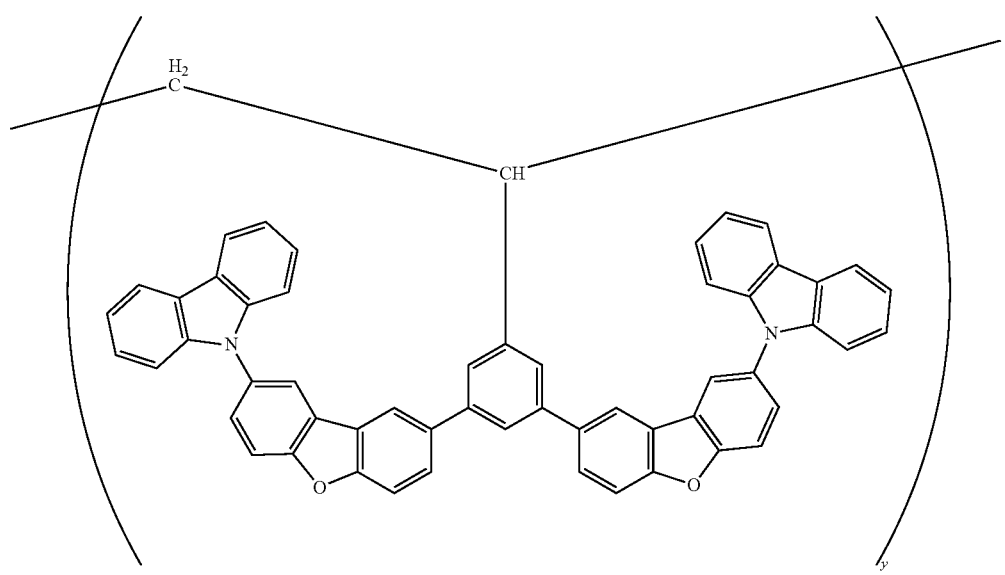
x y + 1 : 10
random co-polymer -continued
[Chemical Formula 59]
H69
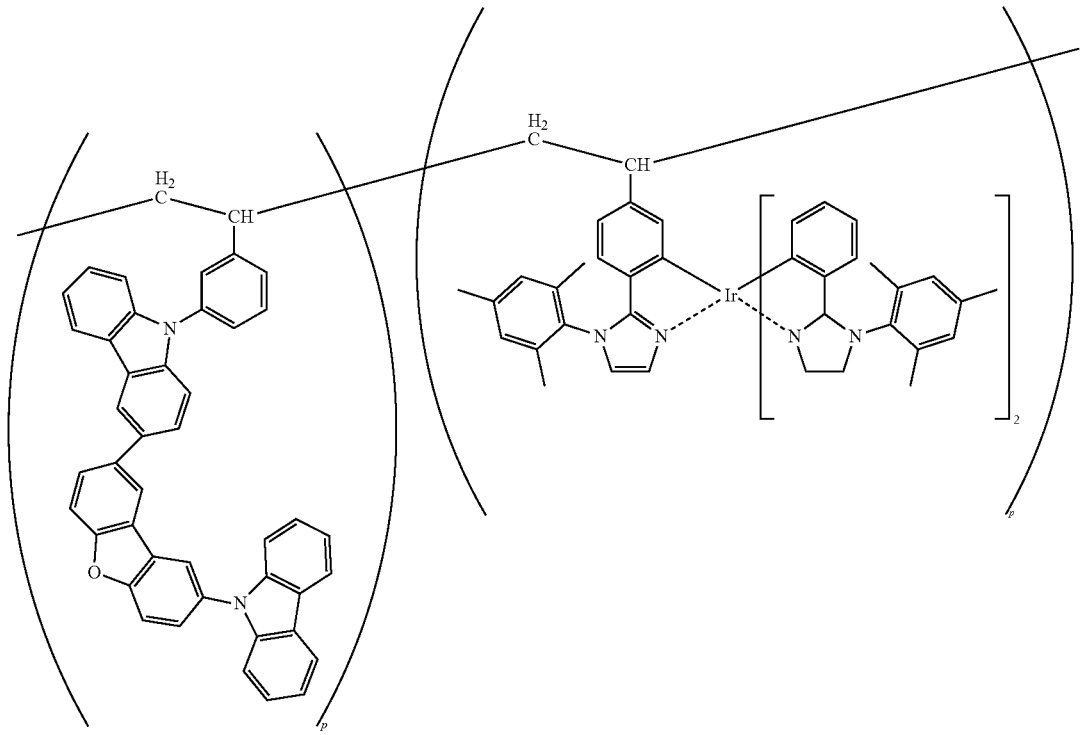
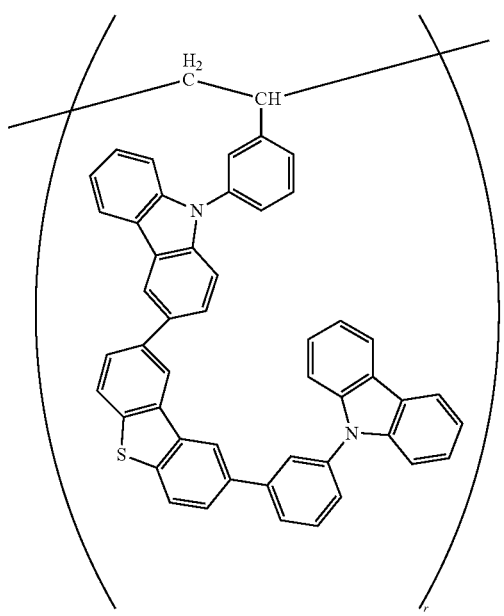

[Chemical Formula 60]
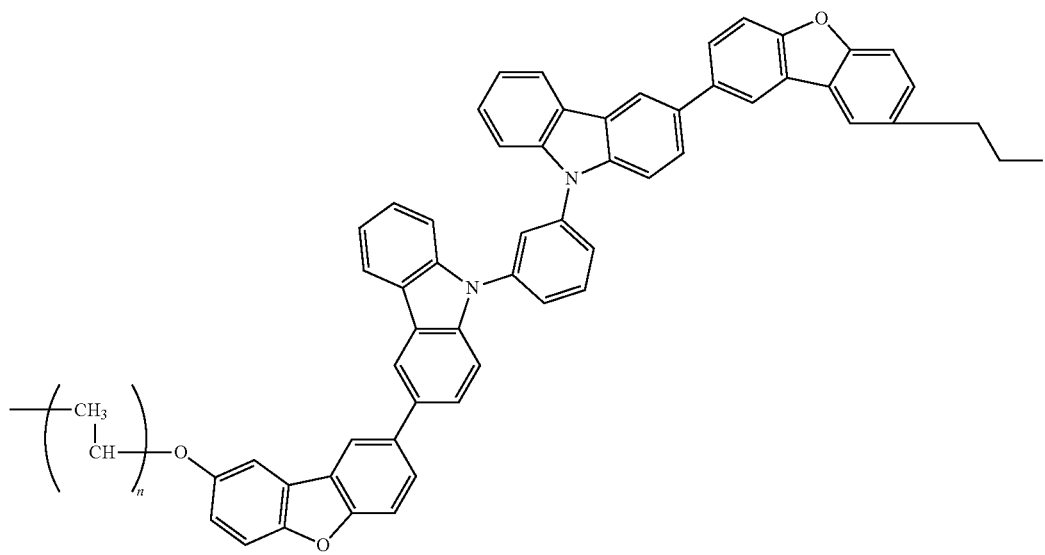
H70
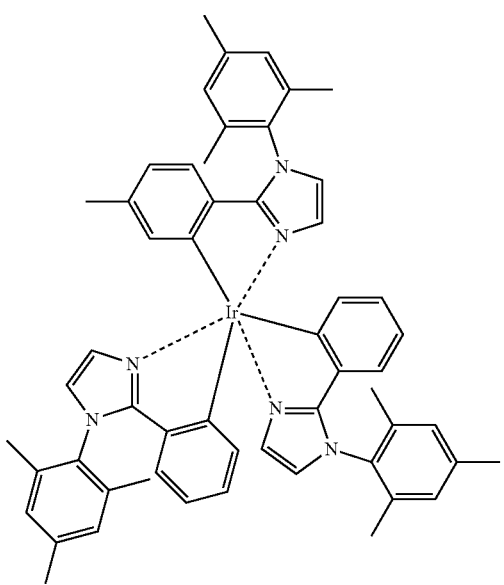
H70
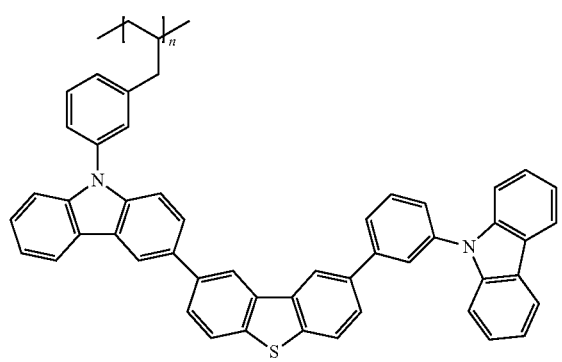
H71
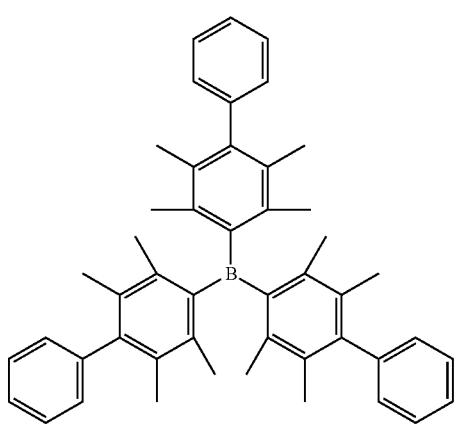
H72

H73
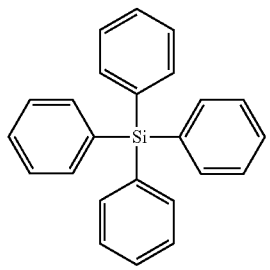

H74
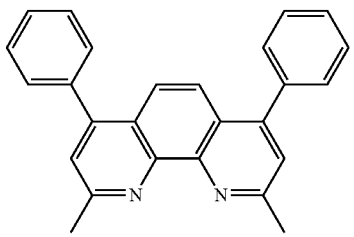

H75
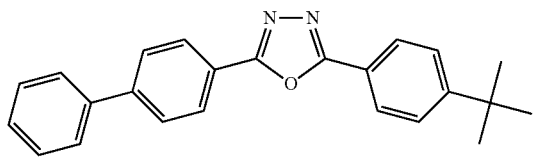

H76
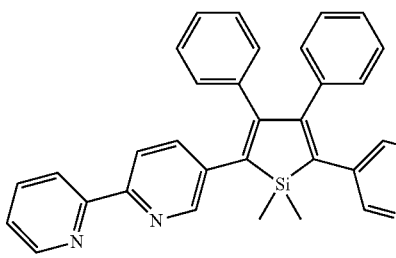

H77
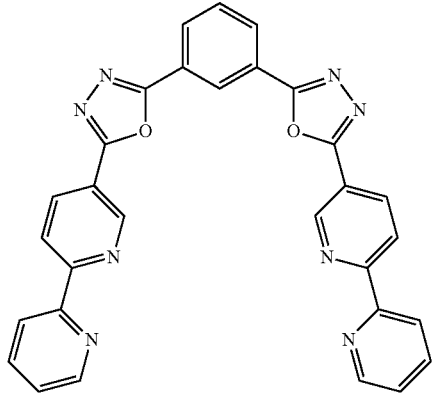

H78
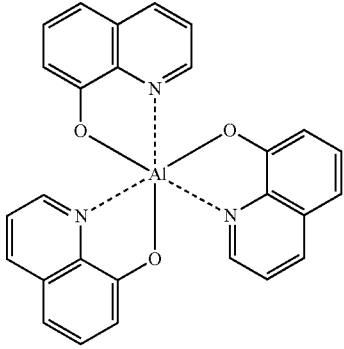

H79
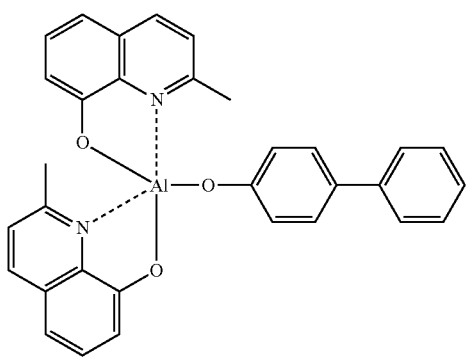

Concrete examples of the known host compound possible to be used are described in the following documents, for example: Japanese Patent Application Laid-Open Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

(Light Emitting Material)

Examples of the light emitting material possible to be used in the present invention include a phosphorescent compound (also referred to as "phosphorescent material").

A phosphorescent compound is a compound in which light emission from an excited triplet state is observed; to be specific, a phosphorescent compound is a compound which emits phosphorescence at room temperature (25° C.) and which exhibits a phosphorescence quantum yield 0.01 or more at 25° C.; however, preferable phosphorescence quantum yield is 0.1 or more.

The phosphorescence quantum yield can be measured by a method described on page 398 of Spectroscopy II of Lecture of Experimental Chemistry, vol. 7, 4th edition) (1992, published by Maruzen Co., Ltd.). The phosphorescence quantum yield in a solution can be measured by using various solvents. In the present invention, in the case where a phosphorescent compound is used, it is only necessary to achieve the aforesaid phosphorescence quantum yield (0.01 or more) with any one arbitrary solvent.

Examples of light-emitting principle of the phosphorescent compound include the following two: one is an energy transfer type, in which carriers recombine on a host compound that transports the carriers, so as to generate an excited state of the host compound, and the energy is transferred to a phosphorescent compound to thereby emit light from the phosphorescent compound; the other is a carrier trap type, wherein a phosphorescent compound serves as a carrier trap, and carriers recombine on the phosphorescent compound to thereby emit light from the phosphorescent compound. In either case, the energy of the phosphorescent compound in excited state is required to be lower than that of the host compound.

The phosphorescent compound can be suitably selected from the known phosphorescent compounds used for the light emitting layer of a generic organic electroluminescence element; the phosphorescent compound is preferably a complex compound containing a metal of groups 8 to 10 in the periodic table of elements, and further preferably an iridium compound, an osmium compound, a platinum compound (a platinum complex compound) or a rare-earth complex, and most preferably an iridium compound.

In the present invention, at least one light emitting layer $3c$ may contain two or more types of phosphorescent compounds, and the ratio of concentration of the phosphorescent compounds contained in the light emitting layer $3c$ may vary in a direction of the thickness of the light emitting layer $3c$.

It is preferred that the content of the phosphorescent compounds is equal to or higher than 0.1 vol. % but less than 30 vol. % of the total amount of the light emitting layer $3c$.

(Compound Represented by General Formula (7))

It is preferred that the compound (i.e., the phosphorescent compound) contained in the light emitting layer $3c$ is a compound represented by the following General Formula (7).

It is preferred that the phosphorescent compound (also referred to as "phosphorescent metal complex") represented by General Formula (7) is contained in the light emitting layer $3c$ of the organic electroluminescence element EL-1 as a light-emitting dopant; however, the phosphorescent compound may also be contained in other layer(s) of the light-emitting functional layer than the light emitting layer $3c$.

[Chemical Formula 62]

General Formula (7)

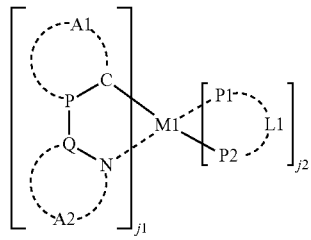

In General Formula (7), P and Q each represent a carbon atom or a nitrogen atom; A1 represents an atom group which forms an aromatic hydrocarbon ring or an aromatic heterocycle with P—C; A2 represents an atom group which forms an aromatic heterocycle with Q-N; P1-L1-P2 represents a bidentate ligand, wherein P1 and P2 each independently represent a carbon atom, a nitrogen atom or an oxygen atom, and L1 represents an atom group which forms the bidentate ligand with P1 and P2; j1 represents an integer of 1 to 3, and j2 represents an integer of 0 to 2, wherein the sum of j1 and j2 is 2 or 3; and M1 represents a transition metal element of groups 8 to 10 in the periodic table of elements.

In General Formula (7), P and Q each represent a carbon atom or a nitrogen atom.

Examples of the aromatic hydrocarbon ring which is formed by A1 with P—C in General Formula (7) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthranthrene ring and the like.

Each of these rings may further have a substituent exemplified as R11, R12 of General Formula (1).

Examples of an aromatic heterocycle which is formed by A1 with P—C in General Formula (7) include a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, a benzimidazole ring, a benzothiazole ring, a benzoxazole ring, a quinoxaline ring, a quinazoline ring, a phthalazine ring, a carbazole ring and an azacarbazole ring.

Here, the azacarbazole ring indicates a ring formed by substituting at least one of carbon atoms of a benzene ring constituting a carbazole ring with a nitrogen atom.

Each of these rings may further have a substituent exemplified as R11, R12 of General Formula (1).

Examples of the aromatic heterocycle which is formed by A2 with Q-N in General Formula (7) include an oxazole ring, an oxadiazole ring, an oxatriazole ring, an isoxazole ring, a tetrazole ring, a thiadiazole ring, a thiatriazole ring, an isothiazole ring, a pyrrole ring, a pyridine ring, a pyridazine ring, a pyrimidine ring, a pyrazine ring, a triazine ring, an imidazole ring, a pyrazole ring, a triazole ring and the like.

Each of these rings may further have a substituent exemplified as R11, R12 of General Formula (1).

In General Formula (7), P1-L1-P2 represents a bidentate ligand, wherein P1 and P2 each independently represent a carbon atom, a nitrogen atom or an oxygen atom, and L1 represents an atom group which forms the bidentate ligand with P1 and P2.

Examples of the bidentate ligand represented by P1-L1-P2 include phenylpyridine, phenylpyrazole, phenylimidazole, phenyltriazole, phenyltetrazole, pyrazabole, acetylacetone, picolinic acid and the like.

In General Formula (7), j1 represents an integer of 1 to 3, j2 represents an integer of 0 to 2, and the sum of j1 and j2 is 2 or 3, wherein it is preferred that j2 is 0.

In General Formula (7), M1 represents a transition metal element (also simply referred to as transition metal) of groups 8 to 10 in the periodic table of elements, wherein it is preferred that transition metal element is iridium.

(Compound Represented by General Formula (8))

Among the compounds represented by General Formula (7), a compound represented by the following General Formula (8) is further preferable.

[Chemical Formula 63]

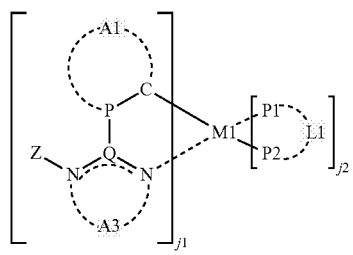

General Formula (8)

In General Formula (8), Z represents a hydrocarbon ring group or a heterocyclic group; P and Q each represent a carbon atom or a nitrogen atom; A1 represents an atom group which forms an aromatic hydrocarbon ring or an aromatic heterocycle with P—C; A3 represents —C(R01)=C(R02)-, —N=C(R02)-, —C(R01)=N— or —N=N—, wherein R01 and R02 each represent a hydrogen atom or a substituent; P1-L1-P2 represents a bidentate ligand, wherein P1 and P2 each independently represent a carbon atom, a nitrogen atom or an oxygen atom, L1 represents an atom group which forms the bidentate ligand with P1 and P2; j1 represents an integer of 1 to 3, and j2 represents an integer of 0 to 2, wherein the sum of j1 and j2 is 2 or 3; and M1 represents a transition metal element of groups 8 to 10 in the periodic table of elements.

Examples of the hydrocarbon ring group represented by Z in General Formula (8) include a non-aromatic hydrocarbon ring group and an aromatic hydrocarbon ring group, wherein examples of the non-aromatic hydrocarbon ring group include a cyclopropyl group, a cyclopentyl group, a cyclohexyl group and the like. Each of these groups may be an unsubstituted group, or may have a substituent exemplified as R11, R12 of General Formula (1).

Examples of the aromatic hydrocarbon ring group (also referred to as aromatic hydrocarbon group, aryl group or the like) include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenyl group and the like.

Each of these groups may be an unsubstituted group, or may have a substituent exemplified as R11, R12 of General Formula (1).

Examples of a heterocyclic group represented by Z in General Formula (8) include a non-aromatic heterocyclic group and an aromatic heterocyclic group; wherein examples of the non-aromatic heterocyclic group include an epoxy ring, an aziridine ring, a thiirane ring, an oxetane ring, an azetidine ring, a thietane ring, a tetrahydrofuran ring, a dioxorane ring, a pyrrolidine ring, a pyrazolidine ring, an imidazolidine ring, an oxazolidine ring, a tetrahydrothiophene ring, a sulforane ring, a thiazolidine ring, an ε-caprolactone ring, an ε-caprolactam ring, a piperidine ring, a hexahydropyridazine ring, a hexahydropyrimidine ring, a piperazine ring, a morpholine ring, a tetrahydropyrane ring, a 1,3-dioxane ring, a 1,4-dioxane ring, a trioxane ring, a tetrahydrothiopyrane ring, a thiomorpholine ring, a thiomorpholine-1,1-dioxide ring, a pyranose ring and a diazabicyclo[2,2,2]-octane ring.

Each of these groups may be an unsubstituted group, or may have a substituent exemplified as R11, R12 of General Formula (1).

Examples of the aromatic heterocyclic group include a pyridyl group, a pyrimidinyl group, a furyl group, a pyrrolyl group, an imidazolyl group, a benzimidazolyl group, a pyrrazolyl group, a pyradinyl group, a triazolyl group (for example, a 1,2,4-triazole-1-yl group, a 1,2,3-triazole-1-yl group and the like), an oxazolyl group, a benzoxazolyl group, a triazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring formed by substituting one of carbon atoms constituting a carboline ring of a carbolinyl group with a nitrogen atom), a quinoxalinyl group, a pyridazinyl group, a triazinyl group, a quinazolinyl group, a phthalazinyl group and the like.

Each of these groups may be an unsubstituted group, or may have a substituent exemplified as R11, R12 of General Formula (1).

The group represented by Z is preferably an aromatic hydrocarbon ring group or an aromatic heterocyclic group.

Examples of the aromatic hydrocarbon ring which is formed by A1 with P—C in General Formula (8) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthranthrene ring and the like.

Each of these rings may further have a substituent exemplified as R11, R12 of General Formula (1).

Examples of an aromatic heterocycle which is formed by A1 with P—C in General Formula (8) include a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, a benzimidazole ring, a benzothiazole ring, a benzoxazole ring, a quinoxaline ring, a quinazoline ring, a phthalazine ring, a carbazole ring, a carboline ring and an azacarbazole ring.

Here, the azacarbazole ring indicates a ring formed by substituting at least one of carbon atoms of a benzene ring constituting a carbazole ring with a nitrogen atom.

Each of these rings may further have a substituent exemplified as R11, R12 of General Formula (1).

The substituent represented by each of R01 and R02 in —C(R01)=C(R02)-, —N=C(R02)- and —C(R01)=N— represented by A3 in General Formula (8) is synonymous with the substituent exemplified as R11, R12 of General Formula (1).

Examples of the bidentate ligand represented by P1-L1-P2 in General Formula (8) include phenylpyridine, phenylpyrazole, phenylimidazole, phenyltriazole, phenyltetrazole, pyrazabole, acetylacetone, picolinic acid and the like.

Further, j1 represents an integer of 1 to 3, j2 represents an integer of 0 to 2, and the sum of j1 and j2 is 2 or 3, wherein it is preferred that j2 is 0.

The transition metal element (also simply referred to as transition metal) of groups 8 to 10 in the periodic table of elements represented by M1 in General Formula (8) is synonymous with the transition metal element of groups 8 to 10 in the periodic table of elements represented by M1 in General Formula (7).

(Compound Represented by General Formula (9))

A compound represented by the following General Formula (9) is one of preferable examples of the compounds represented by General Formula (8).

[Chemical Formula 64]

General Formula (9)

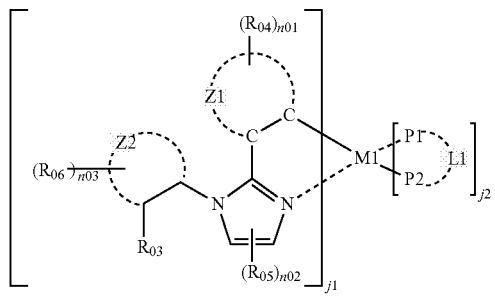

In General Formula (9), $R_{03}$ represents a substituent, $R_{04}$ represents a hydrogen atom or a substituent, and a plurality of $R_{04}$ may be bonded to each other to form a ring; n01 represents an integer of 1 to 4; $R_{05}$ represents a hydrogen atom or a substituent, and a plurality of $R_{05}$ may be bonded to each other to form a ring; n02 represents an integer of 1 to 2; $R_{06}$ represents a hydrogen atom or a substituent, and a plurality of $R_{06}$ may be bonded to each other to form a ring; n03 represents an integer of 1 to 4; Z1 represents an atom group necessary to form, along with C—C, a 6-membered aromatic hydrocarbon ring, or a 5-membered or 6-membered aromatic heterocycle; Z2 represents an atom group necessary to form a hydrocarbon ring group or a heterocyclic group; P1-L1-P2 represents a bidentate ligand, wherein P1 and P2 each independently represent a carbon atom, a nitrogen atom or an oxygen atom, and L1 represents an atom group which forms the bidentate ligand with P1 and P2; j1 represents an integer of 1 to 3, and j2 represents an integer of 0 to 2, wherein the sum of j1 and j2 is 2 or 3; and M1 represents a transition metal element of groups 8 to 10 in the periodic table of elements. $R_{03}$ and $R_{06}$ may be bonded to each other to form a ring, $R_{04}$ and $R_{06}$ may be bonded to each other to form a ring, and $R_{05}$ and $R_{06}$ may be bonded to each other to form a ring.

In General Formula (9), the substituent represented by each of the $R_{03}$, $R_{04}$, $R_{05}$, $R_{06}$ may have a substituent exemplified as R11, R12 of General Formula (1).

Examples of the 6-membered aromatic hydrocarbon ring which is formed by Z1 with C—C in General Formula (9) include a benzene ring and the like.

Each of these rings may further have a substituent exemplified as R11, R12 of General Formula (1).

Examples of the 5-membered or 6-membered aromatic heterocycle which is formed by Z1 with C—C in General Formula (9) include an oxazole ring, an oxadiazole ring, an oxatriazole ring, an isoxazole ring, a tetrazole ring, a thiadiazole ring, a thiatriazole ring, an isothiazole ring, a thiophene ring, furan ring, a pyrrole ring, a pyridine ring, a pyridazine ring, a pyrimidine ring, a pyrazine ring, a triazine ring, an imidazole ring, a pyrazole ring and a triazole ring.

Each of these rings may further have a substituent exemplified as R11, R12 of General Formula (1).

Examples of the hydrocarbon ring group represented by Z2 in General Formula (9) include a non-aromatic hydrocarbon ring group and an aromatic hydrocarbon ring group, wherein examples of the non-aromatic hydrocarbon ring group include a cyclopropyl group, a cyclopentyl group, a cyclohexyl group and the like. Each of these groups may be an unsubstituted group, or may have a substituent exemplified as R11, R12 of General Formula (1).

Examples of the aromatic hydrocarbon ring group (also referred to as aromatic hydrocarbon group, aryl group or the like) include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenyl group and the like. Each of these groups may be an unsubstituted group, or may have a substituent exemplified as R11, R12 of General Formula (1).

Examples of a heterocyclic group represented by Z2 in General Formula (9) include a non-aromatic heterocyclic group and an aromatic heterocyclic group; wherein examples of the non-aromatic heterocyclic group include an epoxy ring, an aziridine ring, a thiirane ring, an oxetane ring, an azetidine ring, a thietane ring, a tetrahydrofuran ring, a dioxorane ring, a pyrrolidine ring, a pyrazolidine ring, an imidazolidine ring, an oxazolidine ring, a tetrahydrothiophene ring, a sulforane ring, a thiazolidine ring, an ε-caprolactone ring, an ε-caprolactam ring, a piperidine ring, a hexahydropyridazine ring, a hexahydropyrimidine ring, a piperazine ring, a morpholine ring, a tetrahydropyrane ring, a 1,3-dioxane ring, a 1,4-dioxane ring, a trioxane ring, a tetrahydrothiopyrane ring, a thiomorpholine ring, a thiomorpholine-1,1-dioxide ring, a pyranose ring and a diazabicyclo[2,2,2]-octane ring. Each of these groups may be an unsubstituted group, or may have a substituent exemplified as R11, R12 of General Formula (1).

Examples of the aromatic heterocyclic group include a pyridyl group, a pyrimidinyl group, a furyl group, a pyrrolyl group, an imidazolyl group, a benzimidazolyl group, a pyrazolyl group, a pyradinyl group, a triazolyl group (for example, a 1,2,4-triazole-1-yl group, a 1,2,3-triazole-1-yl group and the like), an oxazolyl group, a benzoxazolyl group, a triazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring formed by substituting one of carbon atoms constituting a carboline ring of a carbolinyl group with a nitrogen atom), a quinoxalinyl group, a pyridazinyl group, a triazinyl group, a quinazolinyl group, a phthalazinyl group and the like.

Each of these rings may be an unsubstituted ring, or may have a substituent exemplified as R11, R12 of General Formula (1).

It is preferred that, in General Formula (9), the group formed by Z1 and Z2 is a benzene ring.

The bidentate ligand represented by P1-L1-P2 in General Formula (9) is synonymous with the bidentate ligand represented by P1-L1-P2 in General Formula (7).

The transition metal element of groups 8 to 10 in the periodic table of elements represented by M1 in General Formula (9) is synonymous with the transition metal element of groups 8 to 10 in the periodic table of elements represented by M1 in General Formula (7).

The phosphorescent compound may be suitably selected from the known phosphorescent compounds used for the light emitting layer 3c of the organic electroluminescence element EL-1.

The phosphorescent compound of the present invention is preferably a complex compound containing a metal of groups 8 to 10 in the periodic table of elements, further preferably an iridium compound, an osmium compound, a platinum compound (a platinum complex compound) or a rare-earth complex, and most preferably an iridium compound.

Concrete examples (Pt-1 to Pt-3, A-1, Ir-1 to Ir-50) of the phosphorescent compound of the present invention are shown below; however, the present invention is not limited thereto. Note that, in these compounds, m and n each represent number of replication.

[Chemical Formula 65]

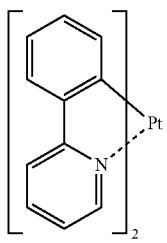
Pt-1

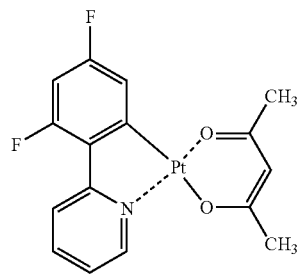
Pt-2

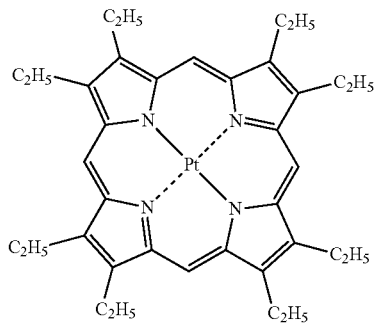
Pt-3

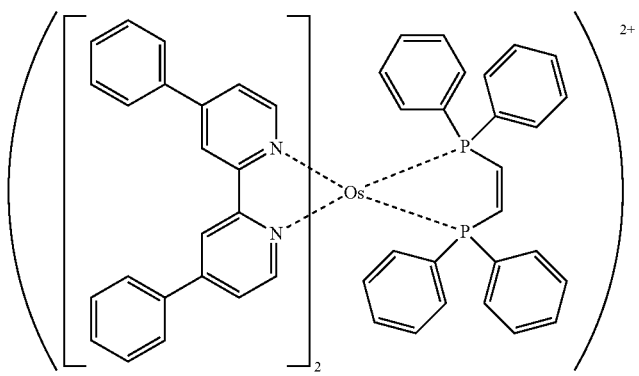
A1

[Chemical Formula 66]

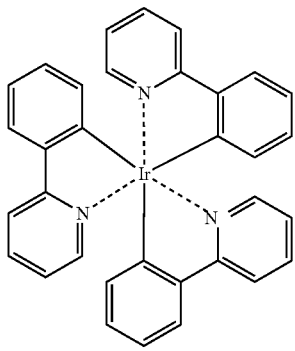
Ir-1

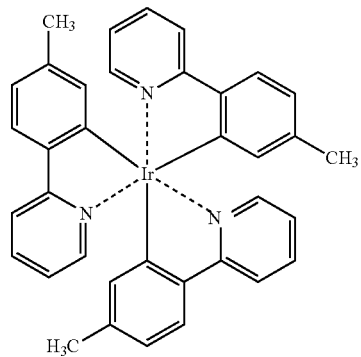
Ir-2

-continued
Ir-3
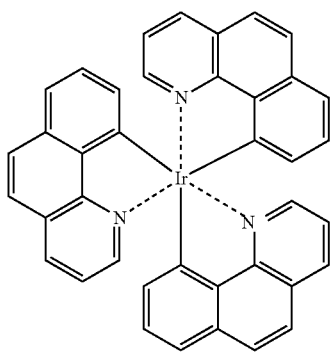
Ir-4
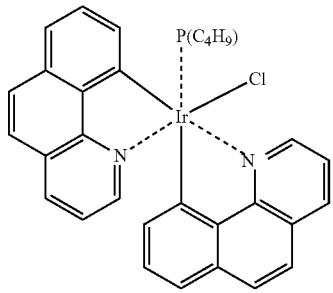
Ir-5
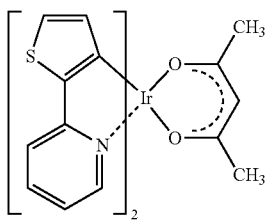
Ir-6
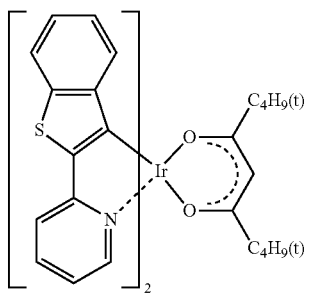
[Chemical Formula 67]
Ir-7
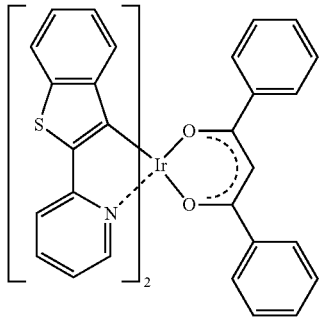
Ir-8
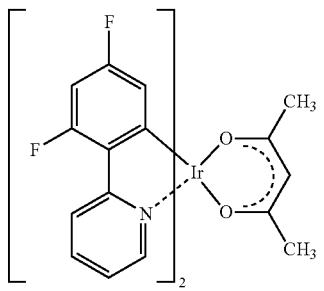
Ir-9
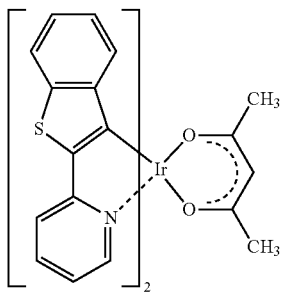
Ir-10
Ir-11
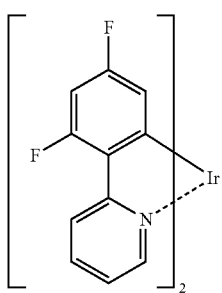
Ir-12
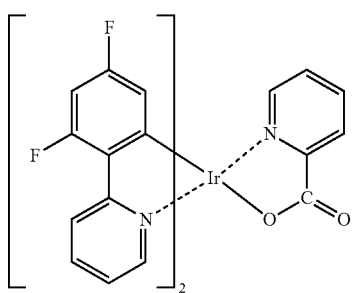

-continued
Ir-13
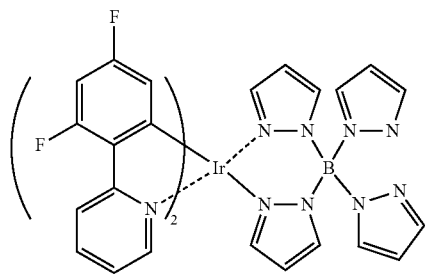
Ir-14
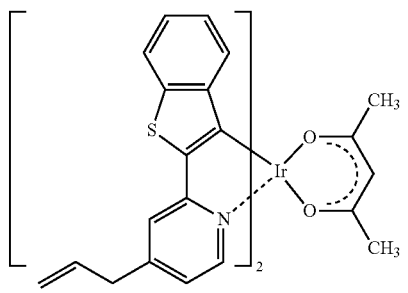
[Chemical Formula 68]
Ir-15
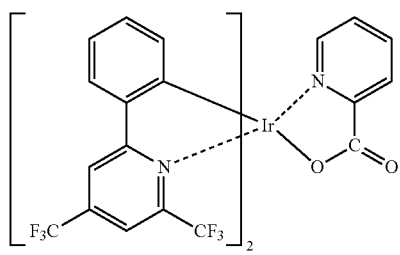
Ir-16
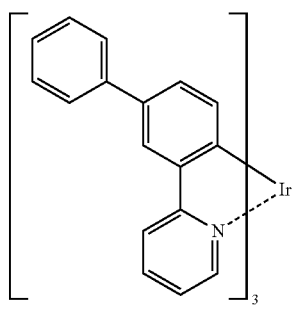
Ir-17
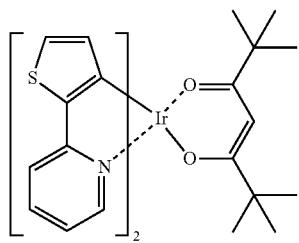
Ir-18
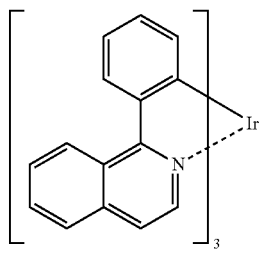
Ir-19
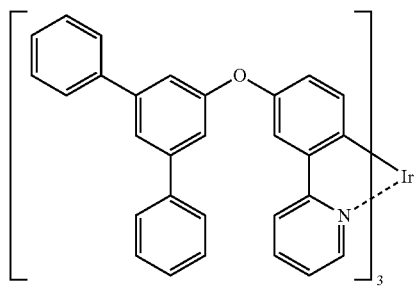
Ir-20
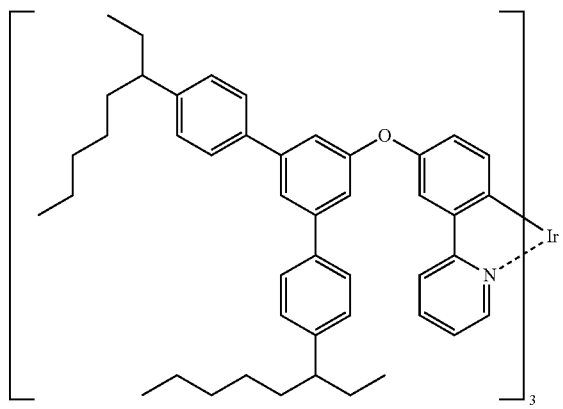

-continued
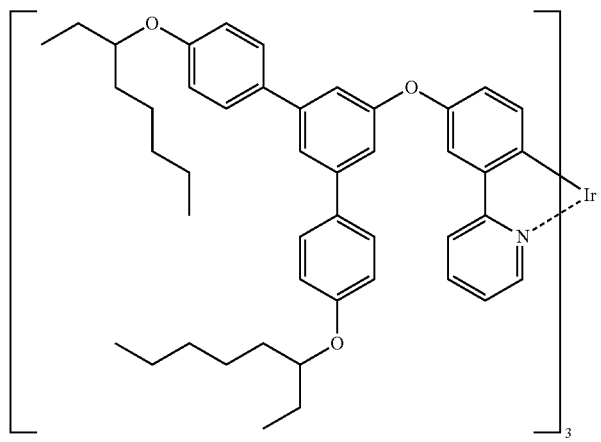
Ir-21
[Chemical Formula 69]
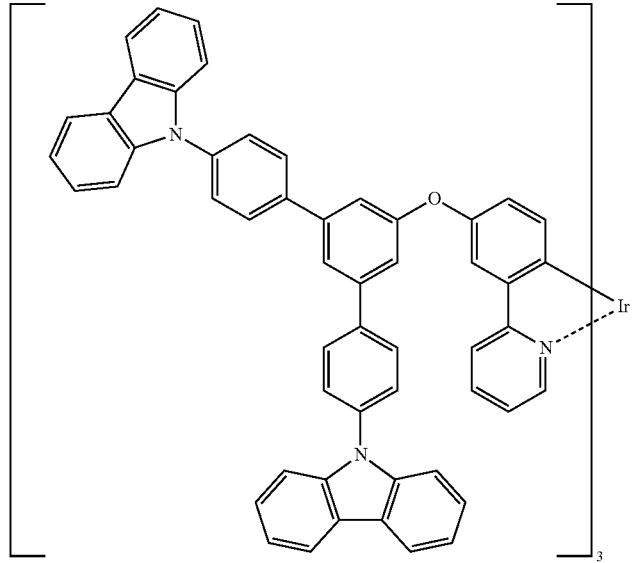
Ir-22
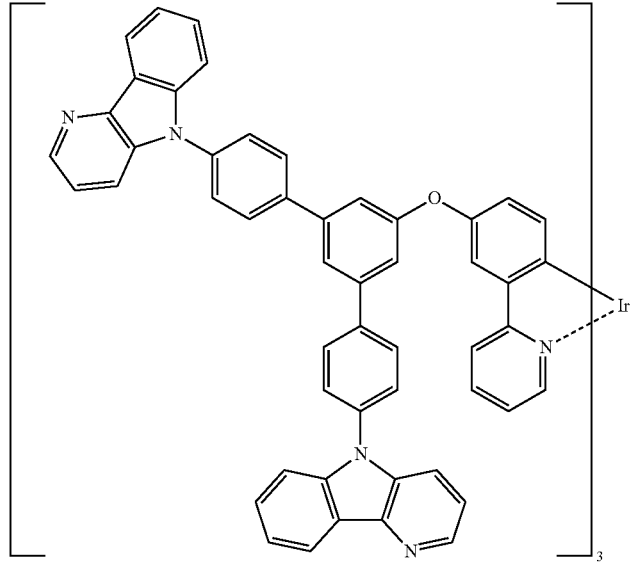
Ir-23

-continued
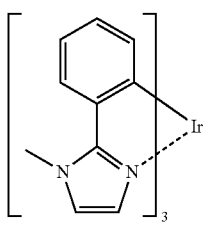 Ir-24
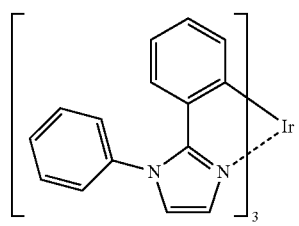 Ir-25
Ir-26
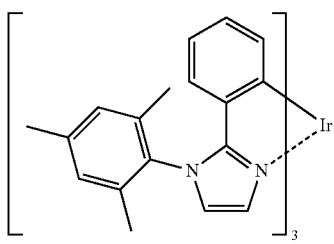
[Chemical Formula 70]
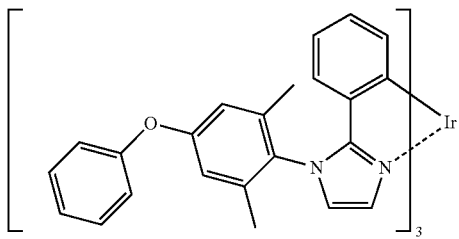 Ir-27
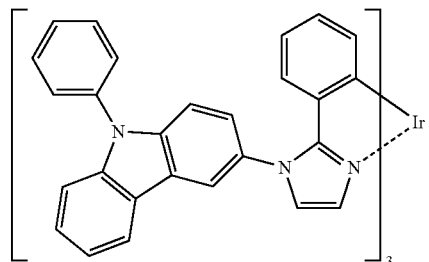 Ir-28
Ir-29
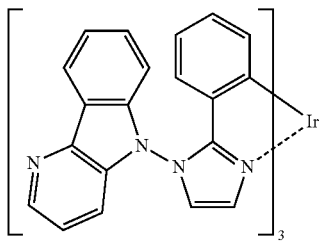
Ir-30
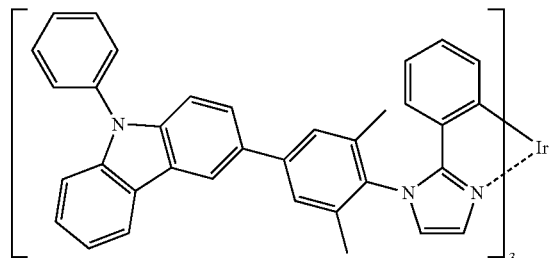
Ir-31
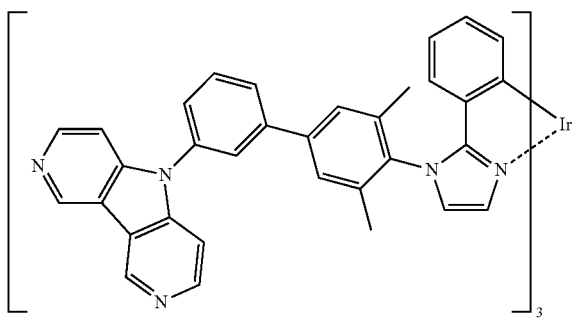

-continued
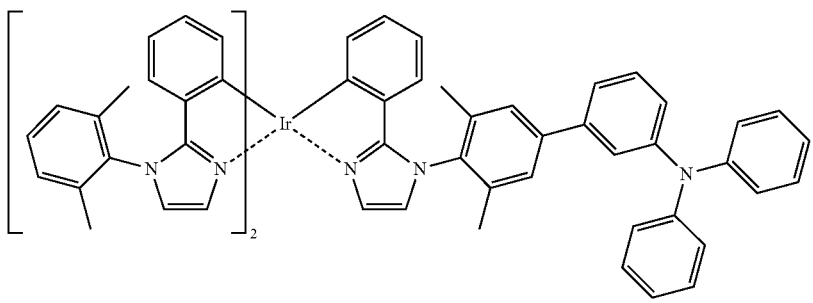
Ir-32
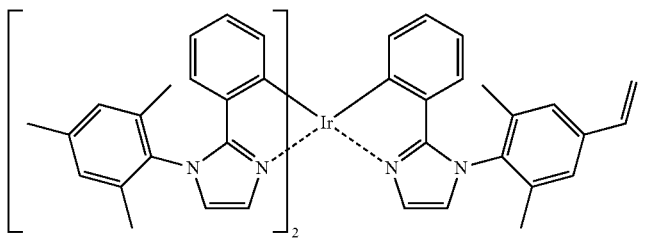
Ir-33
[Chemical Formula 71]
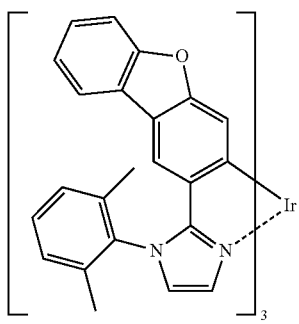
Ir-34
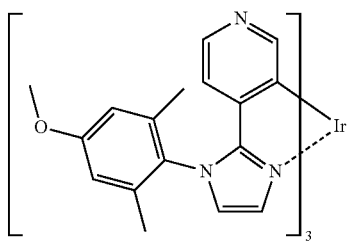
Ir-35
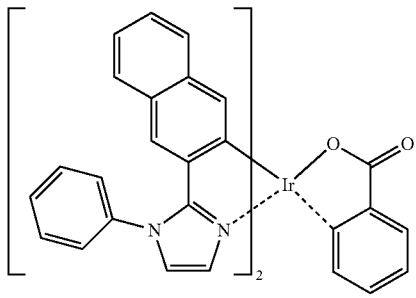
Ir-36
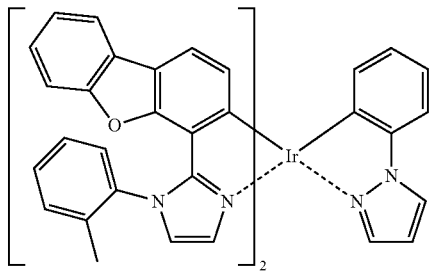
Ir-37
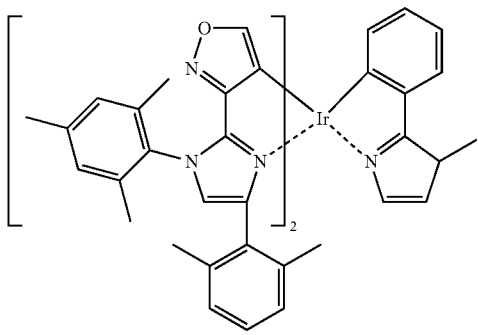
Ir-38
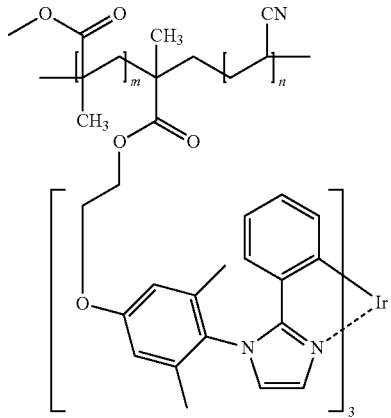
Ir-39

[Chemical Formula 72]
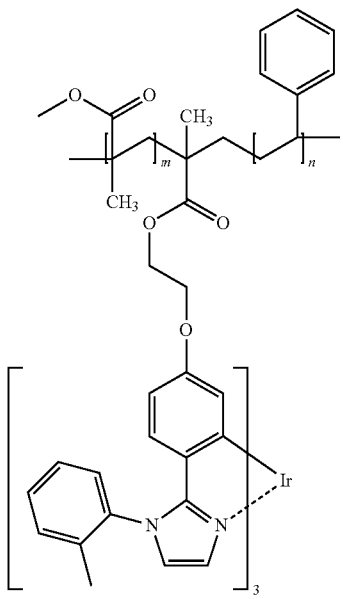
Ir-40
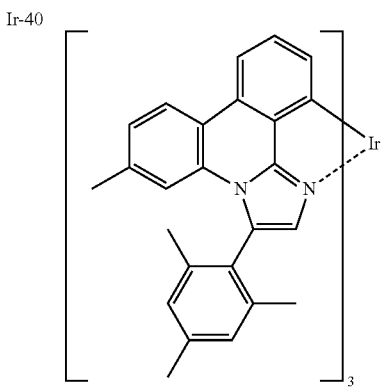
Ir-41
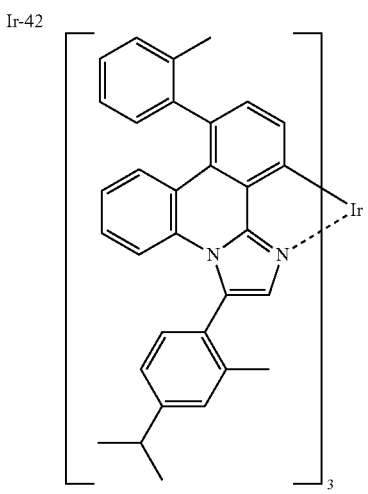
Ir-42
Ir-43
Ir-44
Ir-45
[Chemical Formula 73]
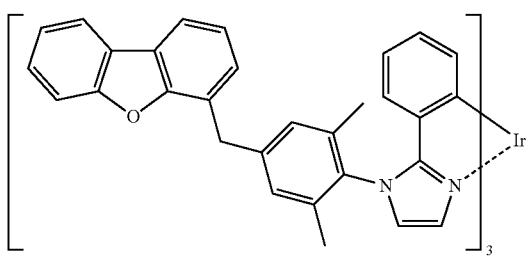
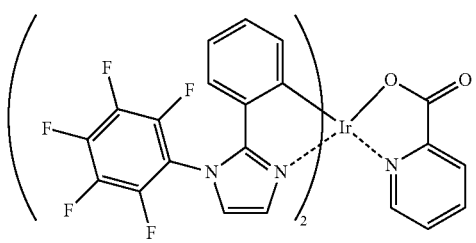
Ir-46
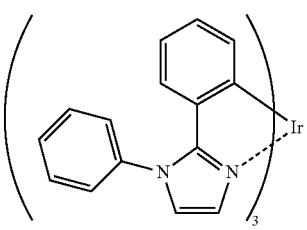
Ir-47

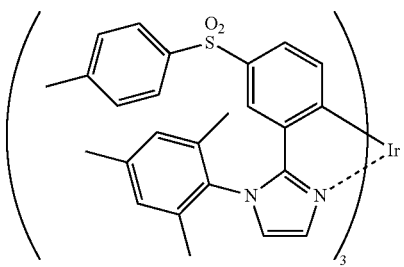

Ir-48

Ir-49

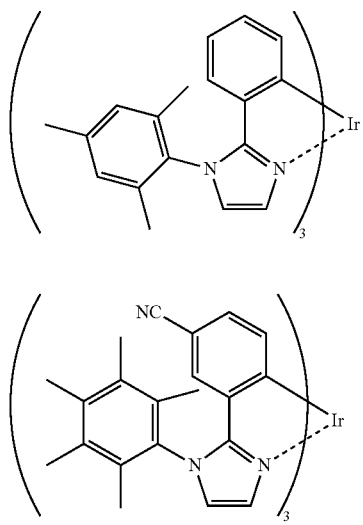

Ir-50

The aforesaid phosphorescent compounds (also referred to as phosphorescent metal complexes or the like) can be synthesized by employing methods described in documents such as Organic Letters, vol. 3, No. 16, pp. 2579-2581 (2001); Inorganic Chemistry, vol. 30, No. 8, pp. 1685-1687 (1991); J. Am. Chem. Soc., vol. 123, pp. 4304 (2001); Inorganic Chemistry, vol. 40, No. 7, pp. 1704-1711 (2001); Inorganic Chemistry, vol. 41, No. 12, pp. 3055-3066 (2002); New Journal of Chemistry, vol. 26, pp. 1171 (2002); and European Journal of Organic Chemistry, vol. 4, pp. 695-709 (2004); and reference documents described in these documents.

(Fluorescent Material)

Examples of the fluorescent material include a coumarin dye, a pyran dye, a cyanine dye, a chloconium dye, a squarylium dye, an oxobenzanthracene dye, a fluorescein dye, a rhodamine dye, a pyrylium dye, a perylene dye, a stilbene dye, a polythiophene dye, a rare earth complex based phosphor and the like.

[Injecting Layer: Hole Injecting Layer 3a and Electron Injecting Layer 3e]

An injecting layer is a layer arranged between an electrode and the light emitting layer 3c in order to decrease driving voltage and improve brightness of the emitted light; the details of the injecting layer are described in "Electrode Material" (pp. 123-166, Part 2, Chapter 2 of "Organic EL Element and Front of Industrialization thereof" Nov. 30, 1998, published by N. T. S Co., Ltd.), and examples of the injecting layer include the hole injecting layer 3a and the electron injecting layer 3e.

The injecting layer can be provided according to necessity. If the injecting layer is the hole injecting layer 3a, the injecting layer may be arranged between the anode and the light emitting layer 3c or the hole transporting layer 3b; and if the injecting layer is the electron injecting layer 3e, the injecting layer may be arranged between the cathode and the light emitting layer 3c or the electron transporting layer 3d.

The details of the hole injecting layer 3a is also described in documents such as Japanese Unexamined Patent Application Publication Nos. 9-45479, 9-260062 and 8-288069; and concrete examples of the hole injecting layer 3a include a layer of a phthalocyanine represented by copper phthalocyanine, a layer of an oxide represented by vanadium oxide, a layer of an amorphous carbon and a layer of a polymer employing conductive polymer such as polyaniline (emeraldine), polythiophene and the like.

The details of the electron injecting layer 3e is also described in documents such as Japanese Unexamined Patent Application Publication Nos. 6-325871, 9-17574 and 10-74586; and concrete examples of the electron injecting layer 3e include a layer of a metal represented by strontium, aluminum or the like; a layer of an alkali metal halide represented by potassium fluoride; a layer of an alkali earth metal compound represented by magnesium fluoride; and a layer of an oxide represented by molybdenum oxide. It is preferred that the electron injecting layer 3e is an extremely thin film; specifically, it is preferred that the film-thickness of the electron injecting layer 3e is within a range from 1 nm to 10 µm depending on the material thereof.

[Hole Transporting Layer 3b]

The hole transporting layer 3b is formed of a hole transporting material having a function of transporting holes; in a broad sense, the hole injecting layer 3a and the electron blocking layer are included in the hole transporting layer 3b. The hole transporting layer 3b may either include only one layer or include a plurality of layers.

The hole transporting material is a material either having a capability of injecting or transporting holes, or having a barrier property against electrons; the hole transporting material may either be an organic material or an inorganic material. Examples of the hole transporting material include a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer, a conductive oligomer such as a thiophene oligomer, and the like.

Although the aforesaid compounds can be used as the hole transporting material, it is preferred that a porphyrin compound, an aromatic tertiary amine compound or a styrylamine compound is used as hole transporting material, and wherein it is particularly preferred that an aromatic tertiary amine compound is used as the hole transporting material.

Typical examples of the aromatic tertiary amine compound and the styrylamine compound include: N,N,N',N'-tetraphenyl-4,4'-diaminophenyl; N,N'-diphenyl-N,N'-bis(3-methylphenyl)-[1,1'-biphenyl]-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino) quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N, N-diphenylaminostilbene; N-phenylcarbazole; those having two condensed aromatic rings in a molecule described in U.S. Pat. No. 5,061,569, such as 4,4'-bis[N-(1-naphthyl)-N-phenylamino]biphenyl (NDP); and 4,4',4"-tris[N-(3-methylphenyl)-N-phenylamino]triphenylamine (MTDATA) in which three triphenylamine units are bonded in a star burst form described in Japanese Patent Application Laid-Open Publication No. 4-308688.

Further, a polymer material in which any of these materials is introduced into a polymer chain or a polymer material in which a polymer main chain is constituted by any of these materials may also be used as the material of the electron transporting layer 3d. Further, inorganic compounds such as a p-type Si and a p-type SiC may also be used as the hole injecting material and the hole transporting material.

Further, it is also possible to use a so-called p-type hole transporting material described Japanese Unexamined Patent Application Publication No. 11-251067 and Applied Physics Letters 80 (2002), pp. 139 by J. Huang et. al. In the present invention, it is preferable to use these materials in order to produce a light-emitting element having high efficiency.

The hole transporting layer 3b can be formed by forming a thin film of the aforesaid hole transporting material using a known method such as a vacuum deposition method, a spin coating method, a casting method, a printing method (which includes an ink-jet method), a LB method or the like. The film-thickness of the hole transporting layer 3b is not particularly limited; however, the film-thickness of the hole transporting layer 3b is typically within a range about from 5 nm to 5 μm, preferably within a range from 5 nm to 200 nm. The hole transporting layer 3b may have a single-layer structure formed of one type of the aforesaid materials, or formed of two or more types of the aforesaid materials.

Further, it is also possible to dope impurities into the material of the hole transporting layer 3b to improve its p-property. Examples of doping impurities into the material of the hole transporting layer include those described in documents such as Japanese Unexamined Patent Application Publication Nos. 4-297076, 2000-196140 and 2001-102175 and J. Appl. Phys., 95, 5773 (2004).

It is preferred to dope impurities into the material of the hole transporting layer 3b, because improved p-property of the hole transporting layer 3b makes it possible to produce an element which consumes less electric power.

[Electron Transporting Layer 3d]

The electron transporting layer 3d is formed of a material having a function to transport electrons; in a broad sense, the electron injecting layer 3e and the hole blocking layer (not shown) are included in the electron transporting layer 3d. The electron transporting layer 3d may have either a single-layer structure or a laminated structure composed of a plurality of layers.

In either an electron transporting layer 3d having a single-layer structure or an electron transporting layer 3d having a laminated structure, an electron transporting material (which also functions as a hole blocking material) constituting a layer-portion adjacent to the light emitting layer 3c may be a material having a function of transferring electrons injected from the cathode to the light emitting layer 3c. Such material can be selected from known compounds. Examples of the known compounds include a nitro-substituted fluorene derivative, a diphenylquinone derivative, a thiopyrandioxide derivative, carbodiimide, a fluorenylidenemethane derivative, anthraquinonedimethane, an anthrone derivative, an oxadiazole derivative and the like. Further, in the aforesaid oxadiazole derivative, a thiadiazole derivative formed by substituting an oxygen atom of an oxadiazole ring with a sulfur atom and a quinoxaline derivative having a quinoxaline ring which is known as an electron withdrawing group may also be used as the material of the electron transporting layer 3d. Further, a polymer material in which any of these materials is introduced into a polymer chain or a polymer material in which a polymer main chain is constituted by any of these materials may also be used as the material of the electron transporting layer 3d.

Further, metal complexes of an 8-quinolinol derivative such as tris(8-quinolinol)aluminum (Alq$_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq) and the like, as well as metal complexes formed by substituting the central metal of the aforesaid metal complexes with In, Mg, Cu, Ca, Sn, Ga or Pb may also be used as the material of the electron transporting layer 3d.

Further, metal-free or metal phthalocyanine and those formed by substituting the terminal of metal-free or metal phthalocyanine with an alkyl group, a sulfonic acid group or the like may be preferably used as the material of the electron transporting layer 3d. Further, the distyrylpyrazine derivative mentioned as an example of the material for the light emitting layer 3c may also be used as the material of the electron transporting layer 3d; and, similar to the cases of the hole injecting layer 3a and the hole transporting layer 3b, inorganic semiconductors such as an n-type Si and an n-type SiC may also be used as the material of the electron transporting layer 3d.

The electron transport layer 3d can be formed by forming the aforesaid material into a thin film by a known method such as a vacuum deposition method, a spin coating method, a casting method, a printing method (which includes an ink-jet method), an LB method or the like. The thickness of the electron transporting layer 3d is not particularly limited; however, the thickness of the electron transporting layer 3d is typically within a range about from 5 nm to 5 μm, preferably within a range from 5 nm to 200 nm. The electron transporting layer 3d may have a single-layer structure formed of one type of the aforesaid materials, or formed of two or more types of the aforesaid materials.

Further, it is also possible to dope impurities into the material of the electron transporting layer 3d to improve its n-property. Examples of doping impurities into the electron transporting layer include those described in documents such as Japanese Unexamined Patent Application Publication Nos. 4-297076, 10-270172, 2000-196140 and 2001-102175 and J. Appl. Phys., 95, 5773 (2004). Further, it is preferred that the electron transporting layer 3d contains kalium, kalium compound and/or the like. For example, potassium fluoride or the like can be used as the potassium compound. If the n-property of the electron transporting layer 3d is improved in the aforesaid manner, it is possible to produce an element which consumes less electric power.

Further, a compound represented by the following General Formula (10) can be preferably used as the material of the electron transporting layer 3d (the electron transporting compound).

(Ar1)n1-Y1    General Formula (10)

In General Formula (10), n1 represents an integer of 1 or greater; Y1 represents a substituent if n1 is equal to 1, or a bond or an n1-valent linking group if n1 is equal to or greater than 2; Ar1 represents a group represented by below-mentioned General Formula (A), and if n1 is equal to or greater than 2, a plurality of pieces of Ar1 may either be the same, or be different from each other. However, the compound represented by General Formula (10) has, in the molecule, at least two condensed aromatic heterocycles each formed by condensing three or more rings.

The substituent represented by Y1 in General Formula (10) is synonymous with the substituent exemplified as R11, R12 of General Formula (1) which represents a compound constituting the nitrogen-containing layer 1a of the transparent electrode 1.

Concrete examples of the n1-valent linking group represented by Y1 in General Formula (10) include a divalent linking group, a trivalent linking group, a tetravalent linking group and the like.

Examples of the divalent linking group represented by Y1 in General Formula (10) include: an alkylene group (for example, an ethylene group, a trimethylene group, a tetramethylene group, a propylene group, an ethylethylene group, a pentamethylene group, a hexamethylene group, a 2,2,4-trimethylhexamethylene group, a heptamethylene group, an octamethylene group, nonamethylene group, a decamethylene group, an undecamethylene group, a dodecamethylene group, a cyclohexylene group (for example, a 1,6-cyclohexanediyl group and the like), a cyclopenthylene group (for example, a 1,5-cyclopentanediyl group and the like) and the like); an alkenylene group (for example, a vinylene group, a propenylene group, a butenylene group, a pentenylene group, a 1-methylvinylene group, a 1-methylpropenylene group, a 2-methylpropenylene group, a 1-methylpentenylene group, a 3-methylpentenylene group, a 1-ethylvinylene group, a 1-ethylpropenylene group, a 1-ethylbutenylene group, a 3-ethylbutenylene group and the like); an alkynylene group (for example, an ethynylene group, a 1-propynylene group, a 1-butynylene group, a 1-pentynylene group, a 1-hexynylene group, a 2-butynylene group, a 2-pentynylene group, a 1-methylethynylene group, a 3-methyl-1-propynylene group, a 3-methyl-1-butynylene group and the like); an arylene group (for example, an o-phenylene group, a p-phenylene group, a naphthalenediyl group, an anthracenediyl group, a naphthacenediyl group, a pyrenediyl group, a naphthylnaphthalenediyl group, a biphenyldiyl group (for example, a [1,1'-biphenyl]-4,4'-diyl group, a 3,3'-biphenyldiyl group and, 3,6-biphenyldiyl group and the like), a terphenyldiyl group, a quaterphenyldiyl group, a quinquephenyldiyl group, a sexiphenyldiyl group, a septiphenyldiyl group, an octiphenyldiyl group, a nobiphenyldiyl group, a deciphenyldiyl group and the like); a heteroarylene group (for example, a divalent group derived from a group consisting of a carbazole group, a carboline ring, a diazacarbazole ring (also referred to as a monoazacarboline group, indicating a ring formed by substituting one of carbon atoms constituting a carboline ring with a nitrogen atom), a triazole ring, a pyrrole ring, a pyridine ring, a pyrazine ring, a quinoxaline ring, a thiophene ring, an oxadiazole ring, a dibenzofuran ring, a dibenzothiophene ring, an indole ring and the like), a chalcogen atom such as oxygen, sulfur or the like, a group derived from a condensed aromatic heterocycle formed by condensing three or more, and the like (herein, it is preferred that the condensed aromatic heterocycle formed by condensing three or more rings is a condensed aromatic heterocycle which contains a hetero atom selected from N, O and S as an element constituting a condensed ring; concrete examples of such condensed aromatic heterocycle include an acridine ring, a benzoquinoline ring, a carbazole ring, a phenazine ring, a phenanthridine ring, a phenanthroline ring, a carboline ring, a cycladine ring, a quindoline ring, a thebenidine ring, a quinindoline ring, a triphenodithiazine ring, a triphenodioxazine ring, a phenanthrazine ring, an anthrazine ring, a perimizine ring, a diazacarbazole ring (indicating a ring formed by substituting one of carbon atoms constituting a carboline ring with a nitrogen atom), a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthrene ring, a phenoxathiin ring, a thiophanthrene ring (naphthothiophene ring) and the like).

Examples of the trivalent linking group represented by Y1 in General Formula (10) include an ethanetriyl group, a propanetriyl group, a butanetriyl group, a pentanetriyl group, a hexanetriyl group, a heptanetriyl group, an octanetriyl group, a nonanetriyl group, a decanetriyl group, an undecanetriyl group, a dodecanetriyl group, a cyclohexanetriyl group, a cyclopentanetriyl group, a benzenetriyl group, a naphthalenetriyl group, a pyridinetriyl group, a carbazoletriyl group and the like.

The tetravalent linking group represented by Y1 in General Formula (10) is a group having a linking group added to any one of the above-mentioned trivalent linking groups. Examples of the tetravalent linking group include a propandiylidene group, a 1,3-propandiyl-2-ylidene group, a butanediylidene group, a pentanediylidene group, a hexanediylidene group, a heptanediylidene group, an octanediylidene group, a nonanediylidene group, a decanediylidene group, an undecanediylidene group, a dodecanediylidene group, a cyclohexanediylidene group, a cyclopentanediylidene group, a benzenetetrayl group, a naphthalenetetrayl group, a pyridinetetrayl group, a carbazoletetrayl group and the like.

Incidentally, the aforesaid divalent, trivalent and tetravalent linking groups may each have a substituent exemplified as R11, R12 of General Formula (1).

In the compound represented by General Formula (10), it is preferred that Y1 represent a group derived from a condensed aromatic heterocycle formed by condensing three or more rings, and it is preferred that the condensed aromatic heterocycle formed by condensing three or more rings is a dibenzofuran ring or a dibenzothiophene ring. Further, it is preferred that n1 is 2 or more.

Further, the compound represented by General Formula (10) has, in the molecule, at least two condensed aromatic heterocycles each formed by condensing three or more rings.

When Y1 represents an n1-valent linking group, Y1 is preferably non-conjugated in order to keep the triplet excitation energy of the compound represented by General Formula (10) high, and is preferably constituted of aromatic rings (an aromatic hydrocarbon ring+an aromatic heterocycle) in order to improve Tg (also referred to as glass transition point or glass transition temperature).

Here, the "non-conjugated" indicates that a linking group cannot be expressed with alternation of single and double bonds, or that a conjugation of aromatic rings which constitute a linking group is sterically broken.

[Group Represented by General Formula (A)]

Ar1 of General Formula (10) is a group represented by the following General Formula (A).

[Chemical Formula 74]

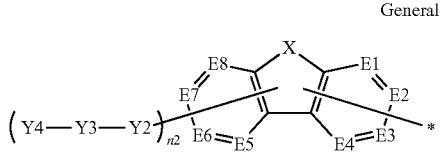

General Formula (A)

In General Formula (A), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; represents a linking site with Y1; Y2 merely represents a bond or a divalent linking group; Y3 and Y4 each represent a group derived from a 5-membered or 6-membered aromatic ring, wherein at least one of Y3 and Y4 represents a group derived from an aromatic heterocycle containing a nitrogen atom as a ring constituent atom; and n2 represents an integer of 1 to 4.

Here, the substituents represented by R, R' or R1 both in —N(R)— or —Si(R)(R')— represented by X and in —C(R1)= represented by each of E1 to E8 in General Formula (A) are each synonymous with the substituent exemplified as R11, R12 of General Formula (1).

Further, the divalent linking group represented by Y2 in General Formula (A) is synonymous with the divalent linking group represented by Y1 in General Formula (10).

Examples of the 5-membered or 6-membered aromatic ring used to form a group derived from a 5-membered or 6-membered aromatic ring represented by each of Y3 and Y4 in General Formula (A) include a benzene ring, an oxazole ring, a thiophene ring, a furan ring, a pyrrole ring, a pyridine ring, a pyridazine ring, a pyrimidine ring, a pyrazine ring, a diazine ring, a triazine ring, an imidazole ring, an isoxazole ring, a pyrazole ring, a triazole ring and the like.

At least one of the groups derived from 5-membered or 6-membered aromatic rings respectively represented by Y3 and Y4 is a group derived from an aromatic heterocycle containing a nitrogen atom as a ring constituent atom. Examples of the aromatic heterocycle containing a nitrogen atom as a ring constituent atom include an oxazole ring, a pyrrole ring, a pyridine ring, a pyridazine ring, a pyrimidine ring, a pyrazine ring, the diazine ring, a triazine ring, an imidazole ring, an isoxazole ring, a pyrazole ring, a triazole ring and the like.

(Preferred Group Represented by Y3)

In General Formula (A), the group represented by Y3 is preferably a group derived from the aforesaid 6-membered aromatic ring, and further preferably a group derived from a benzene ring.

(Preferred Group Represented by Y4)

In General Formula (A), the group represented by Y4 is preferably a group derived from the aforesaid 6-membered aromatic ring, and further preferably a group derived from the aromatic heterocycle containing a nitrogen atom as a ring constituent atom, and particularly preferably a group derived from a pyridine ring.

(Preferred Group Represented by General Formula (A))

The group represented by General Formula (A) is preferably a group represented by one of the following General Formulas (A-1), (A-2), (A-3) and (A-4).

[Chemical Formula 75]

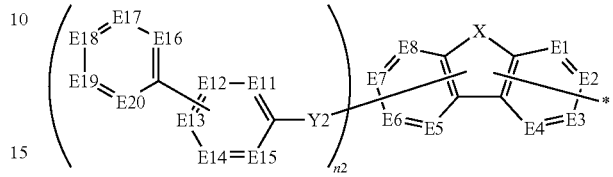

General Formula (A-1)

In General Formula (A-1), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E11 to E20 each represent —C(R2)= or —N=, wherein at least one of E11 to E20 represents —N=, wherein R2 represents a hydrogen atom, a substituent or a linking site, and wherein at least one of E11 and E12 represents —C(R2)=, where R2 represents a linking site; n2 represents an integer of 1 to 4; and represents a linking site with Y1 in General Formula (10).

[Chemical Formula 76]

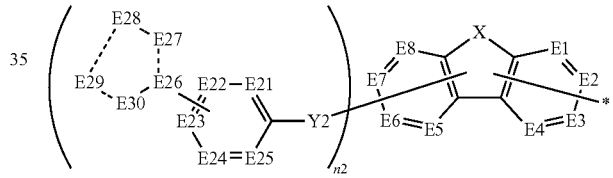

General Formula (A-2)

In General Formula (A-2), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E21 to E25 each represent —C(R2)= or —N=, and E26 to E30 each represent —C(R2)=, —N=, —O—, —S— or —Si(R3)(R4)-, wherein at least one of E21 to E30 represents —N=, wherein R2 represents a hydrogen atom, a substituent or a linking site, and R3 and R4 each represent a hydrogen atom or a substituent, and wherein at least one of E21 and E22 represents —C(R2)=, where R2 represents a linking site; n2 represents an integer of 1 to 4; and represents a linking site with Y1 in General Formula (10).

[Chemical Formula 77]

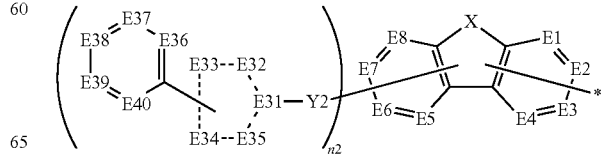

General Formula (A-3)

In General Formula (A-3), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E31 to E35 each represent —C(R2)=, —N=, —O—, —S— or —Si(R3)(R4)-, and E36 to E40 each represent —C(R2)= or N=, wherein at least one of E31 to E40 represents —N=, wherein R2 represents a hydrogen atom, a substituent or a linking site, and R3 and R4 each represent a hydrogen atom or a substituent, and wherein at least one of E32 and E33 represents —C(R2)=, where R2 represents a linking site; n2 represents an integer of 1 to 4; and represents a linking site with Y1 in General Formula (10).

[Chemical Formula 78]

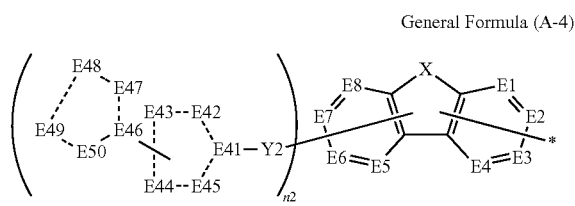

General Formula (A-4)

In General Formula (A-4), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E41 to E50 each represent —C(R2)=, —N=, —O—, —S— or —Si(R3)(R4)-, wherein at least one of E41 to E50 represents —N=, wherein R2 represents a hydrogen atom, a substituent or a linking site, and R3 and R4 each represent a hydrogen atom or a substituent, and wherein at least one of E42 and E43 represents —C(R2)=, where R2 represents a linking site; n2 represents an integer of 1 to 4; and * represents a linking site with Y1 in General Formula (10).

The group represented by any one of General Formulas (A-1) to (A-4) is described below.

The substituents represented by R, R' or R1 both in —N(R)— or —Si(R)(R')— represented by X and in —C(R1)= represented by each of E1 to E8 of the group represented by any one of General Formulas (A-1) to (A-4) are each synonymous with the substituent exemplified as R11, R12 of General Formula (1).

The divalent linking group represented by Y2 of the group represented by any one of General Formulas (A-1) to (A-4) is synonymous with the divalent linking group represented by Y1 in General Formula (10).

The substituent represented by R2 of —C(R2)= represented by each of E11 to E20 in General Formula (A-1), each of E21 to E30 in General Formula (A-2), each of E31 to E40 in General Formula (A-3) or each of E41 to E50 in General Formula (A-4) is synonymous with the substituent exemplified as R11, R12 of General Formula (1).

Further preferred compound represented by General Formula (10) will be described below.

[Compound Represented by General Formula (11)]

In the present invention, among the compounds represented by General Formula (10), a compound represented by General Formula (11) is preferable. General Formula (11) includes General Formula (2) shown as the compound constituting the nitrogen-containing layer 1a of the transparent electrode 1. The compound represented by General Formula (11) will be described below.

[Chemical Formula 79]

General Formula (11)

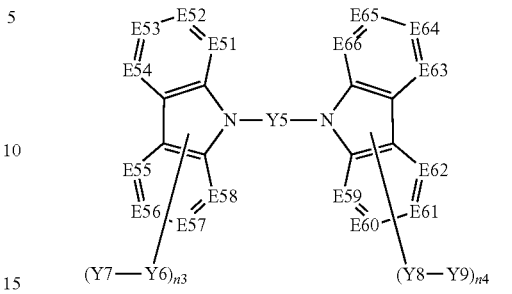

In General Formula (11), Y5 represents a divalent linking group which is an arylene group, a heteroarylene group or a combination of the arylene group and the heteroarylene group; E51 to E66 each represent —C(R3)= or —N=, wherein R3 represents a hydrogen atom or a substituent; Y6 to Y9 each represent a group derived from an aromatic hydrocarbon ring or a group derived from an aromatic heterocycle, wherein at least one of Y6 and Y7 and at least one of Y8 and Y9 each represent a group derived from an aromatic heterocycle containing a nitrogen atom; and n3 and n4 each represent an integer of 0 to 4, wherein the sum of n3 and n4 is an integer of 2 or more.

Y5 in General Formula (11) is synonymous with Y21 in General Formula (2).

E51 to E66 of General Formula (11) is synonymous with E201 to E216 of General Formula (2), and in the case where R3 of —C(R3)= represented by each of E51 to E66 is a substituent, the examples of the substituent exemplified as R11, R12 of General Formula (1) may be applied equally as examples of the substituent of R3.

In General Formula (11), it is preferable that as groups represented by E51 to E66, six or more of E51 to E58 and six or more of E59 to E66 are each represented by —C(R3)=.

Examples of aromatic hydrocarbon ring used to form the group derived from an aromatic hydrocarbon ring represented by each of Y6 to Y9 in General Formula (11) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthranthrene ring and the like.

Further, the aforesaid aromatic hydrocarbon ring may further have a substituent exemplified as R11, R12 of General Formula (1).

In General Formula (11), examples of aromatic heterocycle used to form the group derived from an aromatic heterocycle represented by each of Y6 to Y9 include a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring naphthylidine ring, a carbazole ring, a carboline ring, a diazacarbazole ring (which is a ring formed by further substituting one of carbon atoms constituting a carboline ring with a nitrogen atom) and the like.

Further, the aforesaid aromatic hydrocarbon ring may further have a substituent exemplified as R11, R12 of General Formula (1).

Examples of aromatic heterocycle containing an N atom used to form a group derived from an aromatic heterocycle containing an N atom represented by each of at least one of Y6 and Y7 and at least one of Y8 and Y9 in General Formula (11) include an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthylidine ring, a carbazole ring, a carboline ring, a diazacarbazole ring (which is a ring formed by further substituting one of carbon atoms constituting a carboline ring with a nitrogen atom) and the like.

In General Formula (11), it is preferred that the groups represented by Y7 and Y9 are each a group derived from a pyridine ring.

In General Formula (11), it is preferred that the groups represented by Y6 and Y8 are each a group derived from a benzene ring.

The compound represented by General Formula (2), as the compound constituting the nitrogen-containing layer $1a$ of the transparent electrode 1, is exemplified as a further preferable example of the compound represented by General Formula (11).

The compounds (1 to 118) exemplified above are shown as concrete examples of the compound represented by General Formula (10), (11), or General Formula (2).

[Blocking Layer: Hole Blocking Layer and Electron Blocking Layer]

As described above, a blocking layer is a layer provided according to necessity in addition to the basic constituent layers of the thin-film of the organic compound. Examples of the blocking layer include a hole blocking layer described in documents such as Japanese Unexamined Patent Application Publication Nos. 11-204258 and 11-204359 and pp. 273 of "Organic EL Element and Front of Industrialization thereof" (Nov. 30, 1998, published by N. T. S Co., Ltd.)".

The hole blocking layer has, in a broad sense, the function of the electron transporting layer $3d$. The hole blocking layer is formed of a hole blocking material having a function of transporting electrons with very little capability of transporting holes; the hole blocking layer transports electrons while blocking holes, so that probability of recombination of electrons and holes can be increased. Further, the configuration of the electron transporting layer $3d$ (which is to be described later) can be used as the hole blocking layer according to necessity. It is preferred that the hole blocking layer is formed adjacent to the light emitting layer $3c$.

On the other hand, the electron blocking layer has, in a broad sense, the function of the hole transporting layer $3b$. The electron blocking layer is made of a material having a function of transporting holes with very little capability of transporting electrons; the electron blocking layer transports holes while blocking electrons, so that probability of recombination of electrons and holes can be increased. Further, the configuration of the hole transporting layer $3b$ (which is to be described later) can be used as the electron blocking layer according to necessity. The film-thickness of the blocking layer of the present invention is preferably within a range from 3 to 100 nm, and further preferably within a range from 5 to 30 nm.

[Auxiliary Electrode 15]

The auxiliary electrode 15 is provided for reducing resistance of the transparent electrode 1, and is arranged in contact with the electrode layer $1b$ of the transparent electrode 1. It is preferred that the auxiliary electrode 15 is formed of a metal having low resistance, such as aurum, platinum, silver, copper, aluminum or the like. Since each of these metals has low light transmissibility, the auxiliary electrode 15 is formed into a pattern in a range where the luminescence light h is not prevented from being extracted from a light extracting face $17a$. Examples of the method for forming such an auxiliary electrode 15 include a deposition method, a sputtering method, a printing method, an ink-jet method, an aerosol jet method and the like. In view of aperture ratio of light extraction, it is preferred that the line width of the auxiliary electrode 15 is 50 µm or less; while in view of electrical conductivity, it is preferred that the film-thickness of the auxiliary electrode 15 is 1µ or more.

[Transparent Sealing Material 17]

The transparent sealing material 17 is provided to cover the organic electroluminescence element EL-1; the transparent sealing material 17 may either be a plate-like (film-like) sealing member to be fixed to the side of the substrate 13 by the adhesive 19, or be a sealing film. The surface of the transparent sealing material 17 is the light extracting face $17a$ from which the luminescence light h of the organic electroluminescence element EL-1 is extracted. The transparent sealing material 17 is arranged in a manner to at least cover the light-emitting functional layer 3 in a state where the terminal portions of both the transparent electrode and the opposite electrode 5-1 of the organic electroluminescence element EL-1 are exposed to the outside. The present invention also includes a configuration in which electrodes are arranged on the transparent sealing material 17, and terminal portions of the transparent electrode 1 and the opposite electrode 5-1 of an organic electroluminescence element EL-1 are brought into conduction with the electrodes.

Concrete examples of the plate-like (film-like) transparent sealing material 17 include a glass substrate, a polymer substrate and the like; and each of these substrate materials may also be formed into a further thinner film. Examples of the glass substrate include a soda-lime glass substrate, a barium/strontium-containing glass substrate, a lead glass substrate, an aluminosilicate glass substrate, a borosilicate glass substrate, a barium borosilicate glass substrate, a quartz substrate, and the like. Examples of the polymer substrate include a polycarbonate substrate, an acryl resin substrate, a polyethylene terephthalate substrate, a polyether sulfide substrate, a polysulfone substrate and the like.

Among these materials, a thin-film-like polymer substrate can be preferably used as the transparent sealing material 17 in order to reduce the thickness of the element.

Further, it is preferred that the film-like polymer substrate has an oxygen permeability of $1 \times 10^{-3}$ ml/(m$^2 \cdot$24 h$\cdot$atm) or less measured by a method in conformity with JIS K 7126-1987 and a water vapor permeability of $1 \times 10^{-3}$ g/(m$^2 \cdot$24 h) or less (at temperature of 25±0.5° C. and relative humidity of (90±2)% RH) measured by a method in conformity with JIS K 7129-1992.

Further, the aforesaid substrate material may also be formed into a concave plate so as to be used as the transparent sealing material 17. In such a case, the aforesaid substrate member is subjected to a sand blasting process, a chemical etching process and/or the like, and formed into a concave shape.

The adhesive 19 for fixing the plate-like transparent sealing material 17 to the side of the substrate 13 is used as a sealing agent for sealing the organic electroluminescence element EL-1 sandwiched between the transparent sealing material 17 and the substrate 13. Concrete examples of the adhesive 19 include a photo-curable or thermo-curable adhesive agent containing a reactive vinyl group such as an acrylic acid oligomer or a methacrylic acid oligomer, and a moisture curable adhesive agent such as 2-cyanoacrylate.

Concrete examples of the adhesive 19 also include an epoxy based thermally and chemically (two liquid type) curable adhesive agents; a hot-melt type polyamide, polyester or polyolefin adhesive agents; and a cationic curable type UV-curable epoxy adhesive.

Incidentally, since there is a possibility that the organic material constituting the organic electroluminescence element EL-1 might be degraded by heat treatment, it is preferred that the adhesive 19 is an adhesive possible to be cured in a temperature from room temperature to 80° C. Further, a drying agent may be dispersed in the adhesive 19.

The adhesive 19 may be coated onto the adhesion portion between the transparent sealing material 17 and the substrate either by a commercially available dispenser, or by printing such as screen printing.

In the case where a gap is formed between the transparent sealing material 17, the substrate 13 and the adhesive 19, it is preferred that an inert gas (such as nitrogen, argon or the like) or an inert liquid (such as fluorinated hydrocarbon, silicone oil or the like) is injected, in the form of gas or liquid phase, into the gap. Alternatively, the gap may also be in a vacuum state, or may have a hygroscopic compound enclosed therein.

Examples of the hygroscopic compound include a metal oxide (such as sodium oxide, potassium oxide, calcium oxide, barium oxide, magnesium oxide and aluminum oxide), a sulfate (such as sodium sulfate, calcium sulfate, magnesium sulfate and cobalt sulfate), a metal halide (such as calcium chloride, magnesium chloride, cesium fluoride, tantalum fluoride, cerium bromide, magnesium bromide, barium iodide and magnesium iodide), a perchloric acid (such as barium perchlorate and magnesium perchlorate) and the like; wherein if the sulfate, the metal halide or the perchlorate is used, anhydrides thereof will be preferable.

On the other hand, in the case where a sealing film is used as the transparent sealing material 17, the sealing film is formed on the substrate 13 in a state where the light-emitting functional layer 3 of the organic electroluminescence element EL-1 is completely covered, and the end portions of the transparent electrode 1 and the opposite electrode 5-1 of the organic electroluminescence element EL-1 are exposed to the outside.

Such a sealing film is formed of an inorganic material or an organic material. Particularly, such a sealing film is formed of a material capable of inhibiting penetration of substances, such as moisture, oxygen and the like, which cause the light-emitting functional layer 3 of the organic electroluminescence element EL-1 to degrade. Examples of such material include silicon oxide, silicon dioxide, silicon nitride and the like. Further, in order to reduce the fragility of the sealing film, the sealing film may have a laminated structure composed of the film(s) formed of one of the aforesaid inorganic materials and the film(s) formed of an organic material.

There is no particular limitation on the method of forming the aforesaid films. For example, the aforesaid films may be formed by a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method or the like.

[Protective Film, Protective Plate]

Incidentally, although not shown in the drawings, a protective film or protective plate may be provided so that the organic electroluminescence element EL and the transparent sealing material 17 are sandwiched between the substrate 13 and the protective film or protective plate. The protective film or protective plate is provided for mechanically protecting the organic electroluminescence element EL; particularly in the case where the transparent sealing material 17 is a sealing film, since mechanical protection to the organic electroluminescence element EL is not sufficient, it is preferred that such protective film or protective plate is provided.

A glass plate, a polymer plate, a polymer film (which is thinner than the polymer plate), a metal plate, a metal film (which is thinner than the metal plate), a polymer material film or a metal material film may be used as the aforesaid protective film or protective plate. Among these materials, the polymer film is preferably used in order to reduce the weight and thickness.

[Method for Producing Organic Electroluminescence Element]

As one example, a method for producing the organic electroluminescence element EL-1 shown in FIG. 4 will be described below.

First, the opposite electrode 5-1 (which is the anode) is formed on the substrate 13 by a suitable film-forming method such as a deposition method, a sputtering method or the like.

Next, the hole injecting layer 3a, the hole transporting layer 3b, the light emitting layer 3c, the electron transporting layer 3d and the electron injecting layer 3e are formed, in this order, on the opposite electrode 5-1 to thereby form the light-emitting functional layer 3. Examples of the method for forming each of these layers include a spin coating method, a casting method, an ink-jet method, a deposition method, a printing method and the like; however, a vacuum deposition method or a spin coating method is particularly preferable because by such method, it is easy to form a uniform film and unlikely to cause pinholes. Further, these layers may each be formed by a different film-forming method. When the deposition method is used to form each of these layers, the deposition conditions vary depending on the type of the compound used; generally, it is preferred that the heating temperature of the boat having compound placed therein is selected in a range from 50° C. to 450° C., the vacuum degree is selected in a range from $10^{-6}$ Pa to $10^{-2}$ Pa, the deposition rate is selected in a range from 0.01 nm/sec to 50 nm/sec, the temperature of the substrate is selected in a range from −50° C. to 300° C., and the film-thickness is selected in a range from 0.1 μm to 5 μm.

Then, the nitrogen-containing layer 1a is formed on the light-emitting functional layer 3 so that the film-thickness of the nitrogen-containing layer 1a is 1 μm or less, preferably between 10 nm and 100 nm. Then, the aluminum intermediate layer A composed of aluminum is formed as an extremely thin film having a film-thickness of preferably 1 nm or less. Thereafter, the electrode layer 1b composed of silver (or an alloy having silver as the main component thereof) is formed so that the film-thickness of the electrode layer 1b is in a range of 4 nm to 12 nm, and thereby the transparent electrode 1 on the side of the cathode is formed. Examples of the method for forming the nitrogen-containing layer 1a, the aluminum intermediate layer A and the electrode layer 1b include a spin coating method, a casting method, an ink-jet method, a deposition method, a printing method and the like; however, a vacuum deposition method is particularly preferable, because by such method, it is easy to form a uniform film and unlikely to cause pinholes.

Particularly, when forming the electrode layer 1b, the electrode layer 1b is formed into a pattern such that the electrode layer 1b is insulated from the opposite electrode 5-1 by the light-emitting functional layer 3, and the terminal portion of the electrode layer 1b is drawn out to the edge of the substrate 13 from the top of the light-emitting functional layer 3. Incidentally, the nitrogen-containing layer 1a and the aluminum intermediate layer A may also be formed into the same pattern as that of the electrode layer 1b. Further, the auxiliary electrode 15 is formed into a pattern according to necessity before the formation of the electrode layer 1b, after the formation of the electrode layer 1b, and after the formation of the aluminum intermediate layer A. By performing the above processes, the organic electroluminescence element EL-1 is obtained. Thereafter, the transparent sealing material 17 is formed in a manner in which at least the light-emitting functional layer 3 is covered in a state where the terminal portions of both the transparent electrode 1 and the opposite electrode 5-1 of the organic electroluminescence element EL-1 are exposed to the outside. At this time, the adhesive 19 is used to bond the transparent sealing material 17 to the side of the transparent substrate 13, so that the organic electroluminescence element EL-1 is sealed between the transparent sealing material 17 and the substrate 13.

By performing the above process, a desired organic electroluminescence element EL-1 is obtained on the substrate 13. It is preferred that, when producing the organic electroluminescence element EL-1, the layers from the light-emitting functional layer 3 to the opposite electrode 5-1 are continuously formed with one vacuuming operation; however, it is also possible to take out the substrate 13 from the vacuum atmosphere during production to perform different film-forming method. In such a case, necessary considerations (such as performing the production process in dry inert gas atmosphere) should be taken into account.

In the case where a DC voltage is applied to the organic electroluminescence element EL-1 obtained in the aforesaid manner, light emission can be observed if a voltage of about 2 V to 40 V is applied, wherein the electrode "+" is connected to the opposite electrode 5-1 (which is the anode) and the electrode "−" is connected to the electrode layer 1b (which is the cathode). Also, an AC voltage may be applied to the organic electroluminescence element EL-1, wherein the AC voltage may have any waveform.

<Advantage of Organic Electroluminescence Element EL-1>

The organic electroluminescence element EL-1 has a configuration in which the transparent electrode 1 of the present invention, which has both the electrical conductivity and the light transmissibility, is used as the cathode, and the light-emitting functional layer 3 and the opposite electrode 5-1 (which is the anode) are formed, in this order, on the side of the nitrogen-containing layer 1a of the transparent electrode 1. Thus, it is possible to increase brightness by applying sufficient voltage between the transparent electrode 1 and the opposite electrode 5-1 to achieve high brightness light-emitting of the organic electroluminescence element EL-1 while increasing extraction efficiency of the luminescence light h from the side of the transparent electrode 1. Further, it is also possible to increase the light-emitting lifetime by reducing the driving voltage for obtaining a given brightness.

<<4. Second Example of Organic Electroluminescence Element (Bottom Emission Type)>>
<Configuration of Organic Electroluminescence Element>

Figure 5:
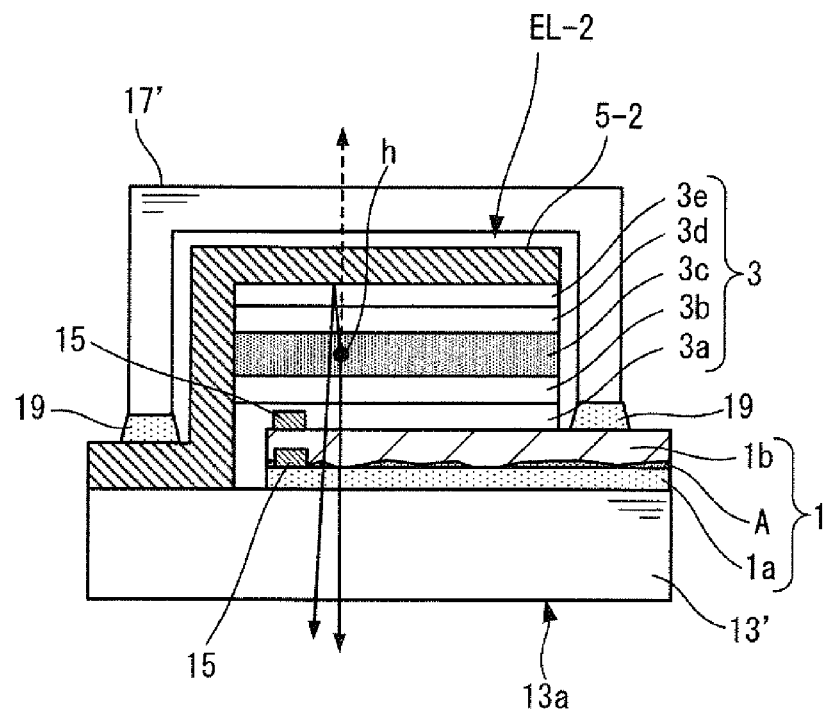
FIG. 5 is a view showing a cross-sectional configuration of a second example of the organic electroluminescence element that uses the transparent electrode according to the present invention.

As an example of the electronic device of the present invention, FIG. 5 shows a cross-sectional configuration of a second example of the organic electroluminescence element using the aforesaid transparent electrode. An organic electroluminescence element EL-2 of the second example shown in FIG. 4 differs from the organic electroluminescence element EL-1 of the first example described with reference to FIG. 3 in that a transparent electrode 1 is arranged on a transparent substrate 13', and a light-emitting functional layer 3 and an opposite electrode 5-2 are laminated, in this order, on the top of the transparent electrode 1. In the following paragraphs, components identical to those of the first example will not be described repeatedly, and description will be focused on characteristic configurations of the organic electroluminescence element EL-2 of the second example.

The organic electroluminescence element EL-2 shown in FIG. 5 is arranged on the transparent substrate 13', and is obtained by laminating the transparent electrode 1 (which is an anode), the light-emitting functional layer 3, and the opposite electrode 5-2 (which is a cathode), in this order, from the side of the transparent substrate 13'. It is characterized that, among these layers, the aforesaid transparent electrode 1 of the present invention is used as the transparent electrode 1 of the organic electroluminescence element EL-2. Thus, the organic electroluminescence element EL-2 is configured as a bottom emission type organic electroluminescence element in which the luminescence light h is extracted at least from the side of the transparent substrate 13'.

Similar to the first example, the entire layer-structure of the organic electroluminescence element EL-2 is not particularly limited, but may be a generic layer-structure. As one example of the second example, a configuration shown here is obtained by laminating a hole injecting layer 3a/a hole transporting layer 3b/a light emitting layer 3c/an electron transporting layer 3d/an electron injecting layer 3e, in this order, on the top of transparent electrode 1, which functions as the anode, and further laminating the opposite electrode 5-2, which is the cathode, on the top of the electron injecting layer 3e. However, among these layers, the light emitting layer 3c composed of at least an organic material is indispensable. Further, the electron transporting layer 3d may be provided as an electron transporting layer 3d having electron injection performance, so that the electron transporting layer 3d also serves as the electron injecting layer 3e.

Note that, similar to the first example, in addition to these layers, the light-emitting functional layer 3 may also be provided with a hole blocking layer (not shown) and/or an electron blocking layer (not shown) according to necessity. In such a configuration, similar to the first example, only the portion where the light-emitting functional layer 3 is sandwiched by the transparent electrode 1 and the opposite electrode 5-2 is a light-emitting region of the organic electroluminescence element EL-2.

In the organic electroluminescence element EL-2 of the present embodiment, in the transparent electrode 1 obtained by laminating the nitrogen-containing layer 1a, the aluminum intermediate layer A and the electrode layer 1b, in this order, on the transparent substrate 13', the electrode layer 1b substantially functions as the anode; and the light-emitting functional layer 3 is directly formed on the electrode layer 1b. Thus, the nitrogen-containing layer 1a is formed by using a compound whose effective unshared electron pair content [n/M] falls into a predetermined range; further, it is preferred that the effective unshared electron pair content [n/M] of the nitrogen-containing layer 1a itself falls into a predetermined range, so that it is not necessary to use a material having hole transport performance or hole injection performance.

Further, similar to the first example, in the aforesaid layer-structure, in order to reduce the resistance of the transparent electrode 1, the auxiliary electrode 15 may be provided in contact with the electrode layer 1b of the transparent electrode 1.

Further, the opposite electrode 5-2 (as the cathode) formed on the top of the light-emitting functional layer 3 is composed of a metal, an alloy, an organic or inorganic conductive compound, or a mixture of these materials. To be specific, the opposite electrode 5-2 is composed of a metal (such as gold (Au) and the like), copper iodide (CuI), an oxide semiconductor (such as ITO, ZnO, TiO2, SnO2 and the like) or the like.

The opposite electrode 5-2 described above can be produced by forming a thin-film with the aforesaid conductive material by a method such as deposition, sputtering or the like. The sheet resistance of the opposite electrode 5-2 is preferably several hundred Q/sq. or less; and the film-thickness of the opposite electrode 5-1 is generally within a range from 5 nm to 5 μm, preferably within a range from 5 nm to 200 nm.

Further, a sealing material 17' for sealing the bottom emission type organic electroluminescence element EL-2 does not have to have light transmissibility. In addition to the same material as the transparent sealing material used in the first example, metal material may also be used as the material of such sealing material 17'. Examples of the metal material include one or more kinds of metals selected from the group consisting of stainless steel, iron, copper, aluminum, magnesium, nickel, zinc, chromium, titanium, molybdenum, silicon, germanium, tantalum, and alloys thereof. By using thin film of the aforesaid metal material as the sealing material 17', the thickness of the whole light-emitting panel on which the organic electroluminescence element is arranged can be reduced.

Incidentally, in the case where the organic electroluminescence element EL-2 is to be configured so that the luminescence light h is also extracted from the side of the opposite electrode 5-2, the opposite electrode 5-2 may be formed by a conductive material with good light transmissibility selected from the aforesaid conductive materials. Further, in such a case, a transparent sealing material having light transmissibility is used as the sealing material 17'.

<Advantage of Organic Electroluminescence Element EL-2>

The organic electroluminescence element EL-2 described above has a configuration in which the transparent electrode 1, which has both the electrical conductivity and the light transmissibility, of the present invention is used as the anode, and the light-emitting functional layer 3 and the opposite electrode 5-2 (which is the cathode) are formed on the top of the transparent electrode 1. Thus, similar to the first example, it is possible to increase brightness by applying sufficient voltage between the transparent electrode 1 and the opposite electrode 5-2 to achieve high brightness light-emitting of the organic electroluminescence element EL-2 while increasing extraction efficiency of the luminescence light h from the side of the transparent electrode 1. Further, it is also possible to increase the light-emitting lifetime by reducing the driving voltage for obtaining a given brightness.

<<5. Third Example of Organic Electroluminescence Element (Dual Emission Type)>>
<Configuration of Organic Electroluminescence Element>

Figure 6:
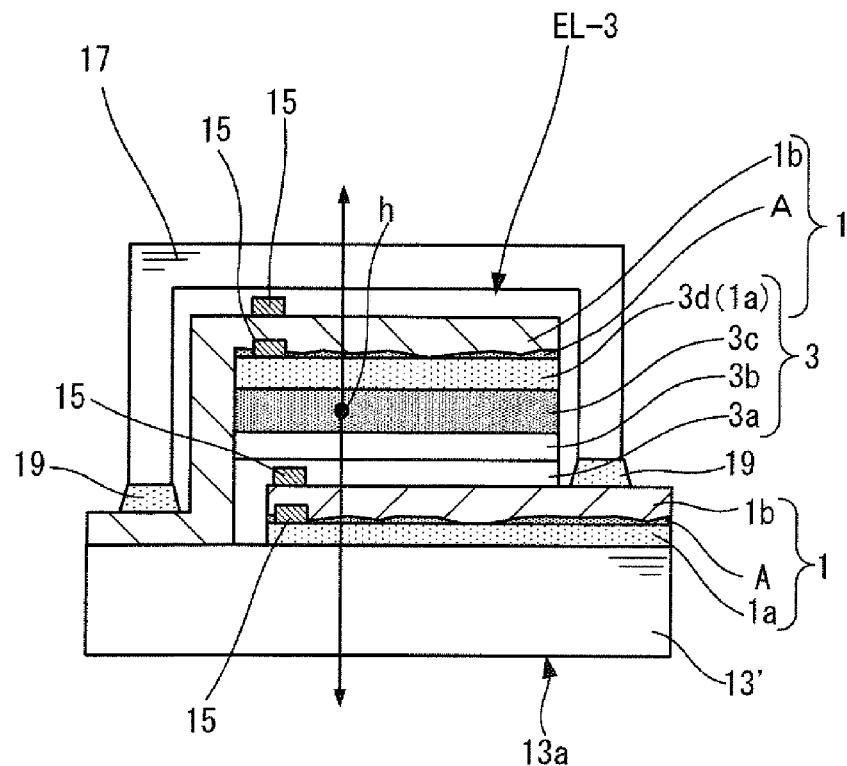
FIG. 6 is a view showing a cross-sectional configuration of a third example of the organic electroluminescence element that uses the transparent electrode according to the present invention.

As an example of the electronic device of the present invention, FIG. 6 shows a cross-sectional configuration of a third example of the organic electroluminescence element using the aforesaid transparent electrode. An organic electroluminescence element EL-3 of the third example shown in FIG. 6 differs from the organic electroluminescence element EL-1 of the first example described with reference to FIG. 4 in that a transparent substrate 13' is used as the substrate, and a light-emitting functional layer 3 is sandwiched between two transparent electrodes 1. In the following paragraphs, components identical to those of the first example will not be described repeatedly, and description will be focused on characteristic configurations of the organic electroluminescence element EL-3 of the third example.

The organic electroluminescence element EL-3 shown in FIG. 6 is arranged on the transparent substrate 13', and is obtained by laminating a transparent electrode 1 functioning as an anode, a light-emitting functional layer 3, and a transparent electrode 1 functioning as a cathode, in this order, from the side of the transparent substrate 13'. It is characterized that, among these layers, the aforesaid transparent electrode 1 of the present invention is used as each of the two transparent electrodes 1 of the organic electroluminescence element EL-3. Thus, the organic electroluminescence element EL-3 is configured as a dual emission type organic electroluminescence element in which the luminescence light h is extracted from both the side of the transparent substrate 13' and the side of the transparent sealing material 17, which is opposite to the side of the transparent substrate 13'.

Similar to the first example, the entire layer-structure of the organic electroluminescence element EL-3 is not particularly limited, but may be a generic layer-structure. As one example of the third example, a configuration shown here is obtained by laminating a hole injecting layer 3a/a hole transporting layer 3b/a light emitting layer 3c/an electron transporting layer 3d, in this order, on the top of the transparent electrode 1 functioning as the anode, and further laminating the transparent electrode 1 functioning as the cathode on the top of the electron transporting layer 3d. In the example shown in FIG. 6, the electron transporting layer 3d not only functions as an electron injecting layer, but also functions as the nitrogen-containing layer 1a of the transparent electrode 1.

Note that, similar to the first example, various configurations according to necessity may be adopted as the light-emitting functional layer 3; for example, the light-emitting functional layer 3 may also be provided with a hole blocking layer (not shown) and/or an electron blocking layer (not shown). In the aforesaid configuration, similar to the first example, only the portion where the light-emitting functional layer 3 is sandwiched by the two transparent electrodes 1 is a light-emitting region of the organic electroluminescence element EL-3.

In the organic electroluminescence element EL-3 of the present embodiment, the transparent electrode 1 arranged on the side of the transparent substrate 13' is obtained by forming the nitrogen-containing layer 1a, the aluminum intermediate layer A and the electrode layer 1b, in this order, from the side of the transparent substrate 13'; and the light-emitting functional layer 3 is directly formed on the top of the electrode layer 1b, which substantially functions as the anode. Thus, the nitrogen-containing layer 1a arranged on the side of the transparent substrate 13' is formed by using a compound whose effective unshared electron pair content [n/M] falls into a predetermined range; further, it is preferred that the effective unshared electron pair content [n/M] of the nitrogen-containing layer 1a itself falls into a predetermined range, so that it is not necessary to use a material having hole transport performance or hole injection performance.

In contrast, the transparent electrode 1 arranged on the light-emitting functional layer 3 is obtained by forming the nitrogen-containing layer 1a, the aluminum intermediate layer A and the electrode layer 1b, in this order, from the side of the light-emitting functional layer 3, so that the nitrogen-containing layer 1a is sandwiched between the light-emitting functional layer 3 and both the electrode layer 1b (which substantially functions as the cathode) and the aluminum intermediate layer A. Thus, the nitrogen-containing layer 1a formed on the light-emitting functional layer 3 also constitutes a portion of the light-emitting functional layer 3. The nitrogen-containing layer 1a is formed by using a material having electron transport performance or electron injection performance selected from the compounds whose effective unshared electron pair content [n/M] falls in a predetermined range. Further, the nitrogen-containing layer 1a may also be formed by using a mixture obtained by mixing a compound having electron transport performance or electron injection performance with a compound whose effective unshared electron pair content [n/M] is equal to a certain value, so that the nitrogen-containing layer 1a itself has aforesaid effective unshared electron pair content [n/M].

Further, similar to the first example, in the aforesaid layer-structure, the auxiliary electrode 15 may be provided in contact with the electrode layer 1b of each of the two transparent electrodes 1 in order to reduce the resistance of the transparent electrode 1.

Further, since the organic electroluminescence element EL-3 is a dual emission type organic electroluminescence element, it is sealed by the transparent sealing material 17 having light transmissibility.

<Advantage of Organic Electroluminescence Element EL-3>

The organic electroluminescence element EL-3 is configured by sandwiching the light-emitting functional layer 3 between two transparent electrodes 1 having the electrical conductivity and the light transmissibility (one is used as the anode and the other is used as the cathode). Thus, similar to the first example, it is possible to increase the brightness by applying sufficient voltage between the two transparent electrodes 1 to achieve high-brightness emission of the organic electroluminescence element EL-3 while increasing the extraction efficiency of the luminescence light h from the sides of the two transparent electrodes 1. Further, it is also possible to increase the light-emitting lifetime by reducing the driving voltage for obtaining a given brightness.

<<6. Fourth Example of Organic Electroluminescence Element (Inversely laminated configuration)>>
<Configuration of Organic Electroluminescence Element>

Figure 7:
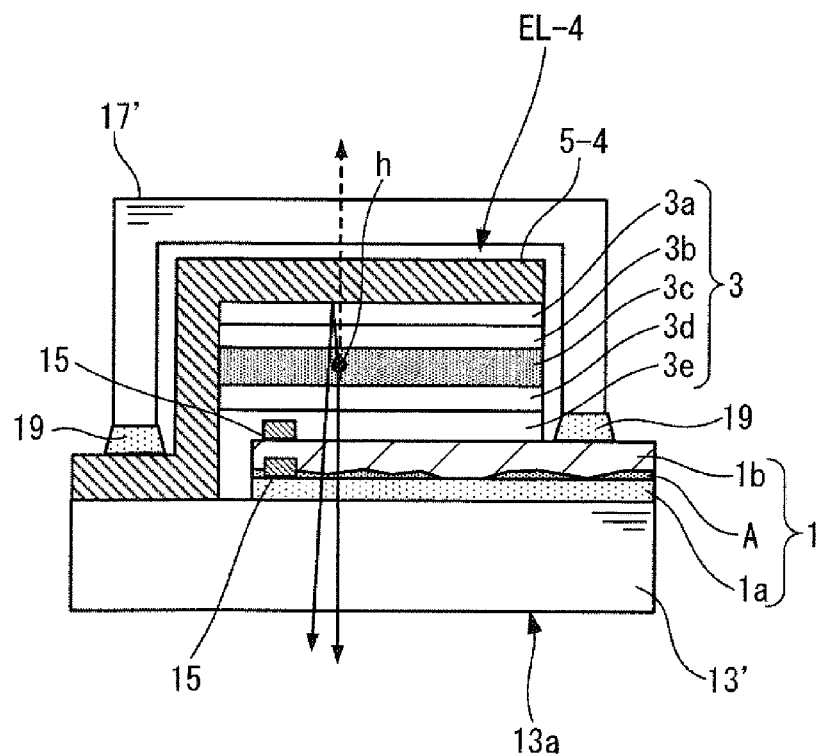
FIG. 7 is a view showing a cross-sectional configuration of a fourth example of the organic electroluminescence element that uses the transparent electrode according to the present invention.

As an example of the electronic device of the present invention, FIG. 7 shows a cross-sectional configuration of a fourth example of the organic electroluminescence element using the aforesaid transparent electrode. An organic electroluminescence element EL-4 of the fourth example shown in FIG. 7 differs from the organic electroluminescence element EL-1 of the first example described with reference to FIG. 4 in that a cathode a transparent electrode 1), a light-emitting functional layer 3 and an anode (an opposite electrode 5-4) are formed from the side of the transparent substrate 13' in this order, which is an order reverse to that of the organic electroluminescence element EL-1. In the following paragraphs, components identical to those of the first example will not be described repeatedly, and description will be focused on characteristic configurations of the organic electroluminescence element EL-4 of the fourth example.

The organic electroluminescence element EL-4 shown in FIG. 7 is arranged on the transparent substrate 13', and is formed by laminating a transparent electrode 1 (as the cathode), the light-emitting functional layer 3, and the opposite electrode 5-4 (as the anode), in this order, from the side of the transparent substrate 13'. It is characterized that, among these layers, the aforesaid transparent electrode of the present invention is used as the transparent electrode 1 of the organic electroluminescence element EL-4. Thus, the organic electroluminescence element EL-4 is configured as a bottom emission type organic electroluminescence element in which the luminescence light h is extracted at least from the side of the transparent substrate 13'.

Similar to the first example, the entire layer-structure of the organic electroluminescence element EL-4 is not particularly limited, but may be a generic layer-structure. As one example of the fourth example, a configuration shown here is formed by laminating an electron injecting layer 3e/an electron transporting layer 3d/a light emitting layer 3c/a hole transporting layer 3b/a hole injecting layer 3a, in this order, on the top of the transparent electrode 1 (as the cathode), and further laminating the opposite electrode 5-4 (as the anode) on the top of the hole injecting layer 3a.

Note that, similar to the first example, various configurations according to necessity may be adopted as the light-emitting functional layer 3; for example, the light-emitting functional layer 3 may also be provided with a hole blocking layer (not shown) and/or an electron blocking layer (not shown). In such a configuration, similar to the first example, only the portion sandwiched by the transparent electrode 1 and the opposite electrode 5-4 is a light-emitting region of the organic electroluminescence element EL-4.

In the organic electroluminescence element EL-4 of the present embodiment, in the transparent electrode 1 obtained by laminating the nitrogen-containing layer 1a, the aluminum intermediate layer A and the electrode layer 1b, in this order, on the transparent substrate 13', the electrode layer 1b substantially functions as the cathode; and the light-emitting functional layer 3 is directly formed on the electrode layer 1b. Thus, the nitrogen-containing layer 1a is formed by using a compound whose effective unshared electron pair content [n/M] falls into a predetermined range; further, it is preferred that the effective unshared electron pair content [n/M] of the nitrogen-containing layer 1a itself falls into a predetermined range, so that it is not necessary to use a material having electron transport performance or electron injection performance.

Further, similar to the first example, in the aforesaid layer-structure, in order to reduce the resistance of the transparent electrode 1, the auxiliary electrode 15 may also be provided in contact with the electrode layer 1b of the transparent electrode 1.

Further, the opposite electrode 5-4 (as the anode) formed on the top of the light-emitting functional layer 3 is composed of the same material as the anode of the first example, i.e., a metal, an alloy, an organic or inorganic conductive compound, or a mixture of these materials.

Incidentally, as a modification of the present embodiment, the present invention includes a configuration in which the anode above the light-emitting functional layer 3 is also a transparent electrode 1. In such a case, the aluminum intermediate layer A and the electrode layer 1b formed on the light-emitting functional layer 3 through the nitrogen-containing layer 1a are a substantive anode. Further, the nitrogen-containing layer 1a formed on the light-emitting functional layer 3 also constitutes a portion of the light-emitting functional layer 3. The nitrogen-containing layer 1a is formed by using a material having hole transport performance or hole injection performance selected from the compounds whose effective unshared electron pair content [n/M] falls in a predetermined range. Further, the nitrogen-containing layer 1a may also be formed by using a mixture obtained by mixing a compound having hole transport performance or hole injection performance with a compound whose effective unshared electron pair content [n/M] is equal to a certain value, so that the nitrogen-containing layer 1a itself has the aforesaid effective unshared electron pair content [n/M].

<Advantage of Organic Electroluminescence Element EL-4>

The organic electroluminescence element EL-4 described above has a configuration in which the transparent electrode 1, which has both the electrical conductivity and the light transmissibility, of the present invention is used as the cathode, and the light-emitting functional layer 3 and the opposite electrode 5-4 (as the anode) are formed, in this order, on the top of the transparent electrode 1. Thus, similar to the first example, it is possible to increase brightness by applying sufficient voltage between the transparent electrode 1 and the opposite electrode 5-4 to achieve high brightness light-emitting of the organic electroluminescence element EL-4 while increasing extraction efficiency of the luminescence light h from the side of the transparent electrode 1. Further, it is also possible to increase the light-emitting lifetime by reducing the driving voltage for obtaining a given brightness.

<<7. Applications of Organic Electroluminescence Element>>

As mentioned above, since the organic electroluminescence elements having the aforesaid configurations are each a planar light-emitting body, they can be used as various kinds of luminescent light sources. Examples of the various kinds of luminescent light sources include, but not limited to, an illumination device (such as a home lighting fixture, a car lighting fixture or the like), a backlight for timepiece or liquid crystal, an illumination for billboard, a light source for traffic light, a light source for optical storage medium, a light source for electrophotographic copier, a light source for optical communication processor and a light source for optical sensor; particularly, the light emitting source can be effectively used as a backlight for a liquid crystal display device combined with a color filter, and as a light source for illumination.

Further, the organic electroluminescence element according to the present invention may either be used as a kind of lamp such as an illuminating source, an exposing source or the like, or be used as a projection device where an image is projected, a display device (a display) where a still image or dynamic image is directly viewed, or the like. In such a case, as the size of the illumination devices and displays becomes large in recent years, the area of the light-emitting face may be increased by a method of so-called "tiling", in which a plurality of light-emitting panels each having an organic electroluminescence element are planarly connected with each other.

In the case where the organic electroluminescence element is used as a display device for replaying dynamic image, the driving method may either be a simple matrix driving method (i.e., passive matrix driving method) or an active matrix driving method. Further, it is possible to produce a color or full color display device by using two or more organic electroluminescence elements of the present invention each having different luminescent color.

As an example of the applications, an illumination device will be described below, and thereafter an illumination device whose light-emitting face is made large by tiling will be described.

<<8. Illumination Device 1>>

The illumination device of the present invention has an aforesaid organic electroluminescence element.

The organic electroluminescence element used in the illumination device according to the present invention may also have a design in which each of the organic electroluminescence elements having the aforesaid configurations is provided with a resonator structure. Examples of the intended use of the organic electroluminescence element configured as the resonator structure include, but not limited to, a light source for an optical storage medium, a light source for an electrophotographic copier, a light source for an optical communication processor, a light source for an optical sensor, and the like. Further, the illumination device may also be used for the aforesaid purpose by laser-oscillating.

Incidentally, the material used in the organic electroluminescence element of the present invention may be used for an organic electroluminescence element which substantially emits while light (also referred to as a "white organic electroluminescence element"). For example, it is possible to cause a plurality of emission colors to be simultaneously emitted by a plurality of light emitting materials so as to obtain a white light emission by mixed color. The combination of the plurality of luminescent colors may be a combination including three light emission maximum wavelengths of three primary colors of blue, green and red, or a combination including two light emission maximum wavelengths using the complementary color relationship such as blue and yellow, bluish-green and orange, or the like.

Further, the combination of light emitting materials for obtaining a plurality of emission colors may be a combination of a plurality of materials which emit a plurality of phosphorescent lights or fluorescent lights, or a combination of a light emitting material which emits phosphorescent light or fluorescent light and a dye material which emits light with the light emitted from the light emitting material as exciting light; however, in a white organic electroluminescence element, the combination of light emitting materials for obtaining a plurality of emission colors may also be a combinations of a plurality of light-emitting dopants.

In such a white organic electroluminescence element, the organic electroluminescence element itself emits white light, in contrast to a configuration in which a plurality of organic electroluminescence elements each emitting different color are parallelly arranged in array to obtain white-light emission. Thus, almost all layers constituting the element can be formed without mask, and it is possible to form an electrode film, for example, on one surface by a deposition method, a casting method, a spin coating method, an ink-jet method, a printing method or the like, so that productivity can be improved.

The light emitting material used in the light emitting layer of such a white organic electroluminescence element is not particularly limited; for example, if the light emitting material is used for the back light of a liquid crystal display element, arbitrary light emitting materials may be selected from the metal complexes of the present invention or known light emitting materials and combined to obtain white light in a manner in which the light is matched to the wavelength range corresponding to CF (color filter) characteristics.

By using the white organic electroluminescence element described above, it is possible to produce an illumination device which substantially emits white light.

<<9. Illumination Device 2>>

The organic electroluminescence element according to the present invention can be used as an illumination device whose light-emitting face is made large by using a plurality of the organic electroluminescence elements. In such a case, the area of the light-emitting face is increased by arranging (i.e., so-called "tiling") a plurality of light-emitting panels on a supporting substrate, wherein each light-emitting panel is formed by arranging an organic electroluminescence element on a transparent substrate. The supporting substrate may also serves as a sealing material; the light-emitting panels are tiled in a state where the organic electroluminescence elements are sandwiched between the supporting substrate and the transparent substrates of the light-emitting panels. An adhesive may be filled between the supporting substrate and the transparent substrates, and thereby the organic electroluminescence elements are sealed. Incidentally, the terminal of the transparent electrode and the terminal of the opposite electrode are exposed from the periphery of the light-emitting panel.

In the illumination device with such a configuration, the center of each light-emitting panel is a light-emitting region, and the region between adjacent light-emitting panels is a light non-emitting region. Thus, a light extraction member for increasing the amount of the light extracted from the light non-emitting region may be arranged in the light non-emitting region of the light extracting face. A light-collecting sheet, a light-diffusing sheet or the like can be used as the light extraction member.

Example 1

Production of Transparent Electrode

As the configuration shown in Table 2, the transparent electrode each of Samples 101 to 128 was produced so that the area of the conductive region of the transparent electrode became 5 cm×5 cm.

<Process for Producing Transparent Electrodes of Samples 101, 102>

As described below, an electrode layer composed of silver was formed on a base material made of glass to each film-thickness shown in Table 2.

First, a base material made of transparent alkali-free glass was fixed to a base material holder of a commercially available vacuum deposition device, and then the base material holder was mounted in a vacuum chamber of the vacuum deposition device. Further, silver (Ag) was placed in a tungsten resistance heating boat, and then the tungsten resistance heating boat was mounted in the vacuum chamber. Next, the pressure of the vacuum chamber was reduced to $4 \times 10^{-4}$ Pa, and then the resistance heating boat was electrically heated to form an electrode layer composed of silver to each film-thickness at a deposition rate of 0.1 nm/sec to 0.2 nm/sec. In Sample 101, the electrode layer was formed to a film-thickness of 5 nm, and in Sample 102, the electrode layer was formed to a film-thickness of 15 nm.

<Process for Producing Transparent Electrode of Sample 103>

As described below, an aluminum intermediate layer was formed on a base material made of transparent alkali-free glass, and an electrode layer composed of silver was formed on the top of the aluminum intermediate layer.

First, a base material made of transparent alkali-free glass was fixed to a base material holder of a commercially available vacuum deposition device, and then the base material holder was mounted in a vacuum chamber of the vacuum deposition device. Further, aluminum (A1) and silver (Ag) were respectively placed in two tungsten resistance heating boats, and then the tungsten resistance heating boats were mounted in the vacuum chamber. Next, the pressure of the vacuum chamber was reduced to $4 \times 10^{-4}$ Pa, and then the resistance heating boats were electrically heated sequentially, so that an aluminum intermediate layer composed of aluminum was formed to a film-thickness of 1 nm at a deposition rate of 0.05 nm/sec, and then an electrode layer composed of silver was formed to a film-thickness of 5 nm at a deposition rate of 0.1 nm/sec to 0.2 nm/sec.

<Process for Producing Transparent Electrodes of Samples 104 to 118>

As described below, a nitrogen-containing layer was formed by using each of materials shown in Table 2 on a base material made glass, and an aluminum intermediate layer and an electrode layer composed of silver were formed, in this order, on the top of the nitrogen-containing layer. However, in Sample 104, a ground layer containing no nitrogen was formed instead of the nitrogen-containing layer.

First, a base material made of transparent alkali-free glass was fixed to a base material holder of a commercially available vacuum deposition device. In the production of each transparent electrode, each of Compounds No. -1 to No. 11 shown in Table 2 was placed in a tantalum resistance heating boat. The base material holder and the heating boat were mounted in a first vacuum chamber of the vacuum deposition device. Further, aluminum (Al) and silver (Ag) were respectively placed in two tungsten resistance heating boats, and then the tungsten resistance heating boats were mounted in a second vacuum chamber.

Here, among the compounds to be used, Compounds No. -1 to No. -4 are compounds shown below, wherein each nitrogen atom having [effective unshared electron pair] is circled with a circle. Among these compounds, Compounds No. -1 is anthracene which contains no nitrogen atom; Compounds No. -2 to No. -4 each contain nitrogen atom(s), however the value of the effective unshared electron pair content [n/M] of each of Compounds No. -2 to No. -4 falls in a range of "$[n/M] < 3.9 \times 10^{-3}$".

[Chemical Formula 80]

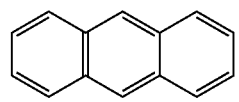

(Anthracene)

No.-1

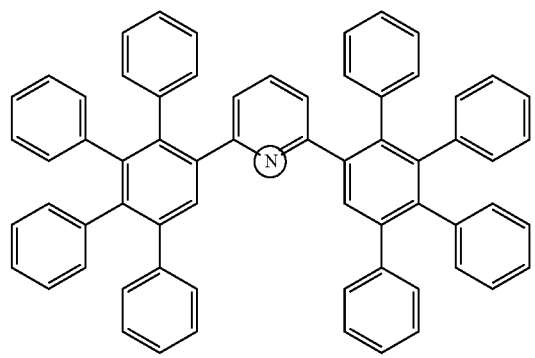

No.-2

-continued

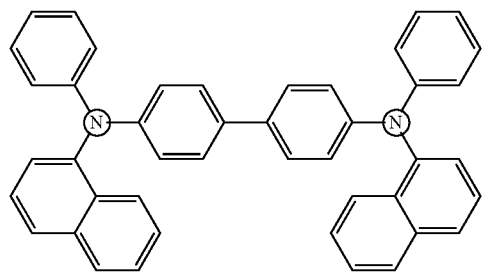

(α-NPD)

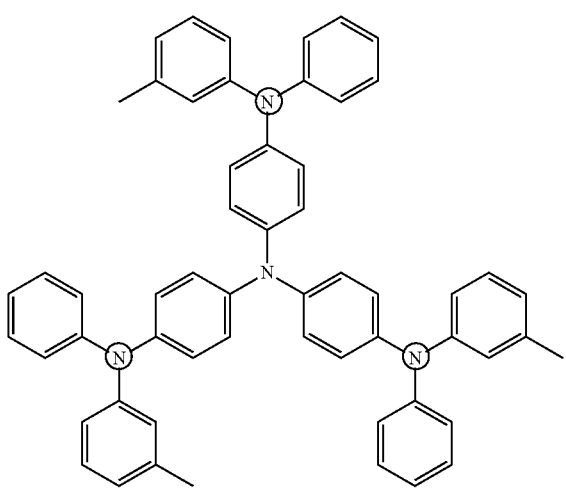

(m-MADATA)

On the other hand, each of Compounds No. 1 to No. 11 is one of the exemplary compounds whose effective unshared electron pair content [n/M] falls in a range of "[n/M]≥3.9× $10^{-3}$" exemplified in the aforesaid embodiment. The number [n] of the [effective unshared electron pair], the molecular weight [M], and the effective unshared electron pair content [n/M] of each of the compounds used here are also shown in Table 2.

Next, the pressure of the first vacuum chamber was reduced to 4×10$^{-4}$ Pa, and then the heating boat having each of the compounds placed therein was electrically heated to form a nitrogen-containing layer (or a ground layer in Sample 104) composed of each of the compounds to a film-thickness of 25 nm on the base material at a deposition rate of 0.1 nm/sec to 0.2 nm/sec.

Next, the base material, on which the layers up to the nitrogen-containing layer (or the ground layer) had been formed, was transferred to the second vacuum chamber while maintaining the vacuum state. After the pressure of the second vacuum chamber had been reduced to −4×10$^{-4}$ Pa, the heating boat having aluminum placed therein was electrically heated, and thereby an aluminum intermediate layer having a film-thickness of 1 nm was formed at a deposition rate of 0.05 nm/sec.

Thereafter, the heating boat having silver placed therein was electrically heated, and thereby an electrode layer composed of silver and having a film-thickness of 5 nm was formed at a deposition rate of 0.1 nm/sec to 0.2 nm/sec, so that the transparent electrode of each of Samples 104 to 118 having a laminated structure formed by laminating a nitrogen-containing layer (or a ground layer), an aluminum intermediate layer and an electrode layer, in this order, was obtained.

<Process for Producing Transparent Electrodes of Samples 119, 120>

The transparent electrode of each of Samples 119 and 120 was produced by performing the same process as the transparent electrode of each of Samples 104 to 118 except that the film-thickness of the electrode layer composed of silver was changed to 8 nm. However, in Sample 119, the nitrogen-containing layer was formed by using Compound No. 1, and in Sample 120, the nitrogen-containing layer was formed by using Compound No. 8.

<Process for Producing Transparent Electrodes of Samples 121 to 124>

The transparent electrode of each of Samples 121 to 124 was produced by performing the same process as the transparent electrode of each of Samples 104 to 118 except that the film-thickness of the aluminum intermediate layer was changed to 0.6 nm or 0.3 nm and the film-thickness of the electrode layer composed of silver was changed to 8 nm. However, in each of Samples 121 and 123, the nitrogen-containing layer was formed by using Compound No. 1, and in each of Samples 122 and 124, the nitrogen-containing layer was formed by using Compound No. 8. Further, in each of Samples 121 and 122, the film-thickness of the aluminum intermediate layer was 0.6 nm, and in each of Samples 123 and 124, the film-thickness of the aluminum intermediate layer was 0.3 nm.

<Process for Producing Transparent Electrodes of Samples 125, 126>

The transparent electrode of each of Samples 125 and 126 were formed by performing the same process as the transparent electrode of each of Samples 104 to 118 except that, in the formation of the nitrogen-containing layer, Compound No. 1 containing nitrogen and a halogen compound were co-deposited to form a nitrogen-containing layer containing 10 vol % of halogen atoms, and that the film-thickness of the aluminum intermediate layer was changed to 0.6 nm and the film-thickness of the electrode layer composed of silver was changed to 8 nm. Incidentally, in the formation of the aluminum intermediate layer, the temperature of the substrate was cooled to 10° C., so that the aluminum intermediate layer was formed without causing the halogen atoms of the nitrogen-containing layer to diffuse. Further, in Sample 125, potassium fluoride (KF) was used as the halogen compound for forming the nitrogen-containing layer, and in Sample 126, a bromine (Br) substituted product of Compound No. 1 was used as the halogen compound for forming the nitrogen-containing layer.

<Process for Producing Transparent Electrodes of Samples 127 and 128>

The transparent electrode of each of Samples 127 and 128 was produced by performing the same process as the transparent electrode of each of Samples 104 to 118 except that polyethylene terephthalate (PET) was used as the base material, the film-thickness of the aluminum intermediate layer was changed to 0.6 nm and the film-thickness of the electrode layer composed of silver was changed to 8 nm. However, in Sample 127, the nitrogen-containing layer was formed by using Compound No. 1, and in Sample 128, the nitrogen-containing layer was formed by using Compound No. 8.

<Evaluation of Each Sample of Example 1>

Light transmittance for light with a wavelength of 550 nm and sheet resistance of the transparent electrode of each of Samples 101 to 128 produced above were measured. The measurement of the light transmittance was performed using a spectrophotometer (U-3300, manufactured by Hitachi Co., Ltd.) with a base material identical to the sample as a baseline. The measurement of the sheet resistance was performed by a 4-terminal 4-probe constant current applying method using a resistivity meter (MCP-T610, manufactured by Mitsubishi Chemical Corporation). The results of the measurement are also shown in the following Table 2.

TABLE 2

Example 1 Transparent electrode

| | | Configuration of transparent electrode | | | | | Aluminum intermediate layer | Electrode layer | Result of Evaluation | | |
|---|---|---|---|---|---|---|---|---|---|---|---|
| | | Nitrogen-containing layer (ground layer) Film-thickness: 25 nm | | | | | | | | | |
| Sample No. | Substrate Material | Compound | Number of effective unshared electron pair [n] | Molecular weight [M] | [n/M] | Halogen compound (content) | (Al) Film-thickness nm | (Ag) Film-thickness nm | Transmittance % (550 nm) | Sheet resistance $\Omega$/sq. | Remark |
| 101 | Glass | — | — | — | — | — | — | 5 | 45.3 | Unmeasurable | Comparison |
| 102 | | — | — | — | — | — | — | 15 | 25.4 | 5.0E+00 | Comparison |
| 103 | | — | — | — | — | — | 1 | 5 | 43.5 | Unmeasurable | Comparison |
| 104 | | No. −1 (Anthracene) | 0 | 178.23 | 0.0E+00 | — | 1 | 5 | 44.4 | Unmeasurable | Comparison |
| 105 | | No. −2 | 1 | 839 | 1.2E−03 | — | | | 42.3 | Unmeasurable | Comparison |
| 106 | | No. −3 (α-NPD) | 2 | 588.74 | 3.4E−03 | — | | | 47.4 | 2.4E+04 | Comparison |
| 107 | | No. −4 (m-MADATA) | 3 | 789.02 | 3.8E−03 | — | | | 48.2 | 1.2E+04 | Comparison |
| 108 | Glass | No. 1 | 4 | 716.83 | 5.6E−03 | — | 1 | 5 | 69.8 | 7.2E+02 | Present invention |
| 109 | | No. 2 | 4 | 716.83 | 5.6E−03 | — | | | 66.8 | 7.4E+02 | Present invention |
| 110 | | No. 3 | 4 | 551.64 | 7.3E−03 | — | | | 67.8 | 6.8E+02 | Present invention |
| 111 | | No. 4 | 4 | 516.60 | 7.7E−03 | — | | | 69.8 | 1.1E+02 | Present invention |
| 112 | | No. 5 | 5 | 539.63 | 9.3E−03 | — | | | 66.8 | 1.1E+02 | Present invention |
| 113 | | No. 6 | 6 | 646.76 | 9.3E−03 | — | | | 67.8 | 9.6E+01 | Present invention |
| 114 | | No. 7 | 4 | 412.45 | 9.7E−03 | — | | | 71.8 | 6.4E+01 | Present invention |
| 115 | | No. 8 | 6 | 616.71 | 9.7E−03 | — | | | 71.8 | 4.7E+01 | Present invention |
| 116 | | No. 9 | 5 | 463.53 | 1.1E−03 | — | | | 67.8 | 1.1E+02 | Present invention |
| 117 | | No. 10 | 6 | 540.62 | 1.1E−03 | — | | | 71.8 | 5.0E+01 | Present invention |
| 118 | | No. 11 | 6 | 312.33 | 1.9E−03 | — | | | 71.8 | 4.2E+01 | Present invention |
| 119 | Glass | No. 1 | 4 | 716.83 | 5.6E−03 | — | 1 | 8 | 71.8 | 8.1E+00 | Present invention |
| 120 | | No. 8 | 6 | 616.71 | 9.7E−03 | — | | | 71.8 | 8.4E+00 | Present invention |
| 121 | | No. 1 | 4 | 716.83 | 5.6E−03 | — | 0.6 | 8 | 73.4 | 7.6E+00 | Present invention |
| 122 | | No. 8 | 6 | 616.71 | 9.7E−03 | — | | | 72.4 | 7.9E+00 | Present invention |
| 123 | | No. 1 | 4 | 716.83 | 5.6E−03 | — | 0.3 | 8 | 71.8 | 7.1E+00 | Present invention |
| 124 | | No. 8 | 6 | 616.71 | 9.7E−03 | — | | | 70.8 | 7.3E+00 | Present invention |
| 125 | Glass | No. 1 | 4 | 716.83 | 5.6E−03 | KF (10 vol %) | 0.6 | 8 | 75.9 | 6.6E+00 | Present invention |
| 126 | | No. 1 | 4 | 716.83 | 5.6E−03 | Compound No. 1 containing Br (10 vol %) | | | 76.0 | 6.8E+00 | Present invention |
| 127 | PET | No. 1 | 4 | 716.83 | 5.6E−03 | — | 0.6 | 8 | 66.8 | 1.3E+01 | Present invention |
| 128 | | No. 8 | 6 | 616.71 | 9.7E−03 | — | | | 67.8 | 1.6E+01 | Present invention |

<Evaluation Results of Example 1>

As is clear from Table 2, the transparent electrode of each of Samples 108 to 128 (i.e., a transparent electrode including a nitrogen-containing layer, an aluminum intermediate layer and an electrode layer composed of silver, wherein the nitrogen-containing layer is formed by using one of Compounds No. 1 to No. 11 whose effective unshared electron pair content [n/M] falls in a confirmed predetermined range of "$3.9 \times 10^{-3} \leq [n/M]$" and "$[n/M] \leq 1.9 \times 10^{-2}$", and wherein the aluminum intermediate layer and the electrode layer are formed on the top of the nitrogen-containing layer) has an electrode layer (which substantially functions as a conductive layer) having an extremely small film-thickness of 5 nm or 8 nm yet having a low sheet resistance of a two-digit value or lower. Incidentally, such effect will be further reliable if the effective unshared electron pair content [n/M] falls in a range of "$5.0 \times 10^{-3} \leq [n/M]$". Based on this fact, it is confirmed that, in the transparent electrode having the configuration of the present invention, the electrode layer formed on the nitrogen-containing layer through the aluminum intermediate layer is formed in a manner in which the electrode layer grows in a single-layer growth mode (Frank-van der Merwe: FW mode) and thereby is formed into a film having substantially uniform thickness.

Further, it is confirmed that, the transparent electrode of each of Samples 108 to 128 is provided with an aluminum intermediate layer, yet has a very small film-thickness of 0.3 nm to 1 nm, and thereby has a light transmittance of 50% or higher, so that the transparent electrode of each of Samples 108 to 128 can be used as a transparent electrode.

The aforesaid results do not change no matter the base material is glass or plastic material (PET).

Particularly, it is confirmed by comparing Sample 108 with Sample 119 (they are different only in the film-thickness of the electrode layer) and comparing Sample 115 with Sample 120 (they are also different only in the film-thickness of the electrode layer) that no matter the film-thickness of the electrode layer is 5 nm or 8 nm, the light transmittance of the electrode layer is maintained at a high value of around 70%, and it is also confirmed that the sheet resistance is reduced by increasing the film-thickness of the electrode layer from 5 nm to 8 nm, so that it is possible to improve both the light transmittance and the electrical conductivity.

In contrast, the transparent electrode of each of Samples 101, 103 (in which no nitrogen-containing layer is provided) and the transparent electrode of each of Samples 104 to 107 (in which the nitrogen-containing layer (or ground layer) is formed by using one of Compounds No. -2 to No. -4 whose effective unshared electron pair content [n/M] falls in a range of "$3.9 \times 10^{-3} > [n/M]$") each have an unmeasurable sheet resistance or have a high sheet resistance of four-digit value, and therefore cannot be used as an electrode. Also, these transparent electrodes each have a light transmittance of less than 50%, and therefore cannot be used as a transparent electrode. Incidentally, since the electrode layer of Sample 102, in which no ground layer (such as nitrogen-containing layer) is provided, has a large film-thickness of 15 nm, it has small sheet resistance but low light transmittance, and therefore cannot be used as a transparent electrode.

Based on above facts, it is confirmed that, by bringing a nitrogen-containing layer composed of a compound selected using the effective unshared electron pair content [n/M] as an index into contact with an electrode layer having silver as the main component thereof with an aluminum intermediate layer sandwiched therebetween, it is possible to obtain an electrode film which has small thickness (so as to have light transmissibility) and yet has low resistance (i.e., it is possible to obtain a transparent electrode).

Further, it can be known by comparing Samples 119, 121, 123 (they are different only in the film-thickness of the aluminum intermediate layer) and comparing Samples 120, 122, 124 (they are also different only in the film-thickness of the aluminum intermediate layer) that the smaller the film-thickness of the aluminum intermediate layer is, the lower the sheet resistance of the transparent electrode becomes; however, the light transmittance of the transparent electrode has a maximum value with the film-thickness of the aluminum intermediate layer as a factor, and the maximum value is obtained when the film-thickness of the aluminum intermediate layer is equal to or smaller than 1 nm. Thus, it is preferred that the film-thickness of the aluminum intermediate layer is equal to or smaller than 1 nm.

Furthermore, it is confirmed by comparing Samples 121, 125, 126 (they are different only in the halogen compound of the nitrogen-containing layer) that it is possible to improve the light transmittance of the transparent electrode and further reduce the sheet resistance by containing a halogen compound in the nitrogen-containing layer.

Example 2

Production of Top Emission Type Organic Electroluminescence Element

As shown in Table 3, top emission type organic electroluminescence elements of Samples 201 to 228 were produced, wherein each top emission type organic electroluminescence element has one of the transparent electrodes, each having different configuration, produced in Example 1 arranged, as a cathode, above the light-emitting functional layer. Each organic electroluminescence element of Example 2 was produced by applying the production of a corresponding transparent electrode of Example 1 having the same last two digits of the sample number as Example 2; for example, the organic electroluminescence element of Sample 201 is produced by applying the production of the transparent electrode of Sample 101, the organic electroluminescence element of Sample 203 is produced by applying the production of the transparent electrode of Sample 103, the organic electroluminescence element of Sample 204 is produced by applying the production of the transparent electrode of Sample 104, and the like. Incidentally, since the light transmittance of Sample 102 of Example 1 is not sufficient to be used as a transparent electrode, Example 2 has no Sample 202. The process of the production will be described below with reference to FIG. 8.

<Process for Producing Organic Electroluminescence Elements of Samples 201 to 228>

(Opposite Electrode 5-1: Formation of Anode)

First, in Samples 201 to 226, a substrate 13 made of transparent alkali-free glass was prepared. Further, in Samples 227 and 228, a substrate 13 made of polyethylene terephthalate (PET) was prepared. Further, in the production of each of Samples 201 to 228, as an anode, an opposite electrode 5-1 composed of aluminum was formed into a pattern having a film-thickness of 100 nm on the top of the substrate 13 by using a sputtering method.

The substrate 13, on which the opposite electrode 5-1 had been formed, was fixed to a substrate holder of a commercially available vacuum deposition device, a deposition mask was set to face a surface of the substrate where the opposite electrode 5-1 had been formed, and the substrate holder was mounted in a first vacuum chamber of the vacuum deposition device. Further, respective materials for forming the light-emitting functional layer 3 and the transparent electrode 1 were filled into respective heating boats provided in the vacuum deposition device, wherein the amounts of the respective materials filled into respective heating boards were optimized to form the respective layers, and the heating boats were mounted in the first vacuum chamber. Incidentally, the heating boats were each produced by using a resistance heating material made of tungsten.

Next, the pressure of the first vacuum chamber of the vacuum deposition device was reduced to $4 \times 10^{-4}$ Pa, and the heating boats having respective materials placed therein were electrically heated sequentially, and thereby the respective layers were formed as follows.

(Formation of Hole Transporting/injecting Layer 31)

First, a heating boat having α-NPD represented by the following structural formula, as a hole transporting/injecting material, placed therein was electrically heated to form a hole transporting/injecting layer 31 on the opposite electrode 5-1, wherein the hole transporting/injecting layer 31 is composed of α-NPD and serves both as a hole injecting layer and as a hole transporting layer. At this time, the deposition rate was 0.1 nm/sec to 0.2 nm/sec, and the film-thickness was 20 nm.

[Chemical Formula 81]

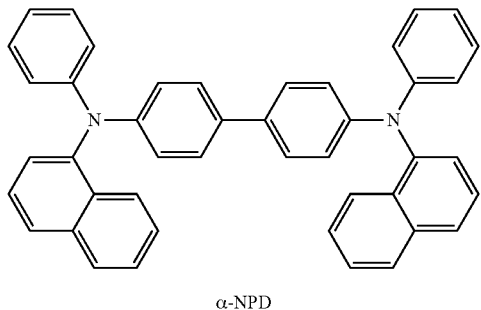

α-NPD (Formation of Light Emitting Layer 32)

Next, a heating boat having a host material H4 represented by a structural formula shown before placed therein and a heating boat having a phosphorescent compound Ir-4 represented by a structural formula shown before placed therein were each independently electrically heated to form, on the hole transporting/injecting layer 31, a light emitting layer 32 composed of the host material H4 and the phosphorescent compound Ir-4. At this time, the deposition rates of the two compounds were adjusted by adjusting the currents of the two heating boats so that the ratio of (host H4):(phosphorescent compound Ir-4)=10:6. The film-thickness was 30 nm.

(Formation of Hole Blocking Layer 33)

Next, a heating boat having BAlq, as a hole blocking material, represented by the following formula placed therein was electrically heated to form a hole blocking layer 33 composed of BAlq on the light emitting layer 32. At this time, the deposition rate was 0.1 nm/sec to 0.2 nm/sec, and the film-thickness was 10 nm.

[Chemical Formula 82]

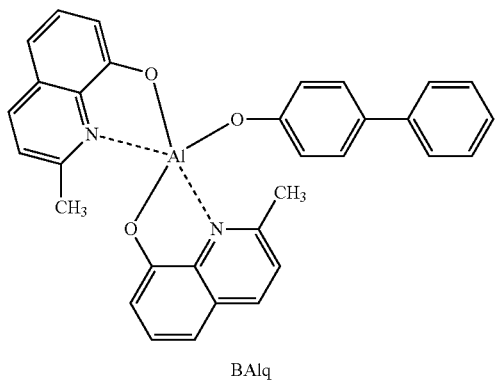

BAlq (Formation of Electron Transporting/injecting Layer 34)

Thereafter, as an electron transporting material, a heating boat having Compound 10 represented by the structural formula shown before placed therein and a heating boat having potassium fluoride placed therein were each independently electrically heated to form an electron transporting/injecting layer 34 composed of Compound 10 and potassium fluoride on the hole blocking layer 33, wherein the electron transporting/injecting layer 34 functions both as an electron injecting layer and as an electron transporting layer. At this time, the deposition rates of the two compounds were adjusted by adjusting the currents of the two heating boats so that the ratio of (Compound 10):(potassium fluoride (KF))=75:25. The film-thickness was 30 nm. Incidentally, Compound 10 also is Compound No. 1 whose effective unshared electron pair content [n/M] falls in a predetermined range.

(Formation of Nitrogen-Containing Layer 1a of Transparent Electrode 1)

Thereafter, in each of Samples 204 to 228, a heating boat having a compound placed therein was electrically heated to form a nitrogen-containing layer 1a (or a ground layer containing no nitrogen in Sample 204) composed of the compound on the electron transporting/injecting layer 34. At this time, the deposition rate was 0.1 nm/sec to 0.2 nm/sec, and the film-thickness was 25 nm. Such process was omitted for Samples 201 and 203.

(Aluminum Intermediate Layer A of Transparent Electrode 1: Formation of Cathode)

The substrate 13, on which the electron transporting/injecting layer 34 or the nitrogen-containing layer 1a had been formed, was transferred to a second vacuum chamber of the vacuum deposition device while maintaining the vacuum atmosphere, and the pressure of the second vacuum chamber was reduced to 4×10-4 Pa. Thereafter, a heating boat having aluminum placed therein mounted in the second vacuum chamber was electrically heated to form an aluminum intermediate layer A composed of aluminum at a deposition rate of 0.05 nm/sec. The aluminum intermediate layer A is used as a portion of the cathode. As shown in the following Table 3, in each of Samples 203 to 228, the aluminum intermediate layer A is formed so that the film-thickness of the aluminum intermediate layer A falls in a range between 0.3 nm to 1 nm. Incidentally, such process was omitted for Sample 201.

(Electrode Layer 1b of Transparent Electrode 1: Formation of Cathode)

Thereafter, a heating boat having silver placed therein mounted in the second vacuum chamber was electrically heated to form an electrode layer 1b composed of silver at a deposition rate of 0.3 nm/sec. The electrode layer 1b was used as a portion of the cathode. As shown in the following Table 3, in each of Samples 201 to 228, the electrode layer 1b was formed so that the film-thickness of the electrode layer 1b falls in a range between 5 nm to 8 nm. By performing this process, each transparent electrode 1 with different configuration was obtained for Samples 201 to 228. By performing the above processes, a top emission type organic electroluminescence element EL-1 was formed.

(Sealing of Element)

Thereafter, the organic electroluminescence element EL-1 was covered by the transparent sealing material 17 formed of a glass substrate having a thickness of 300 μm, and, in a state where the organic electroluminescence element EL-1 was enclosed by the transparent sealing material 17, the gap between the transparent sealing material 17 and the substrate 13 was filled with the adhesive 19 (a sealing material). An epoxy-based light curable adhesive (Lux track LC0629B, manufactured by Toa Gosei Co. Ltd.) was used as the adhesive 19. Ultraviolet light was irradiated from the side of the glass substrate (i.e., the transparent sealing material 17) onto the adhesive 19 filled into the gap between the transparent sealing material 17 and the substrate 13 to cure the adhesive 19 to thereby seal the organic electroluminescence element EL-1.

Incidentally, in the formation of the organic electroluminescence element EL-1, a deposition mask was used to form each layer; so that in the substrate 13 which had a size of (5 cm×5 cm), the central area (4.5 cm×4.5 cm) was formed as a light-emitting region A, and a light non-emitting region B having a width of 0.25 cm was formed surrounding the light-emitting region A. Further, the opposite electrode 5-1 (which is the anode), and both the electrode layer 1b and aluminum intermediate layer A (which are the cathode) of the transparent electrode 1 were formed into a shape such that the terminal portions thereof were drawn out to the edge of the substrate 13 in a state where the opposite electrode 5-1, and both the electrode layer 1b and the aluminum intermediate layer A of the transparent electrode 1 were insulated from each other by the layers from the hole transporting/injecting layer 31 to the nitrogen-containing layer (the ground layer) 1a.

In such a manner, the organic electroluminescence element EL-1 was arranged on the substrate 13, and the organic electroluminescence element EL-1 was sealed by the transparent sealing material 17 and the adhesive 19, so that each light-emitting panel of the organic electroluminescence element of the Samples 201 to 228 was obtained. In each light-emitting panel, each different color of the luminescence light h emitted from the light emitting layer 32 was extracted from the side of the transparent sealing material 17.

<Evaluation of Each Sample of Example 2>

Driving voltage and high-temperature/high-humidity preservation performance of the organic electroluminescence element EL-1 (the light-emitting panel) produced in each of Samples 201 to 228 were measured. The results of the measurement are also shown in the following Table 3.

In the measurement of the driving voltage, the voltage at the time when the front brightness on the side of the transparent electrode 1 (i.e., the side of transparent sealing material 17) of each organic electroluminescence element EL-1 was equal to 1000 cd/m$^2$ was measured as the driving voltage. Incidentally, the brightness was measured using a spectroradiometer CS-1000 (manufactured by Konica Minolta Sensing Inc.). The smaller the value of the obtained driving voltage is, the more preferable the result is.

In the measurement of the high-temperature/high-humidity preservation performance, the light-emitting panel of each of Samples 201 to 228 was preserved under a high-temperature/high-humidity environment (at a temperature of 60° C. and a humidity of 90%) while the light-emitting panel was driven by a driving voltage when the brightness becomes 10000 cd, and variation ΔV between the driving voltages before and after 300 hours had passed was measured. The value of the variation ΔV was regarded as the high-temperature/high-humidity preservation performance. The smaller the value of the obtained variation ΔV is, the more preferable the result is.

TABLE 3

Example 2 Top emission configuration

| | | Configuration of transparent electrode (cathode: upper electrode) | | | | | Aluminum intermediate layer (Al) Film-thickness nm | Electrode layer (Ag) Film-thickness nm | Result of Evaluation | | |
|---|---|---|---|---|---|---|---|---|---|---|---|
| | | Nitrogen-containing layer (ground layer) Film-thickness: 25 nm | | | | | | | | | |
| Sample No. | Substrate Material | Compound | Number of effective unshared electron pair [n] | Molecular weight [M] | [n/M] | Halogen compound (content) | | | Driving voltage V | High-temperature/high-humidity preservation performance ΔV | Remark |
| 201 | Glass | — | — | — | — | — | — | 5 | Do not emit light | — | Comparison |
| 203 | — | — | — | — | — | — | 1 | 5 | Do not emit light | — | Comparison |
| 204 | | No. −1 (Anthracene) | 0 | 178.23 | 0.0E+00 | — | 1 | 5 | Do not emit light | — | Comparison |
| 205 | | No. −2 | 1 | 839 | 1.2E−03 | — | | | Do not emit light | — | Comparison |
| 206 | | No. −3 (α-NPD) | 2 | 588.74 | 3.4E−03 | — | | | 10.5 | Do not emit light | Comparison |
| 207 | | No. −4 (m-MADATA) | 3 | 789.02 | 3.8E−03 | — | | | 10.2 | Do not emit light | Comparison |
| 208 | Glass | No. 1 | 4 | 716.83 | 5.6E−03 | — | 1 | 5 | 6.3 | 3.3 | Present invention |
| 209 | | No. 2 | 4 | 716.83 | 5.6E−03 | — | | | 8.7 | 4.3 | Present invention |
| 210 | | No. 3 | 4 | 551.64 | 7.3E−03 | — | | | 5.9 | 2.9 | Present invention |
| 211 | | No. 4 | 4 | 516.60 | 7.7E−03 | — | | | 6.4 | 3.2 | Present invention |
| 212 | | No. 5 | 5 | 539.63 | 9.3E−03 | — | | | 8.8 | 4.2 | Present invention |
| 213 | | No. 6 | 6 | 646.76 | 9.3E−03 | — | | | 7.8 | 3.9 | Present invention |

TABLE 3-continued

Example 2 Top emission configuration

Configuration of transparent electrode (cathode: upper electrode)

| Sample No. | Substrate Material | Compound | Number of effective unshared electron pair [n] | Molecular weight [M] | [n/M] | Halogen compound (content) | Aluminum intermediate layer (Al) Film-thickness nm | Electrode layer (Ag) Film-thickness nm | Driving voltage V | High-temperature/ high-humidity preservation performance $\Delta$V | Remark |
|---|---|---|---|---|---|---|---|---|---|---|---|
| 214 | | No. 7 | 4 | 412.45 | 9.7E–03 | — | | | 5.2 | 2.5 | Present invention |
| 215 | | No. 8 | 6 | 616.71 | 9.7E–03 | — | | | 5.3 | 2.6 | Present invention |
| 216 | | No. 9 | 5 | 463.53 | 1.1E–03 | — | | | 7.9 | 3.8 | Present invention |
| 217 | | No. 10 | 6 | 540.62 | 1.1E–03 | — | | | 5.1 | 2.4 | Present invention |
| 218 | | No. 11 | 6 | 312.33 | 1.9E–03 | — | | | 5.2 | 2.6 | Present invention |
| 219 | Glass | No. 1 | 4 | 716.83 | 5.6E–03 | — | 1 | 8 | 5.2 | 1.5 | Present invention |
| 220 | | No. 8 | 6 | 616.71 | 9.7E–03 | — | | | 5.1 | 1.4 | Present invention |
| 221 | | No. 1 | 4 | 716.83 | 5.6E–03 | — | 0.6 | 8 | 4.3 | 1.1 | Present invention |
| 222 | | No. 8 | 6 | 616.71 | 9.7E–03 | — | | | 4.9 | 1.2 | Present invention |
| 223 | | No. 1 | 4 | 716.83 | 5.6E–03 | — | 0.3 | | 5.1 | 1.5 | Present invention |
| 224 | | No. 8 | 6 | 616.71 | 9.7E–03 | — | | | 5.5 | 1.4 | Present invention |
| 225 | Glass | No. 1 | 4 | 716.83 | 5.6E–03 | KF (10 vol %) | 0.6 | 8 | 4.2 | 0.9 | Present invention |
| 226 | | No. 1 | 4 | 716.83 | 5.6E–03 | Compound No. 1 containing Br (10 vol %) | | | 4.2 | 0.8 | Present invention |
| 227 | PET | No. 1 | 4 | 716.83 | 5.6E–03 | — | 0.6 | 8 | 6.1 | 2.1 | Present invention |
| 228 | | No. 8 | 6 | 616.71 | 9.7E–03 | — | | | 6.2 | 2.3 | Present invention |

<Evaluation Results of Example 2>

As is clear from Table 3, it is confirmed that, with the organic electroluminescence element of each of Samples 208 to 228, light emission at a front brightness of 1000 cd/m² can be obtained with a low driving voltage of 10 V or less, wherein the organic electroluminescence element of each of Samples 208 to 228 is provided with a transparent electrode 1 that includes a nitrogen-containing layer 1a formed by using one of Compounds No. 1 to No. 11 whose effective unshared electron pair content [n/M] satisfies "3.9×10-3×≤[n/M]", an aluminum intermediate layer A and an electrode layer 1b composed of silver, wherein the aluminum intermediate layer A and the electrode layer 1b are formed on the top of the nitrogen-containing layer 1a. Further, it is confirmed that the organic electroluminescence element of each of Samples 208 to 228 can emit light after being preserved under a high-temperature/high-humidity environment, and therefore it is confirmed that such organic electroluminescence element is excellent in high-temperature/high-humidity preservation performance; and further, based on this fact, it is confirmed that the electrode layer 1b composed of silver is formed as a continuous film and therefore has barrier properties, so that deterioration of the light-emitting functional layer 3 composed of the organic material is prevented.

In contrast, the organic electroluminescence element EL-1 of each of Samples 201 and 203 (in which the nitrogen-containing layer 1a is not provided) and the organic electroluminescence element EL-1 of each of Samples 204 to 207 (in which the nitrogen-containing layer (the ground layer) is formed by using one of Compounds No. -1 to No. -4 whose effective unshared electron pair content [n/M] does not fall in the aforesaid range) cannot emit light even when a voltage is applied, or can emit light only when a driving voltage of higher than 10 V is applied, and have poor high-temperature/high-humidity preservation performance.

Based on the above facts, it is confirmed that the top emission type organic electroluminescence element EL-1 using the transparent electrode 1 having the configuration of the present invention can emit light of higher brightness with lower driving voltage, and has excellent preservation performance; and further, based on this, it is confirmed that it is expected to reduce driving voltage and improve light-emitting lifetime for obtaining a given brightness.

Further, it can be known by comparing Samples 219, 221, 223 (they are different only in the film-thickness of the aluminum intermediate layer A) and comparing Samples 220, 222, 224 (they are also different only in the film-thickness of the aluminum intermediate layer A) that the driving voltage and the high-temperature/high-humidity preservation performance each have a minimum value with the film-thickness of the aluminum intermediate layer as a factor, and the minimum value is obtained when the film-thickness of the aluminum intermediate layer is equal to or smaller than 1 nm. Thus, it is preferred that the film-thickness of the aluminum intermediate layer is equal to or smaller than 1 nm.

Furthermore, it is confirmed by comparing Samples 221, 225, 226 (they are different only in the halogen compound of the nitrogen-containing layer 1a) that it is possible to reduce the driving voltage and further improve the high-temperature/high-humidity preservation performance by containing a halogen compound in the nitrogen-containing layer 1a.

Example 3

Production of Bottom Emission Type Organic Electroluminescence Element

As shown in Table 4, bottom emission type organic electroluminescence elements of Samples 301 to 328 were produced, wherein each bottom emission type organic electroluminescence element has one of the transparent electrodes, each having different configuration, produced in Example 1 arranged, as an anode, above the light-emitting functional layer. Each organic electroluminescence element of Example 3 was produced by applying the production of a corresponding transparent electrode of Example 1 having the same last two digits of the sample number as Example 2; for example, the organic electroluminescence element of Sample 301 is produced by applying the production of the transparent electrode of Sample 101, the organic electroluminescence element of Sample 303 is produced by applying the production of the transparent electrode of Sample 103, the organic electroluminescence element of Sample 304 is produced by applying the production of the transparent electrode of Sample 104, and the like. Incidentally, since the light transmittance of Sample 102 of Example 1 is not sufficient to be used as a transparent electrode, Example 3 has no Sample 302. The process of the production will be described below with reference to FIG. 9.

<Process for Producing Organic Electroluminescence Elements of Samples 301 to 328>

(Formation of Transparent Electrode 1)

First, in Samples 301 to 326, a transparent substrate 13' made of transparent alkali-free glass was prepared. Further, in Samples 327 and 328, a transparent substrate 13' made of polyethylene terephthalate (PET) was prepared. In the production of each of Samples 301 to 328, a transparent electrode 1 having one of the configurations shown in Table 4 was formed on the top of the transparent substrate 13'. The process for forming the transparent electrode 1 is identical to that of each of Samples 101 to 128 of Example 1. In other words, each transparent electrode of Example 3 was formed by performing the same process as that for forming a corresponding transparent electrode of Example 1 having the same last two digits of the sample number as Example 3; for example, the transparent electrode of Sample 301 was formed by performing the same process as Sample 101, the transparent electrode of Sample 303 was formed by performing the same process as Sample 103, and the like.

(Formation of Layers from Hole Transporting/injecting Layer 31 to Electron Transporting/injecting Layer 34)

Next, a hole transporting/injecting layer 31 (which functions both as a hole injecting layer and as a hole transporting layer) composed of α-NPD (film-thickness: 20 nm), a light emitting layer 32 composed of the host material H4 and the phosphorescent compound Ir-4 (film-thickness: 30 nm), a hole blocking layer 33 composed of BAlq (film-thickness: 10 nm), and an electron transporting/injecting layer 34 composed of Compound 10 and potassium fluoride (film-thickness: 30 nm) were formed into the same configuration as each of Samples 201 to 228 of Example 2 described above. Each layer was formed in the same manner as described in Example 2.

(Opposite Electrode 5-2: Formation of Cathode)

Thereafter, the transparent substrate 13' having the light-emitting functional layer 3 formed thereon was transferred to the second vacuum chamber of the vacuum deposition device. After the pressure of the second vacuum chamber was reduced to $-4 \times 10^{-4}$ Pa, a heating boat having aluminum placed therein and mounted in the second vacuum chamber was electrically heated, and thereby an opposite electrode 5-2 composed of aluminum and having a film-thickness of 100 nm was formed at a deposition rate of 0.3 nm/sec. The opposite electrode 5-2 is used as the cathode. By performing the above process, a bottom emission type organic electroluminescence element EL-2 was formed on the transparent substrate 13'.

(Sealing of Element)

Thereafter, similar to Example 2, the organic electroluminescence element EL-2 was sealed by a glass substrate (the sealing material 17'). Incidentally, in the formation of the organic electroluminescence element EL-2, a deposition mask was used to form each layer; so that in the transparent substrate 13' having a size of (5 cm×5 cm), the central area (4.5 cm×4.5 cm) was formed as a light-emitting region A, and a light non-emitting region B having a width of 0.25 cm was formed surrounding the light-emitting region A. Further, both the electrode layer 1b and the aluminum intermediate layer A (the anode) of the transparent electrode 1, and the opposite electrode 5-2 (the cathode) were formed into a shape such that the terminal portions thereof were drawn out to the edge of the transparent substrate 13' in a state where both the electrode layer 1b and the aluminum intermediate layer A of the transparent electrode 1, and the opposite electrode 5-2 were insulated from each other by the layers from the hole transporting/injecting layer 31 to the electron transporting/injecting layer 34.

In such a manner, the organic electroluminescence element EL-2 was arranged on the transparent substrate 13', and the organic electroluminescence element EL-2 was sealed by the sealing material 17' and the adhesive 19, so that each light-emitting panel of the organic electroluminescence element of the Samples 301 to 328 was obtained. In each light-emitting panel, each different color of the luminescence light h emitted from the light emitting layer 32 was extracted from the side of the transparent substrate 13'.

<Evaluation of Each Sample of Example 3>

Similar to Example 2, the driving voltage and the high-temperature/high-humidity preservation performance of the organic electroluminescence element EL-2 (the light-emitting panel) produced in each of Samples 301 to 328 were measured. The results of the measurement are also shown in the following Table 4.

TABLE 4

Example 3 Bottom emission configuration

| | | Configuration of transparent electrode (anode: lower electrode) | | | | | | | | |
|---|---|---|---|---|---|---|---|---|---|---|
| | | Nitrogen-containing layer (ground layer) Film-thickness: 25 nm | | | | Aluminum intermediate layer (Al) Film-thickness nm | Electrode layer (Ag) Film-thickness nm | Result of Evaluation | | |
| Sample No. | Substrate Material | Compound | Number of effective unshared electron pair [n] | Molecular weight [M] | [n/M] | Halogen compound (content) | | | Driving voltage V | High-temperature/ high-humidity preservation performance ΔV | Remark |
| 301 | Glass | — | — | — | — | — | — | 5 | Do not emit light | — | Comparison |
| 303 | | — | — | — | — | — | 1 | 5 | Do not emit light | — | Comparison |
| 304 | | No. −1 (Anthracene) | 0 | 178.23 | 0.0E+00 | | 1 | 5 | Do not emit light | — | Comparison |
| 305 | | No. −2 | 1 | 839 | 1.2E−03 | | | | Do not emit light | — | Comparison |
| 306 | | No. −3 (α-NPD) | 2 | 588.74 | 3.4E−03 | | | | 10.3 | Do not emit light | Comparison |
| 307 | | No. −4 (m-MADATA) | 3 | 789.02 | 3.8E−03 | | | | 10.2 | Do not emit light | Comparison |
| 308 | Glass | No. 1 | 4 | 716.83 | 5.6E−03 | | 1 | 5 | 6.1 | 7.1 | Present invention |
| 309 | | No. 2 | 4 | 716.83 | 5.6E−03 | | | | 8.3 | 2.1 | Present invention |
| 310 | | No. 3 | 4 | 551.64 | 7.3E−03 | | | | 6.2 | 1.6 | Present invention |
| 311 | | No. 4 | 4 | 516.60 | 7.7E−03 | | | | 8.3 | 1.5 | Present invention |
| 312 | | No. 5 | 5 | 539.63 | 9.3E−03 | | | | 8.2 | 2.1 | Present invention |
| 313 | | No. 6 | 6 | 646.76 | 9.3E−03 | | | | 7.0 | 2.1 | Present invention |
| 314 | | No. 7 | 4 | 412.45 | 9.7E−03 | | | | 5.0 | 1.4 | Present invention |
| 315 | | No. 8 | 6 | 616.71 | 9.7E−03 | | | | 4.9 | 1.3 | Present invention |
| 316 | | No. 9 | 5 | 463.53 | 1.1E−03 | | | | 7.3 | 1.8 | Present invention |
| 317 | | No. 10 | 6 | 540.62 | 1.1E−03 | | | | 4.7 | 1.1 | Present invention |
| 318 | | No. 11 | 6 | 312.33 | 1.9E−03 | | | | 4.7 | 1.2 | Present invention |
| 319 | Glass | No. 1 | 4 | 716.83 | 5.6E−03 | | 1 | 8 | 4.8 | 0.7 | Present invention |
| 320 | | No. 8 | 6 | 616.71 | 9.7E−03 | | | | 4.7 | 0.6 | Present invention |
| 321 | | No. 1 | 4 | 716.83 | 5.6E−03 | | 0.6 | 8 | 4.2 | 0.5 | Present invention |
| 322 | | No. 8 | 6 | 616.71 | 9.7E−03 | | | | 4.6 | 0.6 | Present invention |
| 323 | | No. 1 | 4 | 716.83 | 5.6E−03 | | 0.3 | | 4.9 | 0.7 | Present invention |
| 324 | | No. 8 | 6 | 616.71 | 9.7E−03 | | | | 5.1 | 0.6 | Present invention |
| 325 | Glass | No. 1 | 4 | 716.83 | 5.6E−03 | KF (10 vol %) | 0.6 | 8 | 4.1 | 0.3 | Present invention |
| 326 | | No. 1 | 4 | 716.83 | 5.6E−03 | Compound No. 1 containing Br (10 vol %) | | | 4.1 | 0.3 | Present invention |
| 327 | PET | No. 1 | 4 | 716.83 | 5.6E−03 | — | 0.6 | 8 | 5.9 | 1.9 | Present invention |
| 328 | | No. 8 | 6 | 616.71 | 9.7E−03 | — | | | 5.8 | 2.1 | Present invention |

<Evaluation Results of Example 3>

As is clear from Table 4, it is confirmed that, with the organic electroluminescence element of each of Samples 308 to 328, light emission at a front brightness of 1000 cd/m² can be obtained with a low driving voltage of 10V or less, wherein the organic electroluminescence element of each of Samples 308 to 328 is provided with a transparent electrode 1 that includes a nitrogen-containing layer 1a formed by using one of Compounds No. 1 to No. 11 whose effective unshared electron pair content [n/M] satisfies "3.9×10-3×≤[n/M]", an aluminum intermediate layer A, and an electrode layer 1b composed of silver, wherein the aluminum intermediate layer A and the electrode layer 1b are arranged on the top of the nitrogen-containing layer 1a. Further, it is confirmed that the organic electroluminescence element of each of Samples 308 to 328 can emit light after being preserved under a high-temperature/high-humidity environment, and therefore such organic electroluminescence element is excellent in high-temperature/high-humidity preservation performance; and further, based on this fact, it is confirmed that the electrode layer 1b composed of silver is formed as a continuous film and therefore has barrier properties, so that deterioration of the light-emitting functional layer 3 composed of organic material is prevented.

In contrast, the organic electroluminescence element EL-2 of each of Samples 301 and 303 (in which the nitrogen-containing layer 1a is not provided) and the organic electroluminescence element EL-2 of each of Samples 304 to 307 (in which the nitrogen-containing layer (the ground layer) is formed by using one of Compounds No. -1 to No. -4 whose effective unshared electron pair content [n/M] does not fall in the aforesaid range) cannot emit light even when a voltage is applied, or can emit light only when a driving voltage of higher than 10 V is applied, and have poor high-temperature/high-humidity preservation performance.

Based on the above facts, it is confirmed that the bottom emission type organic electroluminescence element EL-2 using the transparent electrode 1 having the configuration of the present invention can emit light of higher brightness with lower driving voltage, and has excellent preservation performance; and further, based on this fact, it is confirmed that it is expected to reduce driving voltage and improve light-emitting lifetime for obtaining a given brightness.

Further, it can be known by comparing Samples 319, 321, 323 (they are different only in the film-thickness of the aluminum intermediate layer A) and comparing Samples 320, 322, 324 (they are also different only in the film-thickness of the aluminum intermediate layer A) that the driving voltage and the high-temperature/high-humidity preservation performance each have a minimum value with the film-thickness of the aluminum intermediate layer as a factor, and the minimum value is obtained when the film-thickness of the aluminum intermediate layer is equal to or smaller than 1 nm. Thus, it is preferred that the film-thickness of the aluminum intermediate layer is equal to or smaller than 1 nm.

Furthermore, it is confirmed by comparing Samples 2321, 325, 326 (they are different only in the halogen compound of the nitrogen-containing layer 1a) that it is possible to reduce the driving voltage and further improve the high-temperature/high-humidity preservation performance by containing a halogen compound in the nitrogen-containing layer 1a.

Example 4

Production of Transparent Electrode

In Example 4, transparent electrodes were produced by containing halogen atoms into the nitrogen-containing layer 1a and containing halogen atoms into the whole layer of the aluminum intermediate layer of the transparent electrode of each of Samples 101 to 128 produced in Example 1. The following Table 5 shows the configuration of the transparent electrode of each of Samples 401 to 428 produced in Example 4.

Incidentally, the configuration of the transparent electrodes of Samples 401 to 428 shown in Table 5 corresponds to the configuration of the transparent electrodes of Samples 101 to 128 of Example 1 shown in Table 1. In other words, the configuration of each transparent electrode of Example 4 corresponds to the configuration of a corresponding transparent electrode of Example 1 having the same last two digits of the sample number as Example 4; for example, the configuration of the transparent electrode of Sample 401 corresponds to the configuration of the transparent electrode of Sample 101, the configuration of the transparent electrode of Sample 403 corresponds to the configuration of the transparent electrode of Sample 103, the configuration of the transparent electrode of Sample 404 corresponds to the configuration of the transparent electrode of Sample 104, and the like. However, in Samples 401 to 403, the same transparent electrodes as those of Samples 101 to 103 were produced.

In the production of the transparent electrode of each of Samples 404 to 428, a co-deposition was performed to add one of halogen compounds shown in Table 5, as deposition material, with respect to the formation of the nitrogen-containing layer (the ground layer) in the production of the transparent electrode of each of Example 1. In Sample 126 of Example 1, a deposition using Compound No. 1 and a bromine (Br) substituted product of Compound No. 1, as the deposition material of the nitrogen-containing layer, was performed; however, in Sample 426 of Example 4, a co-deposition using Compound No. 1 and kalium bromide (KBr), as the deposition material of the nitrogen-containing layer, was performed.

Further, in the next process for forming the aluminum intermediate layer, an aluminum intermediate layer having a film-thickness of 1 nm was formed at a deposition rate of 0.05 nm/sec with an additional condition that the substrate was heated to 50° C. In the process for forming the aluminum intermediate layer, due to the reaction between the halogen atoms contained in the nitrogen-containing layer and aluminum, an aluminum intermediate layer having halogen atoms (as aluminum halide) contained in the whole layer thereof was formed.

Other processes were identical to those for producing Samples 104 to 128 of Example 1, and each transparent electrode of Samples 404 to 428 was obtained by performing these processes.

<Evaluation of Each Sample of Example 4>

Similar to Example 1, the light transmittance for light with a wavelength of 550 nm and the sheet resistance of each transparent electrode of Samples 401 to 428 produced above were measured. The results of the measurement are also shown in the following Table 5.

TABLE 5

Example 4 Transparent electrode

| | | Transparent electrode | | | | | | | | | | |
|---|---|---|---|---|---|---|---|---|---|---|---|---|
| | | Nitrogen-containing layer (ground layer) Film-thickness: 25 nm | | | | | Aluminum intermediate layer | | Electrode layer (Ag) | Result of Evaluation | | |
| Sample No. | Substrate Material | Compound | Number of effective unshared electron pair [n] | Molecular weight [M] | [n/M] | Halogen compound | Content (vol %) | Aluminum or aluminum halide | Film-thickness (nm) | Film-thickness (nm) | Transmittance % (550 nm) | Sheet resistance Ω/sq. | Remark |
| 401 | Glass | — | — | — | — | — | — | — | — | 5 | 45.2 | Unmeasurable | Comparison |
| 402 | | — | — | — | — | — | — | — | — | 15 | 25.1 | 5.0E+00 | |
| 403 | | — | — | — | — | — | — | Al | 1 | 5 | 43.1 | Unmeasurable | |
| 404 | | No. -1 | 0 | 178.23 | 0.0E+00 | LiF | 10 | AlF3 | 1 | 5 | 44.1 | Unmeasurable | |
| 405 | | No. -2 | 1 | 839 | 1.2E-03 | LiF | 10 | AlF3 | 1 | 5 | 42.4 | Unmeasurable | |
| 406 | | No. -3 | 2 | 588.74 | 3.4E-03 | LiF | 10 | AlF3 | 1 | 5 | 46.9 | 2.20E+04 | |
| 407 | | No. -4 | 3 | 789.02 | 3.8E-03 | LiF | 10 | AlF3 | 1 | 5 | 47.9 | 1.40E+04 | |
| 408 | Glass | No. 1 | 4 | 716.83 | 5.6E-03 | LiF | 10 | AlF3 | 1 | 5 | 69.9 | 6.9E+02 | Present invention |
| 409 | | No. 2 | 4 | 716.83 | 5.6E-03 | LiF | 10 | AlF3 | 1 | 5 | 67.0 | 7.2E+02 | |
| 410 | | No. 3 | 4 | 551.64 | 7.3E-03 | LiF | 10 | AlF3 | 1 | 5 | 68.0 | 6.8E+02 | |
| 411 | | No. 4 | 4 | 516.60 | 7.7E-03 | LiF | 10 | AlF3 | 1 | 5 | 70.0 | 1.1E+02 | |
| 412 | | No. 5 | 5 | 539.63 | 9.3E-03 | LiF | 10 | AlF3 | 1 | 5 | 67.0 | 1.1E+02 | |
| 413 | | No. 6 | 6 | 646.76 | 9.3E-03 | LiF | 10 | AlF3 | 1 | 5 | 68.0 | 9.4E+01 | |
| 414 | | No. 7 | 4 | 412.45 | 9.7E-03 | LiF | 10 | AlF3 | 1 | 5 | 72.0 | 6.2E+01 | |
| 415 | | No. 8 | 6 | 616.71 | 9.7E-03 | LiF | 10 | AlF3 | 1 | 5 | 72.0 | 4.5E+01 | |
| 416 | | No. 9 | 5 | 463.53 | 1.1E-03 | LiF | 10 | AlF3 | 1 | 5 | 68.1 | 1.1E+02 | |
| 417 | | No. 10 | 6 | 540.62 | 1.1E-03 | LiF | 10 | AlF3 | 1 | 5 | 72.1 | 4.8E+01 | |
| 418 | | No. 11 | 6 | 312.33 | 1.9E-03 | LiF | 10 | AlF3 | 1 | 5 | 72.0 | 4.2E+01 | |
| 419 | Glass | No. 1 | 4 | 716.83 | 5.6E-03 | LiF | 10 | AlF3 | 1 | 8 | 71.9 | 7.9E+00 | Present invention |
| 420 | | No. 8 | 6 | 616.71 | 9.7E-03 | LiF | 10 | AlF3 | 1 | 8 | 72.1 | 8.2E+00 | |
| 421 | | No. 1 | 4 | 716.83 | 5.6E-03 | LiF | 10 | AlF3 | 0.6 | 8 | 73.5 | 7.5E+00 | |
| 422 | | No. 8 | 6 | 616.71 | 9.7E-03 | LiF | 10 | AlF3 | 0.6 | 8 | 72.6 | 7.8E+00 | |
| 423 | | No. 1 | 4 | 716.83 | 5.6E-03 | LiF | 10 | AlF3 | 0.3 | 8 | 71.9 | 7.1E+00 | |
| 424 | | No. 8 | 6 | 616.71 | 9.7E-03 | LiF | 10 | AlF3 | 0.3 | 8 | 71.0 | 7.2E+00 | |
| 425 | | No. 1 | 4 | 716.83 | 5.6E-03 | KF | 10 | AlF3 | 0.6 | 8 | 76.1 | 6.5E+00 | |
| 426 | | No. 1 | 4 | 716.83 | 5.6E-03 | KBr | 10 | AlBr3 | 0.6 | 8 | 70.1 | 7.5E+00 | |
| 427 | PET | No. 1 | 4 | 716.83 | 5.6E-03 | LiF | 10 | AlF3 | 0.6 | 8 | 67.0 | 1.2E+01 | Present invention |
| 428 | | No. 8 | 6 | 616.71 | 9.7E-03 | LiF | 10 | AlF3 | 0.6 | 8 | 67.9 | 1.5E+01 | |

<Evaluation Results of Example 4>

As is clear from Table 5, the transparent electrode of each of Samples 408 to 428 (i.e., a transparent electrode including a nitrogen-containing layer, an aluminum intermediate layer having halogen atoms contained in the whole layer thereof, and an electrode layer composed of silver, wherein the nitrogen-containing layer is formed by using one of Compounds No. 1 to No. 11 whose effective unshared electron pair content [n/M] falls in a confirmed predetermined range of "$3.9 \times 10^{-3} \leq [n/M]$" and "$[n/M] \leq 1.9 \times 10^{-2}$", and wherein the aluminum intermediate layer and the electrode layer are formed on the top of the nitrogen-containing layer) has an electrode layer (which substantially functions as a conductive layer) having an extremely small film-thickness of 5 nm or 8 nm yet having a low sheet resistance of a two-digit value or lower. Incidentally, such effect will be further reliable if the effective unshared electron pair content [n/M] falls in a range of "$5.0 \times 10^{-3} \leq [n/M]$". Based on this fact, it is confirmed that, in the transparent electrode having the configuration of the present invention, the electrode layer formed on the nitrogen-containing layer through the aluminum intermediate layer having halogen atoms contained therein is formed in a manner in which the electrode layer grows in a single-layer growth mode (Frank-van der Merwe: FW mode) and thereby is formed into a film having substantially uniform thickness.

Further, it is confirmed that, the transparent electrode of each of Samples 408 to 428 is provided with an aluminum intermediate layer having halogen atoms contained in the whole layer thereof yet has a very small film-thickness of 0.3 nm to 1 nm, and thereby has a light transmittance of 50% or higher, so that the transparent electrode of each of Samples 408 to 428 can be used as a transparent electrode.

The aforesaid results do not change no matter the base material is glass or plastic material (PET).

Particularly, it is confirmed by comparing Sample 408 with Sample 419 (they are different only in the film-thickness of the electrode layer) and comparing Sample 415 with Sample 420 (they are also different only in the film-thickness of the electrode layer) that no matter the film-thickness of the electrode layer is 5 nm or 8 nm, the light transmittance of the electrode layer is maintained at a high value of around 70%, and it is also confirmed that the sheet resistance is reduced by increasing the film-thickness of the electrode layer from 5 nm to 8 nm, so that it is possible to improve both the light transmittance and the electrical conductivity.

In contrast, the transparent electrode of each of Samples 401, 403 (in which no nitrogen-containing layer is provided) and the transparent electrode of each of Samples 404 to 407 (in which the nitrogen-containing layer (or the ground layer) is formed by using one of Compounds No. -2 to No. -4 whose effective unshared electron pair content [n/M] falls in a range of "$3.9 \times 10^{-3} > [n/M]$") each have an unmeasurable sheet resistance or have a high sheet resistance of four-digit value, and therefore cannot be used as an electrode. Also, these transparent electrodes each have a light transmittance of less than 50%, and therefore cannot be used as a transparent electrode. Incidentally, since the electrode layer of Sample 402, in which no ground layer (such as nitrogen-containing layer) is provided, has a large film-thickness of 15 nm, it has small sheet resistance but low light transmittance, and therefore cannot be used as a transparent electrode.

Based on above facts, it is confirmed that, by bringing a nitrogen-containing layer composed of a compound selected using the effective unshared electron pair content [n/M] as an index into contact with an electrode layer having silver as the main component thereof with an aluminum intermediate layer having halogen atoms contained therein sandwiched therebetween, it is possible to obtain an electrode film which has small thickness (so as to have light transmissibility) and yet has low resistance (i.e., it is possible to obtain a transparent electrode).

Further, it can be known by comparing Samples 419, 421, 423 (they are different only in the film-thickness of the aluminum intermediate layer) and comparing Samples 420, 422, 424 (they are also different only in the film-thickness of the aluminum intermediate layer) that the smaller the film-thickness of the aluminum intermediate layer is, the lower the sheet resistance of the transparent electrode becomes; however, the light transmittance of the transparent electrode has a maximum value with the film-thickness of the aluminum intermediate layer having halogen atoms contained in the whole layer thereof as a factor, and the maximum value is obtained when the film-thickness of the aluminum intermediate layer is equal to or smaller than 1 nm. Thus, it is preferred that the film-thickness of the aluminum intermediate layer having halogen atoms contained in the whole layer thereof is equal to or smaller than 1 nm.

Example 5

Production of Top Emission Type Organic Electroluminescence Element

Figure 8:
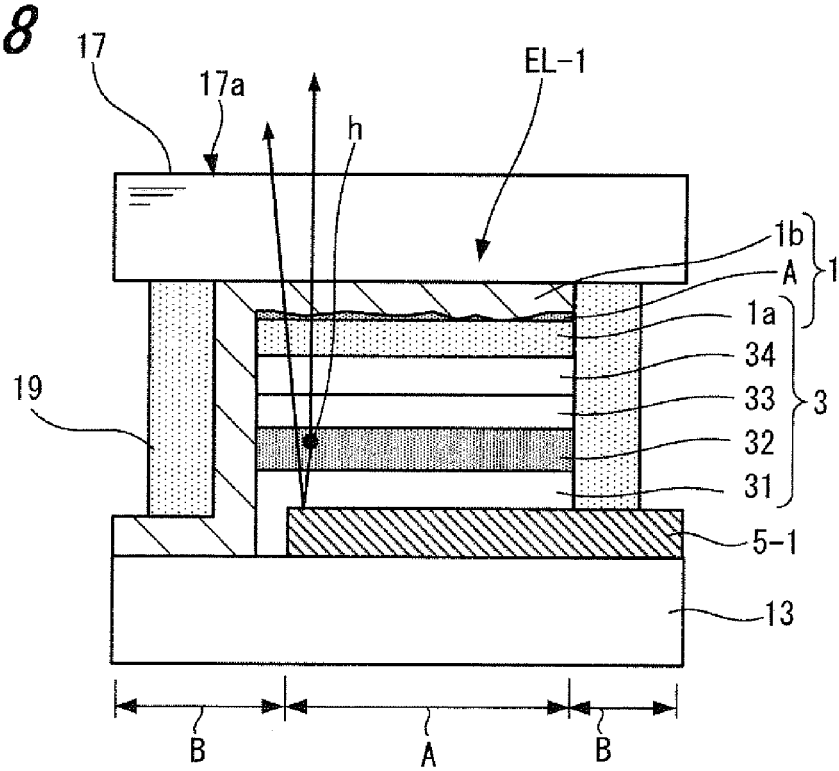
FIG. 8 is a view showing a cross-sectional configuration of a top emission type organic electroluminescence element produced in Example 2.

In Example 5, as shown in Table 6, top emission type organic electroluminescence elements of Samples 501 to 528 were produced, wherein each top emission type organic electroluminescence element has one of the transparent electrodes, each having different configuration, produced in Example 4 arranged, as a cathode, above the light-emitting functional layer. Each organic electroluminescence element of Example 5 was produced by applying the production of a corresponding transparent electrode of Example 4 having the same last two digits of the sample number as Example 5; for example, the organic electroluminescence element of Sample 501 is produced by applying the production of the transparent electrode of Sample 401, the organic electroluminescence element of Sample 503 is produced by applying the production of the transparent electrode of Sample 403, the organic electroluminescence element of Sample 504 is produced by applying the production of the transparent electrode of Sample 404, and the like. Incidentally, since the light transmittance of Sample 402 of Example 4 is not sufficient to be used as a transparent electrode, Example 3 has no Sample 302. FIG. 8 is a view showing a cross-sectional configuration of a top emission type organic electroluminescence element formed as one of Samples 501 to 528. In FIG. 8, the components corresponding to those in FIG. 4 are denoted by the same reference numerals. Process for producing a top emission type organic electroluminescence element EL-1 will be described below with reference to FIG. 8.

<Process for Producing Organic Electroluminescence Elements of Samples 501 to 528>
(Opposite Electrode 5-1: Formation of Anode)

As the anode, an opposite electrode 5-1 composed of aluminum and having a film-thickness of 100 nm was formed into a pattern on the substrate 13 by performing the same process described in Example 2.
(Formation of Layers from Hole Transporting/injecting Layer 31 to Electron Transporting/injecting Layer 34)

Next, a hole transporting/injecting layer 31 (which functions both as a hole injecting layer and as a hole transporting layer) composed of α-NPD (film-thickness: 20 nm), a light emitting layer 32 composed of the host material H4 and the phosphorescent compound Ir-4 (film-thickness: 30 nm), a hole blocking layer 33 composed of BAlq (film-thickness: 10 nm), and an electron transporting/injecting layer 34 composed of Compound 10 and potassium fluoride (film-thickness: 30 nm) were formed into the same configuration as each of Samples 201 to 228 of Example 2 described above. Each layer was formed in the same manner as described in Example 2.
(Formation of Transparent Electrode 1)

Next, in each of Samples 501 to 528, the transparent electrode 1 having different configuration was formed on the top of the electron transporting/injecting layer 34. The process for forming the transparent electrode 1 of each of Samples 401 to 428 is identical to that of each of Samples 401 to 428 of Example 4. In other words, each transparent electrode of Example 5 was formed by performing the same process as that for forming a corresponding transparent electrode of Example 4 having the same last two digits of the sample number as Example 5; for example, the transparent electrode of Sample 501 was formed by performing the same process as Sample 401, the transparent electrode of Sample 503 was formed by performing the same process as Sample 403, and the like.
(Sealing of Element)

Thereafter, the organic electroluminescence element EL-1 was sealed by performing the same process as described in Example 2, to obtain each light-emitting panel of the organic electroluminescence element of Samples 501 to 528. Incidentally, similar to Example 2, in the formation of the organic electroluminescence element EL-1, a deposition mask was used to form each layer, so that the opposite electrode 5-1 (which is the anode), and both the electrode layer 1*b* and the aluminum intermediate layer A (which are the cathode) of the transparent electrode 1 were formed into a shape such that the terminal portions thereof were drawn out to the edge of the substrate 13 in a state where the opposite electrode 5-1, and both the electrode layer 1*b* and the aluminum intermediate layer A of the transparent electrode 1 were insulated from each other by the layers from the hole transporting/injecting layer 31 to the electron transporting/injecting layer 34.

In each light-emitting panel, each different color of the luminescence light h emitted from the light emitting layer 32 was extracted from the side of the transparent sealing material 17.
<Evaluation of Each Sample of Example 5>

Similar to Example 2, the driving voltage and the high-temperature/high-humidity preservation performance of the organic electroluminescence element EL-1 (the light-emitting panel) produced in each of Samples 501 to 528 were measured. The results of the measurement are also shown in the following Table 6.

TABLE 6

Example 5 Top emission type

| | | Transparent electrode | | | | | | | | Electrode layer (Ag) | Result of Evaluation | | |
| | | Nitrogen-containing layer (ground layer) Film-thickness: 25 nm | | | | | | Aluminum intermediate layer | | | | | |
| Sample No. | Substrate Material | Compound | Number of effective unshared electron pair [n] | Molecular weight [M] | [n/M] | Halogen compound | Content (vol %) | Aluminum or aluminum halide | Film-thickness (nm) | Film-thickness (nm) | Driving voltage V | High-temperature/ high-humidity preservation performance ⊿V | Remark |
|---|---|---|---|---|---|---|---|---|---|---|---|---|---|
| 501 | Glass | — | — | — | — | — | — | — | — | 5 | Do not emit light | — | Comparison |
| 503 | | — | — | — | — | — | — | Al | 1 | 5 | Do not emit light | — | |
| 504 | | No. −1 | 0 | 178.23 | 0.0E+00 | LiF | 10 | AlF3 | 1 | 5 | Do not emit light | — | |
| 505 | | No. −2 | 1 | 839 | 1.2E−03 | LiF | 10 | AlF3 | 1 | 5 | Do not emit light | — | |
| 506 | | No. −3 | 2 | 588.74 | 3.4E−03 | LiF | 10 | AlF3 | 1 | 5 | 10.6 | Do not emit light | |
| 507 | | No. −4 | 3 | 789.02 | 3.8E−03 | LiF | 10 | AlF3 | 1 | 5 | 10.2 | Do not emit light | |
| 508 | Glass | No. 1 | 4 | 716.83 | 5.6E−03 | LiF | 10 | AlF3 | 1 | 5 | 6.3 | 3.2 | Present invention |
| 509 | | No. 2 | 4 | 716.83 | 5.6E−03 | LiF | 10 | AlF3 | 1 | 5 | 8.4 | 4.2 | |
| 510 | | No. 3 | 4 | 551.64 | 7.3E−03 | LiF | 10 | AlF3 | 1 | 5 | 5.8 | 2.9 | |
| 511 | | No. 4 | 4 | 516.60 | 7.7E−03 | LiF | 10 | AlF3 | 1 | 5 | 6.5 | 3.1 | |
| 512 | | No. 5 | 5 | 539.63 | 9.3E−03 | LiF | 10 | AlF3 | 1 | 5 | 8.4 | 4.1 | |
| 513 | | No. 6 | 6 | 646.76 | 9.3E−03 | LiF | 10 | AlF3 | 1 | 5 | 7.5 | 3.8 | |
| 514 | | No. 7 | 4 | 412.45 | 9.7E−03 | LiF | 10 | AlF3 | 1 | 5 | 5.1 | 2.5 | |
| 515 | | No. 8 | 6 | 616.71 | 9.7E−03 | LiF | 10 | AlF3 | 1 | 5 | 5.1 | 2.6 | |
| 516 | | No. 9 | 5 | 463.53 | 1.1E−03 | LiF | 10 | AlF3 | 1 | 5 | 7.6 | 3.9 | |
| 517 | | No. 10 | 6 | 540.62 | 1.1E−03 | LiF | 10 | AlF3 | 1 | 5 | 5.1 | 2.4 | |
| 518 | | No. 11 | 6 | 312.33 | 1.9E−03 | LiF | 10 | AlF3 | 1 | 5 | 5.0 | 2.5 | |
| 519 | Glass | No. 1 | 4 | 716.83 | 5.6E−03 | LiF | 10 | AlF3 | 1 | 8 | 5.0 | 1.5 | Present invention |
| 520 | | No. 8 | 6 | 616.71 | 9.7E−03 | LiF | 10 | AlF3 | 1 | 8 | 5.2 | 1.4 | |
| 521 | | No. 1 | 4 | 716.83 | 5.6E−03 | LiF | 10 | AlF3 | 0.6 | 8 | 4.4 | 1.2 | |
| 522 | | No. 8 | 6 | 616.71 | 9.7E−03 | LiF | 10 | AlF3 | 0.6 | 8 | 4.7 | 1.1 | |
| 523 | | No. 1 | 4 | 716.83 | 5.6E−03 | LiF | 10 | AlF3 | 0.3 | 8 | 5.0 | 1.4 | |
| 524 | | No. 8 | 6 | 616.71 | 9.7E−03 | LiF | 10 | AlF3 | 0.3 | 8 | 5.3 | 1.5 | |
| 525 | | No. 1 | 4 | 716.83 | 5.6E−03 | KF | 10 | AlF3 | 0.6 | 8 | 4.1 | 0.9 | |
| 526 | | No. 1 | 4 | 716.83 | 5.6E−03 | KBr | 10 | AlBr3 | 0.6 | 8 | 5.5 | 1.7 | |
| 527 | PET | No. 1 | 4 | 716.83 | 5.6E−03 | LiF | 10 | AlF3 | 0.6 | 8 | 6.0 | 2.2 | Present invention |
| 528 | | No. 8 | 6 | 616.71 | 9.7E−03 | LiF | 10 | AlF3 | 0.6 | 8 | 6.1 | 2.2 | |

<Evaluation Results of Example 5>

As is clear from Table 6, it is confirmed that, with the organic electroluminescence element EL-1 of each of Samples 508 to 528, light emission at a front brightness of 1000 cd/m² can be obtained with a low driving voltage of 10 V or less, wherein the organic electroluminescence element EL-1 of each of Samples 508 to 528 is provided with a transparent electrode 1 that includes a nitrogen-containing layer 1a formed by using one of Compounds No. 1 to No. 11 whose effective unshared electron pair content [n/M] satisfies "3.9×10-3≤[n/M]", an aluminum intermediate layer A having halogen atoms contained in the whole layer thereof and an electrode layer 1b composed of silver, wherein the aluminum intermediate layer A and the electrode layer 1b are arranged on the top of the nitrogen-containing layer 1a. Further, it is confirmed that the organic electroluminescence element of each of Samples 508 to 528 can emit light after being preserved under a high-temperature/high-humidity environment, and therefore is excellent in high-temperature/high-humidity preservation performance; and further, based on this fact, it is confirmed that the electrode layer 1b composed of silver is formed as a continuous film and therefore has barrier properties, so that deterioration of the light-emitting functional layer 3 composed of organic material is prevented.

In contrast, the organic electroluminescence element EL-1 of each of Samples 501 and 503 (in which the nitrogen-containing layer 1a is not provided) and the organic electroluminescence element EL-1 of each of Samples 504 to 507 (in which the nitrogen-containing layer (the ground layer) is formed by using one of Compounds No. −1 to No. −4 whose effective unshared electron pair content [n/M] does not fall in the aforesaid range) cannot emit light even when a voltage is applied, or can emit light only when a driving voltage of higher than 10 V is applied, and have poor high-temperature/high-humidity preservation performance.

Based on the above facts, it is confirmed that the top emission type organic electroluminescence element EL-1 using the transparent electrode 1 can emit light of higher brightness with lower driving voltage, and has excellent preservation performance; and further, based on this fact, it is confirmed that it is expected to reduce driving voltage and improve light-emitting lifetime for obtaining a given brightness.

Further, it can be known by comparing Samples 519, 521, 523 (they are different only in the film-thickness of the aluminum intermediate layer A) and comparing Samples 520, 522, 524 (they are also different only in the film-thickness of the aluminum intermediate layer A) that the driving voltage and the high-temperature/high-humidity preservation performance each have a minimum value with the film-thickness of the aluminum intermediate layer A as a factor, and the minimum value is obtained when the film-thickness of the aluminum intermediate layer A is equal to or smaller than 1 nm. Thus, it is preferred that the film-thickness of the aluminum intermediate layer A having halogen atoms contained in the whole layer thereof is equal to or smaller than 1 nm.

Example 6

Production of Bottom Emission Type Organic Electroluminescence Element

Figure 9:
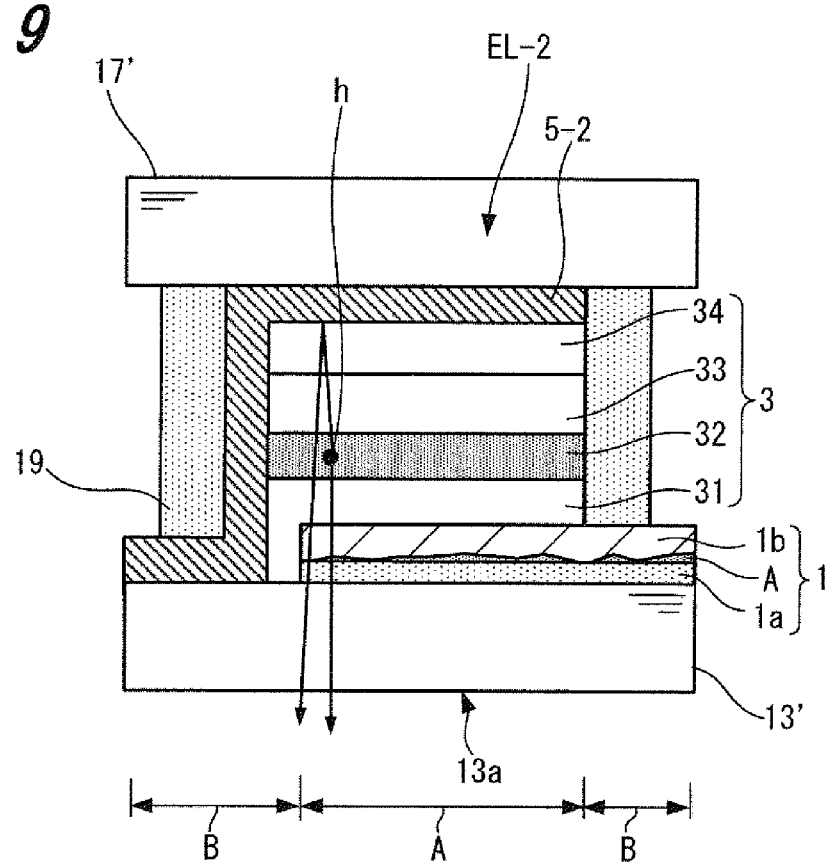
FIG. 9 is a view showing a cross-sectional configuration of a bottom emission type organic electroluminescence element produced in Example 3.

In Example 6, as shown in Table 7, bottom emission type organic electroluminescence elements of Samples 601 to 628 were produced, wherein each top emission type organic electroluminescence element has one of the transparent electrodes, each having different configuration, produced in Example 4 arranged, as an anode, below the light-emitting functional layer. Each organic electroluminescence element of Example 6 was produced by applying the production of a corresponding transparent electrode of Example 4 having the same last two digits of the sample number as Example 6; for example, the organic electroluminescence element of Sample 601 is produced by applying the production of the transparent electrode of Sample 401, the organic electroluminescence element of Sample 603 is produced by applying the production of the transparent electrode of Sample 403, the organic electroluminescence element of Sample 604 is produced by applying the production of the transparent electrode of Sample 404, and the like. Incidentally, since the light transmittance of Sample 402 of Example 4 is not sufficient to be used as a transparent electrode, Example 6 has no Sample 602. FIG. 9 is a view showing a cross-sectional configuration of a bottom emission type organic electroluminescence element formed as one of Samples 601 to 628. In FIG. 9, the components corresponding to those in FIG. 5 and FIG. 8 are denoted by the same reference numerals. The process of the production will be described below with reference to FIG. 9.
<Process for Producing Organic Electroluminescence Elements of Samples 601 to 628>
(Formation of Transparent Electrode 1)

In each of Samples 601 to 628, a transparent electrode 1 having one of the configurations shown in Table 7 was formed on the top of the transparent substrate 13'. The process for forming the transparent electrode 1 is identical to that of each of Samples 401 to 428 of Example 4. In other words, each transparent electrode of Example 6 was formed by performing the same process as that for forming a corresponding transparent electrode of Example 4 having the same last two digits of the sample number as Example 6; for example, the transparent electrode of Sample 601 was formed by performing the same process as Sample 401, the transparent electrode of Sample 603 was formed by performing the same process as Sample 403, and the like.

(Formation of Layers from Hole Transporting/injecting Layer 31 to Electron Transporting/injecting Layer 34)

Next, a hole transporting/injecting layer 31 (which functions both as a hole injecting layer and as a hole transporting layer) composed of α-NPD (film-thickness: 20 nm), a light emitting layer 32 composed of the host material H4 and the phosphorescent compound Ir-4 (film-thickness: 30 nm), a hole blocking layer 33 composed of BAlq (film-thickness: 10 nm), and an electron transporting/injecting layer 34 composed of Compound 10 and potassium fluoride (film-thickness: 30 nm) were formed into the same configuration as each of Samples 201 to 228 of Example 2 described above. Each layer was formed in the same manner as described in Example 2.

(Opposite Electrode 5-2: Formation of Cathode)

Thereafter, the transparent substrate 13' having the light-emitting functional layer 3 formed thereon was transferred to the second vacuum chamber of the vacuum deposition device. After the pressure of the second vacuum chamber was reduced to $-4 \times 10^{-4}$ Pa, a heating boat having aluminum placed therein and mounted in the second vacuum chamber was electrically heated, and thereby an opposite electrode 5-2 composed of aluminum and having a film-thickness of 100 nm was formed at a deposition rate of 0.3 nm/sec. The opposite electrode 5-2 is used as the cathode. By performing the above process, a bottom emission type organic electroluminescence element EL-2 was formed on the transparent substrate 13'.

(Sealing of Element)

Thereafter, similar to Example 2, the organic electroluminescence element EL-2 was sealed by a glass substrate (the sealing material 17'). Incidentally, similar to Example 2, in the formation of the organic electroluminescence element EL-2, a deposition mask was used to form each layer, so that the opposite electrode 5-2 (which is the cathode), and both the electrode layer 1b and the aluminum intermediate layer A (which are the anode) of the transparent electrode 1 were formed into a shape such that the terminal portions thereof were drawn out to the edge of the transparent substrate 13' in a state where the opposite electrode 5-2, and both the electrode layer 1b and the aluminum intermediate layer A of the transparent electrode 1 were insulated from each other by the layers from the hole transporting/injecting layer 31 to the electron transporting/injecting layer 34.

In each light-emitting panel, each different color of the luminescence light h emitted from the light emitting layer 32 was extracted from the side of the transparent substrate 13'.

<Evaluation of Each Sample of Example 6>

Similar to Example 2, the driving voltage and the high-temperature/high-humidity preservation performance of the organic electroluminescence element EL-2 (the light-emitting panel) produced in each of Samples 601 to 628 were measured. The results of the measurement are also shown in the following Table 7.

TABLE 7

Example 6 Bottom emission type

| | | Transparent electrode | | | | | | | | | |
|---|---|---|---|---|---|---|---|---|---|---|---|
| | | Nitrogen-containing layer (ground layer) Film-thickness: 25 nm | | | | | Aluminum intermediate layer | | Electrode layer (Ag) | Result of Evaluation | |
| | | | Number of effective | | | | | | | | |
| Sample No. | Substrate Material | Compound | unshared electron pair [n] | Molecular weight [M] | [n/M] | Halogen compound | Content (vol %) | Aluminum or aluminum halide | Film-thickness (nm) | Film-thickness (nm) | Driving voltage V | High-temperature/ high-humidity preservation performance ΔV | Remark |
| 601 | Glass | — | — | — | — | — | — | — | — | 5 | Do not emit light | — | Comparison |
| 603 | | — | — | — | — | — | — | Al | 1 | 5 | Do not emit light | — | |
| 604 | | No. -1 | 0 | 178.23 | 0.0E+00 | LiF | 10 | AlF3 | 1 | 5 | Do not emit light | — | |
| 605 | | No. -2 | 1 | 839 | 1.2E-03 | LiF | 10 | AlF3 | 1 | 5 | Do not emit light | — | |
| 606 | | No. -3 | 2 | 588.74 | 3.4E-03 | LiF | 10 | AlF3 | 1 | 5 | 10.4 | Do not emit light | |
| 607 | | No. -4 | 3 | 789.02 | 3.8E-03 | LiF | 10 | AlF3 | 1 | 5 | 10.2 | Do not emit light | |
| 608 | Glass | No. 1 | 4 | 716.83 | 5.6E-03 | LiF | 10 | AlF3 | 1 | 5 | 6.0 | 1.7 | Present invention |
| 609 | | No. 2 | 4 | 716.83 | 5.6E-03 | LiF | 10 | AlF3 | 1 | 5 | 8.4 | 2.0 | |
| 610 | | No. 3 | 4 | 551.64 | 7.3E-03 | LiF | 10 | AlF3 | 1 | 5 | 6.1 | 1.5 | |
| 611 | | No. 4 | 4 | 516.60 | 7.7E-03 | LiF | 10 | AlF3 | 1 | 5 | 8.2 | 1.6 | |
| 612 | | No. 5 | 5 | 539.63 | 9.3E-03 | LiF | 10 | AlF3 | 1 | 5 | 8.2 | 2.0 | |
| 613 | | No. 6 | 6 | 646.76 | 9.3E-03 | LiF | 10 | AlF3 | 1 | 5 | 7.1 | 2.1 | |
| 614 | | No. 7 | 4 | 412.45 | 9.7E-03 | LiF | 10 | AlF3 | 1 | 5 | 4.9 | 1.4 | |
| 615 | | No. 8 | 6 | 616.71 | 9.7E-03 | LiF | 10 | AlF3 | 1 | 5 | 5.0 | 1.4 | |
| 616 | | No. 9 | 5 | 463.53 | 1.1E-03 | LiF | 10 | AlF3 | 1 | 5 | 7.5 | 1.9 | |
| 617 | | No. 10 | 6 | 540.62 | 1.1E-03 | LiF | 10 | AlF3 | 1 | 5 | 4.6 | 1.2 | |
| 618 | | No. 11 | 6 | 312.33 | 1.9E-03 | LiF | 10 | AlF3 | 1 | 5 | 4.8 | 1.1 | |
| 619 | Glass | No. 1 | 4 | 716.83 | 5.6E-03 | LiF | 10 | AlF3 | 1 | 8 | 4.7 | 0.8 | Present invention |
| 620 | | No. 8 | 6 | 616.71 | 9.7E-03 | LiF | 10 | AlF3 | 1 | 8 | 4.8 | 0.7 | |
| 621 | | No. 1 | 4 | 716.83 | 5.6E-03 | LiF | 10 | AlF3 | 0.6 | 8 | 4.1 | 0.6 | |
| 622 | | No. 8 | 6 | 616.71 | 9.7E-03 | LiF | 10 | AlF3 | 0.6 | 8 | 4.5 | 0.6 | |
| 623 | | No. 1 | 4 | 716.83 | 5.6E-03 | LiF | 10 | AlF3 | 0.3 | 8 | 5.0 | 0.7 | |
| 624 | | No. 8 | 6 | 616.71 | 9.7E-03 | LiF | 10 | AlF3 | 0.3 | 8 | 4.9 | 0.6 | |
| 625 | | No. 1 | 4 | 716.83 | 5.6E-03 | KF | 10 | AlF3 | 0.6 | 8 | 4.0 | 0.4 | |
| 626 | | No. 1 | 4 | 716.83 | 5.6E-03 | KBr | 10 | AlBr3 | 0.6 | 8 | 5.1 | 1.0 | |
| 627 | PET | No. 1 | 4 | 716.83 | 5.6E-03 | LiF | 10 | AlF3 | 0.6 | 8 | 5.8 | 2.0 | Present invention |
| 628 | | No. 8 | 6 | 616.71 | 9.7E-03 | LiF | 10 | AlF3 | 0.6 | 8 | 5.9 | 2.1 | |

<Evaluation Results of Example 6>

As is clear from Table 7, it is confirmed that, with the organic electroluminescence element of each of Samples 608 to 628, light emission at a front brightness of 1000 cd/m² can be obtained with a low driving voltage of 10V or less, wherein the organic electroluminescence element of each of Samples 608 to 628 is provided with a transparent electrode 1 that includes a nitrogen-containing layer 1a formed by using one of Compounds No. 1 to No. 11 whose effective unshared electron pair content [n/M] satisfies "3.9×10-3×≤[n/M]", an aluminum intermediate layer A having halogen atoms contained in the whole layer thereof and an electrode layer 1b composed of silver, and wherein the aluminum intermediate layer A and the electrode layer 1b are arranged on the top of the nitrogen-containing layer 1a. Further, it is confirmed that the organic electroluminescence element of each of Samples 608 to 628 can emit light after being preserved under a high-temperature/high-humidity environment, and therefore is excellent in high-temperature/high-humidity preservation performance; and further, based on this fact, it is confirmed that the electrode layer 1b composed of silver is formed as a continuous film and therefore has barrier properties, so that deterioration of the light-emitting functional layer 3 composed of organic material is prevented.

In contrast, the organic electroluminescence element EL-2 of each of Samples 601 and 603 (in which the nitrogen-containing layer 1a is not provided) and the organic electroluminescence element EL-2 of each of Samples 604 to 607 (in which the nitrogen-containing layer (the ground layer) is formed by using one of Compounds No. -1 to No. -4 whose effective unshared electron pair content [n/M] does not fall in the aforesaid range) cannot emit light even when a voltage is applied, or can emit light only when a driving voltage of higher than 10 V is applied, and have poor high-temperature/high-humidity preservation performance.

Based on the above facts, it is confirmed that the bottom emission type organic electroluminescence element EL-2 using the transparent electrode 1 having the configuration of the present invention can emit light of higher brightness with lower driving voltage, and has excellent preservation performance; and further, based on this fact, it is confirmed that it is expected to reduce driving voltage and improve light-emitting lifetime for obtaining a given brightness.

Further, it can be known by comparing Samples 619, 621, 623 (they are different only in the film-thickness of the aluminum intermediate layer A having halogen atoms contained in the whole layer thereof) and comparing Samples 620, 622, 624 (they are different only in the film-thickness of the aluminum intermediate layer A having halogen atoms contained in the whole layer thereof) that the driving voltage and the high-temperature/high-humidity preservation performance each have a minimum value with the film-thickness of the aluminum intermediate layer A as a factor, and the minimum value is obtained when the film-thickness of the aluminum intermediate layer A is equal to or smaller than 1 nm. Thus, it is preferred that the film-thickness of the aluminum intermediate layer A having halogen atoms contained in the whole layer thereof is equal to or smaller than 1 nm.

Example 7

Production of Transparent Electrode

In Example 7, transparent electrodes were produced by containing halogen atoms into the nitrogen-containing layer 1a of the transparent electrode of each of Samples 101 to 128 produced in Example 1, and containing halogen atoms only into the interface side of the aluminum intermediate layer with the nitrogen-containing layer. The following Table 8 shows the configuration of the transparent electrode of each of Samples 701 to 728 produced in Example 7.

Incidentally, the configuration of the transparent electrodes of Samples 701 to 728 shown in Table 8 corresponds to the configuration of the transparent electrodes of Samples 101 to 128 of Example 1 shown in Table 1. In other words, the configuration of each transparent electrode of Example 7 corresponds to the configuration of a corresponding transparent electrode of Example 1 having the same last two digits of the sample number as Example 7; for example, the configuration of the transparent electrode of Sample 701 corresponds to the configuration of the transparent electrode of Sample 101, the configuration of the transparent electrode of Sample 703 corresponds to the configuration of the transparent electrode of Sample 103, the configuration of the transparent electrode of Sample 704 corresponds to the configuration of the transparent electrode of Sample 104, and the like. However, in Samples 701 to 703, the same transparent electrodes as those of Samples 101 to 103 were produced.

In the production of each transparent electrode of Samples 704 to 728, a co-deposition was performed to add one of halogen compounds shown in Table 8, as a deposition material, with respect to the formation of the nitrogen-containing layer (the ground layer) in the production of each transparent electrode of Example 1. In Sample 126 of Example 1, a deposition using Compound No. 1 and a bromine (Br) substituted product of Compound No. 1, as the deposition material of the nitrogen-containing layer, was performed; however, in Sample 726 of Example 4, a co-deposition using Compound No. 1 and kalium bromide (KBr), as the deposition material of the nitrogen-containing layer, was performed.

After the nitrogen-containing layer (the ground layer) containing halogen atoms had been formed in the above manner, the aluminum intermediate layer having a film-thickness of 1 nm was formed at a deposition rate of 0.05 nm/sec by performing the same process as for forming the aluminum intermediate layer of each of Samples 104 to 108 of Example 1, without heating the substrate. In the process for forming the aluminum intermediate layer, due to the reaction between the halogen atoms contained in the nitrogen-containing layer and aluminum constituting a material layer, halogen atoms (as aluminum halide) were caused to be contained in a region of the aluminum intermediate layer having a thickness of 0.2 nm from the side of the nitrogen-containing layer. Thus, the aluminum intermediate layer formed in each of Samples 704 to 728 has a laminated structure that includes a first layer having a film-thickness of 0.2 nm and a second layer having a film-thickness of 0.8 nm, wherein the first layer contains aluminum halide (AlF3) and the second layer is composed of aluminum (Al).

Other processes were identical to those for producing Samples 104 to 128 of Example 1, and each transparent electrode of Samples 704 to 728 was obtained by performing these processes.

<Evaluation of Each Sample of Example 7>

Similar to Example 1, the light transmittance for light with a wavelength of 550 nm and the sheet resistance of each transparent electrode of Samples 701 to 728 produced above were measured. The results of the measurement are also shown in the following Table 8.

TABLE 8

Example 7 Transparent electrode

| Sample No. | Substrate Material | Nitrogen-containing layer (ground layer) Film-thickness: 25 nm | | | | | | Aluminum intermediate layer | | | | Electrode layer (Ag) Film-thickness (nm) | Result of Evaluation | | Remark |
|---|---|---|---|---|---|---|---|---|---|---|---|---|---|---|---|
| | | Compound | Number of effective unshared electron pair [n] | Molecular weight [M] | [n/M] | Halogen compound | Content (vol %) | First layer | Film-thickness (nm) | Second layer | Film-thickness (nm) | | Transmittance % (550 nm) | Sheet resistance Ω/sq. | |
| 701 | Glass | — | — | — | — | — | — | — | — | — | — | 5 | 45.2 | Unmeasurable | Comparison |
| 702 | | — | — | — | — | — | — | — | — | — | — | 15 | 25.1 | 5.0E+00 | |
| 703 | | — | — | — | — | — | — | — | — | Al | 1 | 5 | 43.1 | Unmeasurable | |
| 704 | | No. -1 | 0 | 178.23 | 0.0E+00 | LiF | 10 | AlF3 | 0.2 | Al | 0.8 | 5 | 44.1 | Unmeasurable | |
| 705 | | No. -2 | 1 | 839 | 1.2E-03 | LiF | 10 | AlF3 | 0.2 | Al | 0.8 | 5 | 42.4 | Unmeasurable | |
| 706 | | No. -3 | 2 | 588.74 | 3.4E-03 | LiF | 10 | AlF3 | 0.2 | Al | 0.8 | 5 | 46.9 | 2.20E+04 | |
| 707 | | No. -4 | 3 | 789.02 | 3.8E-03 | LiF | 10 | AlF3 | 0.2 | Al | 0.8 | 5 | 47.9 | 1.40E+04 | |
| 708 | Glass | No. 1 | 4 | 716.83 | 5.6E-03 | LiF | 10 | AlF3 | 0.2 | Al | 0.8 | 5 | 69.9 | 6.9E+02 | Present |

TABLE 8-continued

Example 7 Transparent electrode

| Sample No. | Substrate Material | Compound | Nitrogen-containing layer (ground layer) Film-thickness: 25 nm | | | | | Aluminum intermediate layer | | | Electrode layer (Ag) Film-thickness (nm) | Result of Evaluation | | Remark |
|---|---|---|---|---|---|---|---|---|---|---|---|---|---|---|
| | | | Number of effective unshared electron pair [n] | Molecular weight [M] | [n/M] | Halogen compound | Content (vol %) | First layer | Film-thickness (nm) | Second layer | Film-thickness (nm) | | Transmittance % (550 nm) | Sheet resistance Ω/sq. | |
| 709 | | No. 2 | 4 | 716.83 | 5.6E−03 | LiF | 10 | AlF3 | 0.2 | Al | 0.8 | 5 | 67.0 | 7.2E+02 | invention |
| 710 | | No. 3 | 4 | 551.64 | 7.3E−03 | LiF | 10 | AlF3 | 0.2 | Al | 0.8 | 5 | 68.0 | 6.8E+02 | |
| 711 | | No. 4 | 4 | 516.60 | 7.7E−03 | LiF | 10 | AlF3 | 0.2 | Al | 0.8 | 5 | 70.0 | 1.1E+02 | |
| 712 | | No. 5 | 5 | 539.63 | 9.3E−03 | LiF | 10 | AlF3 | 0.2 | Al | 0.8 | 5 | 67.0 | 1.1E+02 | |
| 713 | | No. 6 | 6 | 646.76 | 9.3E−03 | LiF | 10 | AlF3 | 0.2 | Al | 0.8 | 5 | 68.0 | 9.4E+01 | |
| 714 | | No. 7 | 4 | 412.45 | 9.7E−03 | LiF | 10 | AlF3 | 0.2 | Al | 0.8 | 5 | 72.0 | 6.2E+01 | |
| 715 | | No. 8 | 6 | 616.71 | 9.7E−03 | LiF | 10 | AlF3 | 0.2 | Al | 0.8 | 5 | 72.0 | 4.5E+01 | |
| 716 | | No. 9 | 5 | 463.53 | 1.1E−03 | LiF | 10 | AlF3 | 0.2 | Al | 0.8 | 5 | 68.1 | 1.1E+02 | |
| 717 | | No. 10 | 6 | 540.62 | 1.1E−03 | LiF | 10 | AlF3 | 0.2 | Al | 0.8 | 5 | 72.1 | 4.8E+01 | |
| 718 | | No. 11 | 6 | 312.33 | 1.9E−03 | LiF | 10 | AlF3 | 0.2 | Al | 0.8 | 5 | 72.0 | 4.2E+01 | |
| 719 | Glass | No. 1 | 4 | 716.83 | 5.6E−03 | LiF | 10 | AlF3 | 0.2 | Al | 0.8 | 8 | 71.9 | 7.9E+00 | Present invention |
| 720 | | No. 8 | 6 | 616.71 | 9.7E−03 | LiF | 10 | AlF3 | 0.2 | Al | 0.8 | 8 | 72.1 | 8.2E+00 | invention |
| 721 | | No. 1 | 4 | 716.83 | 5.6E−03 | LiF | 10 | AlF3 | 0.2 | Al | 0.4 | 8 | 73.5 | 7.5E+00 | |
| 722 | | No. 8 | 6 | 616.71 | 9.7E−03 | LiF | 10 | AlF3 | 0.2 | Al | 0.4 | 8 | 72.6 | 7.8E+00 | |
| 723 | | No. 1 | 4 | 716.83 | 5.6E−03 | LiF | 10 | AlF3 | 0.2 | Al | 0.1 | 8 | 71.9 | 7.1E+00 | |
| 724 | | No. 8 | 6 | 616.71 | 9.7E−03 | LiF | 10 | AlF3 | 0.2 | Al | 0.1 | 8 | 71.0 | 7.2E+00 | |
| 725 | | No. 1 | 4 | 716.83 | 5.6E−03 | KF | 10 | AlF3 | 0.2 | Al | 0.4 | 8 | 76.1 | 6.5E+00 | |
| 726 | | No. 1 | 4 | 716.83 | 5.6E−03 | KBr | 10 | AlBr3 | 0.2 | Al | 0.4 | 8 | 70.1 | 7.5E+00 | |
| 727 | PET | No. 1 | 4 | 716.83 | 5.6E−03 | LiF | 10 | AlF3 | 0.2 | Al | 0.4 | 8 | 67.0 | 1.2E+01 | Present invention |
| 728 | | No. 8 | 6 | 616.71 | 9.7E−03 | LiF | 10 | AlF3 | 0.2 | Al | 0.4 | 8 | 67.9 | 1.5E+01 | |

<Evaluation Results of Example 7>

As is clear from Table 8, the transparent electrode of each of Samples 708 to 728 (i.e., a transparent electrode including a nitrogen-containing layer, an aluminum intermediate layer having halogen atoms contained only in a portion thereof on the side of the nitrogen-containing layer, and an electrode layer composed of silver, wherein the nitrogen-containing layer is formed by using one of Compounds No. 1 to No. 11 whose effective unshared electron pair content [n/M] falls in a confirmed predetermined range satisfying "$3.9\times10^{-3} \le [n/M]$" and "$[n/M] \le 1.9\times10^{-2}$", and wherein the aluminum intermediate layer and the electrode layer are formed on the top of the nitrogen-containing layer) has an electrode layer (which substantially functions as a conductive layer) having an extremely small film-thickness of 5 nm or 8 nm yet having a low sheet resistance of a two-digit value or lower. Incidentally, such effect will be further reliable if the effective unshared electron pair content [n/M] falls in a range of "$5.0\times10^{-3} \le [n/M]$". Based on this fact, it is confirmed that, in the transparent electrode having the configuration of the present invention, the electrode layer formed on the nitrogen-containing layer through the aluminum intermediate layer is formed in a manner in which the layer grows in a single-layer growth mode (Frank-van der Merwe: FW mode) and thereby is formed into a film having substantially uniform thickness.

Further, it is confirmed that, the transparent electrode of each of Samples 708 to 728 is provided with an aluminum intermediate layer having halogen atoms contained only in a portion thereof on the side of the nitrogen-containing layer yet has a very small film-thickness of 0.3 nm to 1 nm, and thereby has a light transmittance of 50% or higher, so that the transparent electrode of each of Samples 408 to 428 can be used as a transparent electrode.

The aforesaid results do not change no matter the base material is glass or plastic material (PET).

Particularly, it is confirmed by comparing Sample 708 with Sample 719 (they are different only in the film-thickness of the electrode layer) and comparing Sample 715 with Sample 720 (they are also different only in the film-thickness of the electrode layer) that no matter the film-thickness of the electrode layer is 5 nm or 8 nm, the light transmittance of the electrode layer is maintained at a high value of around 70%, and it is also confirmed that the sheet resistance is reduced by increasing the film-thickness of the electrode layer from 5 nm to 8 nm, so that it is possible to improve both the light transmittance and the electrical conductivity.

In contrast, the transparent electrode of each of Samples 701, 703 (in which no nitrogen-containing layer is provided) and the transparent electrode of each of Samples 704 to 707 (in which the nitrogen-containing layer (or the ground layer) is formed by using one of Compounds No. -2 to No. -4 whose effective unshared electron pair content [n/M] falls in a range of "$3.9\times10^{-3} > [n/M]$") each have an unmeasurable sheet resistance or have a high sheet resistance of four-digit value, and therefore cannot be used as an electrode. Also, these transparent electrodes each have a light transmittance of less than 50%, and therefore cannot be used as a transparent electrode. Incidentally, since the electrode layer of Sample 702, in which no ground layer (such as nitrogen-containing layer) is provided, has a large film-thickness of 15 nm, it has small sheet resistance but low light transmittance, and therefore cannot be used as a transparent electrode.

Based on above facts, it is confirmed that, by bringing a nitrogen-containing layer composed of a compound selected using the effective unshared electron pair content [n/M] as an index into contact with an electrode layer having silver as the main component thereof with an aluminum intermediate layer having halogen atoms contained only in a portion thereof on the side of the nitrogen-containing layer sandwiched therebetween, it is possible to obtain an electrode film which has small thickness (so as to have light transmissibility) and yet has low resistance (i.e., it is possible to obtain a transparent electrode).

Further, it can be known by comparing Samples 719, 721, 723 (they are different only in the film-thickness of the aluminum intermediate layer) and comparing Samples 720, 722, 724 (they are also different only in the film-thickness of the aluminum intermediate layer) that the smaller the film-thickness of the aluminum intermediate layer is, the lower the sheet resistance of the transparent electrode becomes; however, the light transmittance of the transparent electrode has a maximum value with the film-thickness of the aluminum intermediate layer as a factor, and the maximum value is obtained when the film-thickness of the aluminum intermediate layer is equal to or smaller than 1 nm. Thus, it is preferred that the film-thickness of the aluminum intermediate layer having halogen atoms contained only in a portion thereof on the side of the nitrogen-containing layer is equal to or smaller than 1 nm.

Example 8

Production of Top Emission Type Organic Electroluminescence Element

In Example 8, as shown in Table 9, top emission type organic electroluminescence elements of Samples 801 to 828 were produced, wherein each top emission type organic electroluminescence element has one of the transparent electrodes, each having different configuration, produced in Example 7 arranged, as a cathode, above the light-emitting functional layer. Each organic electroluminescence element of Example 8 was produced by applying the production of a corresponding transparent electrode of Example 7 having the same last two digits of the sample number as Example 8; for example, the organic electroluminescence element of Sample 801 is produced by applying the production of the transparent electrode of Sample 701, the organic electroluminescence element of Sample 803 is produced by applying the production of the transparent electrode of Sample 703, the organic electroluminescence element of Sample 804 is produced by applying the production of the transparent electrode of Sample 704, and the like. Incidentally, since the light transmittance of Sample 702 of Example 7 is not sufficient to be used as a transparent electrode, Example 8 has no Sample 802. FIG. 8 is a view showing a cross-sectional configuration of a top emission type organic electroluminescence element formed as one of Samples 801 to 828. In FIG. 8, the components corresponding to those in FIG. 4 are denoted by the same reference numerals. Process for producing a top emission type organic electroluminescence element EL-1 will be described below with reference to FIG. 8.
<Process for Producing Organic Electroluminescence Elements of Samples 801 to 328>
(Opposite Electrode 5-1: Formation of Anode)

As the anode, an opposite electrode 5-1 composed of aluminum and having a film-thickness of 100 nm was formed into a pattern on the substrate 13 by performing the same process described in Example 2.
(Formation of Layers from Hole Transporting/injecting Layer 31 to Electron Transporting/injecting Layer 34)

Next, a hole transporting/injecting layer 31 (which functions both as a hole injecting layer and as a hole transporting layer) composed of α-NPD (film-thickness: 20 nm), a light emitting layer 32 composed of the host material H4 and the phosphorescent compound Ir-4 (film-thickness: 30 nm), a hole blocking layer 33 composed of BAlq (film-thickness: 10 nm), and an electron transporting/injecting layer 34 composed of Compound 10 and potassium fluoride (film-thickness: 30 nm) were formed into the same configuration as each of Samples 201 to 228 of Example 2 described above. Each layer was formed in the same manner as described in Example 2.
(Formation of Transparent Electrode 1)

Next, in each of Samples 801 to 828, the transparent electrode 1 having different configuration was formed on the top of the electron transporting/injecting layer 34. The process for forming the transparent electrode 1 of each of Samples 801 to 828 is identical to that of each of Samples 701 to 728 of Example 7. In other words, each transparent electrode of Example 8 was formed by performing the same process as for forming a corresponding transparent electrode of Example 7 having the same last two digits of the sample number as Example 8; for example, the transparent electrode of Sample 801 was formed by performing the same process as Sample 701, the transparent electrode of Sample 803 was formed by performing the same process as Sample 703, and the like.
(Sealing of Element)

Thereafter, the organic electroluminescence element EL-1 was sealed by performing the same process as described in Example 2, to obtain each light-emitting panel of the organic electroluminescence element of Samples 801 to 828. Incidentally, similar to Example 2, in the formation of the organic electroluminescence element EL-1, a deposition mask was used to form each layer, so that the opposite electrode 5-1 (which is the anode), and both the electrode layer 1b and the aluminum intermediate layer A (which are the cathode) of the transparent electrode 1 were formed into a shape such that the terminal portions thereof were drawn out to the edge of the substrate 13 in a state where the opposite electrode 5-1, and both the electrode layer 1b and the aluminum intermediate layer A of the transparent electrode 1 were insulated from each other by the layers from the hole transporting/injecting layer 31 to the electron transporting/injecting layer 34.

In each light-emitting panel, each different color of the luminescence light h emitted from the light emitting layer 32 was extracted from the side of the transparent sealing material 17.
<Evaluation of Each Sample of Example 8>

Similar to Example 2, the driving voltage and the high-temperature/high-humidity preservation performance of the organic electroluminescence element EL-1 (the light-emitting panel) produced in each of Samples 801 to 828 were measured. The results of the measurement are also shown in the following Table 9.

TABLE 9

Example 8 Top emission type

| | | Transparent electrode | | | | | | | | | | | |
|---|---|---|---|---|---|---|---|---|---|---|---|---|---|
| | | Nitrogen-containing layer (ground layer) Film-thickness: 25 nm | | | | | Aluminum intermediate layer | | | Electrode layer (Ag) | Result of Evaluation | | |
| Sample No. | Substrate Material | Compound | Number of effective unshared electron pair [n] | Molecular weight [M] | [n/M] | Halogen compound | Content (vol %) | First layer | Film-thickness (nm) | Second layer | Film-thickness (nm) | Film-thickness (nm) | Driving voltage V | High-temperature/ high-humidity preservation performance ΔV | Remark |
| 801 | Glass | — | — | — | — | — | — | — | — | — | — | 5 | Do not emit light | — | Comparison |
| 803 | | — | — | — | — | — | — | — | — | Al | 1 | 5 | Do not emit light | — | |
| 804 | | No. -1 | 0 | 178.23 | 0.0E+00 | LiF | 10 | AlF3 | 0.2 | Al | 0.8 | 5 | Do not emit light | — | |
| 805 | | No. -2 | 1 | 839 | 1.2E−03 | LiF | 10 | AlF3 | 0.2 | Al | 0.8 | 5 | Do not emit light | — | |
| 806 | | No. -3 | 2 | 588.74 | 3.4E−03 | LiF | 10 | AlF3 | 0.2 | Al | 0.8 | 5 | 10.6 | Do not emit light | |
| 807 | | No. -4 | 3 | 789.02 | 3.8E−03 | LiF | 10 | AlF3 | 0.2 | Al | 0.8 | 5 | 10.2 | Do not emit light | |
| 808 | Glass | No. 1 | 4 | 716.83 | 5.6E−03 | LiF | 10 | AlF3 | 0.2 | Al | 0.8 | 5 | 6.0 | 1.7 | Present invention |
| 809 | | No. 2 | 4 | 716.83 | 5.6E−03 | LiF | 10 | AlF3 | 0.2 | Al | 0.8 | 5 | 8.4 | 2.0 | |
| 810 | | No. 3 | 4 | 551.64 | 7.3E−03 | LiF | 10 | AlF3 | 0.2 | Al | 0.8 | 5 | 6.1 | 1.5 | |
| 811 | | No. 4 | 4 | 516.60 | 7.7E−03 | LiF | 10 | AlF3 | 0.2 | Al | 0.8 | 5 | 8.2 | 1.6 | |
| 812 | | No. 5 | 5 | 539.63 | 9.3E−03 | LiF | 10 | AlF3 | 0.2 | Al | 0.8 | 5 | 8.2 | 2.0 | |
| 813 | | No. 6 | 6 | 646.76 | 9.3E−03 | LiF | 10 | AlF3 | 0.2 | Al | 0.8 | 5 | 7.1 | 2.1 | |
| 814 | | No. 7 | 4 | 412.45 | 9.7E−03 | LiF | 10 | AlF3 | 0.2 | Al | 0.8 | 5 | 4.9 | 1.4 | |
| 815 | | No. 8 | 6 | 616.71 | 9.7E−03 | LiF | 10 | AlF3 | 0.2 | Al | 0.8 | 5 | 5.0 | 1.4 | |
| 816 | | No. 9 | 5 | 463.53 | 1.1E−03 | LiF | 10 | AlF3 | 0.2 | Al | 0.8 | 5 | 7.5 | 1.9 | |
| 817 | | No. 10 | 6 | 540.62 | 1.1E−03 | LiF | 10 | AlF3 | 0.2 | Al | 0.8 | 5 | 4.6 | 1.2 | |
| 818 | | No. 11 | 6 | 312.33 | 1.9E−03 | LiF | 10 | AlF3 | 0.2 | Al | 0.8 | 5 | 4.8 | 1.1 | |
| 819 | Glass | No. 1 | 4 | 716.83 | 5.6E−03 | LiF | 10 | AlF3 | 0.2 | Al | 0.8 | 8 | 4.7 | 0.8 | Present invention |
| 820 | | No. 8 | 6 | 616.71 | 9.7E−03 | LiF | 10 | AlF3 | 0.2 | Al | 0.8 | 8 | 4.8 | 0.7 | |
| 821 | | No. 1 | 4 | 716.83 | 5.6E−03 | LiF | 10 | AlF3 | 0.2 | Al | 0.4 | 8 | 4.1 | 0.6 | |
| 822 | | No. 8 | 6 | 616.71 | 9.7E−03 | LiF | 10 | AlF3 | 0.2 | Al | 0.4 | 8 | 4.5 | 0.6 | |
| 823 | | No. 1 | 4 | 716.83 | 5.6E−03 | LiF | 10 | AlF3 | 0.2 | Al | 0.1 | 8 | 5.0 | 0.7 | |
| 824 | | No. 8 | 6 | 616.71 | 9.7E−03 | LiF | 10 | AlF3 | 0.2 | Al | 0.1 | 8 | 4.9 | 0.6 | |
| 825 | | No. 1 | 4 | 716.83 | 5.6E−03 | KF | 10 | AlF3 | 0.2 | Al | 0.4 | 8 | 4.0 | 0.4 | |
| 826 | | No. 1 | 4 | 716.83 | 5.6E−03 | KBr | 10 | AlBr3 | 0.2 | Al | 0.4 | 8 | 5.1 | 1.0 | |
| 827 | PET | No. 1 | 4 | 716.83 | 5.6E−03 | LiF | 10 | AlF3 | 0.2 | Al | 0.4 | 8 | 5.8 | 2.0 | Present invention |
| 828 | | No. 8 | 6 | 616.71 | 9.7E−03 | LiF | 10 | AlF3 | 0.2 | Al | 0.4 | 8 | 5.9 | 2.1 | |

<Evaluation Results of Example 8>

As is clear from Table 9, it is confirmed that, with the organic electroluminescence element EL-1 of each of Samples 808 to 828, light emission at a front brightness of 1000 cd/m² can be obtained with a low driving voltage of 10 V or less, wherein the organic electroluminescence element EL-1 of each of Samples 808 to 828 is provided with a transparent electrode 1 that includes a nitrogen-containing layer 1a formed by using one of Compounds No. 1 to No. 11 whose effective unshared electron pair content [n/M] satisfies "3.9×10-3×≤[n/M]", an aluminum intermediate layer A having halogen atoms contained only in a portion thereof on the side of the nitrogen-containing layer, and an electrode layer 1b composed of silver, and wherein the aluminum intermediate layer A and the electrode layer 1b are arranged on the top of the nitrogen-containing layer 1a. It is confirmed that the organic electroluminescence element of each of Samples 808 to 828 can emit light after being preserved under a high-temperature/high-humidity environment, and therefore is excellent in high-temperature/high-humidity preservation performance; and further, based on this fact, it is confirmed that the electrode layer 1b composed of silver is formed as a continuous film and therefore has barrier properties, so that deterioration of the light-emitting functional layer 3 composed of organic material is prevented.

In contrast, the organic electroluminescence element EL-1 of each of Samples 803 and 807 (in which the nitrogen-containing layer 1a is not provided) and the organic electroluminescence element EL-1 of each of Samples 804 to 807 (in which the nitrogen-containing layer (the ground layer) is formed by using one of Compounds No. -1 to No. -4 whose effective unshared electron pair content [n/M] does not fall in the aforesaid range) cannot emit light even when a voltage is applied, or can emit light only when a driving voltage of higher than 10 V is applied, and have poor high-temperature/high-humidity preservation performance.

Based on the above facts, it is confirmed that the top emission type organic electroluminescence element EL-1 using the transparent electrode 1 can emit light of higher brightness with lower driving voltage, and has excellent preservation performance; and further, based on this fact, it is confirmed that it is expected to reduce driving voltage and improve light-emitting lifetime for obtaining a given brightness.

Further, it can be known by comparing Samples 819, 821, 823 (they are different only in the film-thickness of the aluminum intermediate layer A) and comparing Samples 820, 822, 824 (they are also different only in the film-thickness of the aluminum intermediate layer A) that the driving voltage and the high-temperature/high-humidity preservation performance each have a minimum value with the film-thickness of the aluminum intermediate layer A as a factor, and the minimum value is obtained when the film-thickness of the aluminum intermediate layer A having halogen atoms contained only in a portion thereof on the side of the nitrogen-containing layer is equal to or smaller than 1 nm. Thus, it is preferred that the film-thickness of the aluminum intermediate layer A having halogen atoms contained only in a portion thereof on the side of the nitrogen-containing layer is equal to or smaller than 1 nm.

Example 9

Production of Bottom Emission Type Organic Electroluminescence Element

In Example 9, as shown in Table 10, bottom emission type organic electroluminescence elements of Samples 901 to 928 were produced, wherein each top emission type organic electroluminescence element has one of the transparent electrodes, each having different configuration, produced in Example 7 arranged, as an anode, below the light-emitting functional layer. Each organic electroluminescence element of Example 9 was produced by applying the production of a corresponding transparent electrode of Example 7 having the same last two digits of the sample number as Example 9; for example, the organic electroluminescence element of Sample 901 is produced by applying the production of the transparent electrode of Sample 701, the organic electroluminescence element of Sample 903 is produced by applying the production of the transparent electrode of Sample 703, the organic electroluminescence element of Sample 904 is produced by applying the production of the transparent electrode of Sample 704, and the like. Incidentally, since the light transmittance of Sample 702 of Example 7 is not sufficient to be used as a transparent electrode, Example 9 has no Sample 902. FIG. 9 is a view showing a cross-sectional configuration of a bottom emission type organic electroluminescence element formed as one of Samples 901 to 928. In FIG. 9, the components corresponding to those in FIG. 5 and FIG. 8 are denoted by the same reference numerals. The process of the production will be described below with reference to FIG. 9.
<Process for Producing Organic Electroluminescence Elements of Samples 901 to 928>
(Formation of Transparent Electrode 1)

In each of Samples 901 to 926, a transparent electrode 1 having one of the configurations shown in Table 10 was formed on the top of the transparent substrate 13'. The process for forming the transparent electrode 1 is identical to that of each of Samples 701 to 728 of Example 7. In other words, each transparent electrode of Example 9 was formed by performing the same process as for forming a corresponding transparent electrode of Example 7 having the same last two digits of the sample number as Example 9; for example, the transparent electrode of Sample 901 was formed by performing the same process as Sample 701, the transparent electrode of Sample 903 was formed by performing the same process as Sample 703, and the like.

(Formation of Layers from Hole Transporting/injecting Layer 31 to Electron Transporting/injecting Layer 34)

Next, a hole transporting/injecting layer 31 (which functions both as a hole injecting layer and as a hole transporting layer) composed of α-NPD (film-thickness: 20 nm), a light emitting layer 32 composed of the host material H4 and the phosphorescent compound Ir-4 (film-thickness: 30 nm), a hole blocking layer 33 composed of BAlq (film-thickness: 10 nm), and an electron transporting/injecting layer 34 composed of Compound 10 and potassium fluoride (film-thickness: 30 nm) were formed into the same configuration as each of Samples 201 to 228 of Example 2 described above. Each layer was formed in the same manner as described in Example 2.

(Opposite Electrode 5-2: Formation of Cathode)

Thereafter, the transparent substrate 13' having the light-emitting functional layer 36 formed thereon was transferred to the second vacuum chamber of the vacuum deposition device. After the pressure of the second vacuum chamber was reduced to −4×10⁻⁴ Pa, a heating boat having aluminum placed therein and mounted in the second vacuum chamber was electrically heated, and thereby an opposite electrode 5-2 composed of aluminum and having a film-thickness of 100 nm was formed at a deposition rate of 0.3 nm/sec. The opposite electrode 5-2 is used as the cathode. By performing the above process, a bottom emission type organic electroluminescence element EL-2 was formed on the transparent substrate 13'.

(Sealing of Element)

Thereafter, similar to Example 2, the organic electroluminescence element EL-2 was sealed by a glass substrate (the sealing material 17'). Incidentally, similar to Example 2, in the formation of the organic electroluminescence element EL-2, a deposition mask was used to form each layer, so that the opposite electrode 5-2 (which is the cathode), and both the electrode layer 1b and the aluminum intermediate layer A (which are the anode) of the transparent electrode 1 were formed into a shape such that the terminal portions thereof were drawn out to the edge of the transparent substrate 13' in a state where the opposite electrode 5-2, and both the electrode layer 1b and the aluminum intermediate layer A of the transparent electrode 1 were insulated from each other by the layers from the hole transporting/injecting layer 31 to the electron transporting/injecting layer 34.

In each light-emitting panel, each different color of the luminescence light h emitted from the light emitting layer 32 was extracted from the side of the transparent substrate 13'.

<Evaluation of Each Sample of Example 9>

Similar to Example 2, the driving voltage and the high-temperature/high-humidity preservation performance of the organic electroluminescence element EL-2 (the light-emitting panel) produced in each of Samples 901 to 928 were measured. The results of the measurement are also shown in the following Table 10.

TABLE 10

Example 9 Bottom emission type

| | | Transparent electrode | | | | | | | | | Electrode layer (Ag) | Result of Evaluation | |
|---|---|---|---|---|---|---|---|---|---|---|---|---|---|
| | | Nitrogen-containing layer (ground layer) Film-thickness: 25 nm | | | | | Aluminum intermediate layer | | | | | High-temperature/ | |
| Sample No. | Substrate Material | Compound | Number of effective unshared electron pair [n] | Molecular weight [M] | [n/M] | Halogen compound | Content (vol %) | First layer | Film-thickness (nm) | Second layer | Film-thickness (nm) | Film-thickness (nm) | Driving voltage V | high-humidity preservation performance ΔV | Remark |
| 901 | Glass | | | | | | | | | | | 5 | Do not emit light | | Comparison |
| 903 | | | | | | | | | | Al | 1 | 5 | Do not emit light | | |
| 904 | | No. -1 | 0 | 178.23 | 0.0E+00 | LiF | 10 | AlF3 | 0.2 | Al | 0.8 | 5 | Do not emit light | | |
| 905 | | No. -2 | 1 | 839 | 1.2E−03 | LiF | 10 | AlF3 | 0.2 | Al | 0.8 | 5 | Do not emit light | | |
| 906 | | No. -3 | 2 | 588.74 | 3.4E−03 | LiF | 10 | AlF3 | 0.2 | Al | 0.8 | 5 | 10.4 | Do not emit light | |
| 907 | | No. -4 | 3 | 789.02 | 3.8E−03 | LiF | 10 | AlF3 | 0.2 | Al | 0.8 | 5 | 10.2 | Do not emit light | |
| 908 | Glass | No. 1 | 4 | 716.83 | 5.6E−03 | LiF | 10 | AlF3 | 0.2 | Al | 0.8 | 5 | 6.3 | 3.2 | Present invention |
| 909 | | No. 2 | 4 | 716.83 | 5.6E−03 | LiF | 10 | AlF3 | 0.2 | Al | 0.8 | 5 | 8.4 | 4.2 | |
| 910 | | No. 3 | 4 | 551.64 | 7.3E−03 | LiF | 10 | AlF3 | 0.2 | Al | 0.8 | 5 | 5.8 | 2.9 | |
| 911 | | No. 4 | 4 | 516.60 | 7.7E−03 | LiF | 10 | AlF3 | 0.2 | Al | 0.8 | 5 | 6.5 | 3.1 | |
| 912 | | No. 5 | 5 | 539.63 | 9.3E−03 | LiF | 10 | AlF3 | 0.2 | Al | 0.8 | 5 | 8.4 | 4.1 | |
| 913 | | No. 6 | 6 | 646.76 | 9.3E−03 | LiF | 10 | AlF3 | 0.2 | Al | 0.8 | 5 | 7.5 | 3.8 | |
| 914 | | No. 7 | 4 | 412.45 | 9.7E−03 | LiF | 10 | AlF3 | 0.2 | Al | 0.8 | 5 | 5.1 | 2.5 | |
| 915 | | No. 8 | 6 | 616.71 | 9.7E−03 | LiF | 10 | AlF3 | 0.2 | Al | 0.8 | 5 | 5.1 | 2.6 | |
| 916 | | No. 9 | 5 | 463.53 | 1.1E−03 | LiF | 10 | AlF3 | 0.2 | Al | 0.8 | 5 | 7.6 | 3.9 | |
| 917 | | No. 10 | 6 | 540.62 | 1.1E−03 | LiF | 10 | AlF3 | 0.2 | Al | 0.8 | 5 | 5.1 | 2.4 | |
| 918 | | No. 11 | 6 | 312.33 | 1.9E−03 | LiF | 10 | AlF3 | 0.2 | Al | 0.8 | 5 | 5.0 | 2.5 | |
| 919 | Glass | No. 1 | 4 | 716.83 | 5.6E−03 | LiF | 10 | AlF3 | 0.2 | Al | 0.8 | 8 | 5.0 | 1.5 | Present invention |
| 920 | | No. 8 | 6 | 616.71 | 9.7E−03 | LiF | 10 | AlF3 | 0.2 | Al | 0.8 | 8 | 5.2 | 1.4 | |
| 921 | | No. 1 | 4 | 716.83 | 5.6E−03 | LiF | 10 | AlF3 | 0.2 | Al | 0.4 | 8 | 4.4 | 1.2 | |
| 922 | | No. 8 | 6 | 616.71 | 9.7E−03 | LiF | 10 | AlF3 | 0.2 | Al | 0.4 | 8 | 4.7 | 1.1 | |
| 923 | | No. 1 | 4 | 716.83 | 5.6E−03 | LiF | 10 | AlF3 | 0.2 | Al | 0.1 | 8 | 5.0 | 1.4 | |
| 924 | | No. 8 | 6 | 616.71 | 9.7E−03 | LiF | 10 | AlF3 | 0.2 | Al | 0.1 | 8 | 5.3 | 1.5 | |
| 925 | | No. 1 | 4 | 716.83 | 5.6E−03 | KF | 10 | AlF3 | 0.2 | Al | 0.4 | 8 | 4.1 | 0.9 | |
| 926 | | No. 1 | 4 | 716.83 | 5.6E−03 | KBr | 10 | AlBr3 | 0.2 | Al | 0.4 | 8 | 5.5 | 1.7 | |
| 927 | PET | No. 1 | 4 | 716.83 | 5.6E−03 | LiF | 10 | AlF3 | 0.2 | Al | 0.4 | 8 | 6.0 | 2.2 | Present invention |
| 928 | | No. 8 | 6 | 616.71 | 9.7E−03 | LiF | 10 | AlF3 | 0.2 | Al | 0.4 | 8 | 6.1 | 2.2 | |

<Evaluation Results of Example 9>

As is clear from Table 10, it is confirmed that, with the organic electroluminescence element of each of Samples 808 to 828, light emission at a front brightness of 1000 cd/m² can be obtained with a low driving voltage of 10 V or less, wherein the organic electroluminescence element of each of Samples 808 to 828 is provided with a transparent electrode 1 that includes a nitrogen-containing layer 1a formed by using one of Compounds No. 1 to No. 11 whose effective unshared electron pair content [n/M] satisfies "3.9×10-3×≤[n/M]", an aluminum intermediate layer A having halogen atoms contained only in a portion thereof on the side of the nitrogen-containing layer, and an electrode layer 1b composed of silver, and wherein the aluminum intermediate layer A and the electrode layer 1b are arranged on the top of the nitrogen-containing layer 1a. Further, it is confirmed that the organic electroluminescence element of each of Samples 808 to 828 can emit light after being preserved under a high-temperature/high-humidity environment, and therefore is excellent in high-temperature/high-humidity preservation performance; and further, based on this fact, it is confirmed that the electrode layer 1b composed of silver is formed as a continuous film and therefore has barrier properties, so that deterioration of the light-emitting functional layer 3 composed of organic material is prevented.

In contrast, the organic electroluminescence element EL-1 of each of Samples 801 and 803 (in which the nitrogen-containing layer 1a is not provided) and the organic electroluminescence element EL-2 of each of Samples 804 to 807 (in which the nitrogen-containing layer (the ground layer) is formed by using one of Compounds No. -1 to No. -4 whose effective unshared electron pair content [n/M] does not fall in the aforesaid range) cannot emit light even when a voltage is applied, or can emit light only when a driving voltage of higher than 10 V is applied, and have poor high-temperature/high-humidity preservation performance.

Based on the above facts, it is confirmed that the bottom emission type organic electroluminescence element EL-2 using the transparent electrode 1 having the configuration of the present invention can emit light of higher brightness with lower driving voltage, and has excellent preservation performance; and further, based on this fact, it is confirmed that it is expected to reduce driving voltage and improve light-emitting lifetime for obtaining a given brightness.

Further, it can be known by comparing Samples 819, 821, 823 (they are different only in the film-thickness of the aluminum intermediate layer A) and comparing Samples 820, 822, 824 (they are also different only in the film-thickness of the aluminum intermediate layer A) that the driving voltage and the high-temperature/high-humidity preservation performance each have a minimum value with the film-thickness of the aluminum intermediate layer A having halogen atoms contained only in a portion thereof on the side of the nitrogen-containing layer as a factor, and the minimum value is obtained when the film-thickness of the aluminum intermediate layer A is equal to or smaller than 1 nm. Thus, it is preferred that the film-thickness of the aluminum intermediate layer A having halogen atoms contained only in a portion thereof on the side of the nitrogen-containing layer is equal to or smaller than 1 nm.

EXPLANATION OF REFERENCE NUMERALS 1 transparent electrode
1a nitrogen-containing layer
1b electrode layer
A aluminum intermediate layer
EL, EL-1, EL-2, EL-3, EL-4 organic electroluminescence element (electronic device)

The invention claimed is:

1. A transparent electrode comprising:
a nitrogen-containing layer formed by using a compound which contains a nitrogen atom and whose effective unshared electron pair content [n/M] satisfies "$3.9 \times 10^{-3} \leq [n/M]$", where n is the number of unshared electron pair(s) not involved in aromaticity and not coordinated to metal, among unshared electron pair(s) owned by the nitrogen atom contained in the compound, and M is molecular weight;
an electrode layer having silver as the main component there of; and
an aluminum intermediate layer in contact with the nitrogen-containing layer and the electrode layer and sandwiched between the nitrogen-containing layer and the electrode layer.

2. The transparent electrode according to claim 1, wherein the effective unshared electron pair content [n/M] of the compound satisfies "$5.0 \times 10^{-3} \leq [n/M]$".

3. The transparent electrode according to claim 1, wherein the nitrogen-containing layer contains a compound represented by the following General Formula (1),

[Chemical Formula 1]

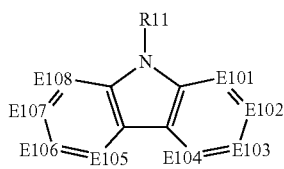

General Formula (1)

where
E101 to E108 each represent —C(R12)= or —N=, and at least one of E101 to E108 represents —N=, and
R11 and R12 each represent a hydrogen atom or a substituent.

4. The transparent electrode according to claim 1, wherein the nitrogen-containing layer contains a compound represented by the following General Formula (2),

[Chemical Formula 2]

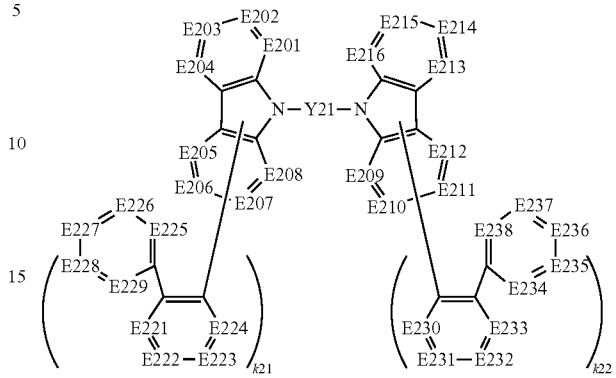

General Formula (2)

where
Y21 represents a divalent linking group which is an arylene group, a heteroarylene group or a combination of the arylene group and the heteroarylene group,
E201 to E216 and E221 to E238 each represent —C(R21)= or —N=, wherein R21 represents a hydrogen atom or a substituent, and wherein at least one of E221 to E229 and at least one of E230 to E238 each represent —N=, and
and k21 and k22 each represent an integer of 0 to 4, wherein the sum of k21 and k22 is an integer of 2 or more.

5. The transparent electrode according to claim 1, wherein the nitrogen-containing layer contains a compound represented by the following General Formula (3),

[Chemical Formula 3]

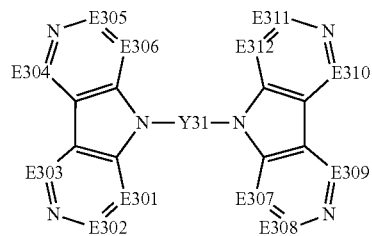

General Formula (3)

where
E301 to E312 each represent —C(R31)=, wherein R31 represents a hydrogen atom or a substituent, and
Y31 represents a divalent linking group which is an arylene group, a heteroarylene group or a combination of the arylene group and the heteroarylene group.

6. The transparent electrode according to claim 1, wherein the nitrogen-containing layer contains a compound represented by the following General Formula (4),

[Chemical Formula 4]

General Formula (4)

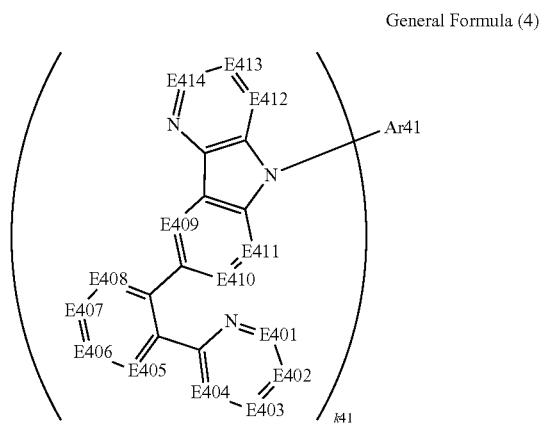

where

E401 to E414 each represent —C(R41)=, wherein R41 represents a hydrogen atom or a substituent, Ar41 represents a substituted or unsubstituted aromatic hydrocarbon ring or aromatic heterocycle, and k41 represents an integer of 3 or more.

7. The transparent electrode according to claim 1, wherein the nitrogen-containing layer contains a compound represented by the following General Formula (5),

[Chemical Formula 5]

General Formula (5)

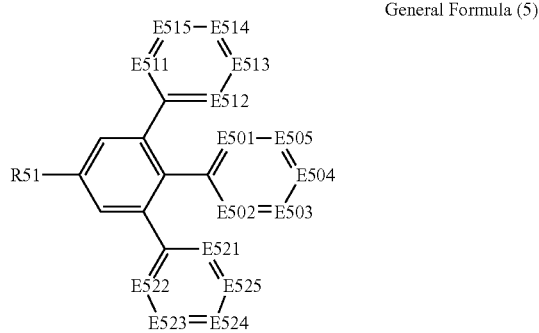

where

R51 represents a substituent,

E501, E502, E511 to E515, and E521 to E525 each represent —C(R52)= or —N=, and

E503 to E505 each represent —C(R52), wherein R52 represents a hydrogen atom (H) or a substituent, and wherein at least one of E501 and E502 represents —N=, at least one of E511 to E515 represents —N=, and at least one of E521 to E525 represents —N=.

8. The transparent electrode according to claim 1, wherein the nitrogen-containing layer contains a compound represented by the following General Formula (6),

[Chemical Formula 6]

General Formula (6)

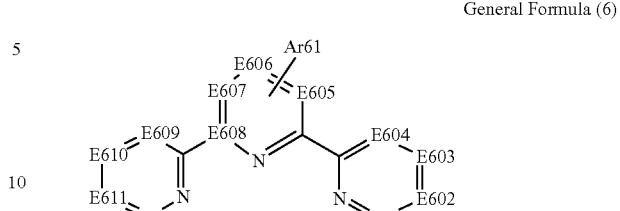

where

E601 to E612 each represent —C(R61)= or —N=, wherein R61 represents a hydrogen atom or a substituent; and Ar61 represents a substituted or unsubstituted aromatic hydrocarbon ring or aromatic heterocycle.

9. The transparent electrode according to claim 1, wherein the nitrogen-containing layer contains halogen atoms.

10. The transparent electrode according to claim 9, wherein the aluminum intermediate layer contains halogen atoms.

11. The transparent electrode according to claim 9, wherein the aluminum intermediate layer includes an intermediate layer that contains halogen atoms at least in its interface with the nitrogen-containing layer.

12. The transparent electrode according to claim 10, wherein the aluminum intermediate layer is formed so that the content of halogen atoms gradually decreases from the side of the nitrogen-containing layer toward the side of the electrode layer.

13. The transparent electrode according to claim 9, wherein the aluminum intermediate layer contains halogen atoms only in a portion thereof on the side of the nitrogen-containing layer.

14. The transparent electrode according to claim 9, wherein the aluminum intermediate layer contains halogen atoms in the whole layer thereof.

15. The transparent electrode according to claim 1, wherein the aluminum intermediate layer has a film-thickness of 1 nm or less.

16. The transparent electrode according to claim 1, wherein the nitrogen-containing layer is formed by using the compound and another compound, and the average value of the effective unshared electron pair content [n/M] obtained considering the mixing ratio of the both compounds satisfies "$3.9\times10^{-3} \le [n/M]$".

17. An electronic device comprising:
a transparent electrode according to claim 1.

18. The electronic device according to claim 17, wherein the electronic device is an organic electroluminescence element.

19. An organic electroluminescence element comprising:
a transparent electrode according to claim 1;
a light-emitting functional layer arranged on the electrode layer side of the transparent electrode; and
an opposite electrode arranged so that the light-emitting functional layer is sandwiched between the opposite electrode and the transparent electrode.

20. An organic electroluminescence element comprising:
a transparent electrode according to claim 1;
a light-emitting functional layer arranged on the nitrogen-containing layer side of the transparent electrode; and an opposite electrode arranged so that the light-emitting functional layer is sandwiched between the opposite electrode and the transparent electrode.

21. A method for producing a transparent electrode, comprising the steps of:
- forming a nitrogen-containing layer by using a compound which contains a nitrogen atom and whose effective unshared electron pair content [n/M] satisfies "$3.9 \times 10^{-3} \leq [n/M]$", where n is the number of unshared electron pair(s) not involved in aromaticity and not coordinated to metal, among unshared electron pair(s) owned by the nitrogen atom contained in the compound, and M is molecular weight;
- forming an aluminum intermediate layer in contact with the nitrogen-containing layer; and
- forming an electrode layer in contact with the aluminum intermediate layer, the electrode layer having silver as the main component thereof.

22. The method for producing a transparent electrode according to claim 21,
- wherein in the step of forming the nitrogen-containing layer, a nitrogen-containing layer containing halogen atoms is formed, and
- wherein in the step of forming the aluminum intermediate layer, the aluminum intermediate layer is formed while the halogen atoms contained in the nitrogen-containing layer are being diffused into the aluminum intermediate layer.

23. The method for producing a transparent electrode according to claim 22,
- wherein in the step of forming the nitrogen-containing layer, a nitrogen-containing layer containing halogen atoms is formed, and
- wherein after the step of forming the aluminum intermediate layer, a step of diffusing the halogen atoms contained in the nitrogen-containing layer into the aluminum intermediate layer is performed.

* * * * *